US012701912B2

(12) United States Patent
Kim et al.

(10) Patent No.: US 12,701,912 B2
(45) Date of Patent: Aug. 4, 2026

(54) ORGANIC LIGHT-EMITTING DEVICE

(71) Applicant: Samsung Display Co., Ltd., Yongin-si (KR)

(72) Inventors: Myeongsuk Kim, Yongin-si (KR); Sungwook Kim, Yongin-si (KR); Wonjun Song, Yongin-si (KR); Jinsoo Hwang, Yongin-si (KR); Changwoong Chu, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 202 days.

(21) Appl. No.: 18/583,972

(22) Filed: Feb. 22, 2024

(65) Prior Publication Data

US 2024/0268220 A1 Aug. 8, 2024

Related U.S. Application Data

(63) Continuation of application No. 17/313,493, filed on May 6, 2021, now Pat. No. 11,944,003, which is a (Continued)

(30) Foreign Application Priority Data

Nov. 30, 2015 (KR) ........................ 10-2015-0169272

(51) Int. Cl.

*H10K 85/60* (2023.01)
*H10K 50/11* (2023.01)
*H10K 59/35* (2023.01)

(52) U.S. Cl.

CPC ......... *H10K 85/633* (2023.02); *H10K 85/636* (2023.02); *H10K 85/6574* (2023.02); *H10K 85/6576* (2023.02); *H10K 50/11* (2023.02); *H10K 59/35* (2023.02); *H10K 85/615* (2023.02); *H10K 85/624* (2023.02); *H10K 85/626* (2023.02); *H10K 85/6572* (2023.02)

(58) Field of Classification Search

None

See application file for complete search history.

(56) References Cited

U.S. PATENT DOCUMENTS

| | | | |
|---|---|---|---|
| 5,840,217 | A | 11/1998 | Lupo et al. |
| 8,502,201 | B2 | 8/2013 | Nagao et al. |

(Continued)

FOREIGN PATENT DOCUMENTS

| | | |
|---|---|---|
| CN | 104114672 | 10/2014 |
| CN | 104768940 | 7/2015 |

(Continued)

OTHER PUBLICATIONS

STN Structure Search dated Apr. 12, 2019.

*Primary Examiner* — Vu A Nguyen

(74) *Attorney, Agent, or Firm* — CANTOR COLBURN LLP

(57) ABSTRACT

An organic light-emitting device having a low driving voltage, high efficiency, and a long lifespan is provided. The device includes a first electrode, a second electrode, and an organic layer between the first electrode and the second electrode, wherein the organic layer includes an emission layer, a first compound, and a second compound. Various chemical structures for the first compound and the second compound are provided.

10 Claims, 2 Drawing Sheets

Related U.S. Application Data continuation of application No. 16/861,571, filed on Apr. 29, 2020, now Pat. No. 11,018,304, which is a continuation-in-part of application No. 15/365,522, filed on Nov. 30, 2016, now Pat. No. 10,665,789.

(56) References Cited

U.S. PATENT DOCUMENTS

| | | | | |
|---|---|---|---|---|
| 9,748,492 | B2 | 8/2017 | Ito et al. | |
| 9,896,621 | B2 | 2/2018 | Kim et al. | |
| 11,944,003 | B2 * | 3/2024 | Kim | H10K 85/636 |
| 2009/0167161 | A1 | 7/2009 | Yabunouchi et al. | |
| 2011/0031975 | A1 | 2/2011 | Kawano et al. | |
| 2014/0183466 | A1 | 7/2014 | Lee et al. | |
| 2015/0065730 | A1 | 3/2015 | Montenegro et al. | |
| 2015/0236261 | A1 | 8/2015 | Stoessel et al. | |
| 2015/0287921 | A1 | 10/2015 | Kato et al. | |
| 2015/0325800 | A1 | 11/2015 | Ito et al. | |
| 2016/0149139 | A1 | 5/2016 | Xia et al. | |
| 2016/0260901 | A1 | 9/2016 | Kim et al. | |
| 2018/0130968 | A1 * | 5/2018 | Ikeda | C07C 255/37 |

FOREIGN PATENT DOCUMENTS

| | | |
|---|---|---|
| JP | 2005-314239 | 11/2005 |
| JP | 2013-232521 | 11/2013 |
| JP | 2013-234169 | 11/2013 |
| KR | 10-2010-0097180 | 9/2010 |
| KR | 10-2011-0040874 | 4/2011 |
| KR | 10-2014-0133572 | 11/2014 |
| KR | 10-2015-0007476 | 1/2015 |
| KR | 10-2015-0058396 | 5/2015 |
| KR | 10-2015-0079664 | 7/2015 |
| KR | 10-2016-0108798 | 9/2016 |
| KR | 10-2018-0027430 | 3/2018 |
| WO | 2009/084268 | 7/2009 |
| WO | 2013/120577 | 8/2013 |
| WO | 2014/069602 | 5/2014 |
| WO | 2014/141725 | 9/2014 |
| WO | 2016/013735 | 1/2016 |

* cited by examiner

ORGANIC LIGHT-EMITTING DEVICE

CROSS-REFERENCE TO RELATED APPLICATION(S)

This is a continuation application based on currently pending U.S. patent application Ser. No. 17/313,493, filed May 6, 2021, the disclosure of which is incorporated herein by reference in its entirety. U.S. patent application Ser. No. 17/313,493 is a continuation application of U.S. patent application Ser. No. 16/861,571, filed Apr. 29, 2020, now U.S. Pat. No. 11,018,304, issued May 25, 2021, the disclosure of which is incorporated herein by reference in its entirety. U.S. patent application Ser. No. 16/861,571 is a continuation-in-part application of U.S. patent application Ser. No. 15/365,522, filed Nov. 30, 2016, now U.S. Pat. No. 10,665,789, issued May 26, 2020, the disclosure of which is incorporated herein by reference in its entirety. U.S. patent application Ser. No. 15/365,522 claims priority benefit of Korean Patent Application No. 10-2015-0169272 under 35 U.S.C. § 119, filed on Nov. 30, 2015, the disclosure of which is incorporated herein by reference in its entirety for all purposes.

BACKGROUND

1. Field

One or more embodiments relate to an organic light-emitting device.

2. Description of the Related Art

Organic light-emitting devices are self-emission devices that produce full-color images and have wide viewing angles, high contrast ratios, and short response times, as well as excellent brightness, driving voltage, and response speed characteristics.

An example of such organic light-emitting devices may include a first electrode disposed on a substrate, and a hole transport region, an emission layer, an electron transport region, and a second electrode, which are sequentially disposed on the first electrode. Holes provided from the first electrode may move toward the emission layer through the hole transport region, and electrons provided from the second electrode may move toward the emission layer through the electron transport region. Carriers, such as holes and electrons, recombine in the emission layer to produce excitons. These excitons transition from an excited state to a ground state, thereby generating light.

SUMMARY

One or more embodiments include an organic light-emitting device having a low driving voltage, high efficiency, and a long lifespan.

Additional aspects will be set forth in part in the description which follows and, in part, will be apparent from the description, or may be learned by practice of the presented embodiments.

According to one or more embodiments, an organic light-emitting device includes:

a first electrode;

a second electrode facing the first electrode; and an organic layer between the first electrode and the second electrode, the organic layer including an emission layer, wherein the organic layer may include a first compound and a second compound, and the first compound may be represented by one selected from Formulae 1A and 1B, and the second compound may be represented by one selected from Formulae 2A to 2C:

<Formula 1A>

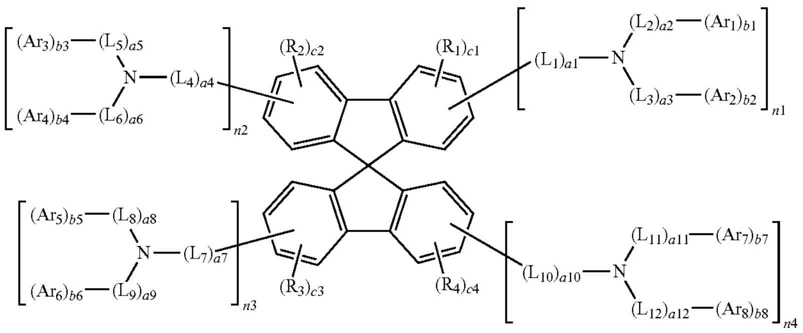

<Formula 1B>

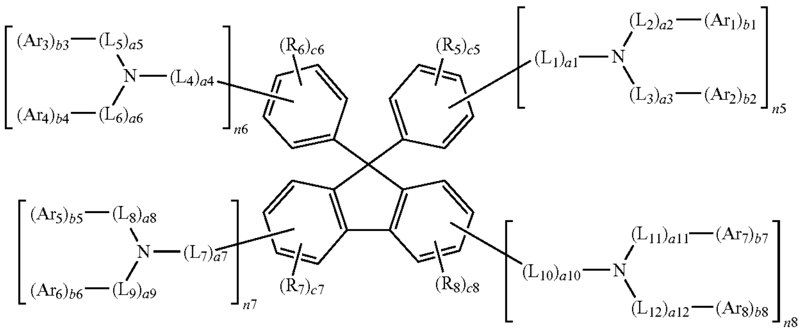

-continued

<Formula 2A>

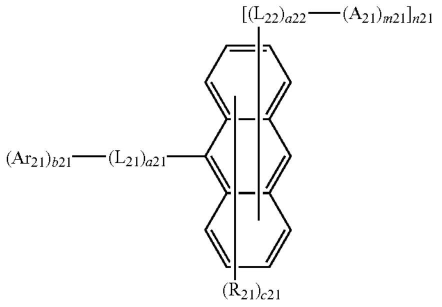

<Formula 2B>

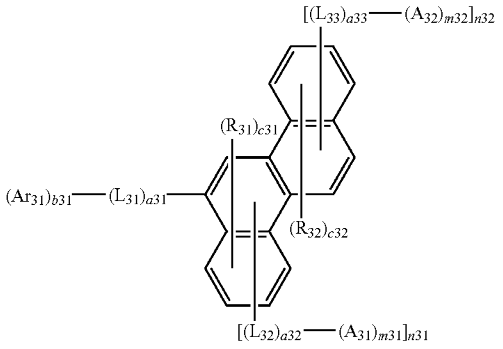

<Formula 2C>

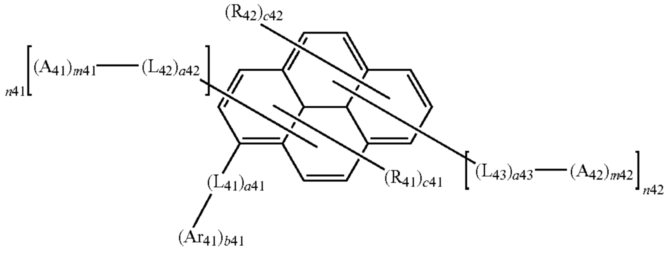

<Formula10>

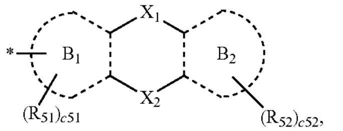

wherein, in Formulae 1A, 1B, 2A to 2C, and 10, $A_{21}$, $A_{31}$, $A_{32}$, $A_{41}$, and $A_{42}$ may each be a group represented by Formula 10, m21, m31, m32, m41, and m42 may each independently be an integer from 1 to 3, $X_1$ may be O or S, $X_2$ may be selected from a single bond, O, and S, ring $B_1$ and ring $B_2$ may each independently be selected from benzene and naphthalene, $L_1$ to $L_{12}$, $L_{21}$, $L_{22}$, $L_{31}$ to $L_{33}$, and $L_{41}$ to $L_{43}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, a1 to a12, a21, a22, a31 to a33, and a41 to a43 may each independently be an integer from 0 to 3, $Ar_1$ to $Ar_8$, $Ar_{21}$, $Ar_{31}$, and $Ar_{41}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, b1 to b8, b21, b31, and b41 may each independently be an integer from 1 to 5, $Ar_1$ and $Ar_2$ may optionally be linked to form a saturated or unsaturated ring, $Ar_3$ and $Ar_4$ may optionally be linked to form a saturated or unsaturated ring, $Ar_8$ and $Ar_6$ may optionally be linked to form a saturated or unsaturated ring, and $Ar_7$ and $Ar_8$ may optionally be linked to form a saturated or unsaturated ring, $R_1$ to $R_8$, $R_{21}$, $R_{31}$, $R_{32}$, $R_{41}$, $R_{42}$, $R_{51}$, and $R_{52}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, and —Si($Q_1$)($Q_2$)($Q_3$), c1 to c4, c7, and c8 may each independently be an integer from 0 to 4, c5 and c6 may each independently be an integer from 0 to 5, c21 may be an integer from 0 to 8, c31 and c32 may each independently be an integer from 0 to 5, c41 and c42 may each independently be an integer from 0 to 4, and c51 and c52 may each independently be an integer from 0 to 6, n1 to n4, n7, and n8 may each independently be an integer from 0 to 4, and n5 and n6 may each independently be an integer from 0 to 5, provided that the sum of n1, n2, n3, and n4 is one or more and the sum of n5, n6, n7, and n8 is one or more, n21 may be an integer from 1 to 3, and n31 and n32 may each independently be an integer from 0 to 3, provided that n31+n32 is one or more, and n41 and n42 may each independently be an integer from 0 to 3, provided that n41+n42 is one or more, and at least one substituent selected from a substituent(s) of the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be selected from:

a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{11}$)($Q_{12}$)($Q_{13}$), and —N($Q_{14}$)($Q_{15}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{21}$)($Q_{22}$)($Q_{23}$), and —N($Q_{24}$)($Q_{25}$); and Si($Q_{31}$)($Q_{32}$)($Q_{33}$) and —N($Q_{34}$)($Q_{35}$), wherein $Q_1$ to $Q_3$, $Q_{11}$ to $Q_{15}$, $Q_{21}$ to $Q_{25}$, and $Q_{31}$ to $Q_{35}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

BRIEF DESCRIPTION OF THE DRAWINGS

These and/or other aspects will become apparent and more readily appreciated from the following description of the embodiments, taken in conjunction with FIGS. 1 to 4 which are schematic views of an organic light-emitting device according to an embodiment.

DETAILED DESCRIPTION

Figure 1:
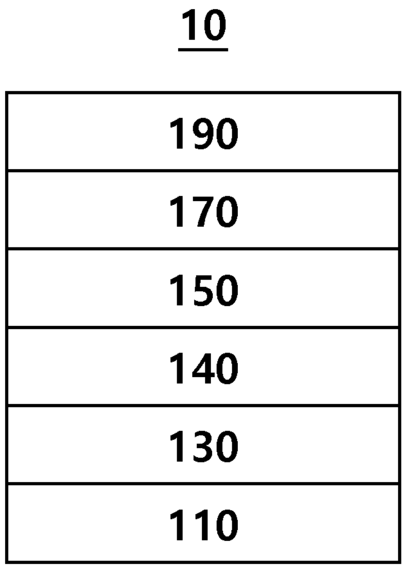

An organic light-emitting device according to an embodiment may include a first electrode; a second electrode facing the first electrode; and an organic layer between the first electrode and the second electrode, the organic layer including an emission layer. The organic layer may include a first compound and a second compound.

The first electrode may be an anode, the second electrode may be a cathode, and the first electrode and the second electrode are the same as described below.

The first compound may be represented by one selected from Formulae 1A and 1B, and the second compound may be represented by one selected from Formulae 2A to 2C:

<Formula 1A>

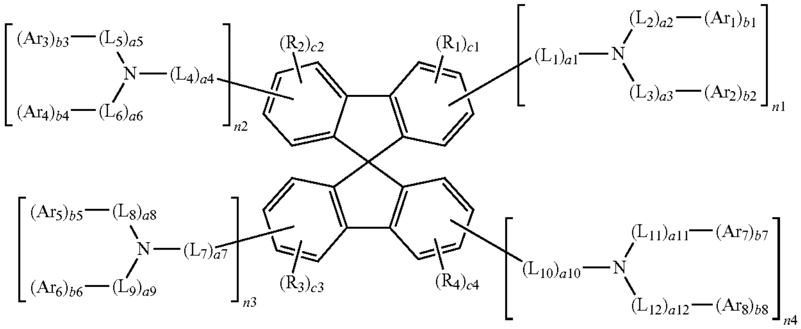

<Formula 1B>

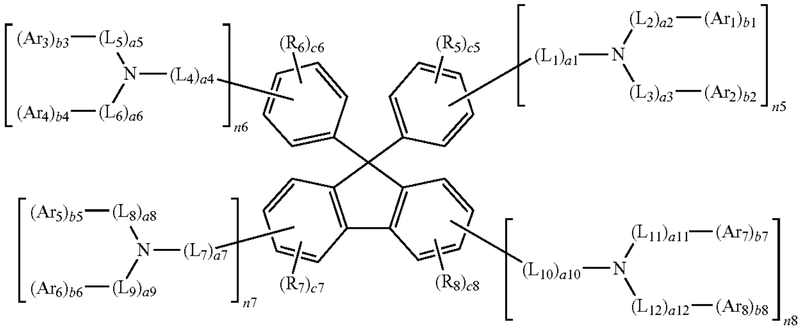

<Formula 2A>

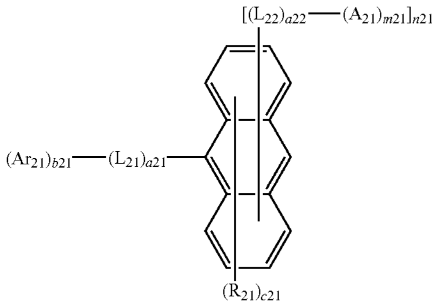

<Formula 2B>

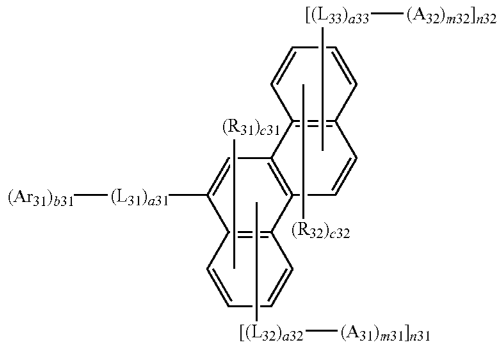

<Formula 2C>

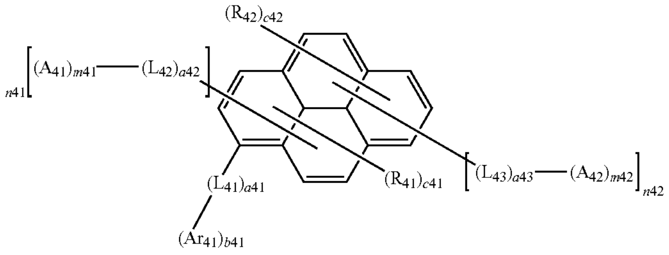

<Formula 10>

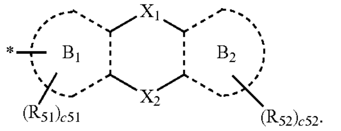

In Formulae 1A, 1B, and 2A to 2C, $L_1$ to $L_{12}$, $L_{21}$, $L_{22}$, $L_{31}$ to $L_{33}$, and $L_{41}$ to $L_{43}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group.

For example, $L_1$ to $L_{12}$, $L_{21}$, $L_{22}$, $L_{31}$ to $L_{33}$, and $L_{41}$ to $L_{43}$ may each independently be selected from:

a phenylene group, a pentalenylene group, an indenylene group, a naphthylene group, an azulenylene group, a heptalenylene group, an indacenylene group, an acenaphthylene group, a fluorenylene group, a spiro-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzimidazolylene group, a benzofuranylene group, a benzothiophenylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a benzocarbazolylene group, a dibenzocarbazolylene group, a thiadiazolylene group, an imidazopyridinylene group, and an imidazopyrimidinylene group; and a phenylene group, a pentalenylene group, an indenylene group, a naphthylene group, an azulenylene group, a heptalenylene group, an indacenylene group, an acenaphthylene group, a fluorenylene group, a spiro-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzimidazolylene group, a benzofuranylene group, a benzothiophenylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a benzocarbazolylene group, a dibenzocarbazolylene group, a thiadiazolylene group, an imidazopyridinylene group, and an imidazopyrimidinylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, an imidazopyridinyl group, and an imidazopyrimidinyl group.

In one or more embodiments, $L_1$ to $L_{12}$, $L_{21}$, $L_{22}$, $L_{31}$ to $L_{33}$, and $L_{41}$ to $L_{43}$ may each independently be selected from groups represented by Formulae 3-1 to 3-41:

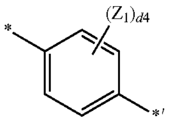

3-1

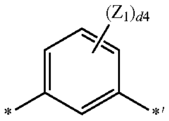

3-2

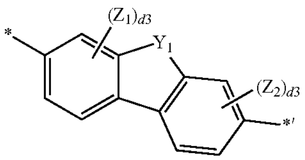

3-3

-continued
3-4
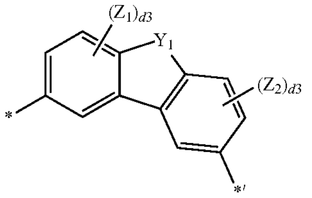
3-5
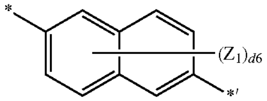
3-6
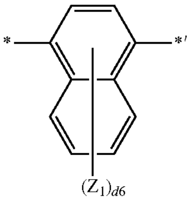
3-7
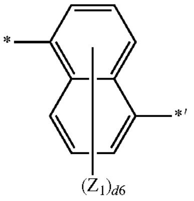
3-8
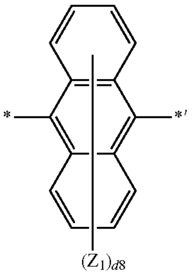
3-9
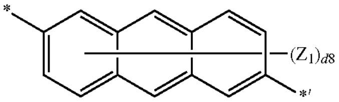
3-10
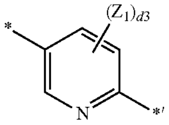
3-11
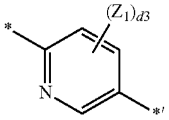
3-12
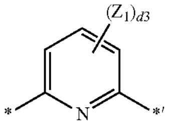
-continued
3-13
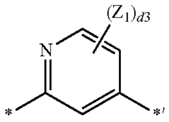
3-14
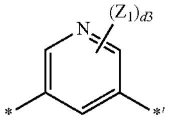
3-15
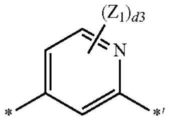
3-16
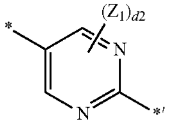
3-17
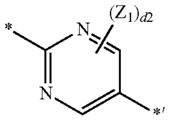
3-18
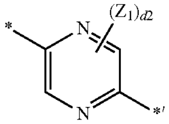
3-19
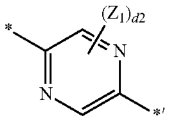
3-20
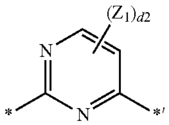
3-21
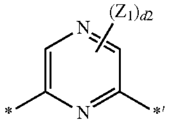
3-22
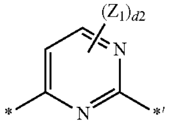
3-23
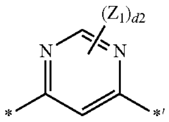

-continued
3-24
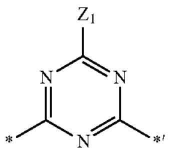
3-25
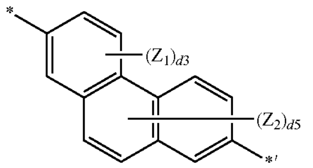
3-26
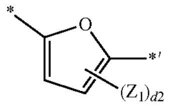
3-27
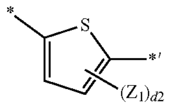
3-28
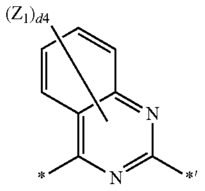
3-29
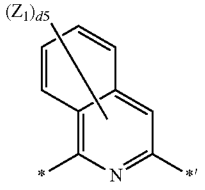
3-30
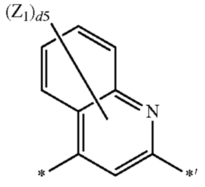
3-31
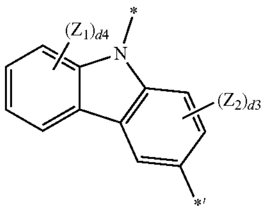
3-32
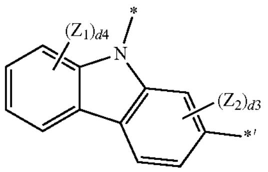
-continued
3-33
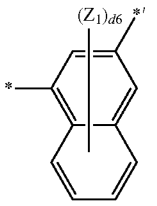
3-34
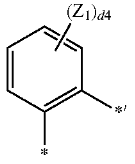
3-35
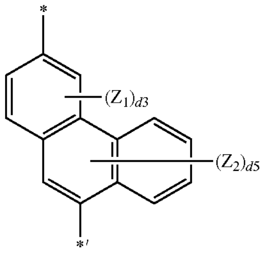
3-36
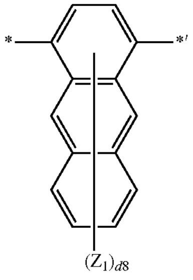
3-37
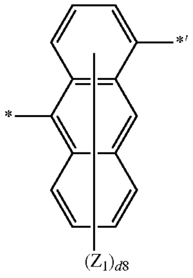
3-38
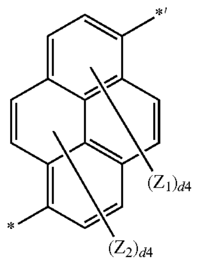

-continued 3-39

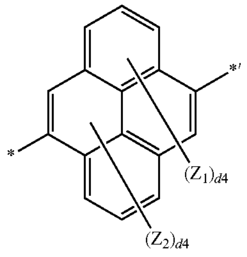

3-40

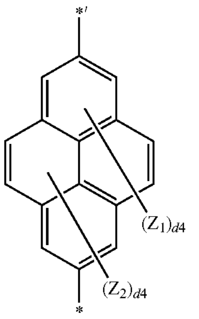

3-41

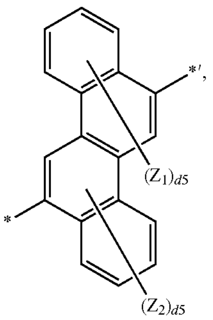

wherein, in Formulae 3-1 to 3-41, $Y_1$ may be O, S, $C(Z_3)(Z_4)$, $N(Z_5)$, or $Si(Z_6)(Z_7)$, $Z_1$ to $Z_7$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, and $—Si(Q_{33})(Q_{34})(Q_{35})$, wherein $Q_{33}$ to $Q_{35}$ may each independently be selected from a $C_1$-$C_{10}$ alkyl group, a $C_1$-$C_{10}$ alkoxy group, a phenyl group, a biphenyl group, a terphenyl group, and a naphthyl group, d2 may be 1 or 2, d3 may be an integer from 1 to 3, d4 may be an integer from 1 to 4, d5 may be an integer from 1 to 5, d6 may be an integer from 1 to 6, d8 may be an integer from 1 to 8, and

* and *' each indicate a binding site to a neighboring atom.

In one or more embodiments, $L_1$ to $L_{12}$, $L_{21}$, $L_{22}$, $L_{31}$ to $L_{33}$, and $L_{41}$ to $L_{43}$ may each independently be selected from groups represented by Formulae 4-1 to 4-36:

4-1

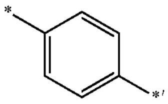

4-2

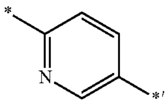

4-3

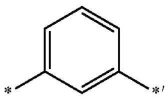

4-4

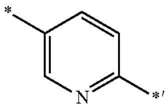

4-5

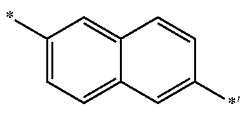

4-6

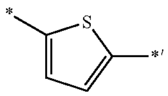

4-7

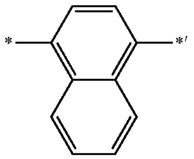

4-8

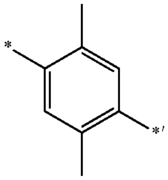

4-9

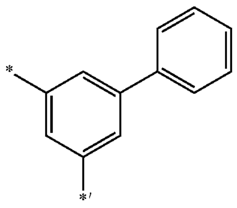

4-10

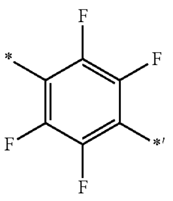

-continued
4-11
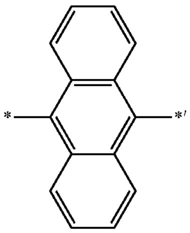
4-12
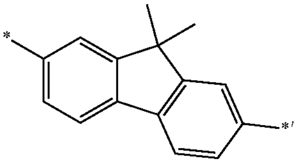
4-13
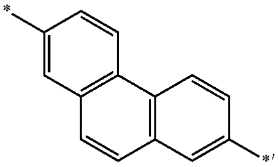
4-14
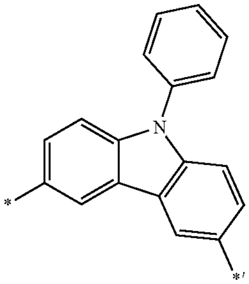
4-15
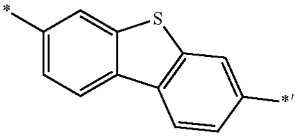
4-16
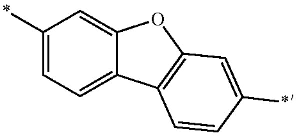
4-17
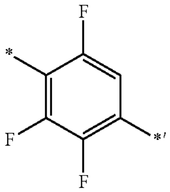
4-18
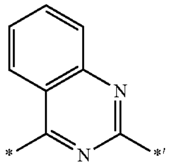
-continued
4-19
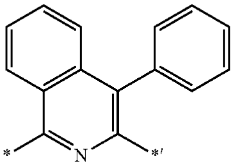
4-20
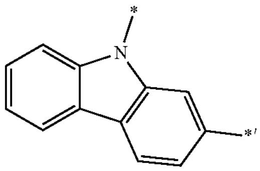
4-21
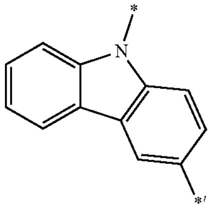
4-22
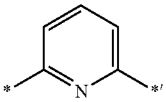
4-23
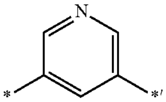
4-24
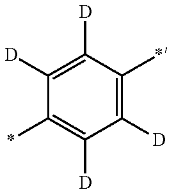
4-25
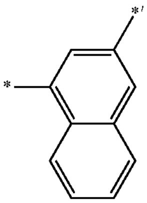
4-26
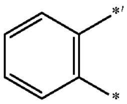
4-27
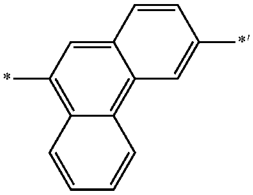

-continued 4-28

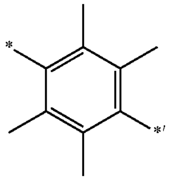

4-29

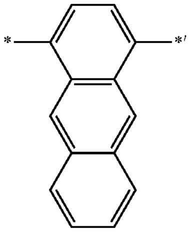

4-30

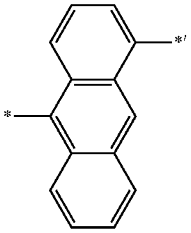

4-31

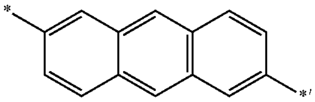

4-32

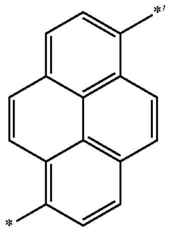

4-33

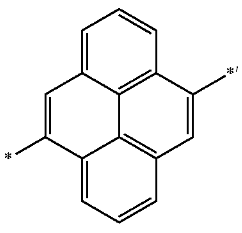

4-34

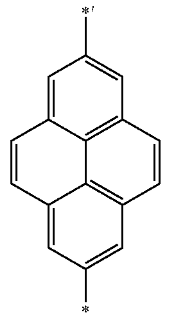

-continued 4-35

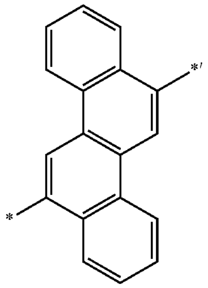

4-36

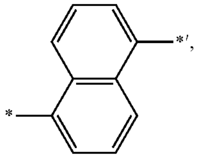

wherein * and *' in Formulae 4-1 to 4-36 each indicate a binding site to a neighboring atom.

a1 to a12, a21, a22, a31 to a33, and a41 to a43 in Formulae 1A, 1B, and 2A to 2C may each independently be an integer from 0 to 3. a1 indicates the number of $L_1$(*s*), wherein when a1 is zero, *-$(L_1)_{a1}$-*' may be a single bond, and when a1 is two or more, two or more $L_1$(*s*) may be identical to or different from each other. a2 to a12, a21, a22, a31 to a33, and a41 to a43 may be understood by referring to the descriptions provided in connection with a1 and the structures of Formulae 1A, 1B, and 2A to 2C.

For example, a1 to a12, a21, a22, a31 to a33, and a41 to a43 may each independently be 0, 1, or 2. In one or more embodiments, a1 to a12, a21, a22, a31 to a33, and a41 to a43 may each independently be 0 or 1.

$Ar_1$ to $Ar_8$, $Ar_{21}$, $Ar_{31}$, and $Ar_{41}$ in Formulae 1A, 1B, and 2A to 2C may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

For example, $Ar_1$ to $Ar_8$, $Ar_{21}$, $Ar_{31}$, and $Ar_{41}$ may each independently be selected from a substituted or unsubstituted phenyl group, a substituted or unsubstituted biphenyl group, a substituted or unsubstituted terphenyl group, a substituted or unsubstituted pentalenyl group, a substituted or unsubstituted indenyl group, a substituted or unsubstituted naphthyl group, a substituted or unsubstituted azulenyl group, a substituted or unsubstituted heptalenyl group, a substituted or unsubstituted indacenyl group, a substituted or unsubstituted acenaphthyl group, a substituted or unsubstituted fluorenyl group, a substituted or unsubstituted spiro-fluorenyl group, a substituted or unsubstituted benzofluorenyl group, a substituted or unsubstituted dibenzofluorenyl group, a substituted or unsubstituted phenalenyl group, a substituted or unsubstituted phenanthrenyl group, a substituted or unsubstituted anthracenyl group, a substituted or unsubstituted fluoranthenyl group, a substituted or unsubstituted triphenylenyl group, a substituted or unsubstituted pyrenyl group, a substituted or unsubstituted chrysenyl group, a substituted or unsubstituted naphthacenyl group, a substituted or unsubstituted picenyl group, a substituted or unsubstituted perylenyl group, a substituted or unsubstituted pentaphenyl group, a substituted or unsubstituted hexacenyl group, a substituted or unsubstituted pentacenyl group, a substituted or unsubstituted rubicenyl group, a substituted or unsubstituted coronenyl group, a substituted or unsubstituted ovalenyl group, a substituted or unsubstituted pyrrolyl group, a substituted or unsubstituted thiophenyl group, a substituted or unsubstituted furanyl group, a substituted or unsubstituted imidazolyl group, a substituted or unsubstituted pyrazolyl group, a substituted or unsubstituted thiazolyl group, a substituted or unsubstituted isothiazolyl group, a substituted or unsubstituted oxazolyl group, a substituted or unsubstituted isoxazolyl group, a substituted or unsubstituted pyridinyl group, a substituted or unsubstituted pyrazinyl group, a substituted or unsubstituted pyrimidinyl group, a substituted or unsubstituted pyridazinyl group, a substituted or unsubstituted isoindolyl group, a substituted or unsubstituted indolyl group, a substituted or unsubstituted indazolyl group, a substituted or unsubstituted purinyl group, a substituted or unsubstituted quinolinyl group, a substituted or unsubstituted isoquinolinyl group, a substituted or unsubstituted benzoquinolinyl group, a substituted or unsubstituted phthalazinyl group, a substituted or unsubstituted naphthyridinyl group, a substituted or unsubstituted quinoxalinyl group, a substituted or unsubstituted quinazolinyl group, a substituted or unsubstituted cinnolinyl group, a substituted or unsubstituted carbazolyl group, a substituted or unsubstituted phenanthridinyl group, a substituted or unsubstituted acridinyl group, a substituted or unsubstituted phenanthrolinyl group, a substituted or unsubstituted phenazinyl group, a substituted or unsubstituted benzimidazolyl group, a substituted or unsubstituted benzofuranyl group, a substituted or unsubstituted benzothiophenyl group, a substituted or unsubstituted isobenzothiazolyl group, a substituted or unsubstituted benzoxazolyl group, a substituted or unsubstituted isobenzoxazolyl group, a substituted or unsubstituted triazolyl group, a substituted or unsubstituted tetrazolyl group, a substituted or unsubstituted oxadiazolyl group, a substituted or unsubstituted triazinyl group, a substituted or unsubstituted benzocarbazolyl group, a substituted or unsubstituted dibenzocarbazolyl group, a substituted or unsubstituted thiadiazolyl group, a substituted or unsubstituted imidazopyridinyl group, a substituted or unsubstituted imidazopyrimidinyl group, a substituted or unsubstituted benzoxanthenyl group, a substituted or unsubstituted dibenzodioxinyl group, and —Si($Q_1$)($Q_2$)($Q_3$), and at least one substituent selected from a substituent(s) of the substituted phenyl group, the substituted biphenyl group, the substituted terphenyl group, the substituted pentalenyl group, the substituted indenyl group, the substituted naphthyl group, the substituted azulenyl group, the substituted heptalenyl group, the substituted indacenyl group, the substituted acenaphthyl group, the substituted fluorenyl group, the substituted spiro-fluorenyl group, the substituted benzofluorenyl group, the substituted dibenzofluorenyl group, the substituted phenalenyl group, the substituted phenanthrenyl group, the substituted anthracenyl group, the substituted fluoranthenyl group, the substituted triphenylenyl group, the substituted pyrenyl group, the substituted chrysenyl group, the substituted naphthacenyl group, the substituted picenyl group, the substituted perylenyl group, the substituted pentaphenyl group, the substituted hexacenyl group, the substituted pentacenyl group, the substituted rubicenyl group, the substituted coronenyl group, the substituted ovalenyl group, the substituted pyrrolyl group, the substituted thiophenyl group, the substituted furanyl group, the substituted imidazolyl group, the substituted pyrazolyl group, the substituted thiazolyl group, the substituted isothiazolyl group, the substituted oxazolyl group, the substituted isoxazolyl group, the substituted pyridinyl group, the substituted pyrazinyl group, the substituted pyrimidinyl group, the substituted pyridazinyl group, the substituted isoindolyl group, the substituted indolyl group, the substituted indazolyl group, the substituted purinyl group, the substituted quinolinyl group, the substituted isoquinolinyl group, the substituted benzoquinolinyl group, the substituted phthalazinyl group, the substituted naphthyridinyl group, the substituted quinoxalinyl group, the substituted quinazolinyl group, the substituted cinnolinyl group, the substituted carbazolyl group, the substituted phenanthridinyl group, the substituted acridinyl group, the substituted phenanthrolinyl group, the substituted phenazinyl group, the substituted benzimidazolyl group, the substituted benzofuranyl group, the substituted benzothiophenyl group, the substituted isobenzothiazolyl group, the substituted benzoxazolyl group, the substituted isobenzoxazolyl group, the substituted triazolyl group, the substituted tetrazolyl group, the substituted oxadiazolyl group, the substituted triazinyl group, the substituted benzocarbazolyl group, the substituted dibenzocarbazolyl group, the substituted thiadiazolyl group, the substituted imidazopyridinyl group, the substituted imidazopyrimidinyl group, the substituted benzoxanthenyl group, and the substituted dibenzodioxinyl group may be selected from:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof;

a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a carbazolyl group, a benzocarbazolyl group, a dibenzocarbazolyl group, and a dibenzofuranyl group;

a phenyl group, a biphenyl group, a terphenyl group, a naphthyl group, a pyridinyl group, a fluorenyl group, a spiro-fluorenyl group, a benzofluorenyl group, a dibenzofluorenyl group, a phenanthrenyl group, an anthracenyl group, a pyrenyl group, a chrysenyl group, a carbazolyl group, a benzocarbazolyl group, a dibenzocarbazolyl group, and a dibenzofuranyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a pyridinyl group, a carbazolyl group, and a dibenzofuranyl group; and $Si(Q_{31})(Q_{32})(Q_{33})$, wherein $Q_{31}$ to $Q_{33}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, and a carbazolyl group.

In one or more embodiments, $Ar_1$ to $Ar_8$, $Ar_{21}$, $Ar_{31}$, and $Ar_{41}$ may each independently be selected from groups represented by Formulae 5-1 to 5-80:

5-1

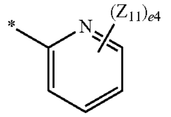

5-2

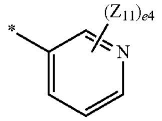

5-3

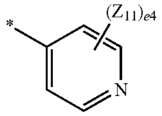

5-4

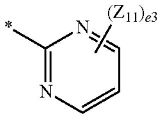

5-5

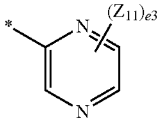

5-6

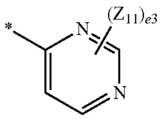

5-7

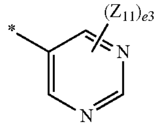

5-8

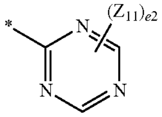

-continued 5-9

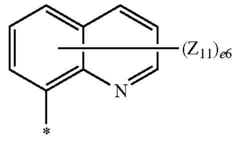

5-10

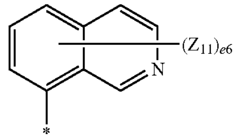

5-11

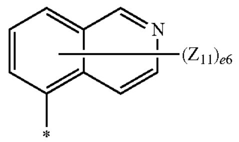

5-12

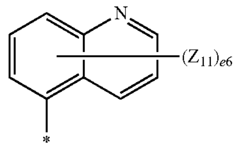

5-13

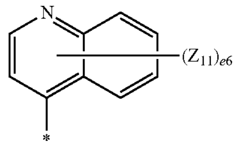

5-14

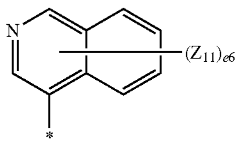

5-15

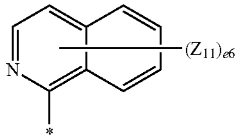

5-16

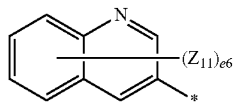

5-17

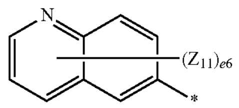

5-18

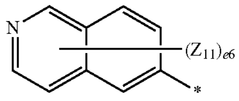

5-19

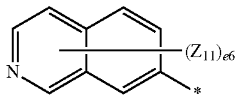

-continued
5-20
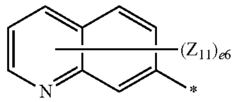
5-21
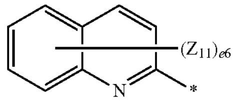
5-22
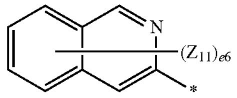
5-23
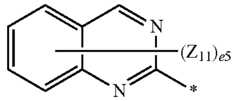
5-24
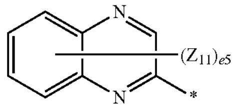
5-25
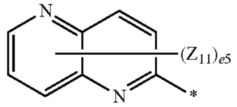
5-26
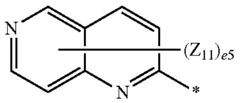
5-27
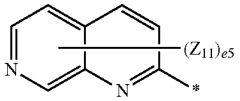
5-28
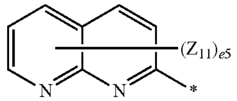
5-29
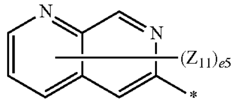
5-30
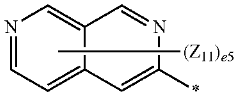
5-31
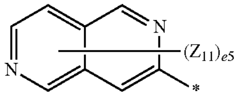
5-32
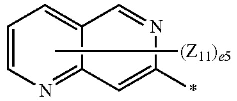
5-33
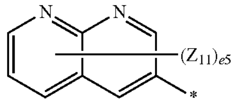
-continued
5-34
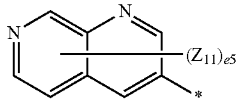
5-35
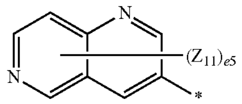
5-36
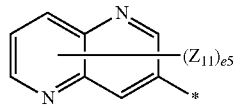
5-37
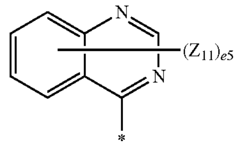
5-38
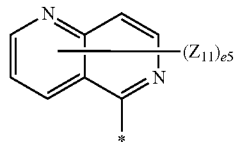
5-39
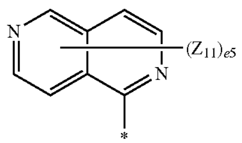
5-40
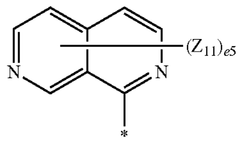
5-41
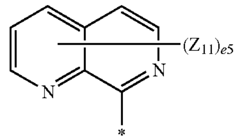
5-42
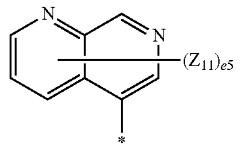
5-43
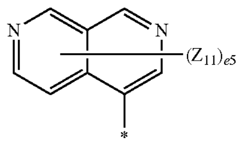
5-44
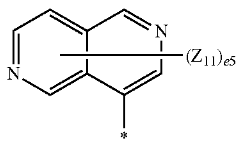

-continued
5-45
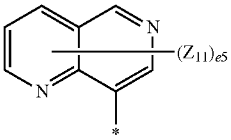
5-46
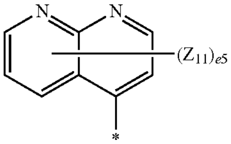
5-47
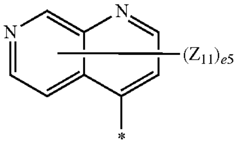
5-48
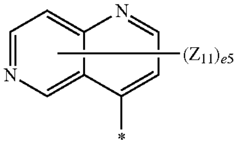
5-49
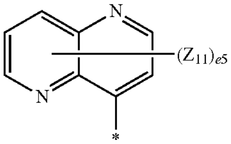
5-50
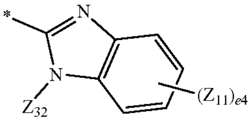
5-51
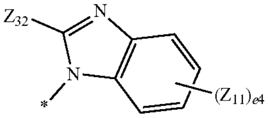
5-52
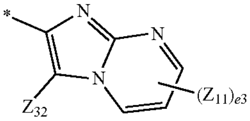
5-53
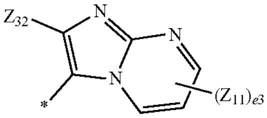
5-54
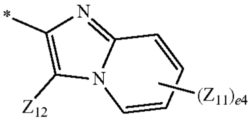
5-55
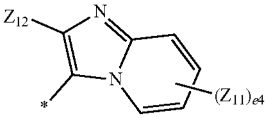
-continued
5-56
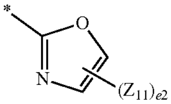
5-57
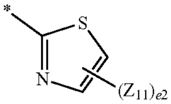
5-58
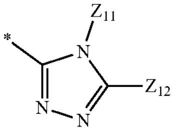
5-59
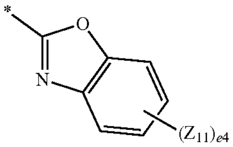
5-60
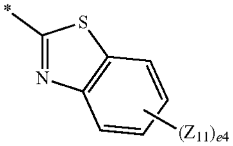
5-61
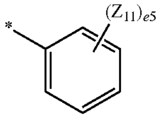
5-62
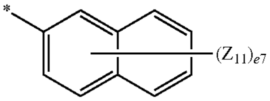
5-63
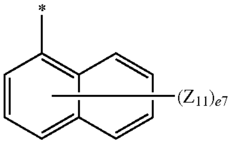
5-64
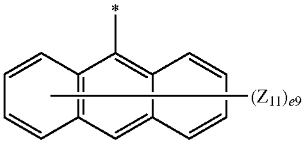
5-65
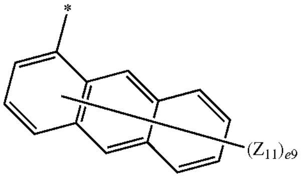
5-66
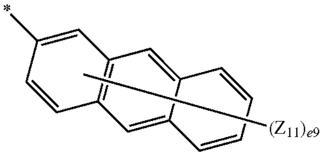

-continued 5-67

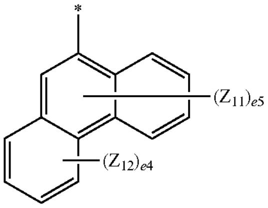

5-68

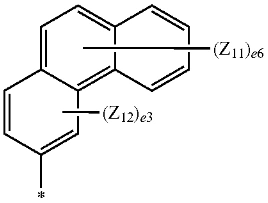

5-69

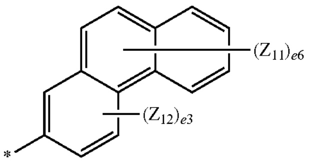

5-70

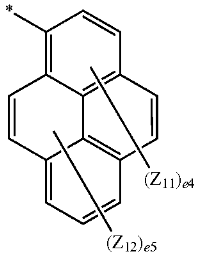

5-71

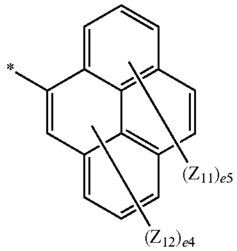

5-72

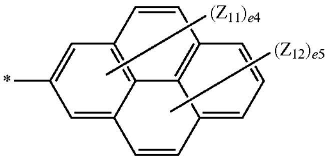

5-73

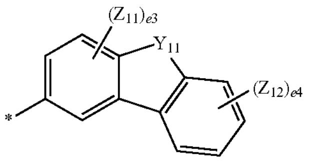

5-74

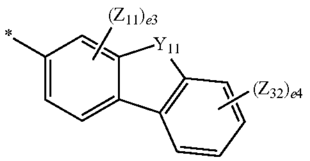

-continued 5-75

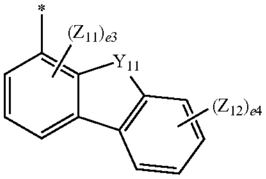

5-76

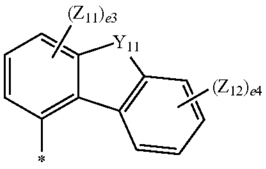

5-77

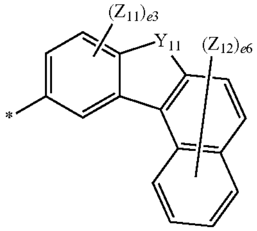

5-78

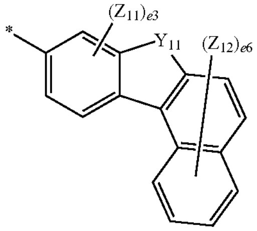

5-79

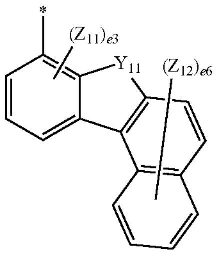

5-80

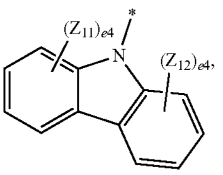

wherein, in Formulae 5-1 to 5-80, $Y_{11}$ may be O, S, $C(Z_{13})(Z_{14})$, $N(Z_{15})$, or $Si(Z_{16})(Z_{17})$, $Z_{11}$ to $Z_{17}$ may each independently be selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof;

a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a carbazolyl group, a benzocarbazolyl group, and a dibenzocarbazolyl group;

a phenyl group, a biphenyl group, a terphenyl group, a naphthyl group, a pyridinyl group, a fluorenyl group, a spiro-fluorenyl group, a benzofluorenyl group, a dibenzofluorenyl group, a phenanthrenyl group, an anthracenyl group, a pyrenyl group, a chrysenyl group, a carbazolyl group, a benzocarbazolyl group, and a dibenzocarbazolyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, and a pyridinyl group; and $Si(Q_{31})(Q_{32})(Q_{33})$, $Z_{13}$ and $Z_{14}$ may optionally be linked to form a saturated or unsaturated ring, $Q_{33}$ to $Q_{35}$ may each independently be selected from a $C_1$-$C_{10}$ alkyl group, a $C_1$-$C_{10}$ alkoxy group, a phenyl group, a biphenyl group, a terphenyl group, and a naphthyl group, e2 may be 1 or 2, e3 may be an integer from 1 to 3, e4 may be an integer from 1 to 4, e5 may be an integer from 1 to 5, e6 may be an integer from 1 to 6, e7 may be an integer from 1 to 7, e8 may be an integer from 1 to 8, e9 may be an integer from 1 to 9, and

* indicates a binding site to a neighboring atom.

In one or more embodiments, $Ar_1$ to $Ar_8$, $Ar_{21}$, $Ar_{31}$, and $Ar_{41}$ may each independently be selected from groups represented by Formulae 6-1 to 6-167:

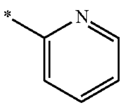
6-1

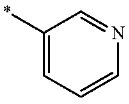
6-2

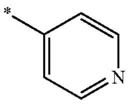
6-3

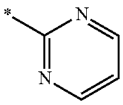
6-4

-continued

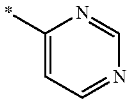
6-5

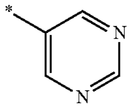
6-6

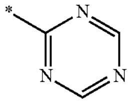
6-7

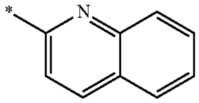
6-8

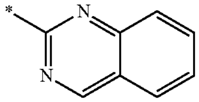
6-9

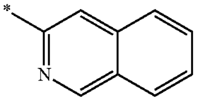
6-10

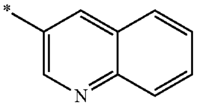
6-11

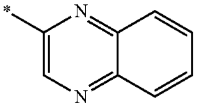
6-12

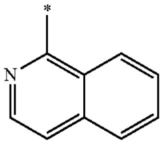
6-13

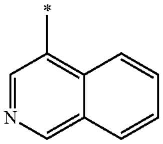
6-14

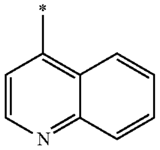
6-15

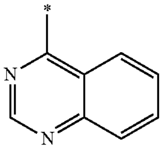
6-16

-continued
6-17
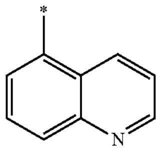
6-18
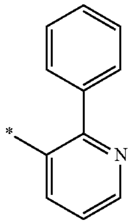
6-19
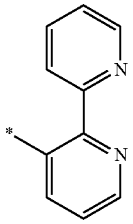
6-20
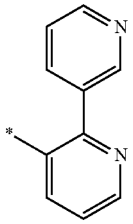
6-21
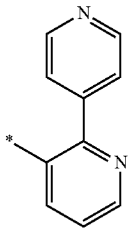
6-22
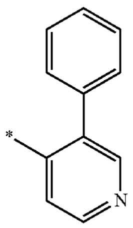
6-23
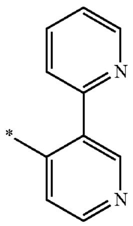
-continued
6-24
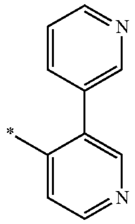
6-25
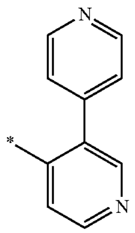
6-26
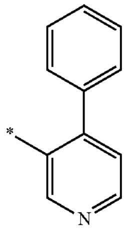
6-27
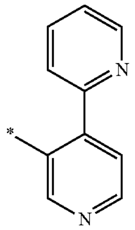
6-28
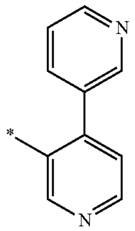
6-29
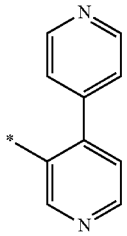

-continued
6-30
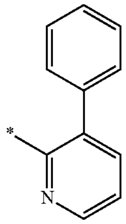
6-31
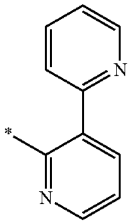
6-32
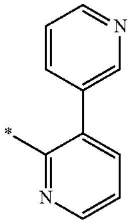
6-33
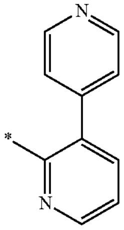
6-34
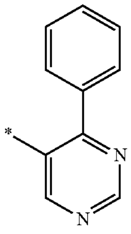
6-35
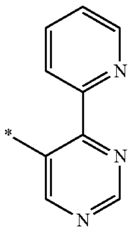
-continued
6-36
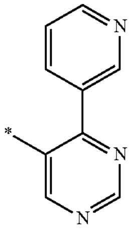
6-37
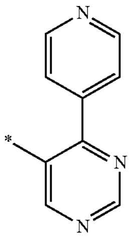
6-38
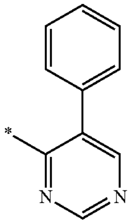
6-39
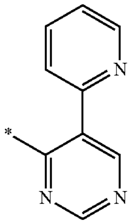
6-40
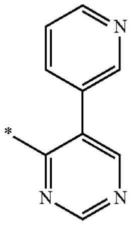
6-41
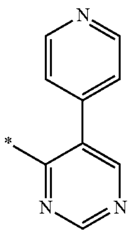
6-42
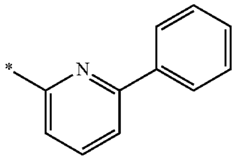

-continued
6-43
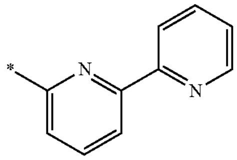
6-44
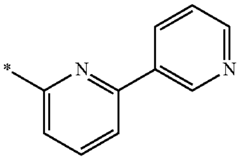
6-45
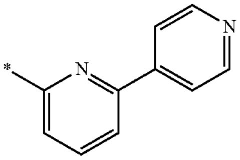
6-46
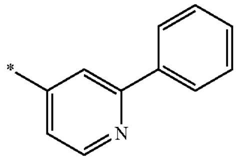
6-47
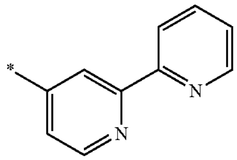
6-48
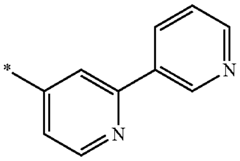
6-49
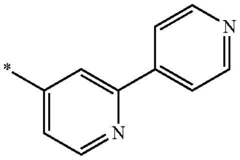
6-50
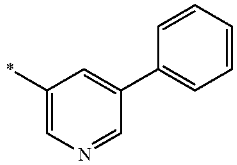
6-51
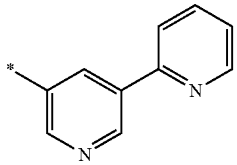
-continued
6-52
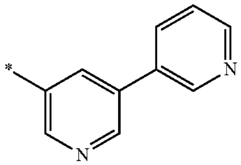
6-53
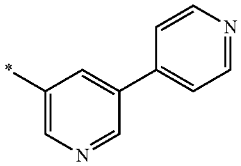
6-54
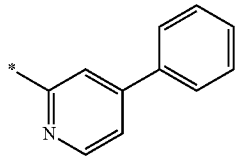
6-55
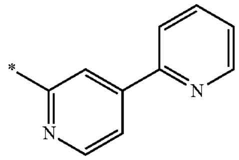
6-56
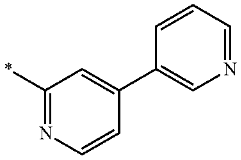
6-57
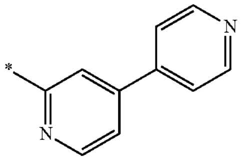
6-58
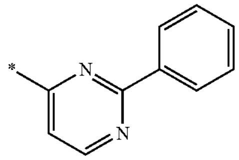
6-59
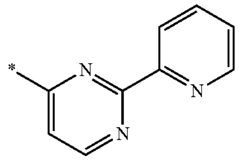
6-60
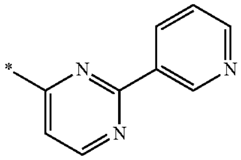

-continued
6-61
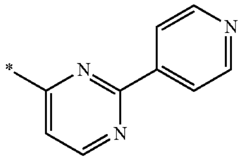
6-62
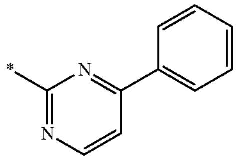
6-63
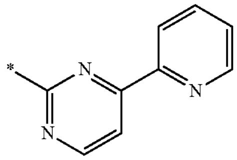
6-64
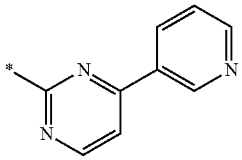
6-65
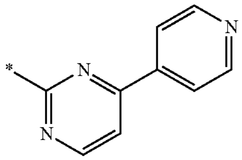
6-66
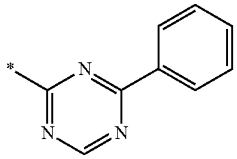
6-67
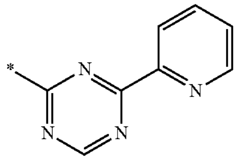
6-68
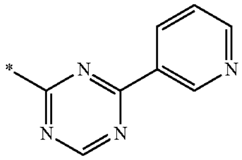
6-69
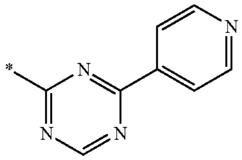
-continued
6-70
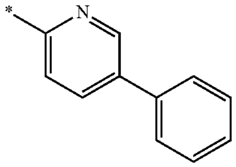
6-71
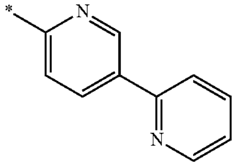
6-72
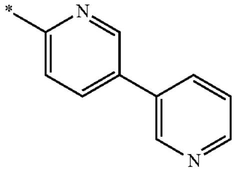
6-73
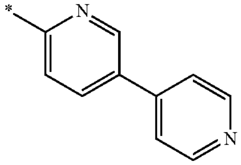
6-74
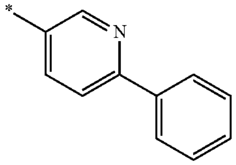
6-75
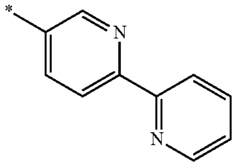
6-76
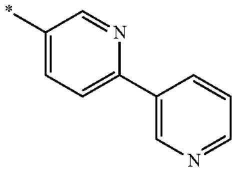
6-77
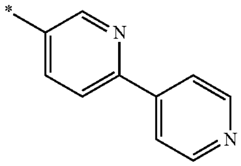
6-78
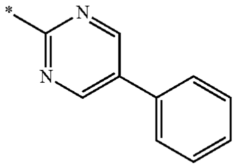

6-79
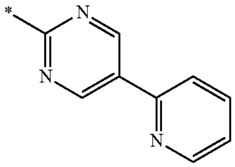
6-80
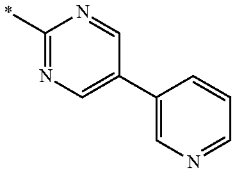
6-81
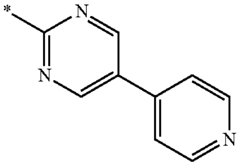
6-82
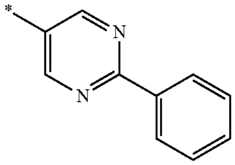
6-83
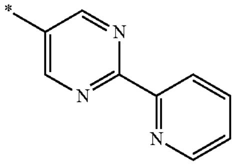
6-84
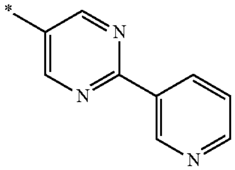
6-85
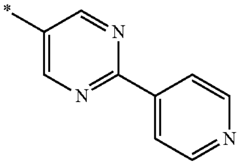
6-86
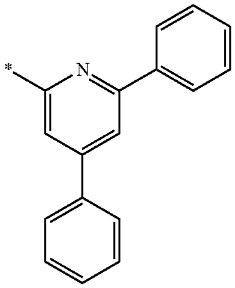
6-87
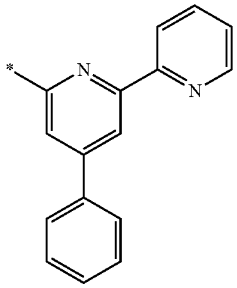
6-88
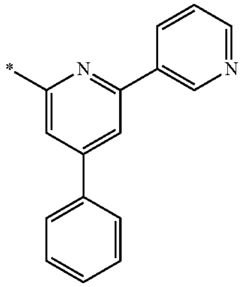
6-89
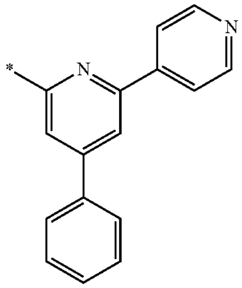
6-90
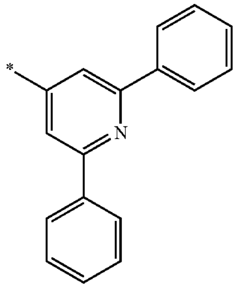
6-91
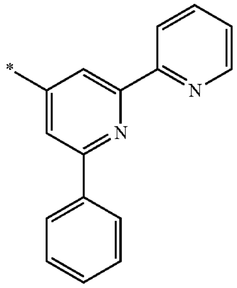

-continued
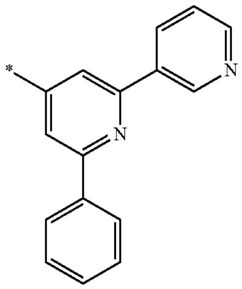
6-92
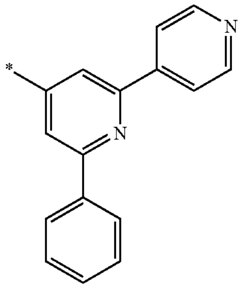
6-93
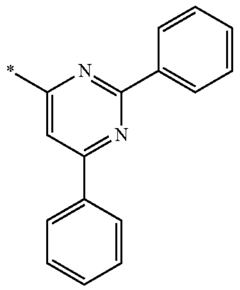
6-94
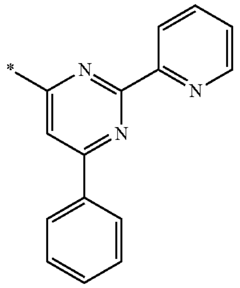
6-95
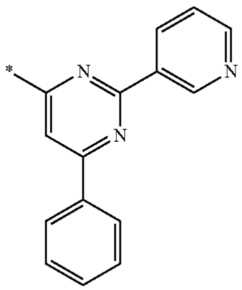
6-96
-continued
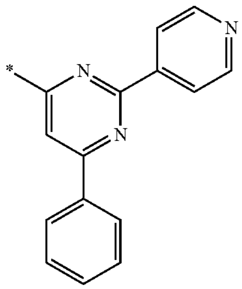
6-97
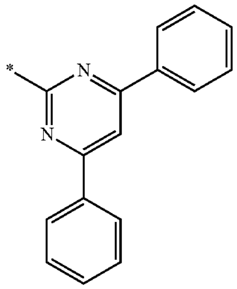
6-98
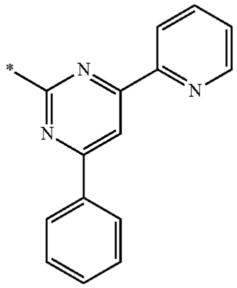
6-99
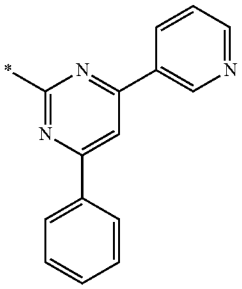
6-100
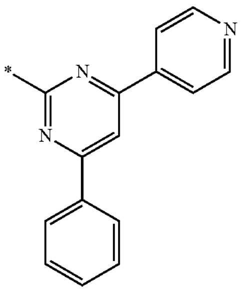
6-101

-continued
6-102
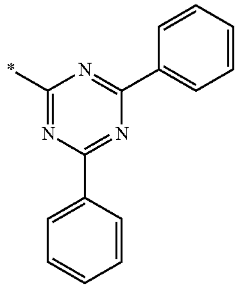
6-103
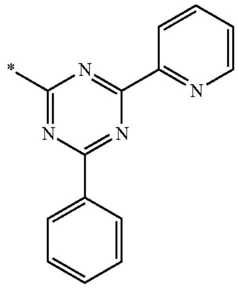
6-104
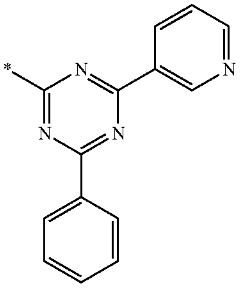
6-105
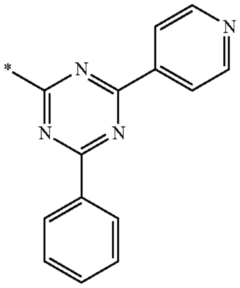
6-106
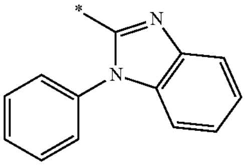
6-107
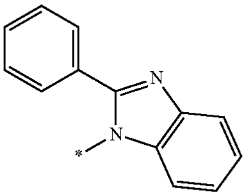
-continued
6-108
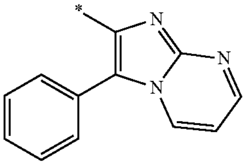
6-109
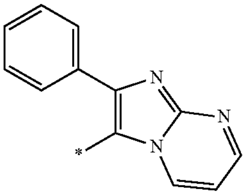
6-110
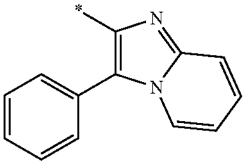
6-111
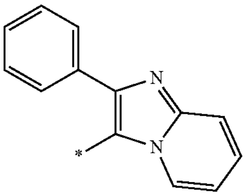
6-112
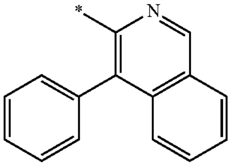
6-113
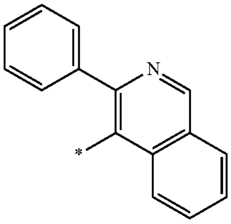
6-114
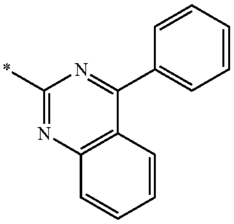
6-115
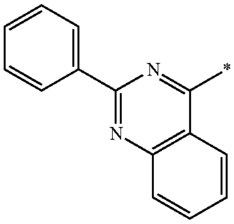

-continued
6-116
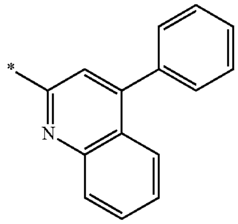
6-117
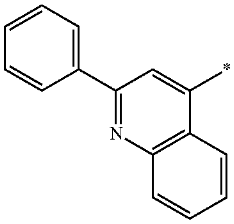
6-118
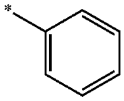
6-119
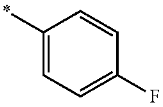
6-120
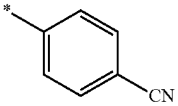
6-121
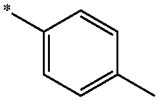
6-122
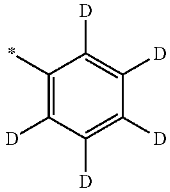
6-123
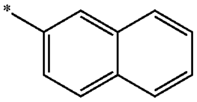
6-124
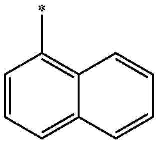
6-125
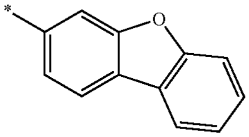
-continued
6-126
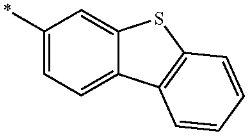
6-127
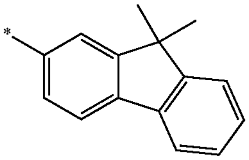
6-128
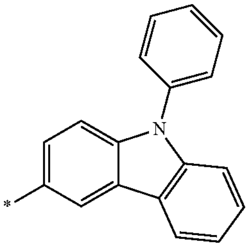
6-129
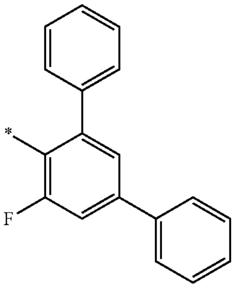
6-130
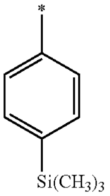
6-131
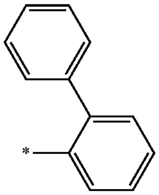
6-132
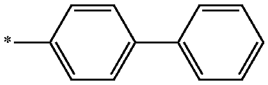
6-133
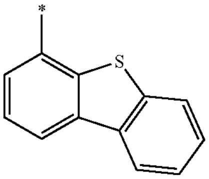

-continued
6-134
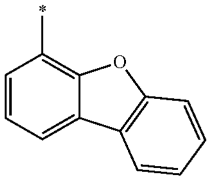
6-135
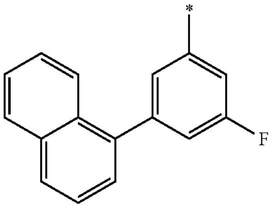
6-136
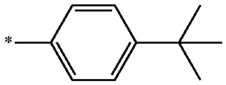
6-137
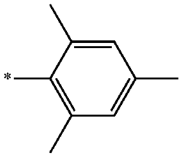
6-138
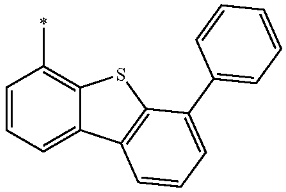
6-139
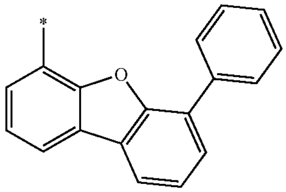
6-140
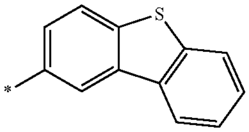
6-141
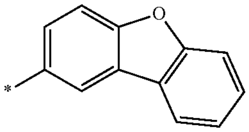
6-142
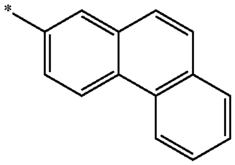
-continued
6-143
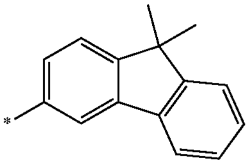
6-144
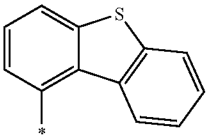
6-145
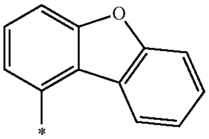
6-146
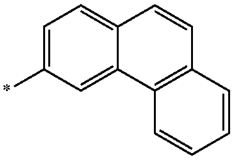
6-147
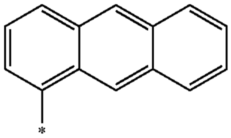
6-148
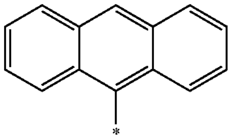
6-149
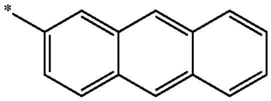
6-150
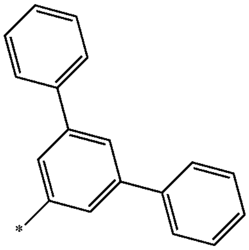
6-151
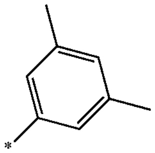

-continued
6-152
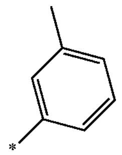
6-153
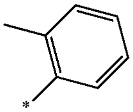
6-154
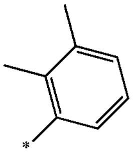
6-155
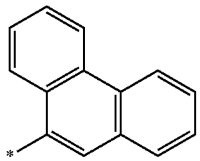
6-156
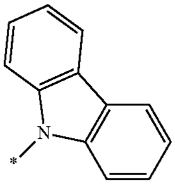
6-157
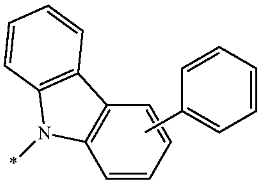
6-158
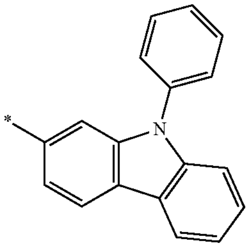
6-159
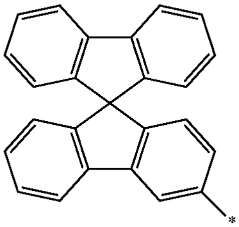
-continued
6-160
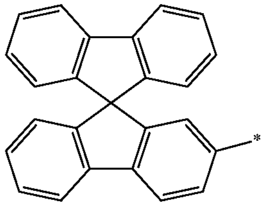
6-161
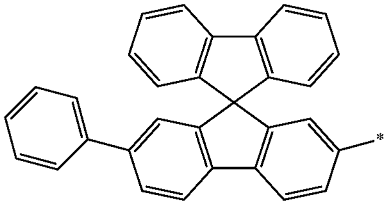
6-162
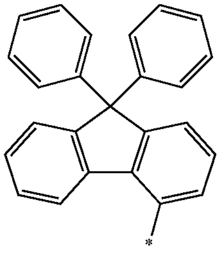
6-163
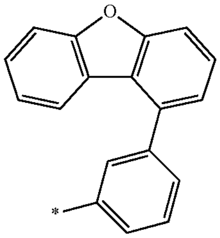
6-164
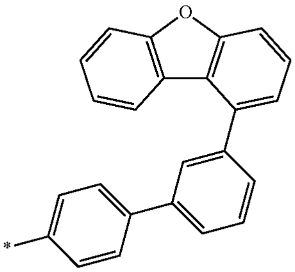
6-165
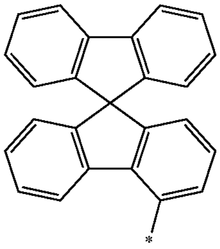

-continued 6-166

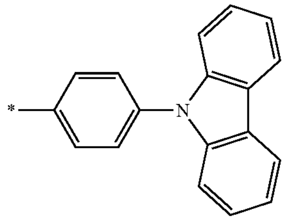

6-167

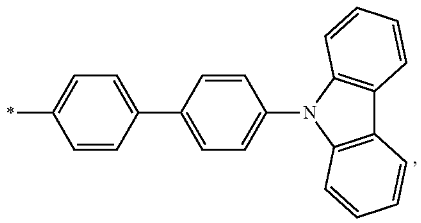

wherein * in Formulae 6-1 to 6-167 indicates a binding site to a neighboring atom.

b1 to b8, b21, b31, and b41 in Formulae 1A, 1B, and 2A to 2C may each independently be an integer from 1 to 5. b1 indicates the number of $Ar_1$ (s), wherein when b1 is two or more, two or more $Ar_1$(*s*) may be identical to or different from each other. b2 to b8, b21, b31, and b41 may be understood by referring to the descriptions provided in connection with b1 and the structures of Formulae 1A, 1B, and 2A to 2C.

In one or more embodiments, b1 to b8, b21, b31, and b41 may each independently be 1 or 2, but are not limited thereto.

In Formulae 1A and 1B, $Ar_1$ and $Ar_2$ may optionally be linked to form a saturated or unsaturated ring, $Ar_3$ and $Ar_4$ may optionally be linked to form a saturated or unsaturated ring, $Ar_8$ and Are may optionally be linked to form a saturated or unsaturated ring, and $Ar_7$ and $Ar_8$ may optionally be linked to form a saturated or unsaturated ring.

In one or more embodiments, at least one selected from

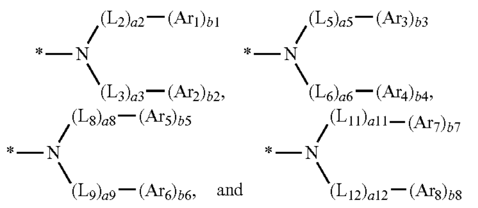

in Formulae 1A and 1B may be selected from groups represented by Formula 9-1 or 9-2:

9-1

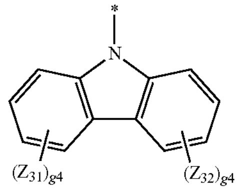

-continued 9-2

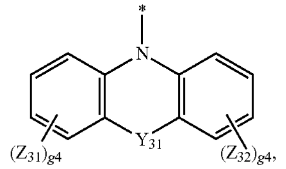

wherein, in Formulae 9-1 and 9-2, $Y_{31}$ may be selected from O, S, $C(Z_{33})(Z_{34})$, $N(Z_{35})$, and $Si(Z_{36})(Z_{37})$, $Z_{31}$ to $Z_{37}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, and $—Si(Q_{31})(Q_{32})(Q_{33})$, wherein $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group, g4 may be an integer from 0 to 4, and

* indicates a binding site to a neighboring atom.

In Formulae 1A and 1B, n1 to n4, n7, and n8 may each independently be an integer from 0 to 4, and n5 and n6 may each independently be an integer from 0 to 5, provided that the sum of n1, n2, n3, and n4 is one or more and the sum of n5, n6, n7, and n8 is one or more. n1 indicates the number of (S)

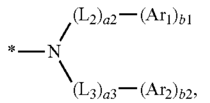

wherein when n1 is two or more, two or more (S)

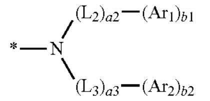

may be identical to or different from each other.

In one or more embodiments, n1 to n4, n7, and n8 may each independently be 0 or 1, and n5 and n6 may each independently be 0 or 1.

In Formulae 2A to 2C, $A_{21}$, $A_{31}$, $A_{32}$, $A_{41}$, and $A_{42}$ may each be a group represented by Formula 10, and $m_{21}$, $m_{31}$, $m_{32}$, $m_{41}$, and $m_{42}$ may each independently be an integer from 1 to 3. $m_{21}$ indicates the number of $A_{21}$(*s*), wherein when $m_1$ is two or more, two or more $A_{21}(s)$ may be identical to or different from each other.

In Formulae 2A to 2C, n21 may be an integer from 1 to 3, n31 and n32 may each independently be an integer from 0 to 3, provided that n31+n32 is one or more, and n41 and n42 may each independently be an integer from 0 to 3, provided that n41+n42 is one or more.

n21 in Formula 2A indicates the number of $*-[(L_{22})_{a22}-(A_{21})_{m21}](s)$, wherein, when n21 is two or more, two or more $*-[(L_{22})_{a22}-(A_{21})_{m21}](s)$ may be identical to or different from each other. n31, n32, n41, and n42 may be understood by referring to the descriptions provided in connection with n21 and the structures of Formulae 2A to 2C.

In one or more embodiments, n21 may be 1 or 2, n31 and n32 may each independently be 0 or 1, and n41 and n42 may each independently be 0 or 1.

In Formula 10, $X_1$ may be O or S, and $X_2$ may be selected from a single bond, O, and S. In one or more embodiments, $X_1$ may be O or S, and $X_2$ may be a single bond.

Ring $B_1$ and ring $B_2$ in Formula 10 may each independently be selected from benzene and naphthalene.

In one or more embodiments, the group represented by Formula 10 may be represented by one selected from Formulae 10A to 10P:

10A

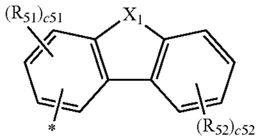

10B

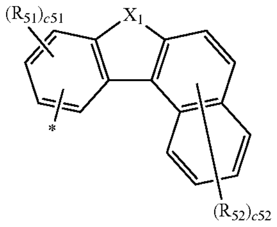

10C

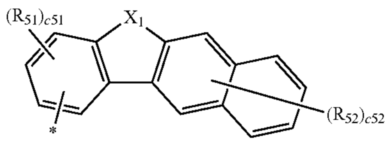

10D

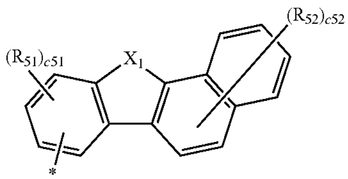

10E

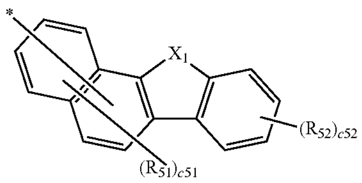

-continued

10F

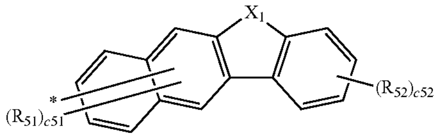

10G

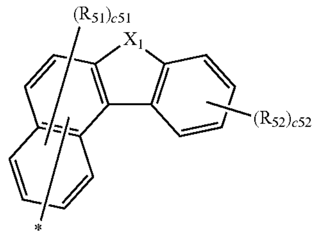

10H

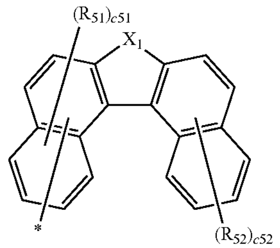

10I

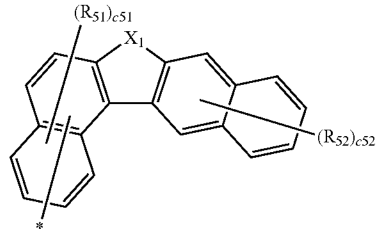

10J

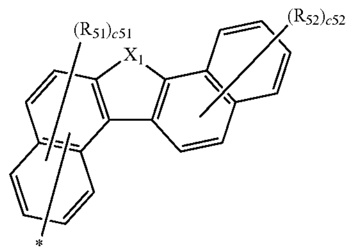

10K

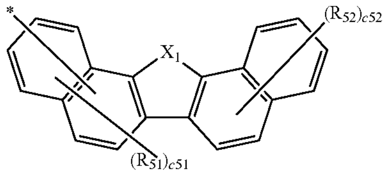

10L

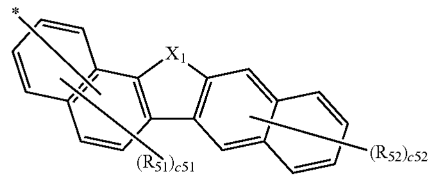

-continued

10M

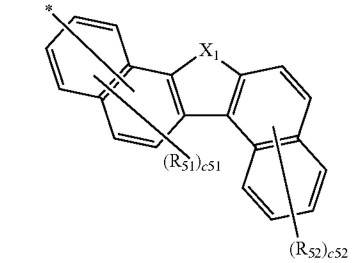

10N

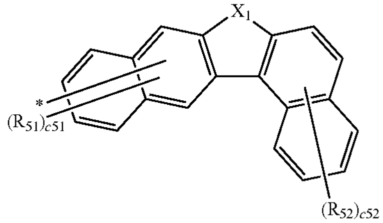

10O

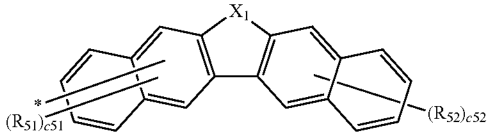

10P

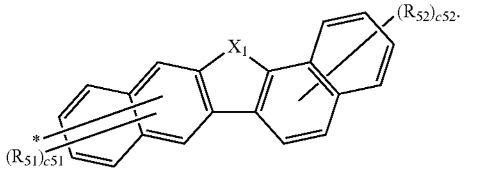

In Formulae 10A to 10P, $X_1$, $R_{51}$, $R_{52}$, c51, and c52 are the same as described above, and * indicates a binding site to a neighboring atom.

$R_1$ to $R_8$, $R_{21}$, $R_{31}$, $R_{32}$, $R_{41}$, $R_{42}$, $R_{51}$, and $R_{52}$ in Formulae 1A, 1B, 2A to 2C, and 10 may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, and —$Si(Q_1)(Q_2)(Q_3)$.

For example, $R_1$ to $R_8$, $R_{21}$, $R_{31}$, $R_{32}$, $R_{41}$, $R_{42}$, $R_{51}$, and $R_{52}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{20}$ alkyl group, a substituted or unsubstituted $C_1$-$C_{20}$ alkoxy group, a substituted or unsubstituted $C_6$-$C_{20}$ aryl group, a substituted or unsubstituted $C_1$-$C_{20}$ heteroaryl group, a substituted or unsubstituted monovalent non-aromatic condensed polycyclic group, a substituted or unsubstituted monovalent non-aromatic condensed heteropolycyclic group, and —$Si(Q_1)(Q_2)(Q_3)$.

In one or more embodiments, $R_1$ to $R_8$, $R_{21}$, $R_{31}$, $R_{32}$, $R_{41}$, $R_{42}$, $R_{51}$, and $R_{52}$ may each independently be selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof;

a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a dibenzosilolyl group, a thiadiazolyl group, an imidazopyridinyl group, and an imidazopyrimidinyl group;

a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a dibenzosilolyl group, a thiadiazolyl group, an imidazopyridinyl group, and an imidazopyrimidinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, an imidazopyridinyl group, an imidazopyrimidinyl group, and —$Si(Q_{33})(Q_{34})(Q_{35})$; and —$Si(Q_3)(Q_4)(Q_5)$, wherein $Q_3$ to $Q_5$ and $Q_{33}$ to $Q_{35}$ may each independently be selected from a $C_1$-$C_{10}$ alkyl group, a $C_1$-$C_{10}$ alkoxy group, a phenyl group, a biphenyl group, a terphenyl group, and a naphthyl group.

In one or more embodiments, $R_1$ to $R_8$, $R_{21}$, $R_{31}$, $R_{32}$, $R_{41}$, $R_{42}$, $R_{51}$, and $R_{52}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, groups represented by Formulae 7-1 to 7-76, and —$Si(Q_3)(Q_4)(Q_5)$, wherein $Q_3$ to $Q_5$ may each independently be selected from a $C_1$-$C_{10}$ alkyl group, a $C_1$-$C_{10}$ alkoxy group, a phenyl group, a biphenyl group, a terphenyl group, and a naphthyl group:

7-1

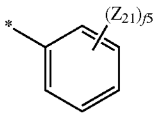

7-2

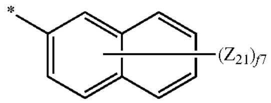

7-3

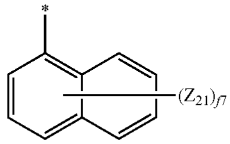

7-4

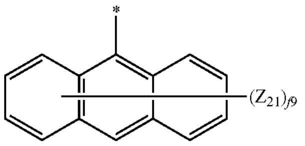

7-5

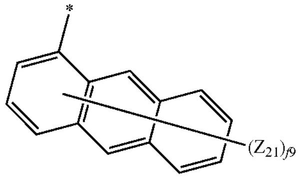

7-6

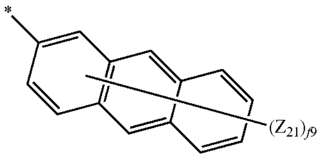

7-7

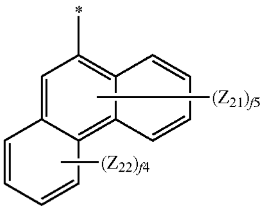

-continued
7-8
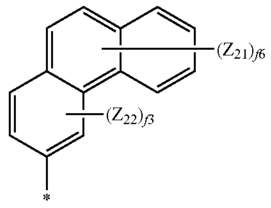
7-9
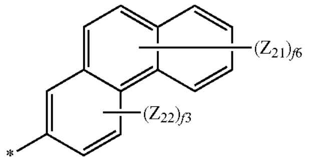
7-10
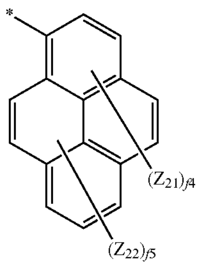
7-11
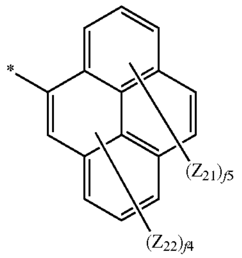
7-12
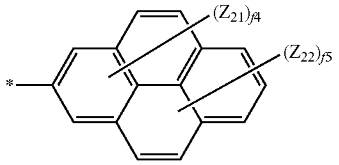
7-13
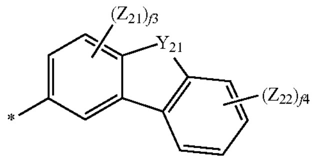
7-14
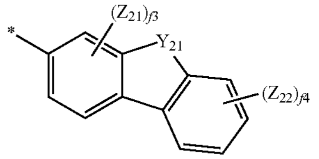
7-15
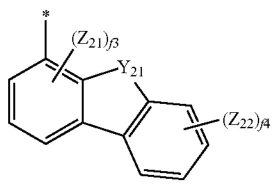
-continued
7-16
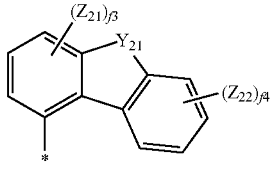
7-17
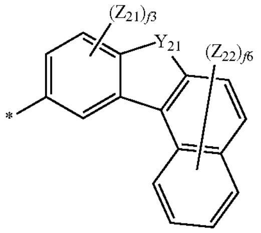
7-18
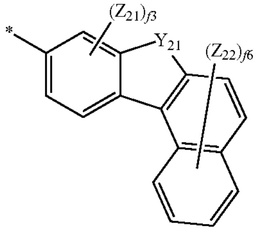
7-19
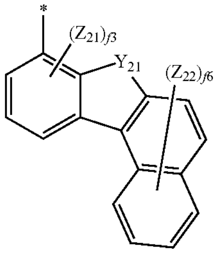
7-20
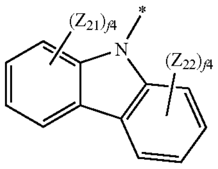
7-21
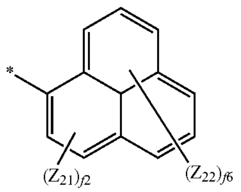
7-22
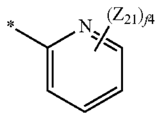
7-23
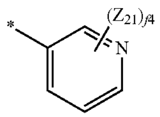

-continued
7-24
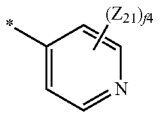
7-25
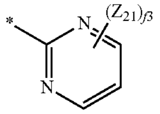
7-26
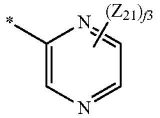
7-27
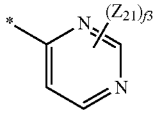
7-28
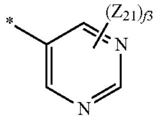
7-29
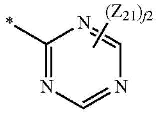
7-30
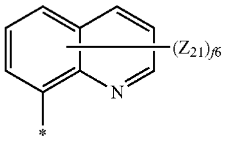
7-31
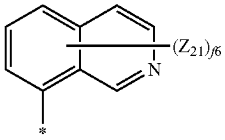
7-32
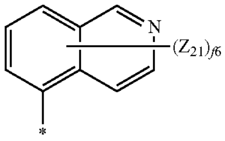
7-33
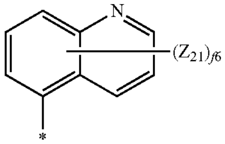
7-34
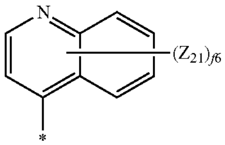
-continued
7-35
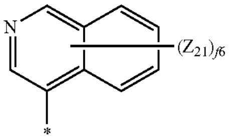
7-36
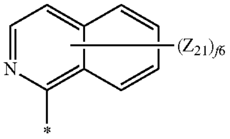
7-37
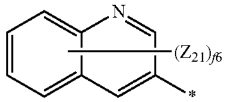
7-38
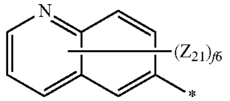
7-39
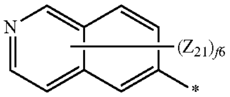
7-40
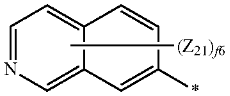
7-41
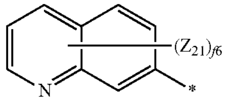
7-42
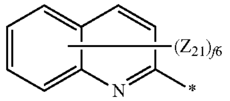
7-43
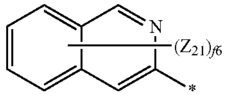
7-44
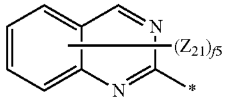
7-45
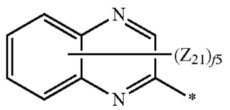
7-46
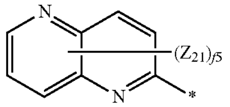
7-47
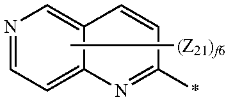

-continued
7-48
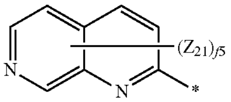
7-49
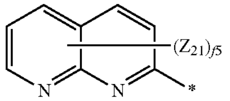
7-50
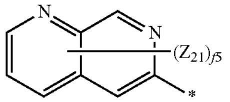
7-51
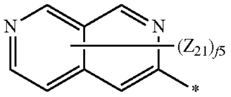
7-52
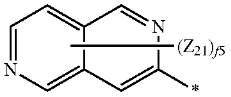
7-53
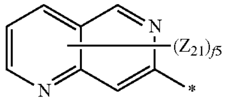
7-54
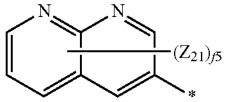
7-55
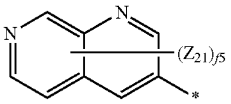
7-56
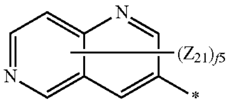
7-57
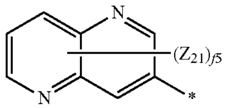
7-58
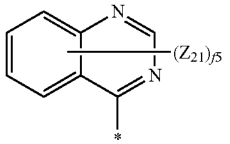
7-59
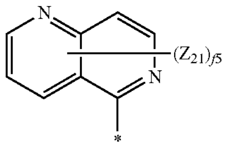
7-60
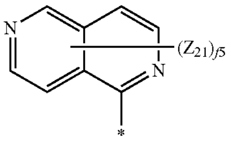
-continued
7-61
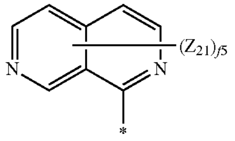
7-62
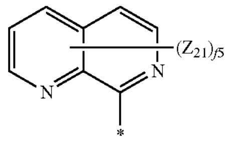
7-63
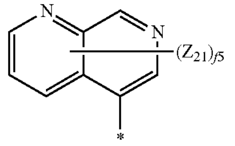
7-64
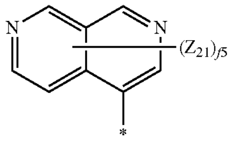
7-65
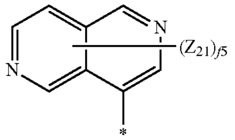
7-66
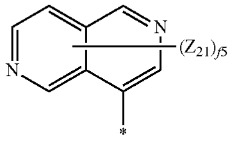
7-67
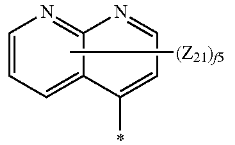
7-68
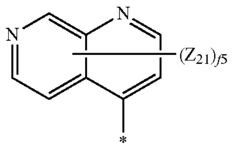
7-69
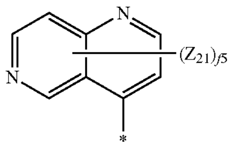
7-70
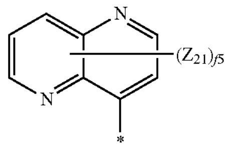

-continued 7-71

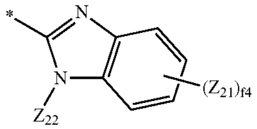

7-72

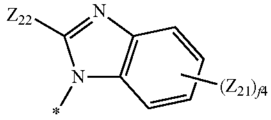

7-73

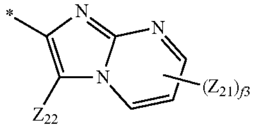

7-74

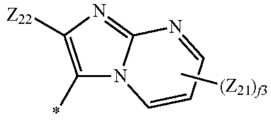

7-75

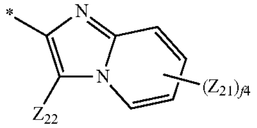

7-76

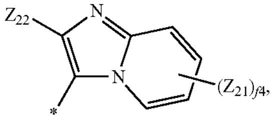

wherein, in Formulae 7-1 to 7-76, $Y_{21}$ may be O, S, $C(Z_{23})(Z_{24})$, $N(Z_{25})$, or $Si(Z_{26})(Z_{27})$, $Z_{21}$ to $Z_{27}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a biphenyl group, a terphenyl group, and $—Si(Q_{13})(Q_{14})(Q_{15})$, $Z_{23}$ and $Z_{24}$ may optionally be linked to form a saturated or unsaturated ring, $Q_{13}$ to $Q_{15}$ may each independently be selected from a $C_1$-$C_{10}$ alkyl group, a $C_1$-$C_{10}$ alkoxy group, a phenyl group, a biphenyl group, a terphenyl group, and a naphthyl group, f2 may be 1 or 2, f3 may be an integer from 1 to 3, f4 may be an integer from 1 to 4, f5 may be an integer from 1 to 5, f6 may be an integer from 1 to 6, f7 may be an integer from 1 to 7, f8 may be an integer from 1 to 8, f9 may be an integer from 1 to 9, and

* indicates a binding site to a neighboring atom.

In one or more embodiments, $R_1$ to R& may each independently be selected from groups represented by Formulae 8-1 to 8-161, and $R_{21}$, $R_{31}$, $R_{32}$, $R_{41}$, $R_{42}$, $R_{51}$, and $R_{52}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, a phenyl group, a biphenyl group, a terphenyl group, a naphthyl group, and $—Si(Q_3)(Q_4)(Q_5)$, wherein $Q_3$ to $Q_5$ may each independently be selected from a $C_1$-$C_{10}$ alkyl group, a $C_1$-$C_{10}$ alkoxy group, a phenyl group, a biphenyl group, a terphenyl group, and a naphthyl group:

8-1

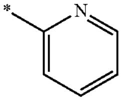

8-2

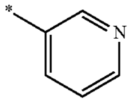

8-3

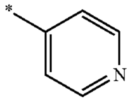

8-4

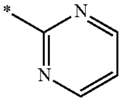

8-5

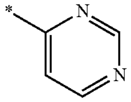

8-6

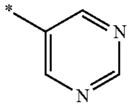

8-7

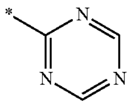

8-8

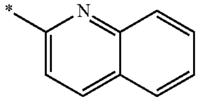

8-9

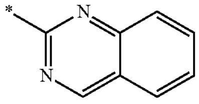

8-10

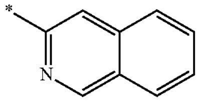

-continued
8-11
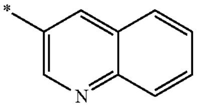
8-12
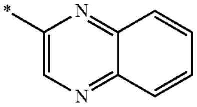
8-13
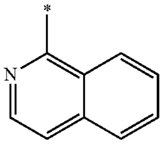
8-14
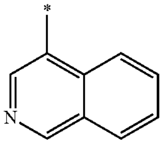
8-15
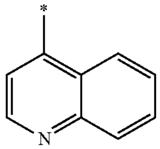
8-16
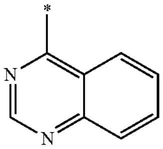
8-17
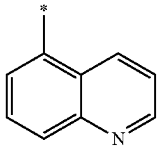
8-18
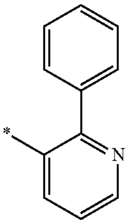
8-19
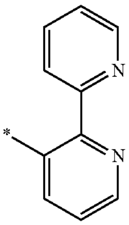
-continued
8-20
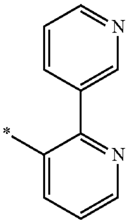
8-21
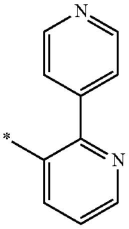
8-22
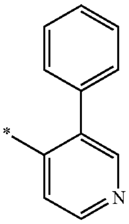
8-23
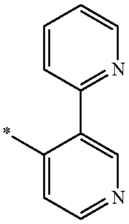
8-24
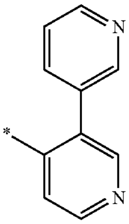
8-25
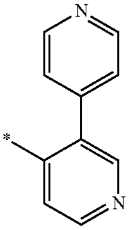
8-26
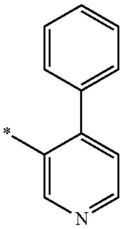

-continued
8-27
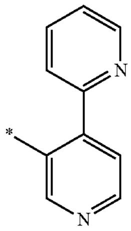
8-28
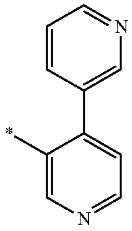
8-29
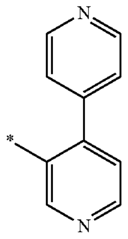
8-30
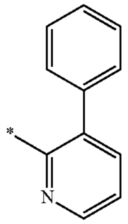
8-31
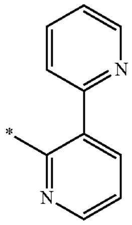
8-32
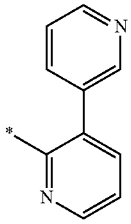
-continued
8-33
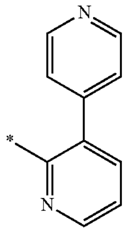
8-34
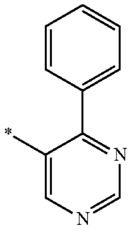
8-35
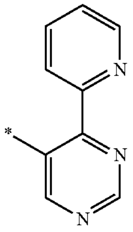
8-36
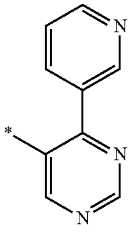
8-37
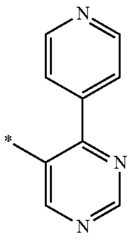
8-38
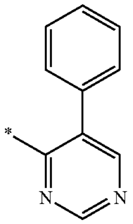

-continued
8-39
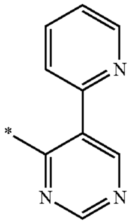
8-40
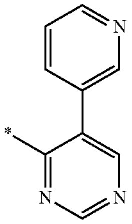
8-41
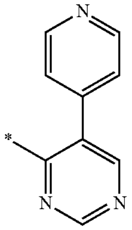
8-42
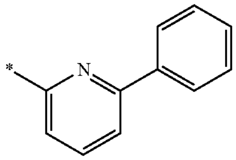
8-43
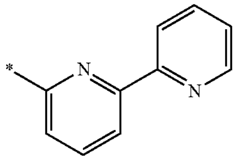
8-44
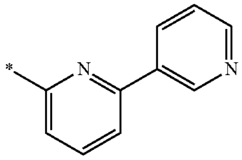
8-45
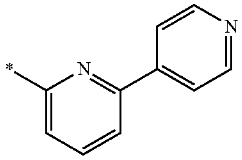
8-46
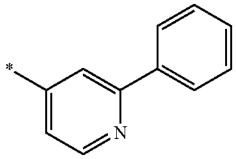
-continued
8-47
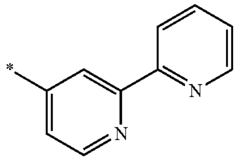
8-48
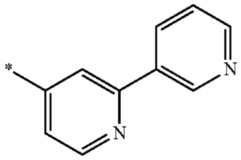
8-49
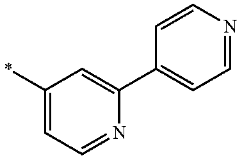
8-50
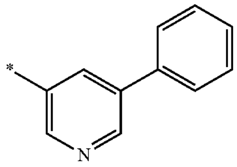
8-51
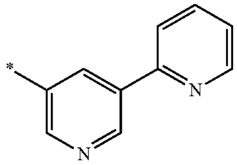
8-52
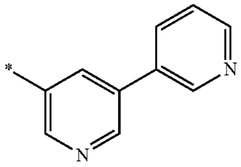
8-53
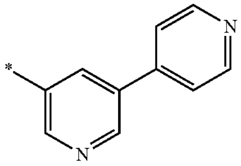
8-54
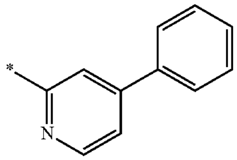
8-55
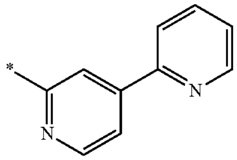

-continued
8-56
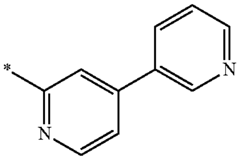
8-57
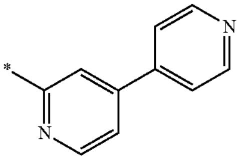
8-58
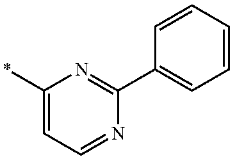
8-59
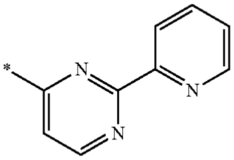
8-60
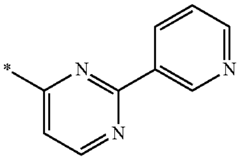
8-61
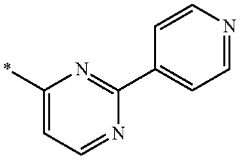
8-62
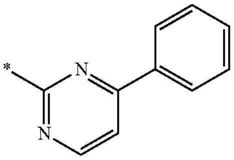
8-63
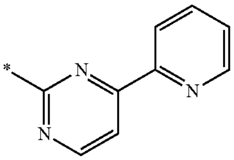
8-64
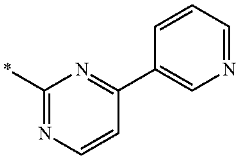
-continued
8-65
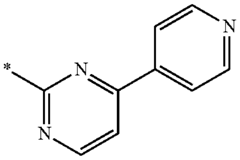
8-66
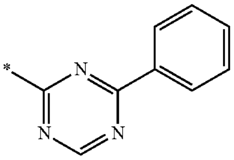
8-67
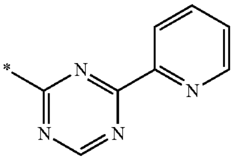
8-68
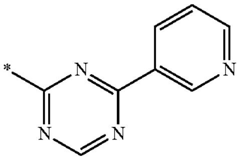
8-69
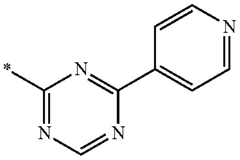
8-70
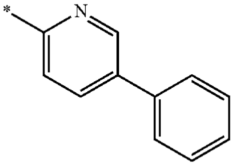
8-71
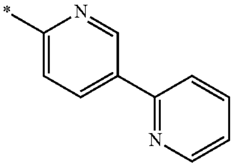
8-72
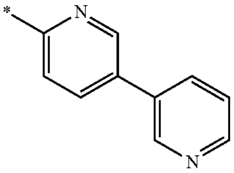
8-73
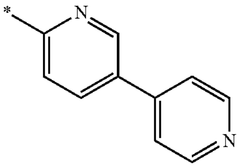

-continued
8-74
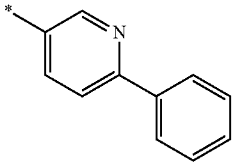
8-75
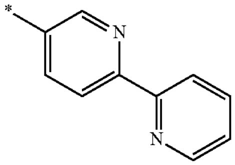
8-76
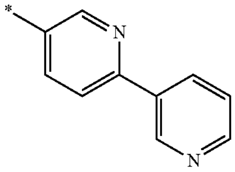
8-77
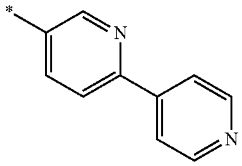
8-78
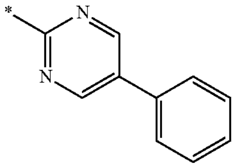
8-79
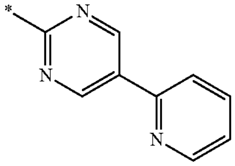
8-80
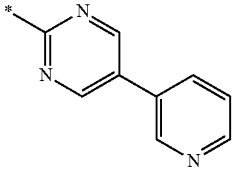
8-81
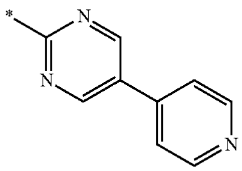
8-82
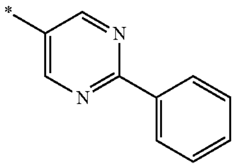
-continued
8-83
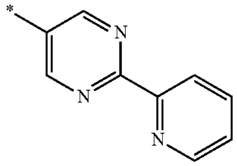
8-84
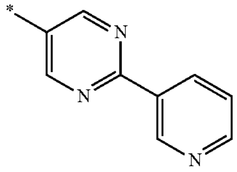
8-85
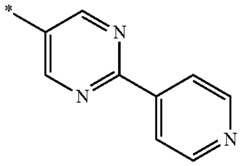
8-86
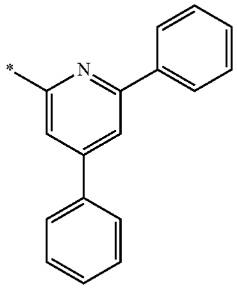
8-87
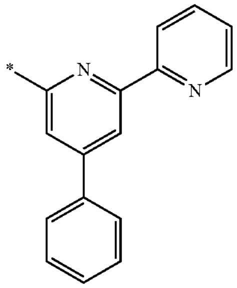
8-88
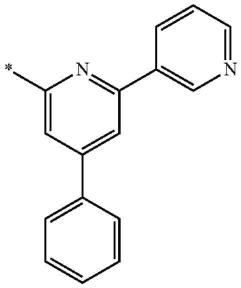

-continued
8-89
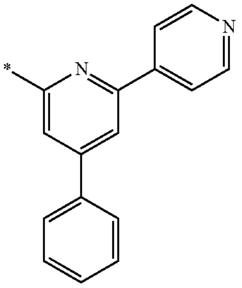
8-90
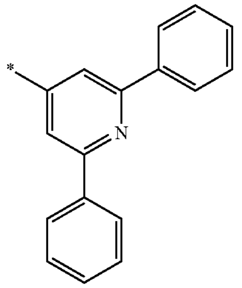
8-91
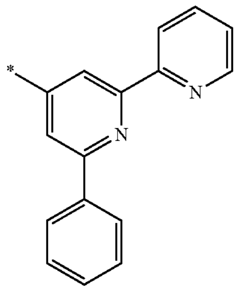
8-92
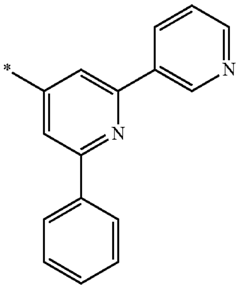
8-93
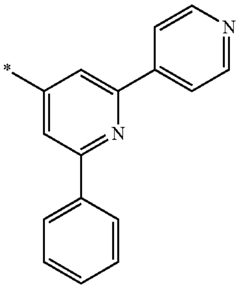
-continued
8-94
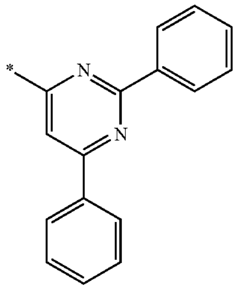
8-95
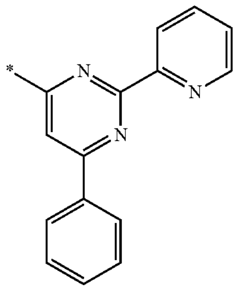
8-96
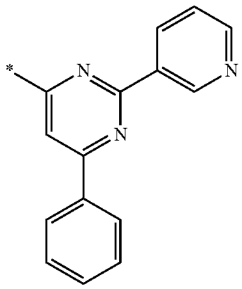
8-97
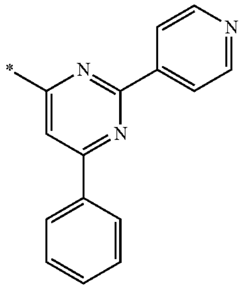
8-98
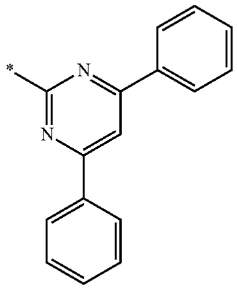

-continued
8-99
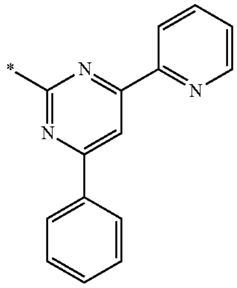
8-100
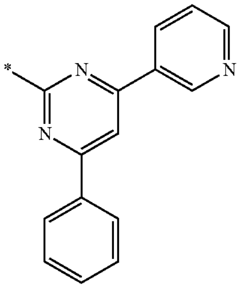
8-101
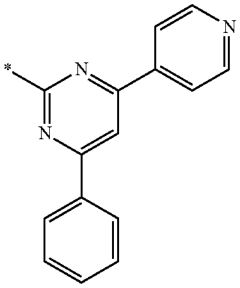
8-102
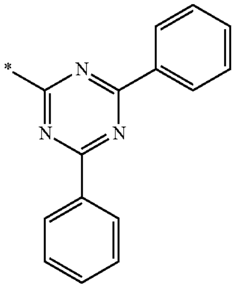
8-103
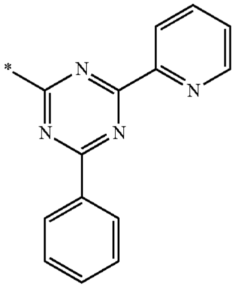
-continued
8-104
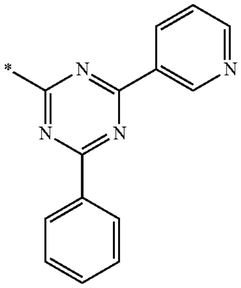
8-105
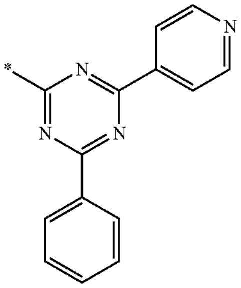
8-106
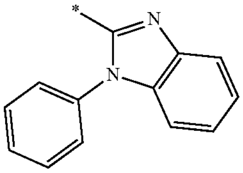
8-107
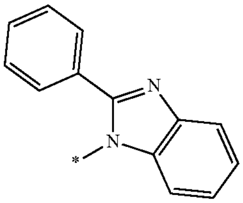
8-108
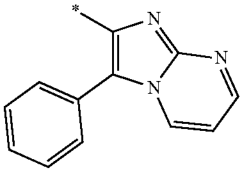
8-109
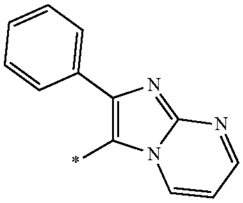
8-110
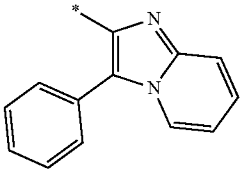

-continued
8-111
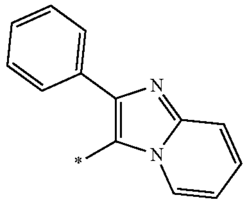
8-112
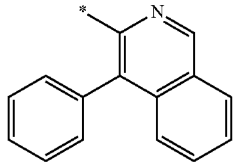
8-113
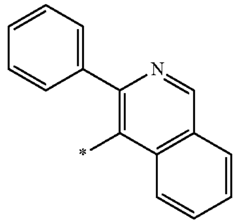
8-114
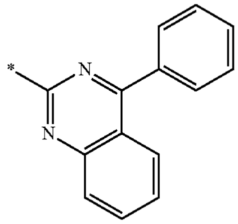
8-115
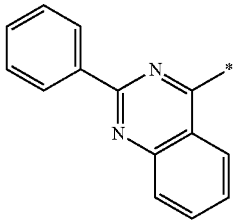
8-116
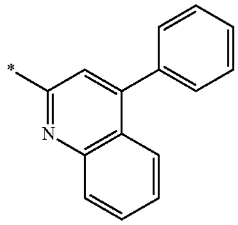
8-117
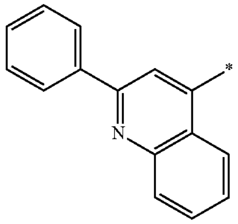
-continued
8-118
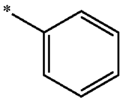
8-119
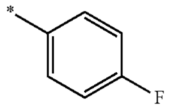
8-120
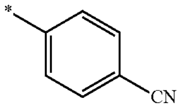
8-121
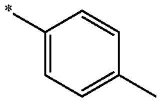
8-122
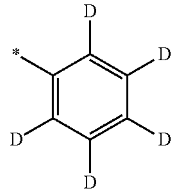
8-123
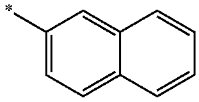
8-124
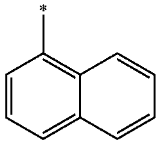
8-125
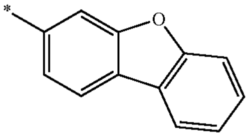
8-126
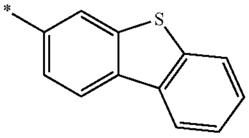
8-127
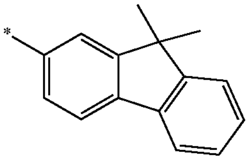

-continued
8-128
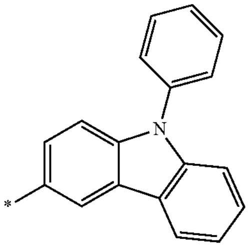
8-129
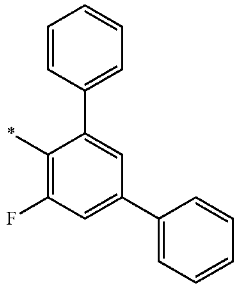
8-130
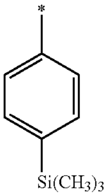
8-131
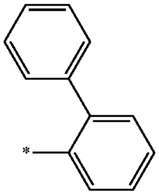
8-132
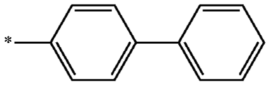
8-133
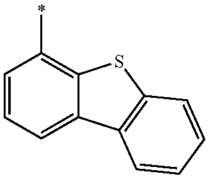
8-134
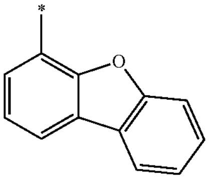
-continued
8-135
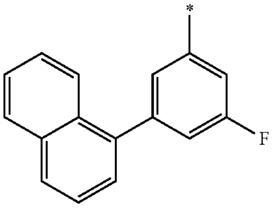
8-136
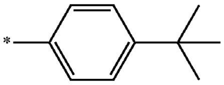
8-137
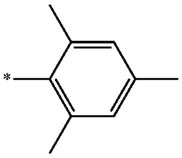
8-138
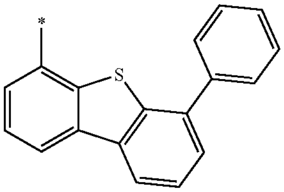
8-139
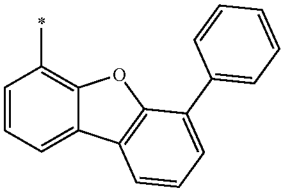
8-140
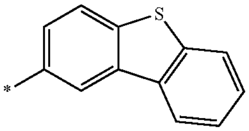
8-141
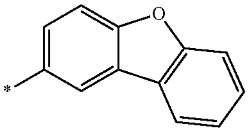
8-142
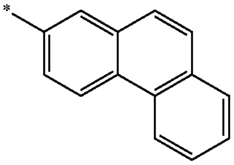
8-143
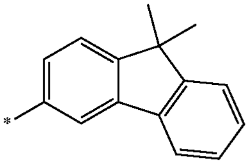

-continued
8-144
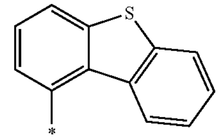
8-145
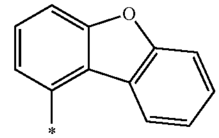
8-146
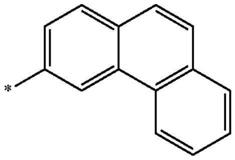
8-147
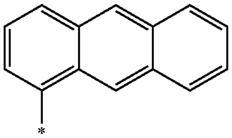
8-148
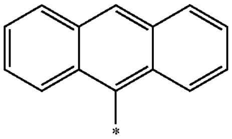
8-149
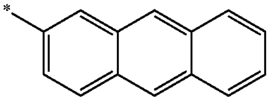
8-150
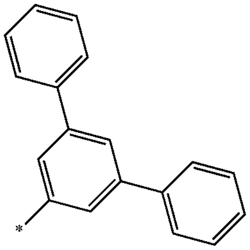
8-151
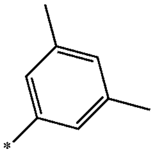
8-152
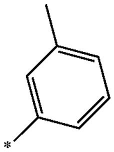
8-153
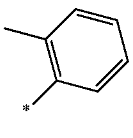
-continued
8-154
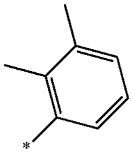
8-155
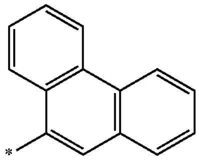
8-156
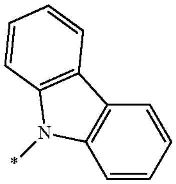
8-157
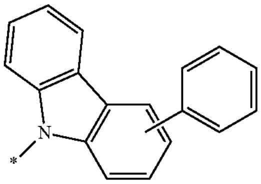
8-158
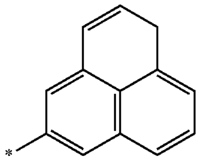
8-159
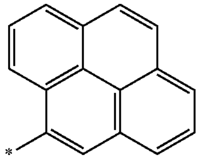
8-160
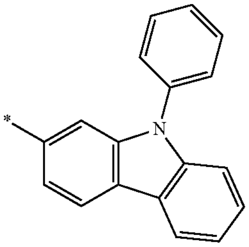
8-161
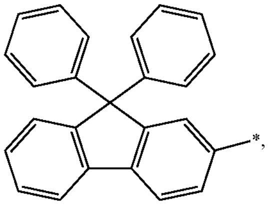
wherein * in Formulae 8-1 to 8-161 indicates a binding site to a neighboring atom.
In Formulae 1A, 1B, 2A to 2C, and 10, c1 to c4, c7, and c8 may each independently be an integer from 0 to 4, c5 and c6 may each independently be an integer from 0 to 5, c21 may be an integer from 0 to 8, c31 and c32 may each independently be an integer from 0 to 5, c41 and c42 may each independently be an integer from 0 to 4, and c51 and c52 may each independently be an integer from 0 to 6. c1 indicates the number of $R_1$(s), wherein, when c1 is two or more, two or more $R_1$(s) may be identical to or different from each other. c1 to c8, c21, c31, c32, c41, c42, c51, and c52 may be understood by referring to the descriptions provided in connection with c1 and the structures of Formulae 1A, 1B, 2A to 2C, and 10.

In one or more embodiments, c1 to c8, c21, c31, c32, c41, c42, c51, and c52 may each independently be 0 or 1.

In one or more embodiments, the first compound may be represented by one selected from Formulae 1A-1 to 1A-10 and 1B-1 to 1B-4:

<Formula 1A-1>

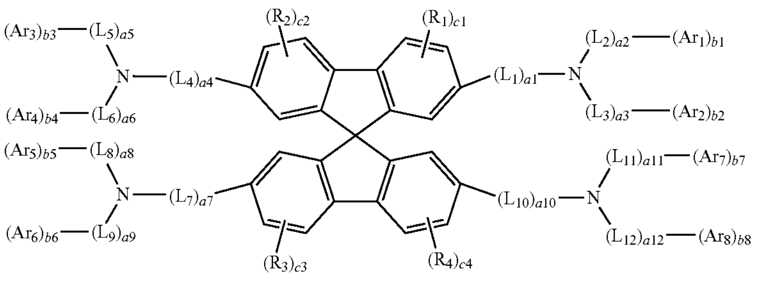

<Formula 1A-2>

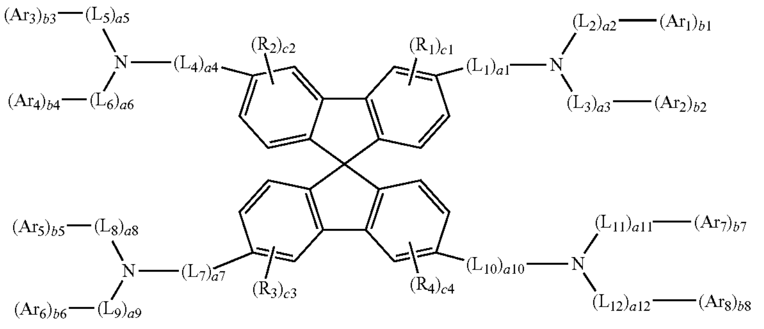

<Formula 1A-3>

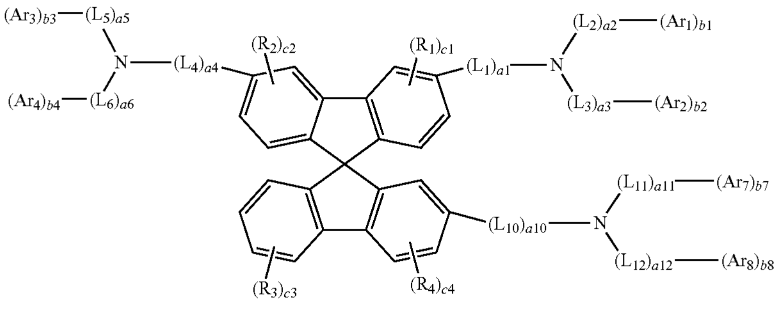

<Formula 1A-4>

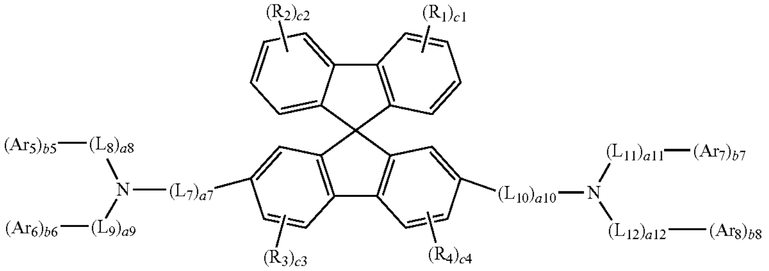

-continued
<Formula 1A-5>
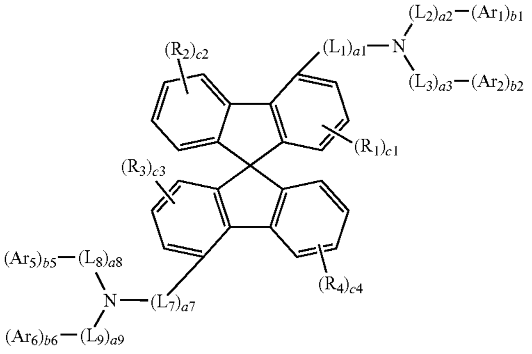
<Formula 1A-6>
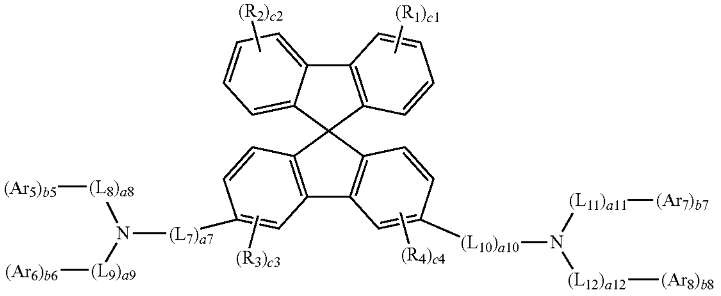
<Formula 1A-7>
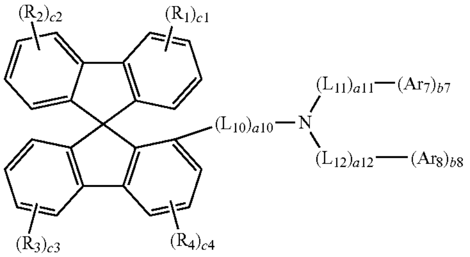
<Formula 1A-8>
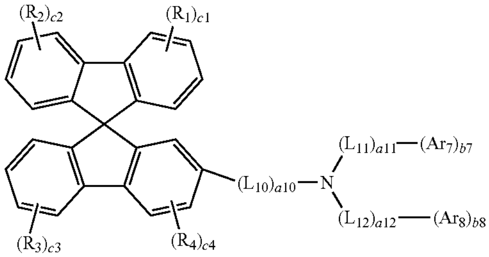
<Formula 1A-9>
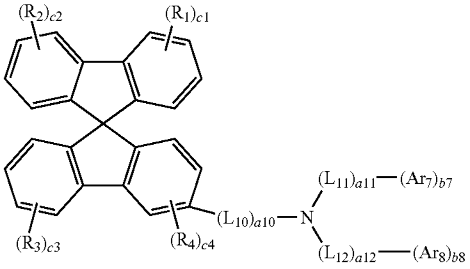
<Formula 1A-10>
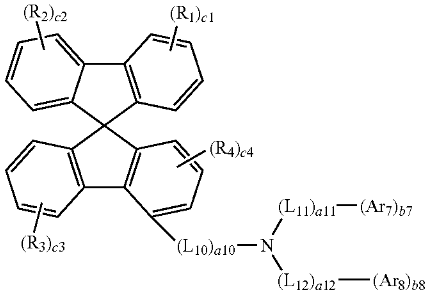
<Formula 1B-1>
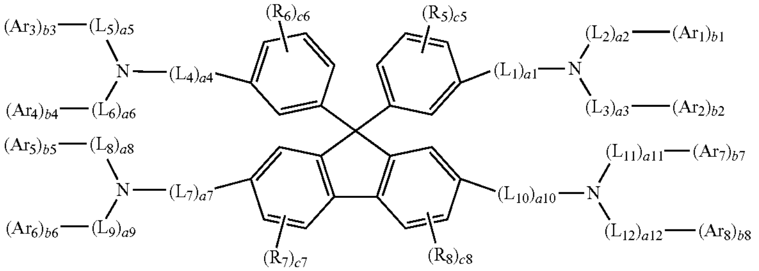

-continued
<Formula 1B-2>
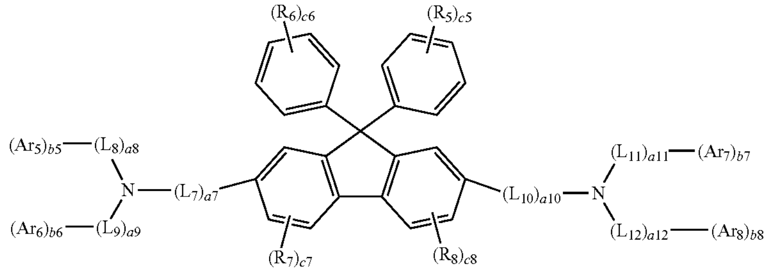
<Formula 1B-3>
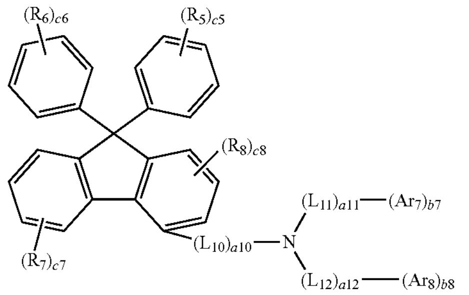
<Formula 1B-4>
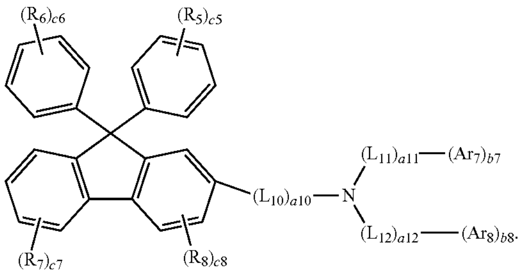
$L_1$ to $L_{12}$, a1 to a12, $Ar_1$ to $Ar_8$, b1 to b8, $R_1$ to $R_{12}$, and c1 to c12 in Formulae 1A-1 to 1A-10 and 1B-1 to 1B-4 are the same as described above.
In one or more embodiments, the first compound may be represented by one selected from Formulae 1A-1(1), 1A-2(1), 1A-2(2), 1A-3(1), 1A-4(1), 1A-4(2), 1A-5(1), 1A-5(2), 1A-5(3), 1A-6(1), 1A-7(1), 1A-8(1), 1A-8(2), 1A-8(3), 1A-8(4), 1A-9(1), 1A-9(2), 1A-10(1), 1A-10(2), 1A-10(3), 1A-10(4), 1B-1(1), 1B-2(1), 1B-2(2), 1B-3(1), and 1B-4(1):
<Formula 1A-1(1)>
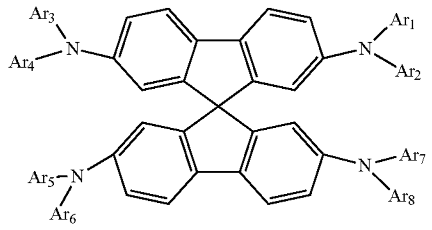
<Formula 1A-2(1)>
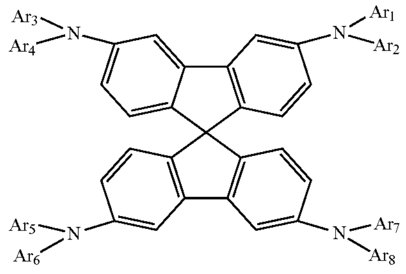
-continued
<Formula 1A-2(2)>
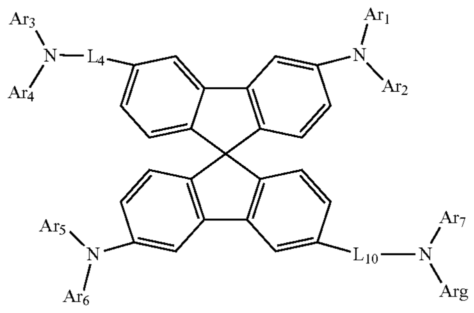
<Formula 1A-3(1)>
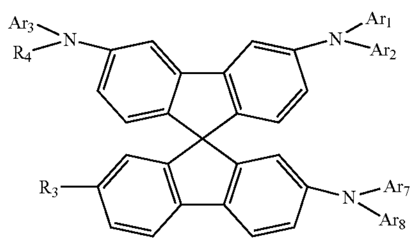
<Formula 1A-4(1)>
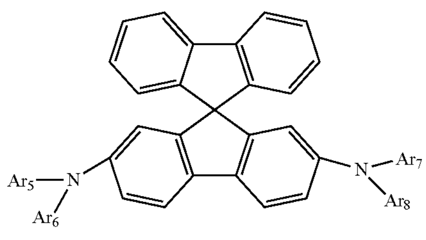

-continued
<Formula 1A-4(2)>
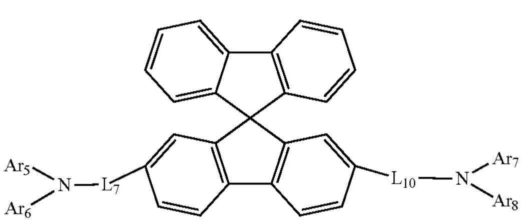
<Formula 1A-5(1)>
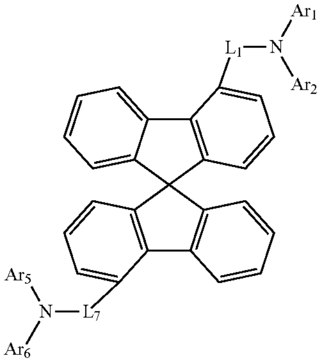
<Formula 1A-5(2)>
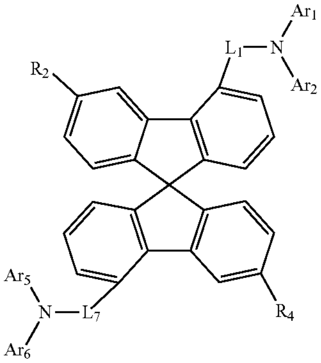
<Formula 1A-5(3)>
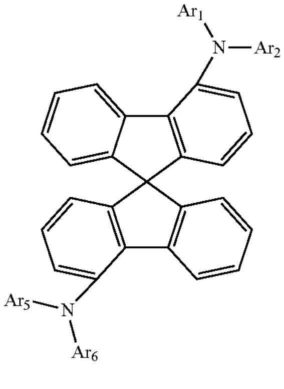
<Formula 1A-6(1)>
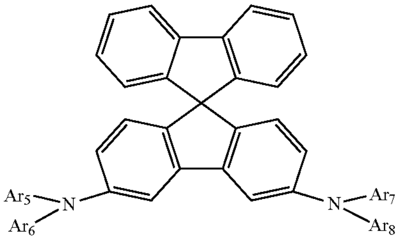
-continued
<Formula 1A-7(1)>
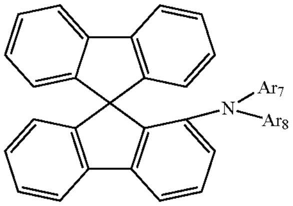
<Formula 1A-8(1)>
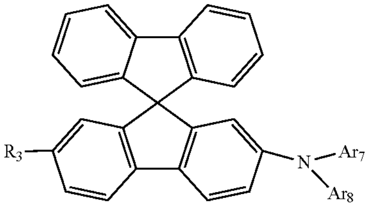
<Formula 1A-8(2)>
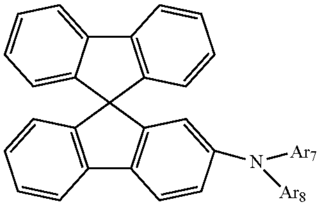
<Formula 1A-8(3)>
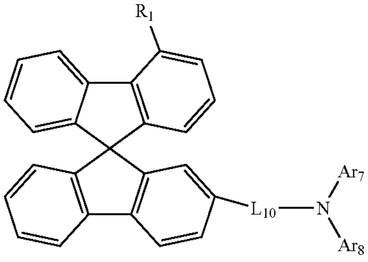
<Formula 1A-8(4)>
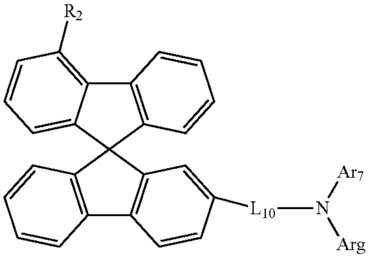
<Formula 1A-9(1)>
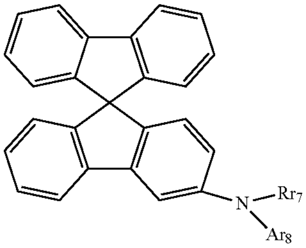

-continued

<Formula 1A-9(2)>

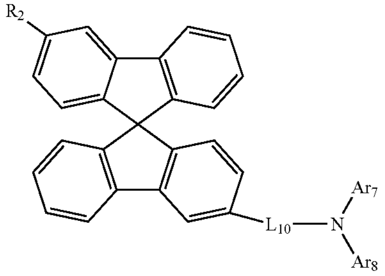

<Formula 1A-10(1)>

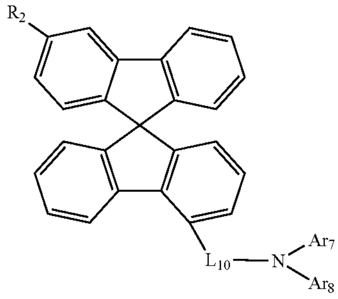

<Formula 1A-10(2)>

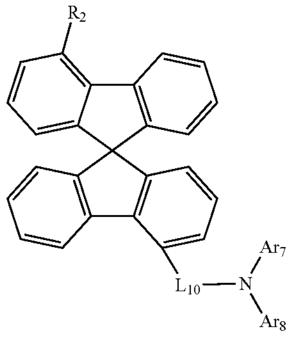

<Formula 1A-10(3)>

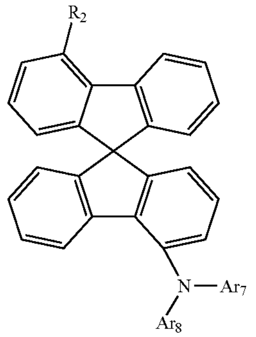

<Formula 1A-10(4)>

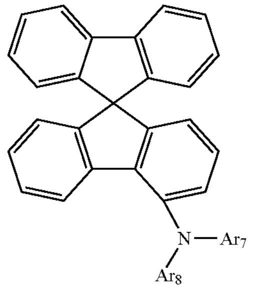

-continued

<Formula 1B-1(1)>

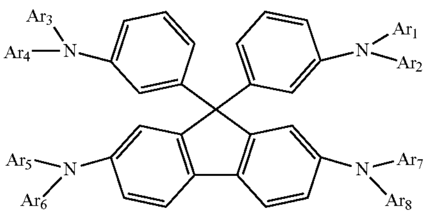

<Formula 1B-2(1)>

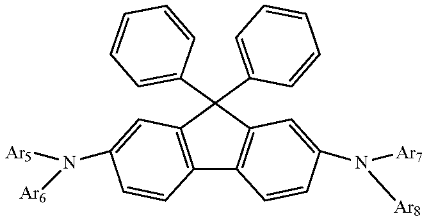

<Formula 1B-2(2)>

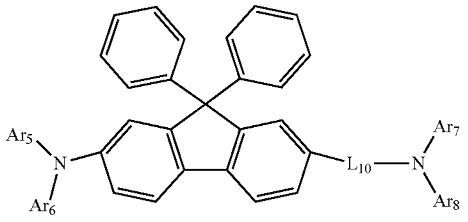

<Formula 1B-3(1)>

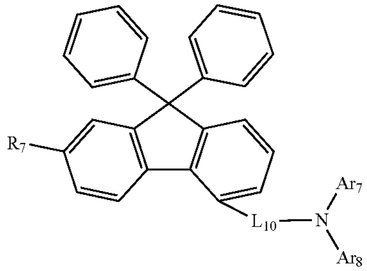

<Formula 1B-4(1)>

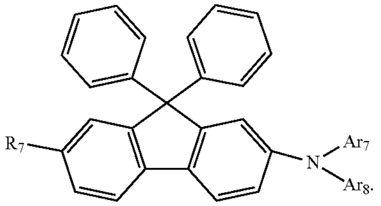

$L_1$, $L_4$, $L_7$, $L_{10}$, $Ar_1$ to $Ar_8$, $R_1$ to $R_4$, and $R_7$ in Formulae 1A-1(1), 1A-2(1), 1A-2(2), 1A-3(1), 1A-4(1), 1A-4(2), 1A-5(1), 1A-5(2), 1A-5(3), 1A-6(1), 1A-7(1), 1A-8(1), 1A-8(2), 1A-8(3), 1A-8(4), 1A-9(1), 1A-9(2), 1A-10 (1), 1A-10(2), 1A-10(3), 1A-10(4), 1B-1(1), 1B-2(1), 1B-2(2), 1B-3(1), and 1B-4(1) are the same as described above.

For example, $L_1$, $L_4$, $L_7$, and $L_{10}$ may each independently be selected from groups represented by Formulae 4-1 to 4-36, $Ar_1$ to $Ar_8$ may each independently be selected from groups represented by Formulae 6-1 to 6-167, and $R_1$ to $R_4$ and $R_7$ may each independently be selected from groups represented by Formulae 8-1 to 8-161.

In one or more embodiments, the second compound may be represented by one selected from Formulae 2A-1, 2B-1, and 2C-1:

<Formula 2A-1>

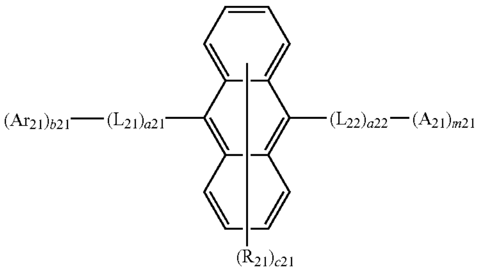

<Formula 2B-1>

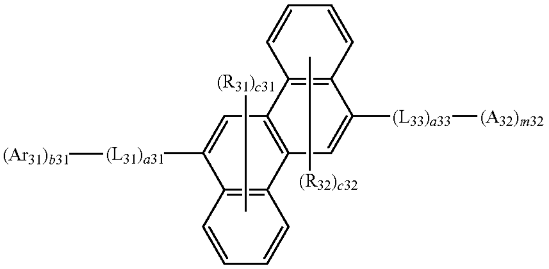

-continued

<Formula 2C-1>

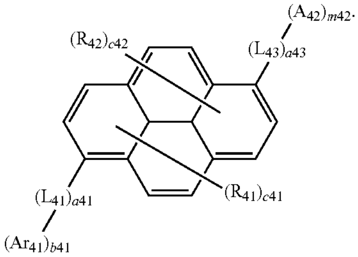

$A_{21}$, $A_{32}$, $A_{42}$, m21, m32, m42, $L_{21}$, $L_{22}$, $L_{31}$, $L_{33}$, $L_{41}$, Las, a21, a22, a31, a33, a41, 843, $Ar_{21}$, $Ar_{31}$, $Ar_{41}$, b21, b31, b41, $R_{21}$, $R_{31}$, $R_{32}$, $R_{41}$, $R_{42}$, c21, c31, c32, c41, and c42 in Formulae 2A-1, 2B-1, and 2C-1 are the same as described above.

In one or more embodiments, the second compound may be represented by one selected from Formulae 2A-1(1) to 2A-1(8), 2B-1(1) to 2B-1(8), and 2C-1(1) to 2C-1(8):

<Formula 2A-1(1)>

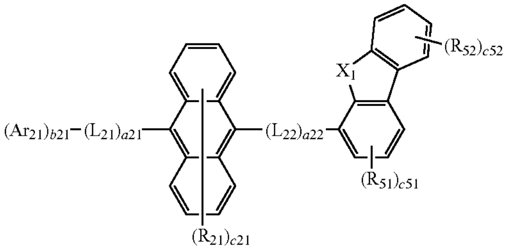

<Formula 2A-1(2)>

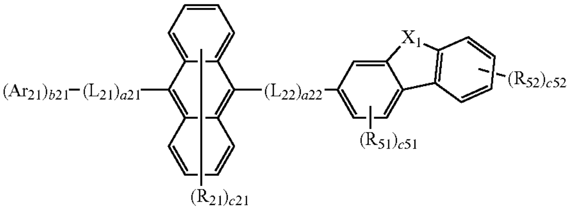

<Formula 2A-1(3)>

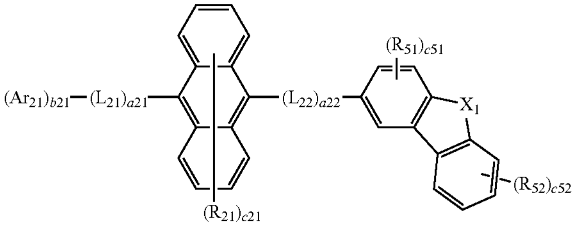

<Formula 2A-1(4)>

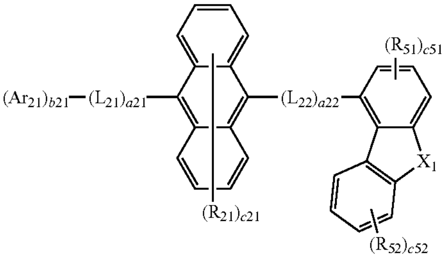

-continued
<Formula 2A-1(5)>
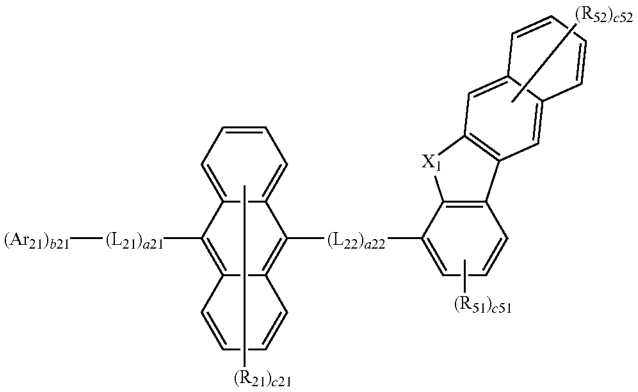
<Formula 2A-1(6)>
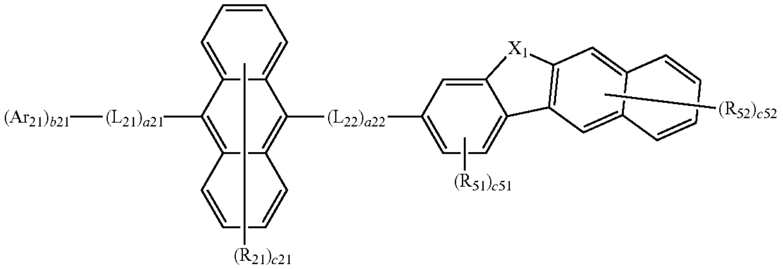
<Formula 2A-1(7)>
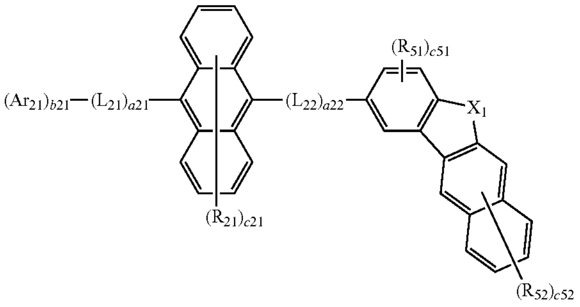
<Formula 2A-1(8)>
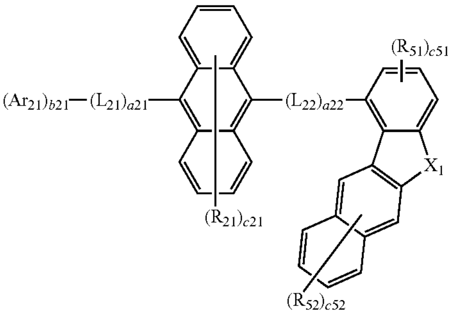
<Formula 2B-1(1)>
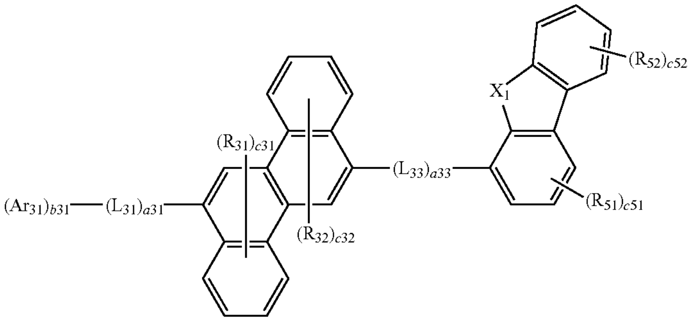
<Formula 2B-1(2)>
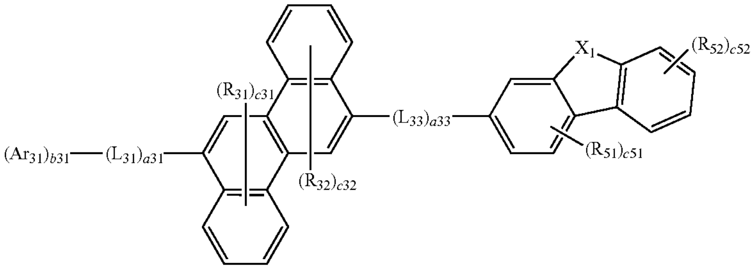

-continued
<Formula 2B-1(3)>
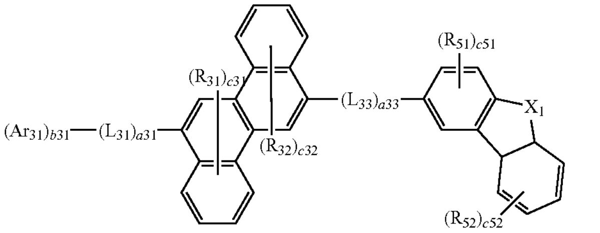
<Formula 2B-1(4)>
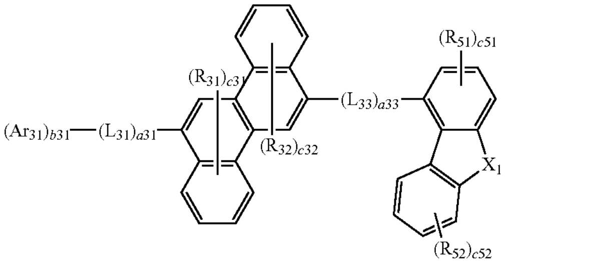
<formula 2B-1(5)>
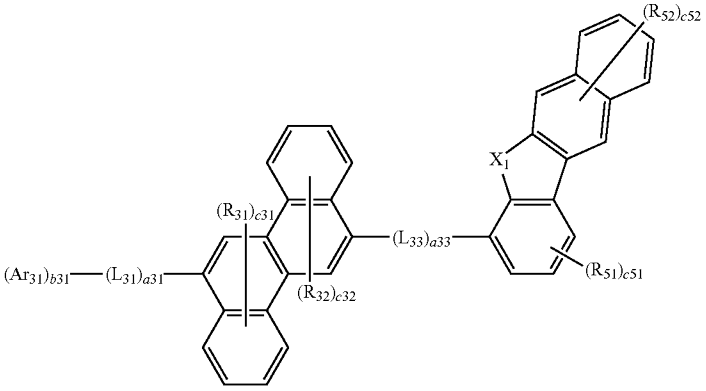
<Formula 2B-1(6)>
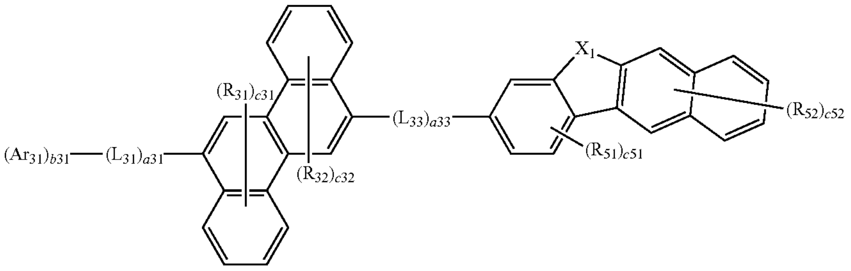
<Formula 2B-1(7)>
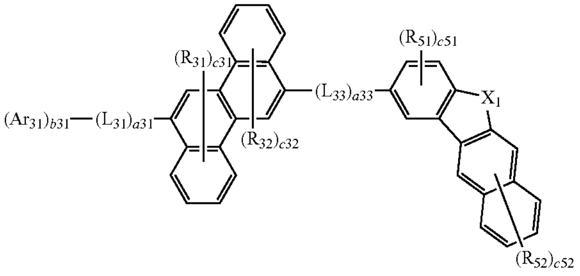
<formula 2B-1(8)>
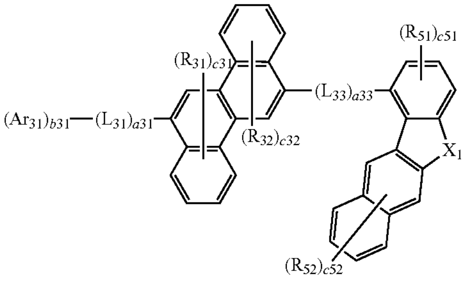

-continued
<Formula 2C-1(1)>
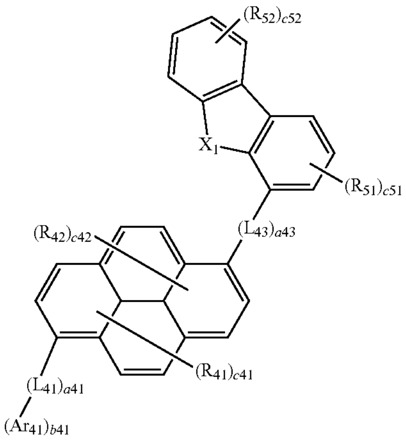
<Formula 2C-1(2)>
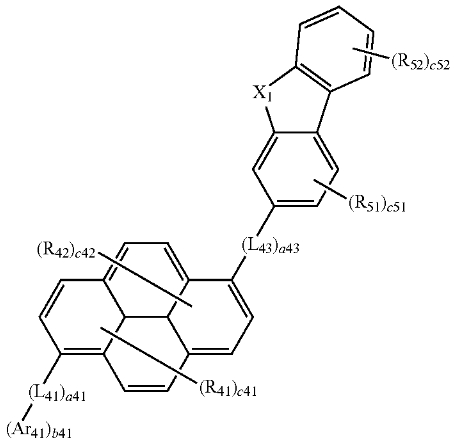
<Formula 2C-1(3)>
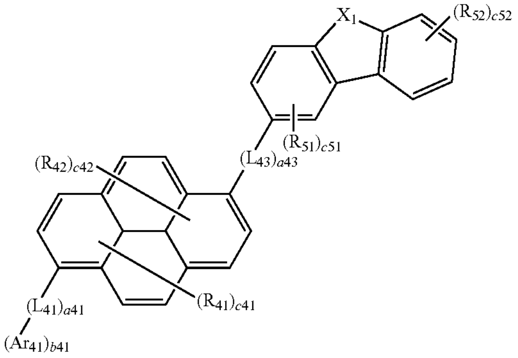
<Formula 2C-1(4)>
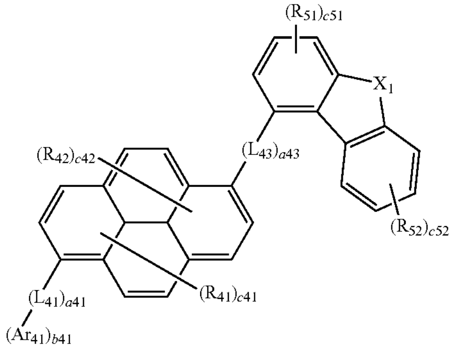
<Formula 2C-1(5)>
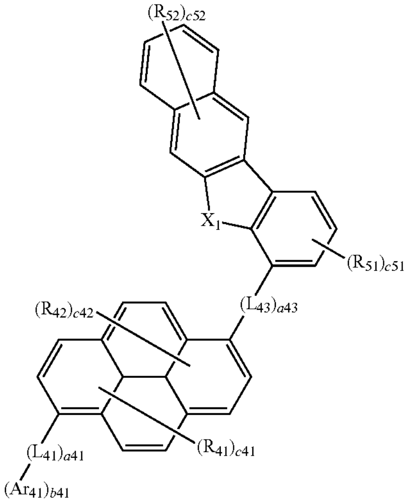
<Formula 2C-1(6)>
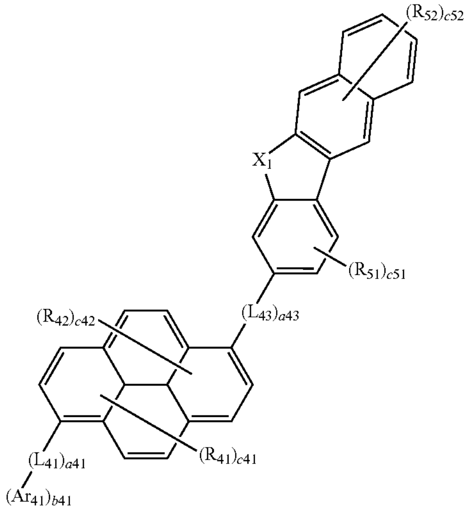

-continued

<Formula 2C-1(7)>

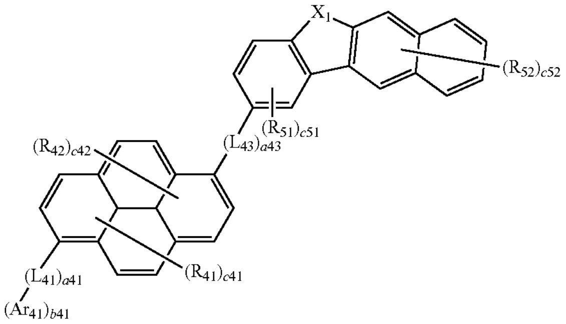

<Formula 2C-1(8)>

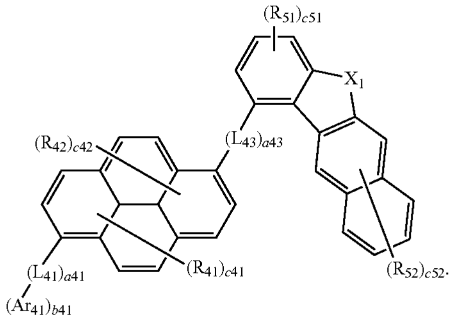

$L_{21}$, $L_{22}$, $L_{31}$, $L_{33}$, $L_{41}$, $L_{43}$, a21, a22, a31, a33, a41, a43, $Ar_{21}$, $Ar_{31}$, $Ar_{41}$, b21, b31, b41, $R_{21}$, $R_{31}$, $R_{32}$, $R_{41}$, $R_{42}$, c21, c31, c32, c41, and c42 in Formulae 2A-1(1) to 2A-1(8), 2B-1(1) to 2B-1(8), and 2C-1(1) to 2C-1(8) are the same as described above.

For example, $L_{21}$, $L_{22}$, $L_{31}$, $L_{33}$, $L_{41}$, and $L_{43}$ may each independently be selected from groups represented by Formulae 4-1 to 4-36, a21, a22, a31, a33, a41, and a43 may each independently be 0 or 1, $Ar_{21}$, $Ar_{31}$, and $Ar_{41}$ may each independently be selected from groups represented by Formulae 6-1 to 6-167, b21, b31, and b41 may each independently be 1 or 2, $R_{21}$, $R_{31}$, $R_{32}$, $R_{41}$, and $R_{42}$ may each independently be selected from groups represented by Formulae 8-1 to 8-161, and c21, c31, c32, c41, and c42 may each independently be 0 or 1.

The first compound may be one selected from Compounds 1 to 51, and the second compound may be one selected from Compounds H1 to H24 and H105 to H184:

1

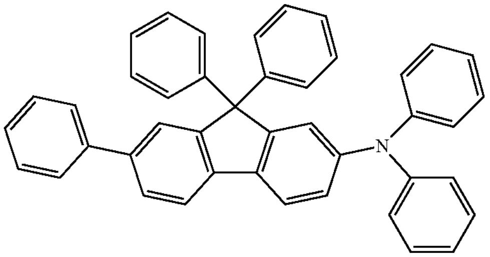

2

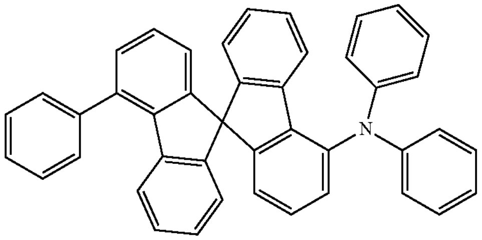

3

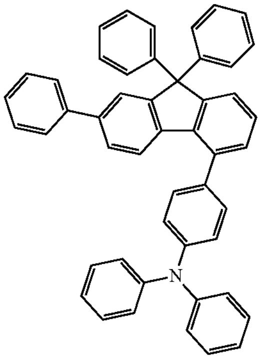

4

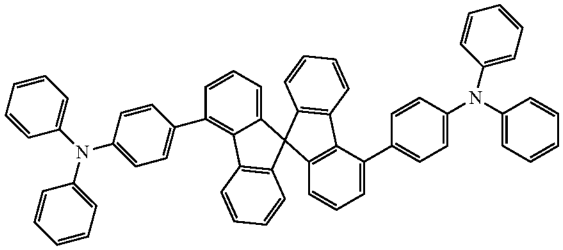

-continued
5
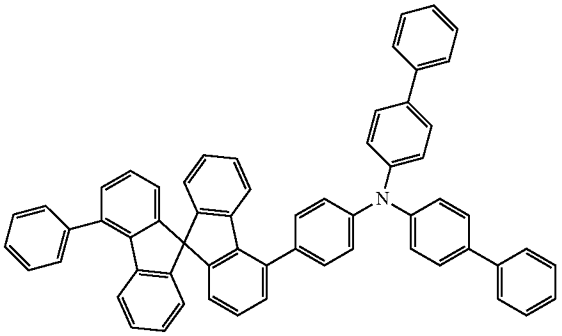
6
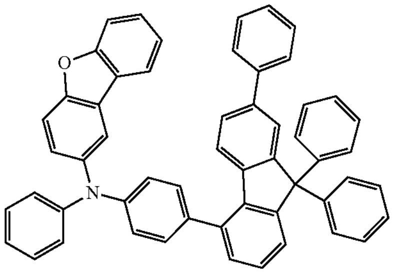
7
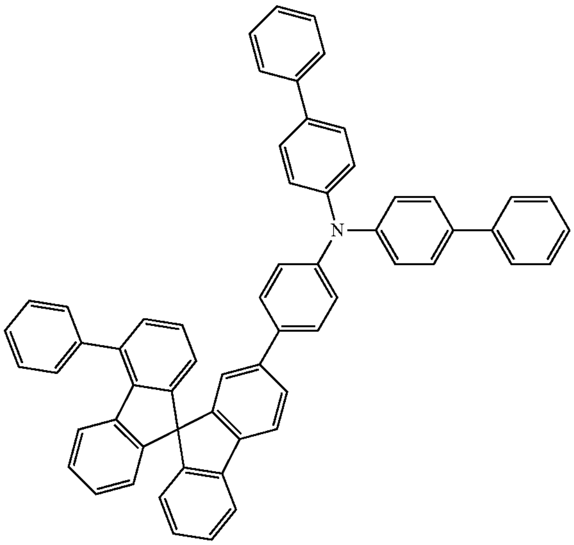
8
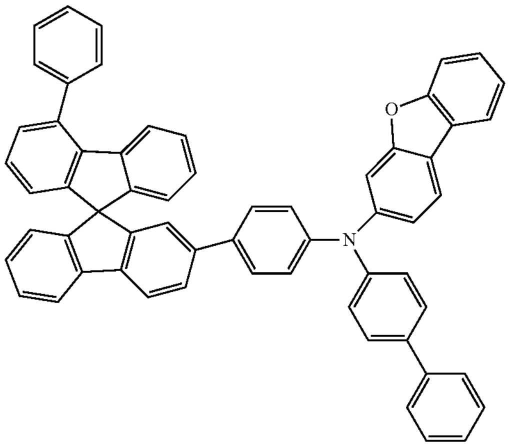
9
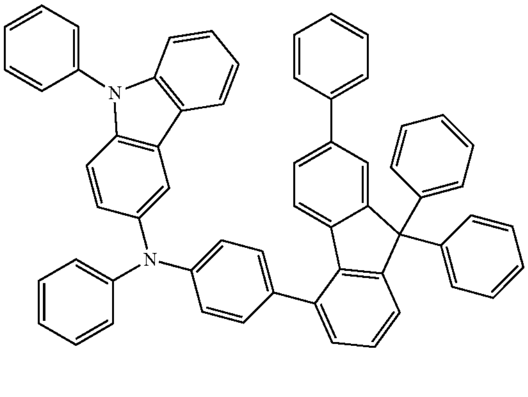
10
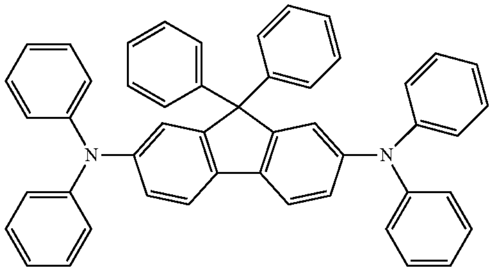

-continued
11
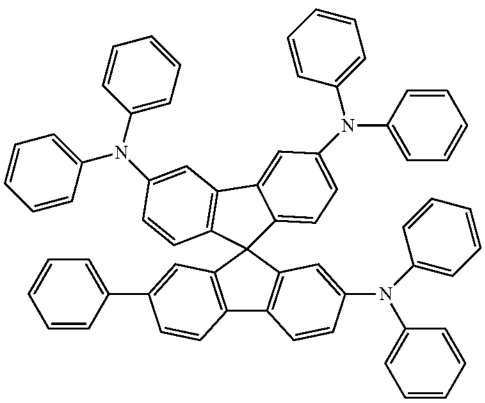
12
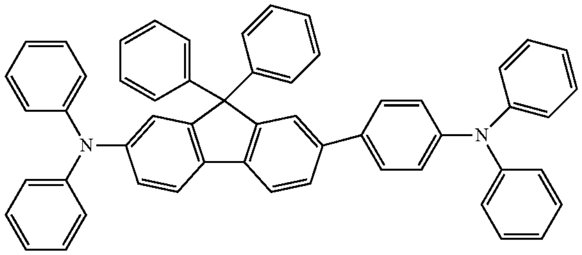
13
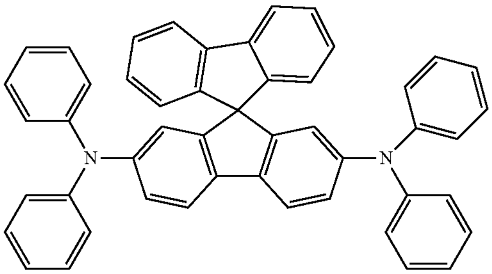
14
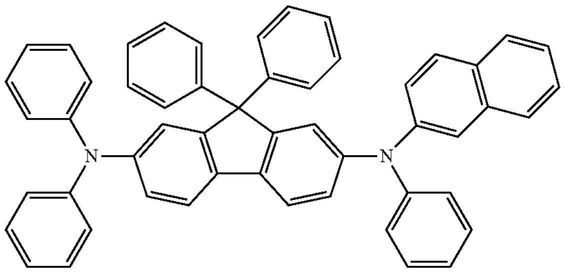
15
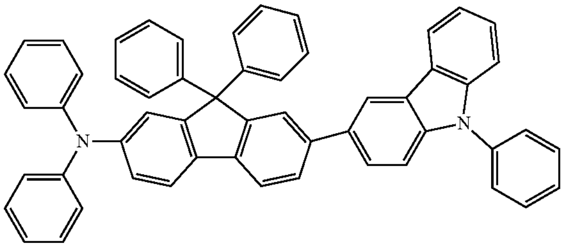
16
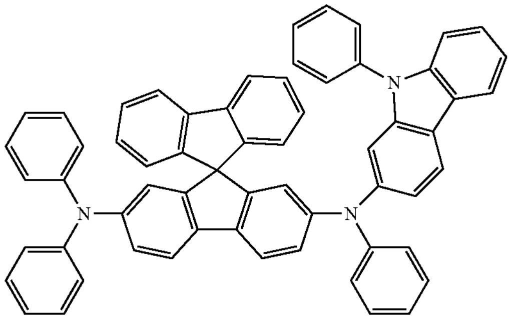
17
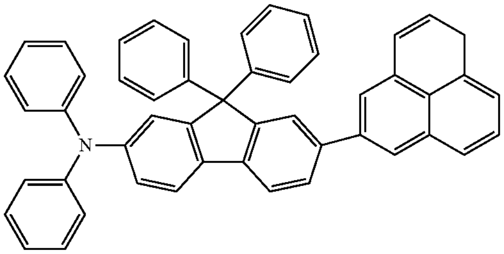
18
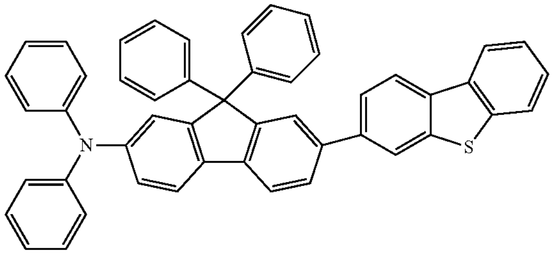

-continued
19
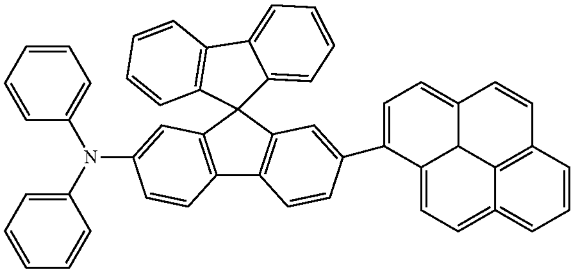
20
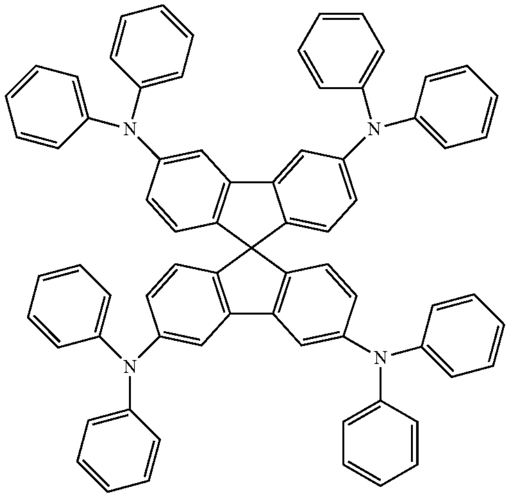
21
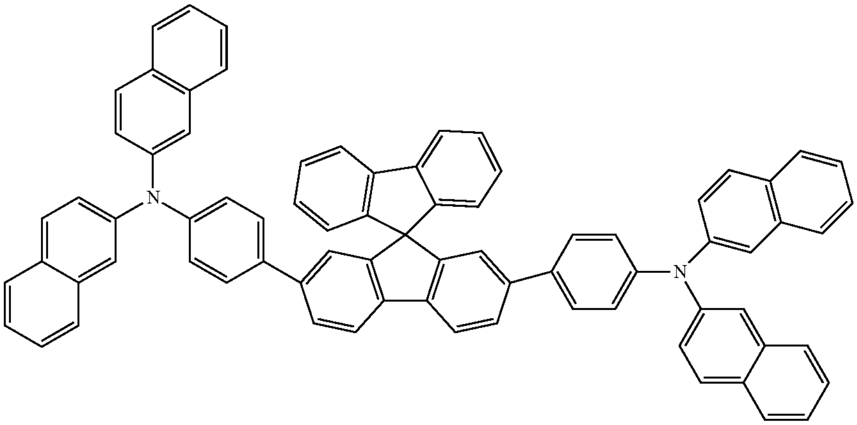
22
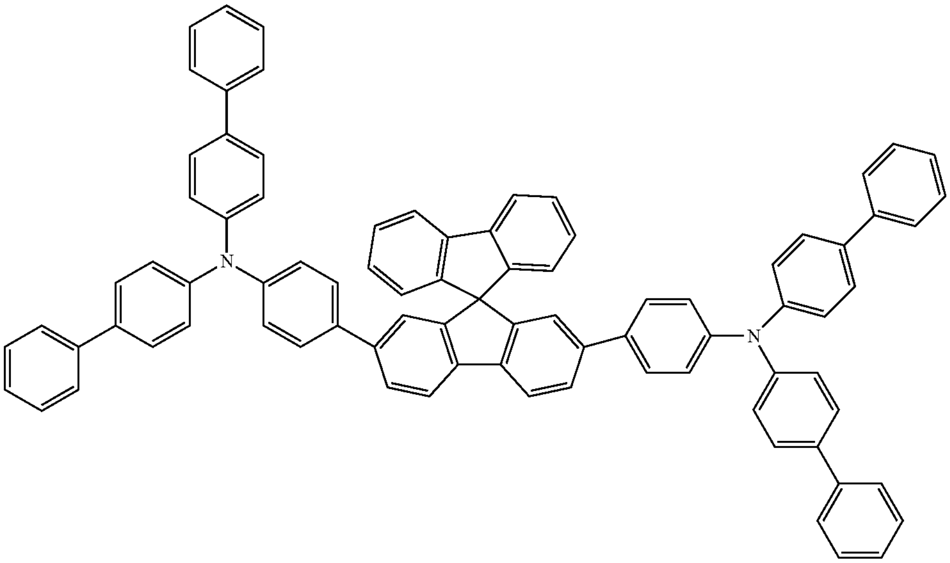

-continued
23
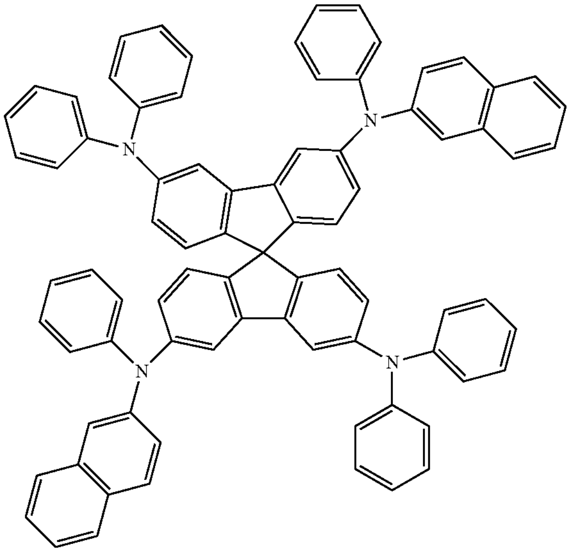
24
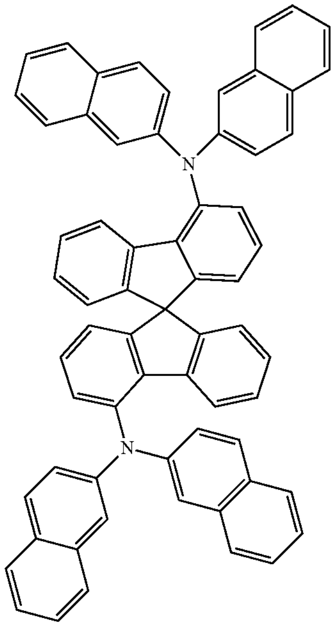
25
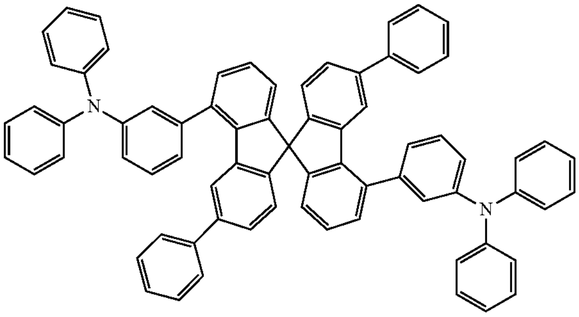
26
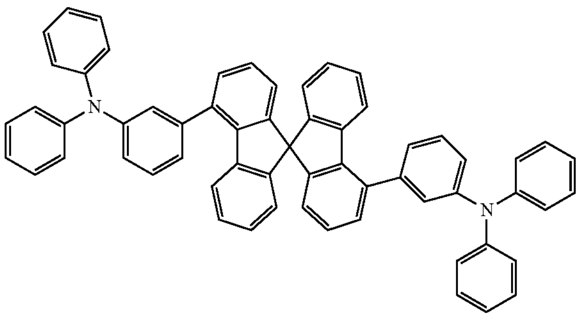
27
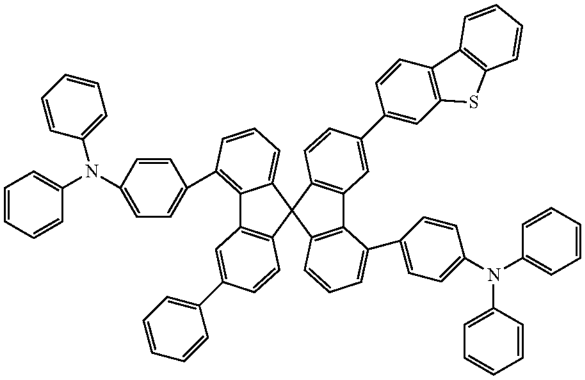
28
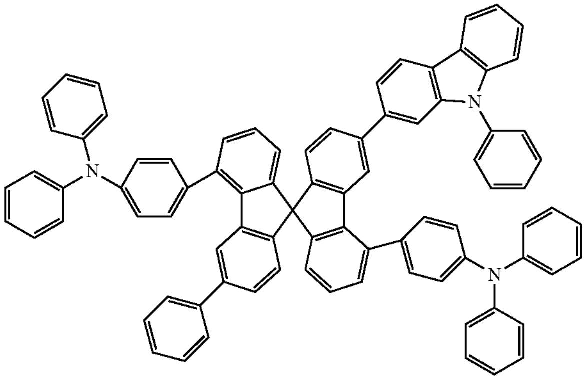

-continued
29
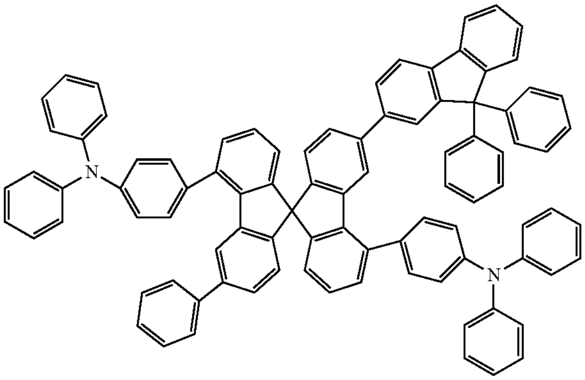
30
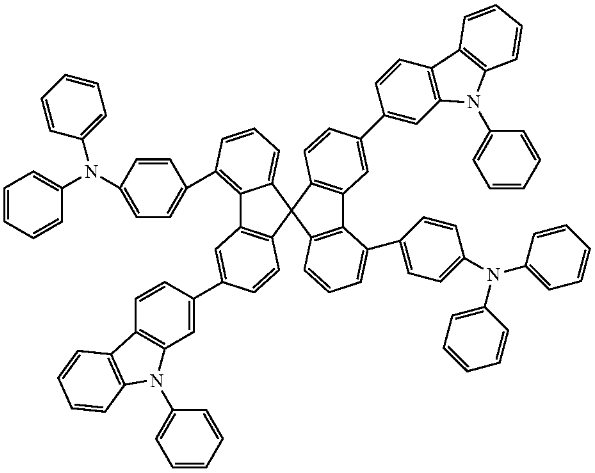
31
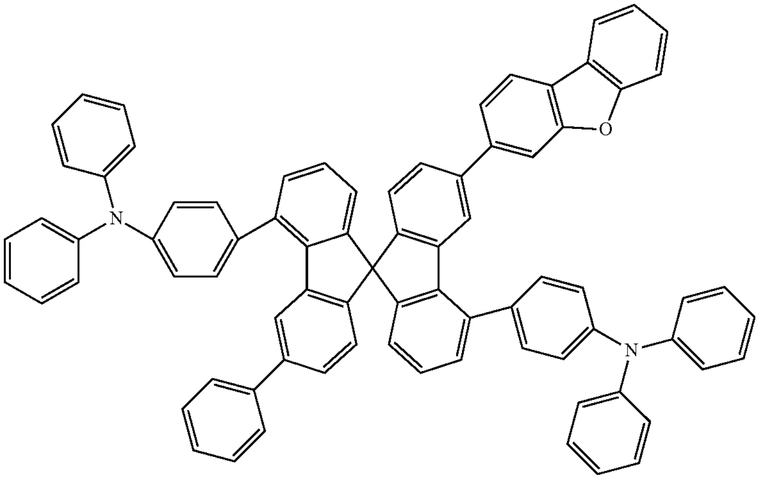
32
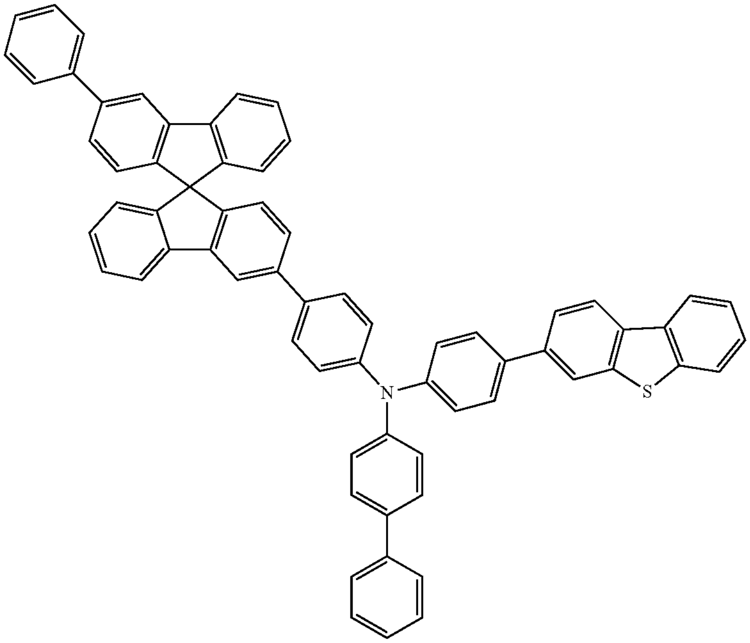

-continued
33
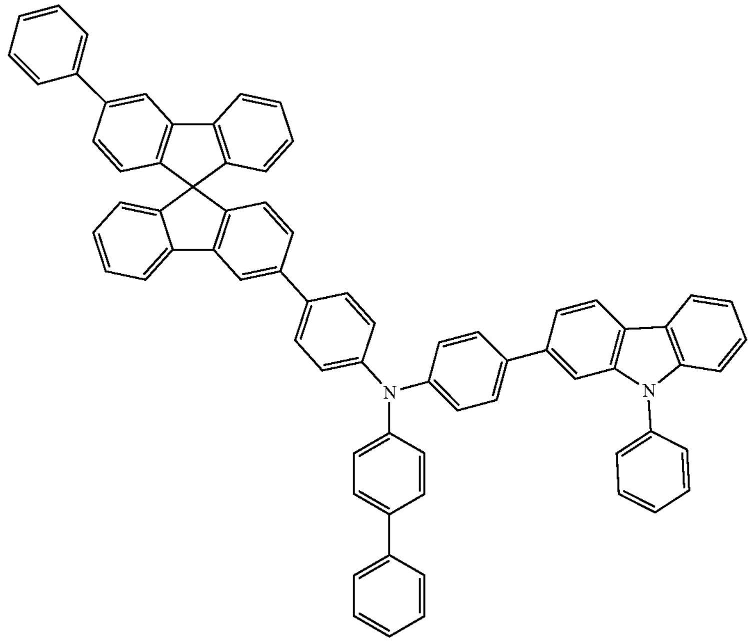
34
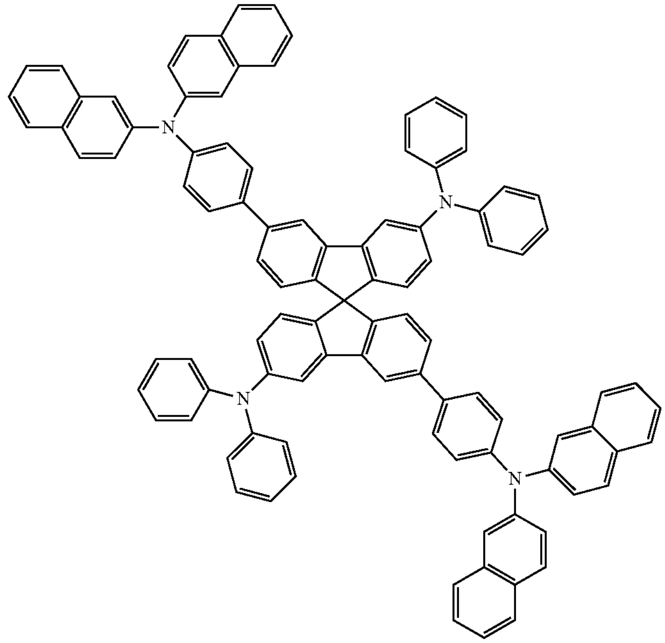

-continued
35
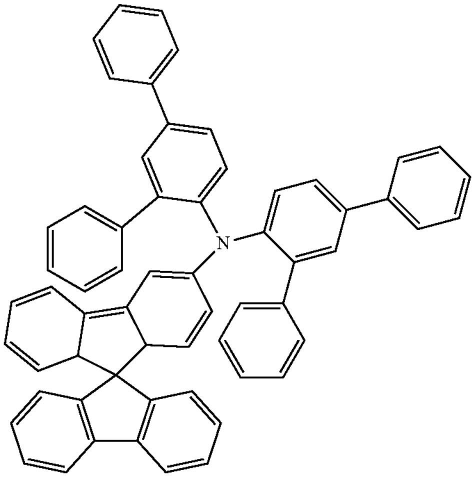
36
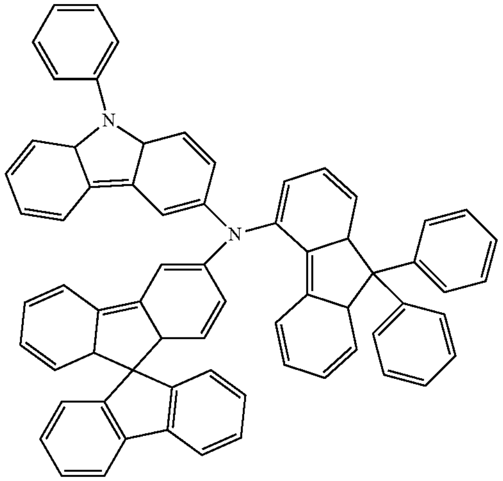
37
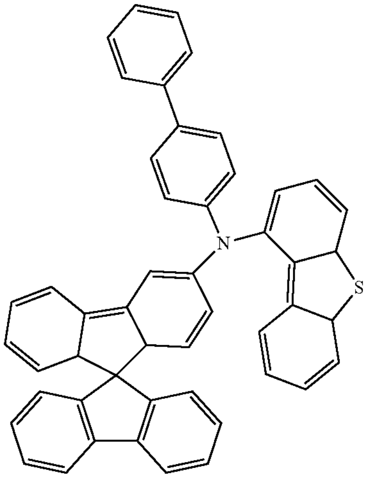
38
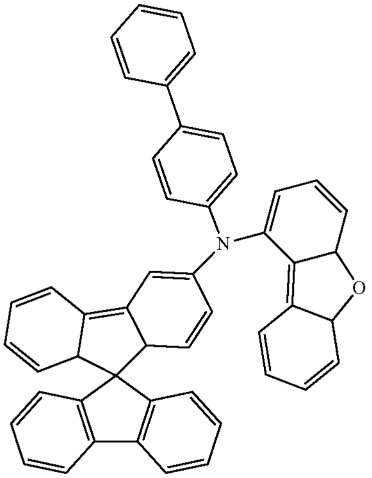
39
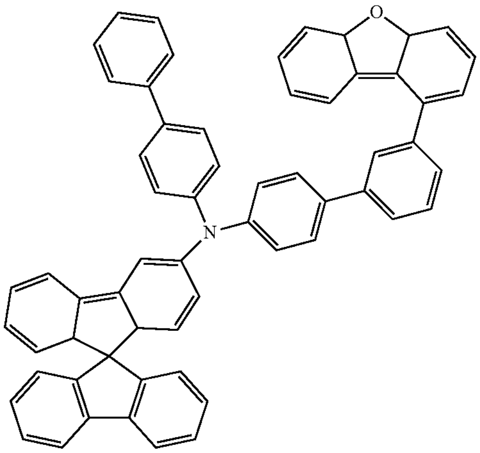
40
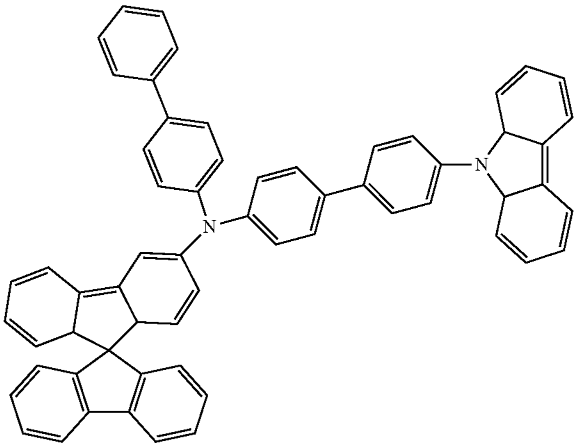

-continued
41
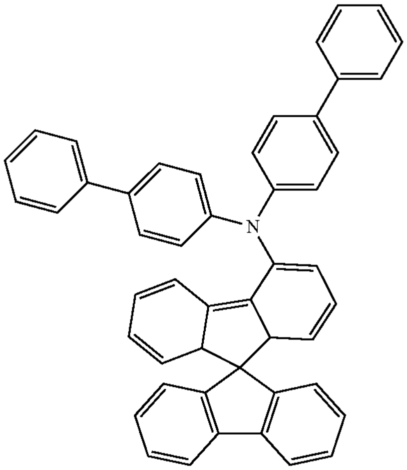
42
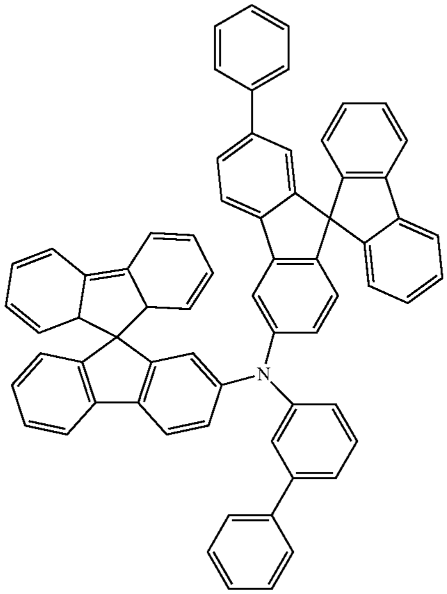
43
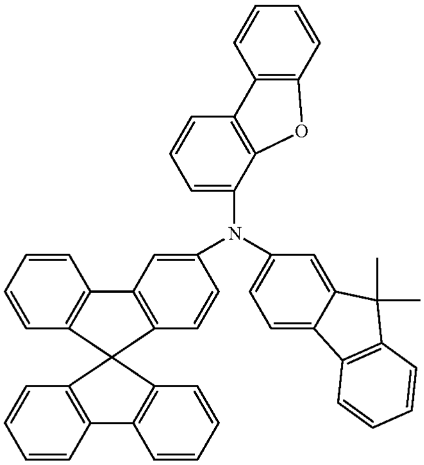
44
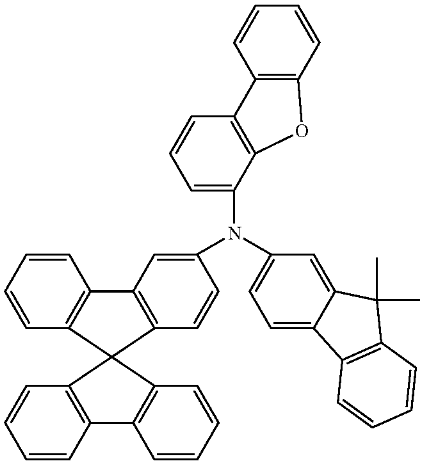
45
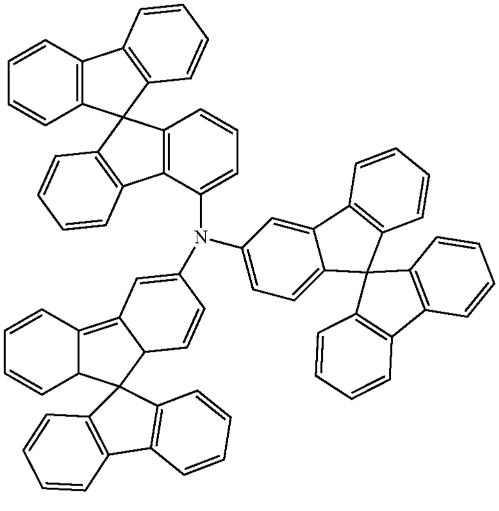
46
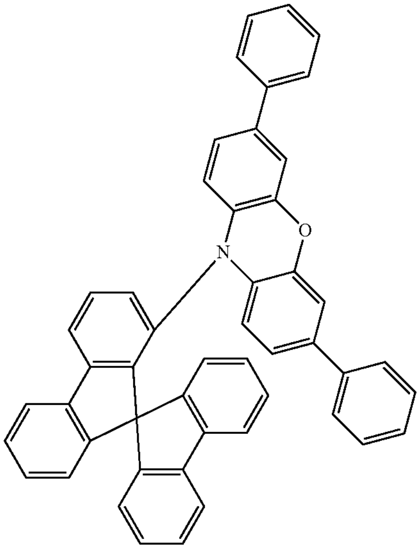

-continued
47
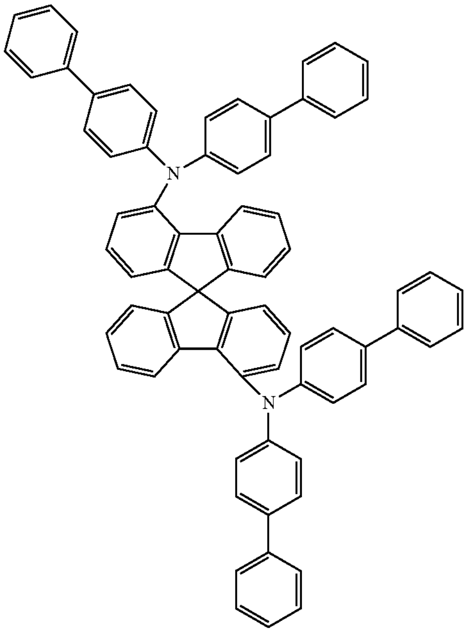
48
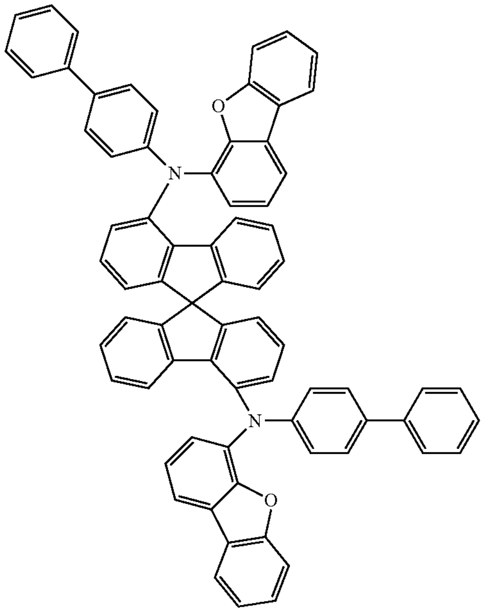
49
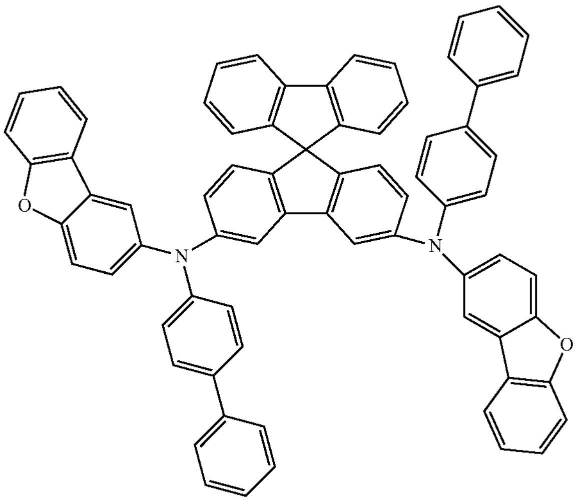
50
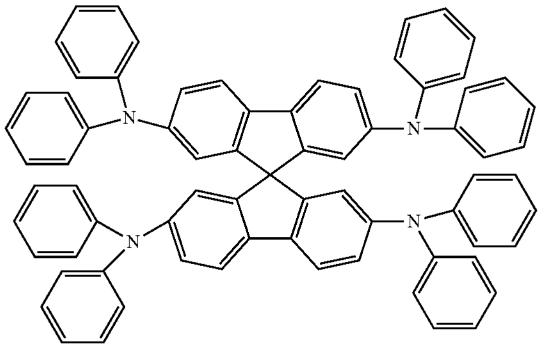
51
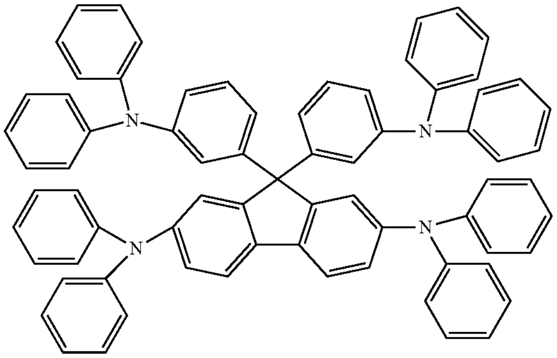
H1
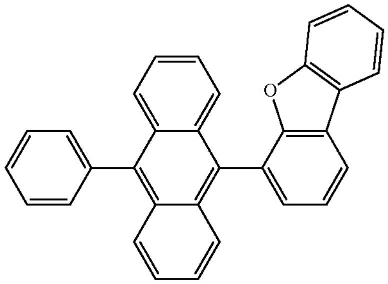

-continued
H2
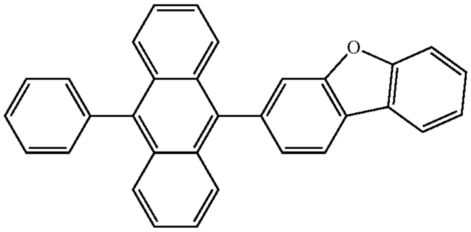
H3
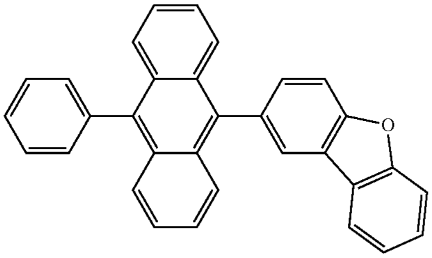
H4
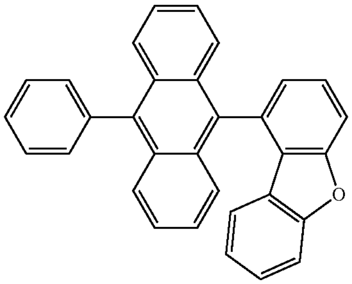
H5
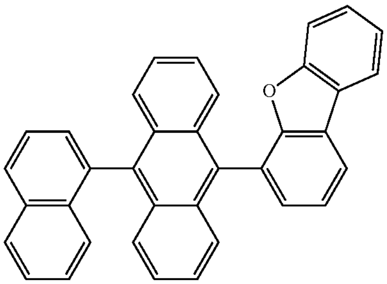
H6
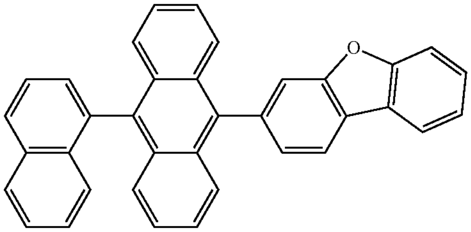
H7
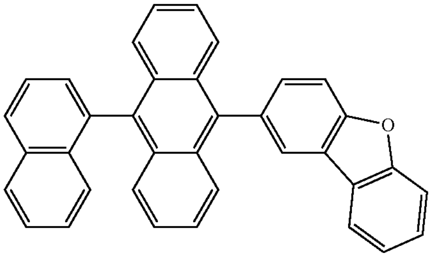
H8
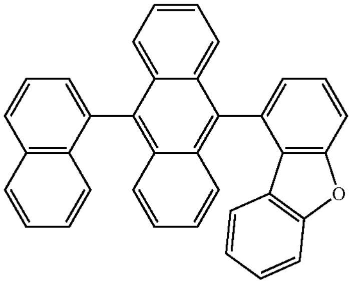
H9
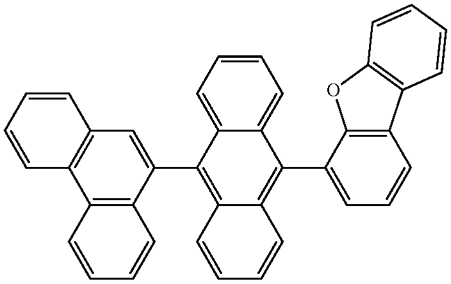
H10
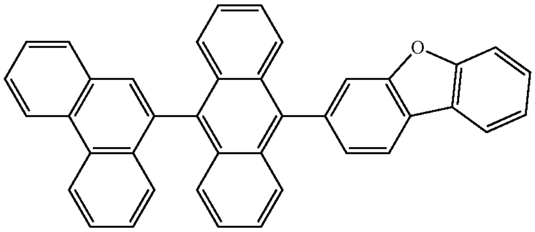
H11
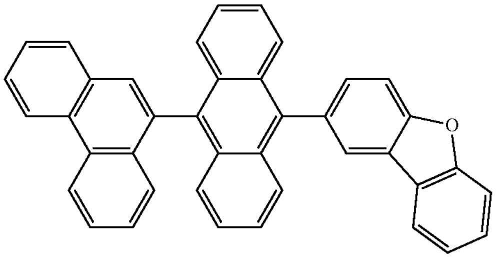

-continued
H12
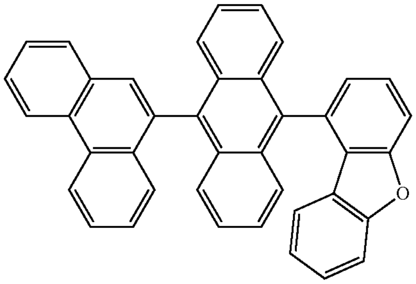
H13
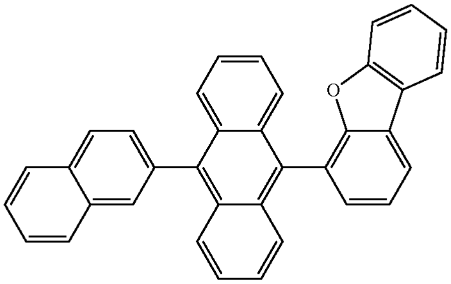
H14
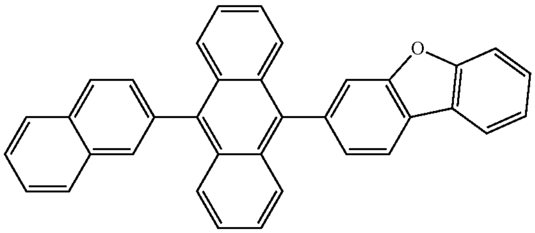
H15
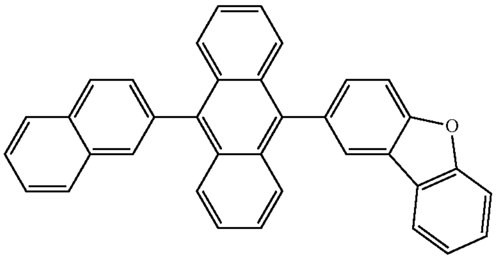
H16
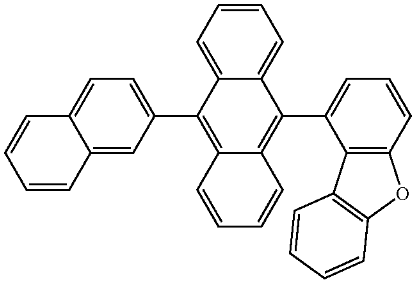
H17
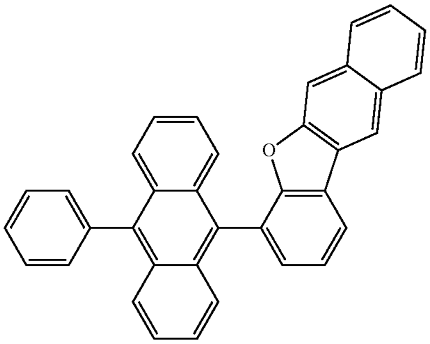
H18
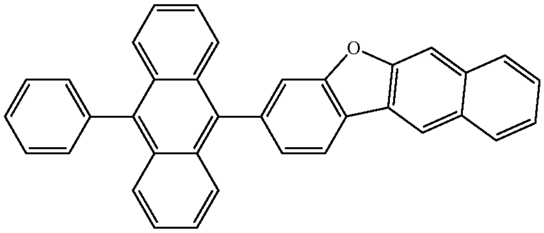
H19
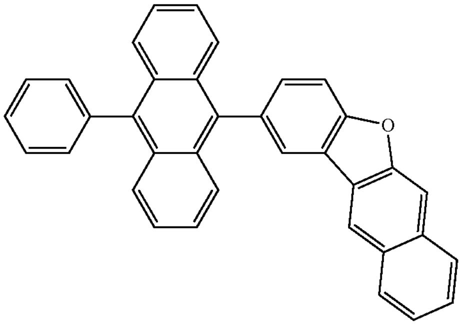
H20
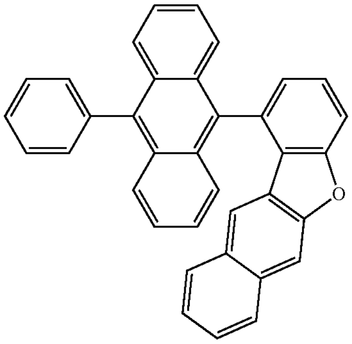
H21
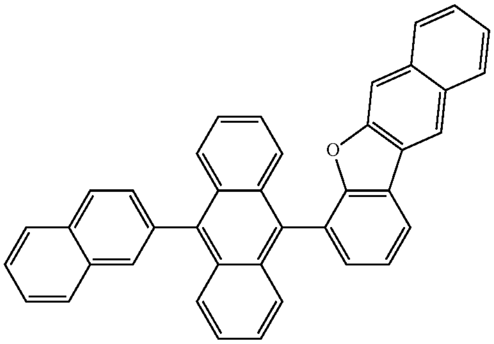

-continued
H22
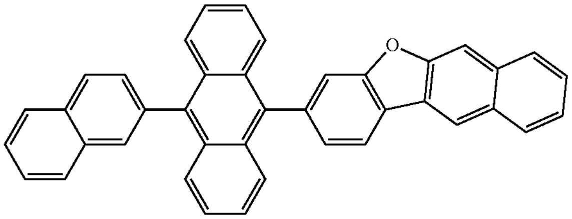
H23
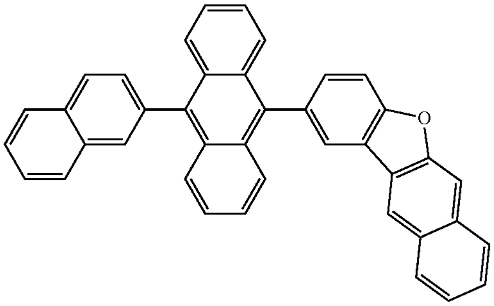
H24
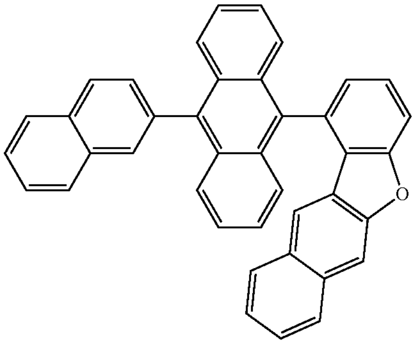
H105
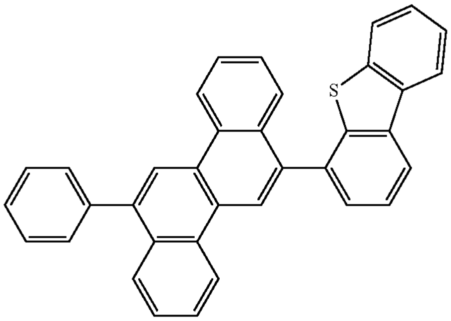
H106
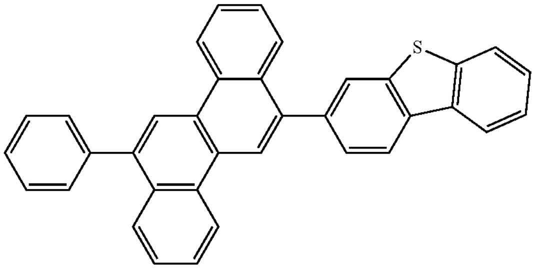
H107
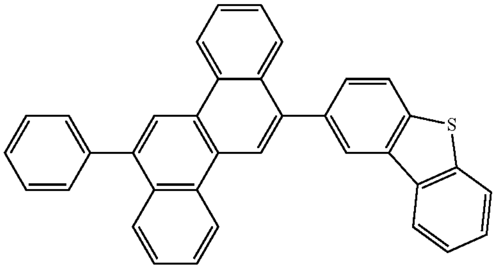
H108
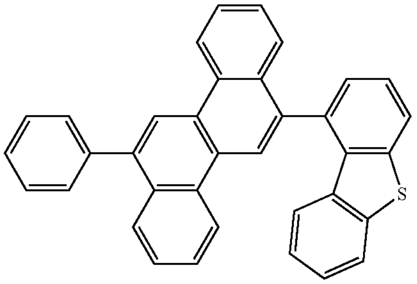
H109
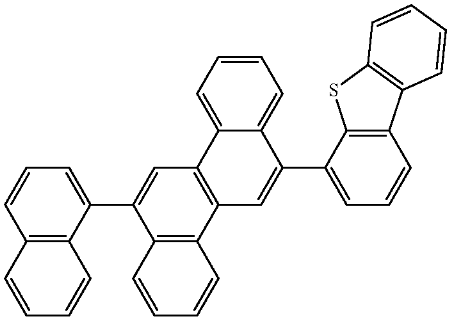
H110
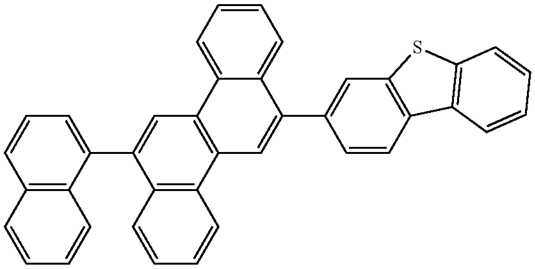
H111
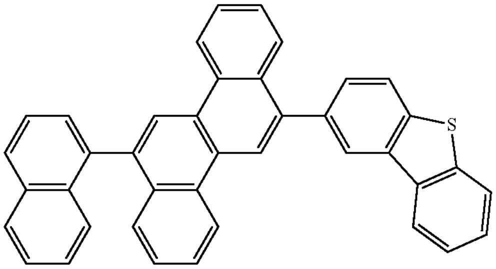

-continued
H112
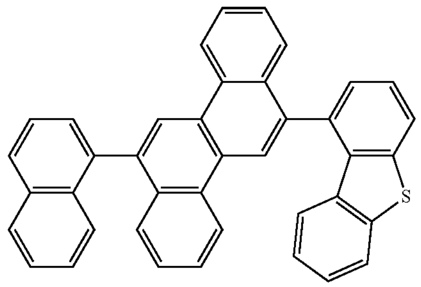
H113
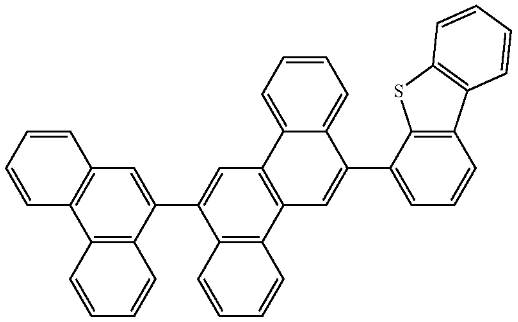
H114
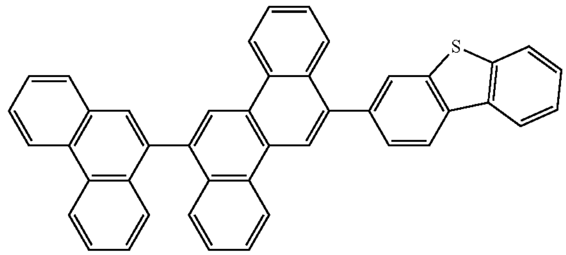
H115
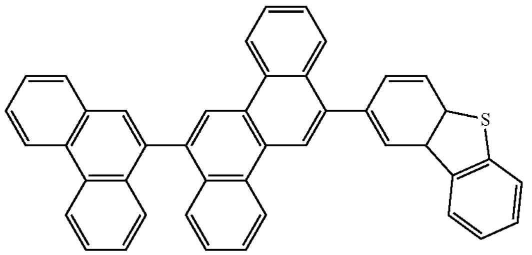
H116
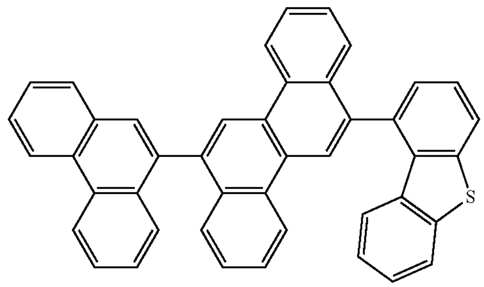
H117
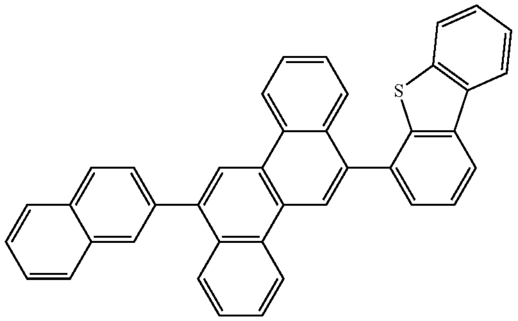
H118
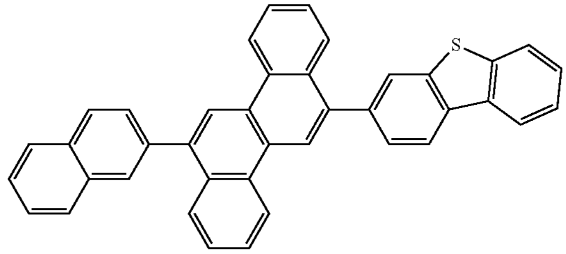
H119
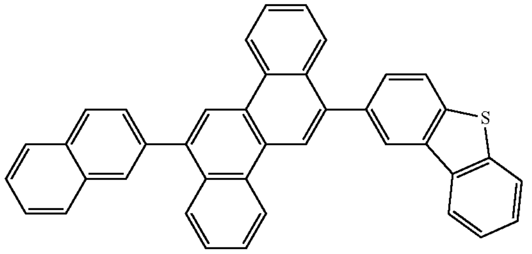
H120
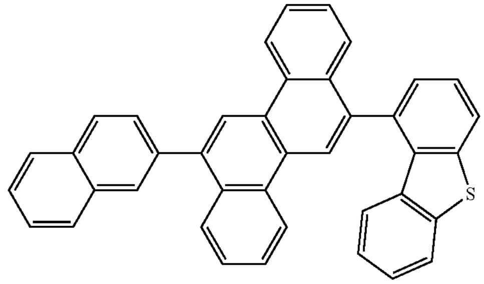
H121
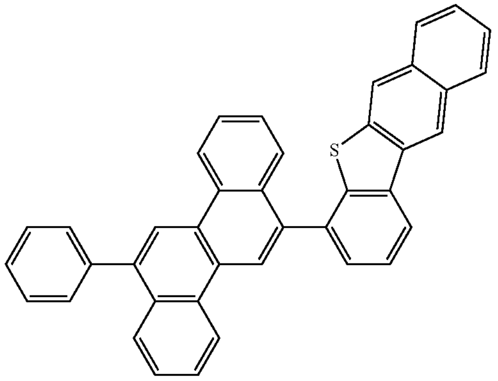

-continued
H122
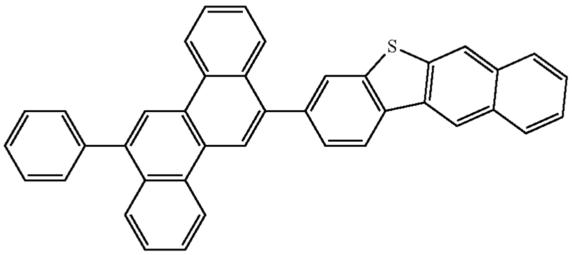
H123
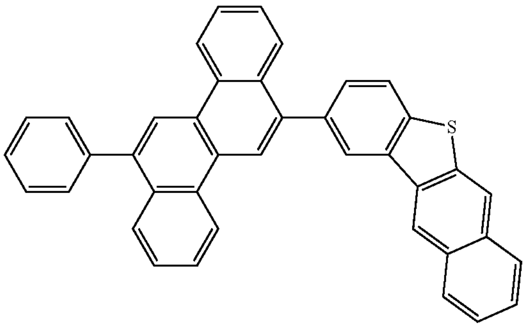
H124
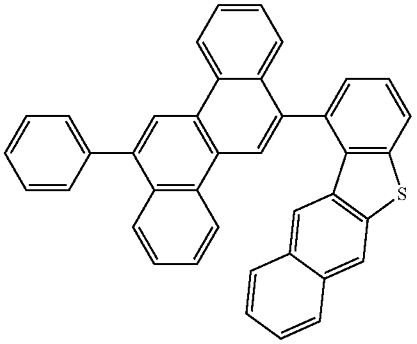
H125
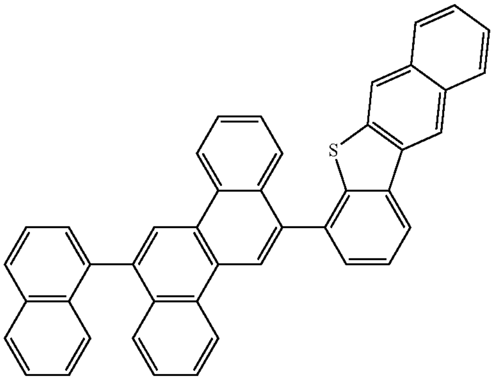
H126
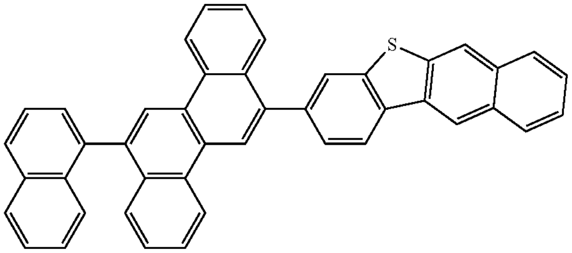
H127
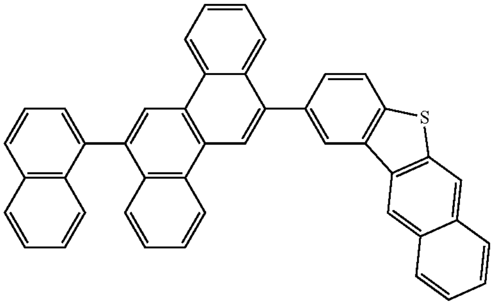
H128
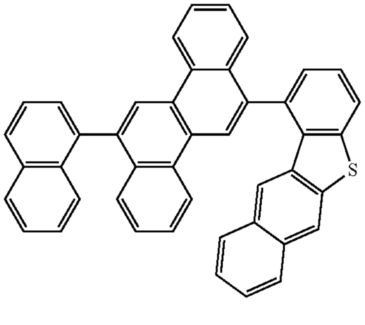
H129
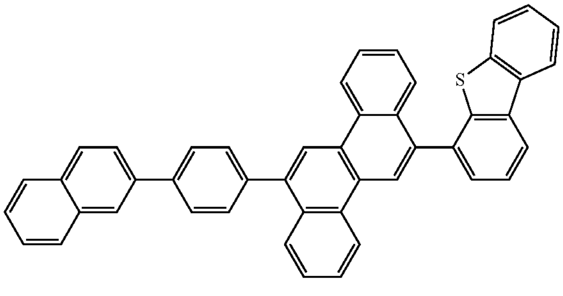
H130
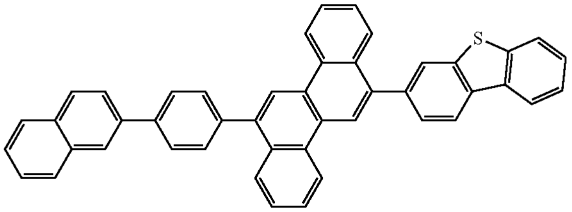
H131
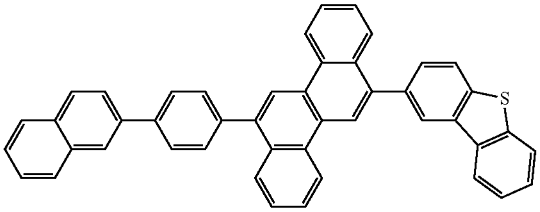

-continued
H132
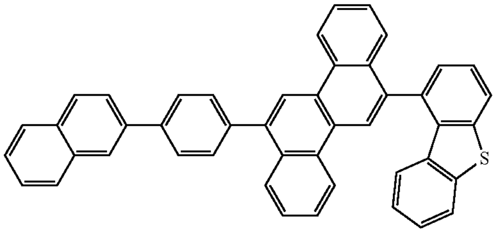
H133
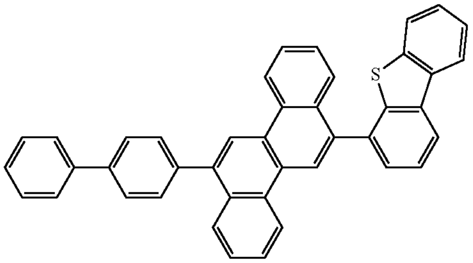
H134
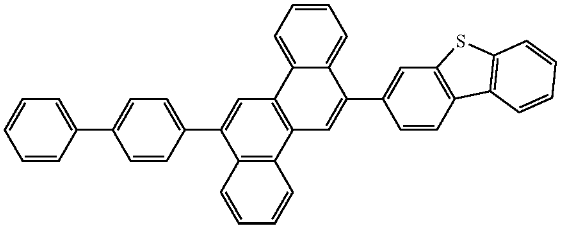
H135
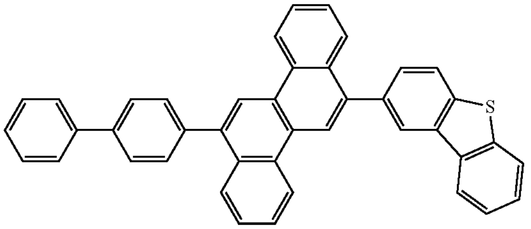
H136
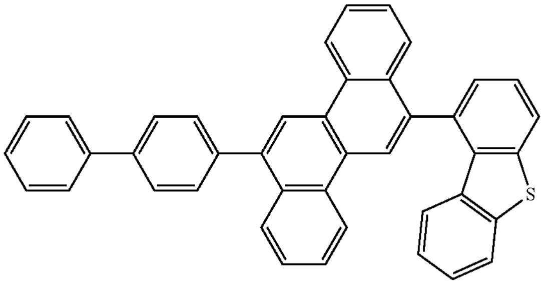
H137
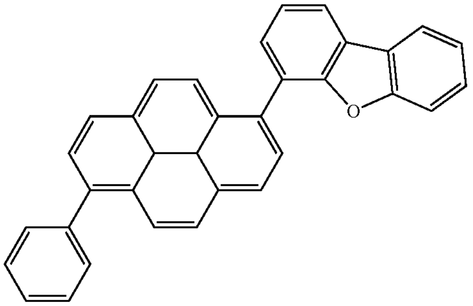
H138
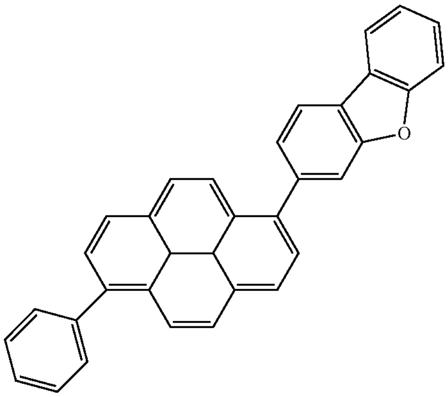
H139
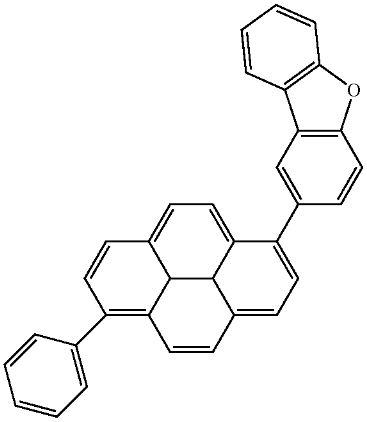

-continued
H140
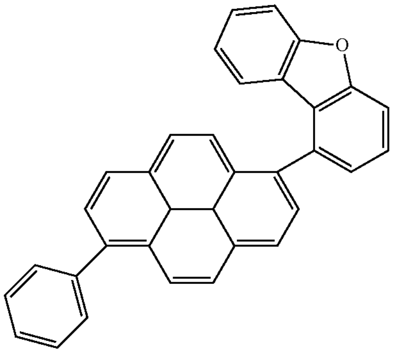
H141
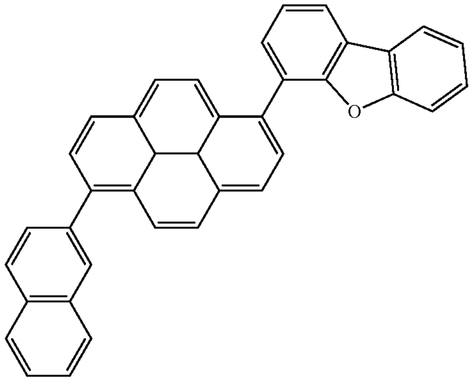
H142
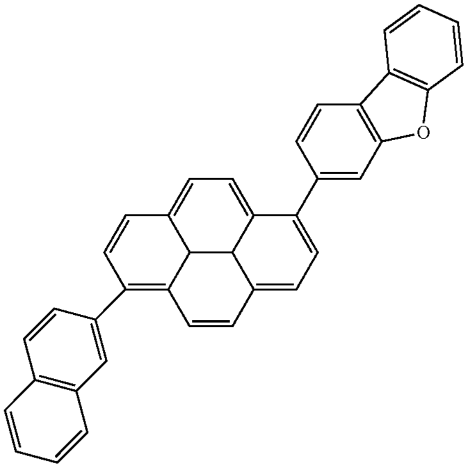
H143
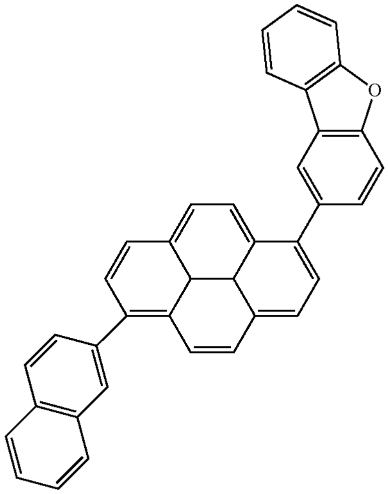
H144
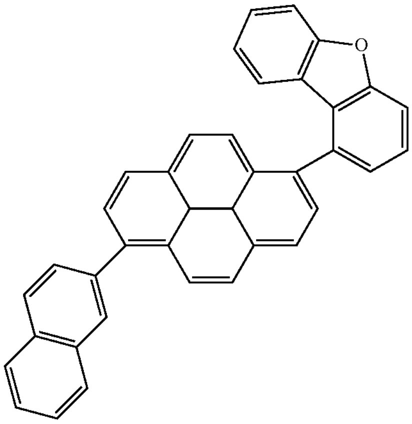
H145
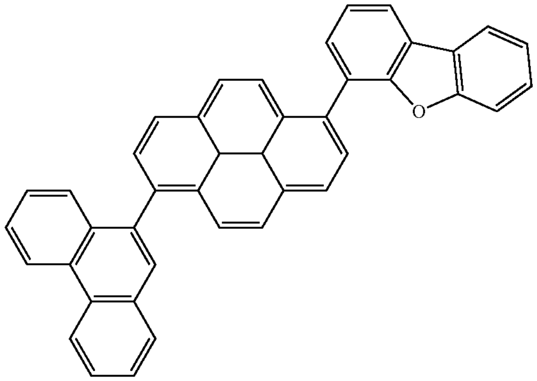

-continued
H146
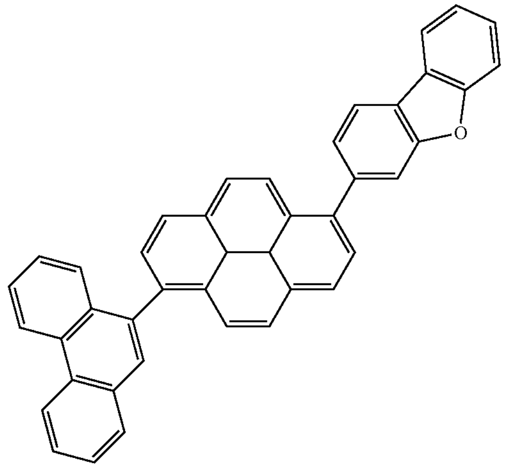
H147
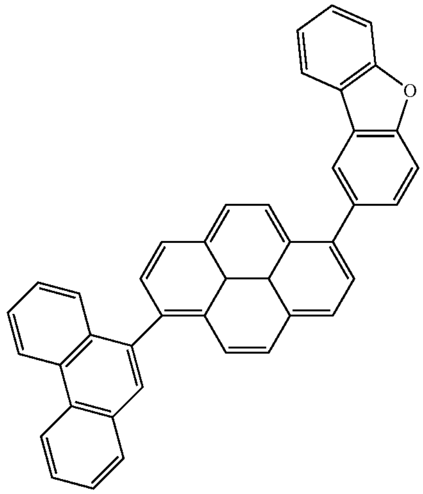
H148
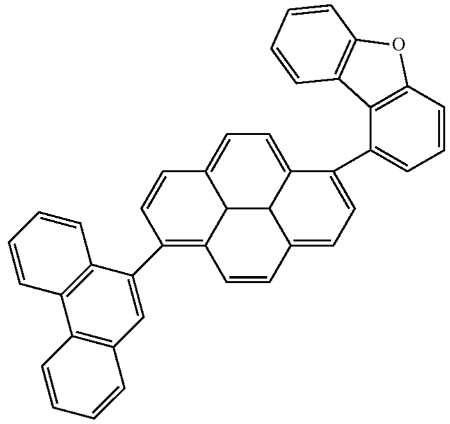
H149
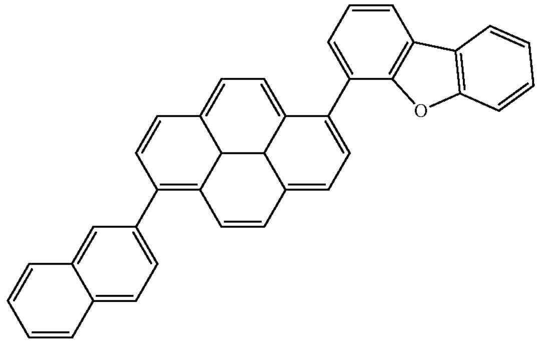
H150
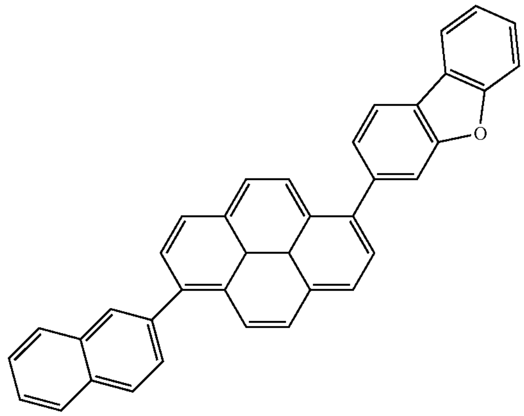
H151
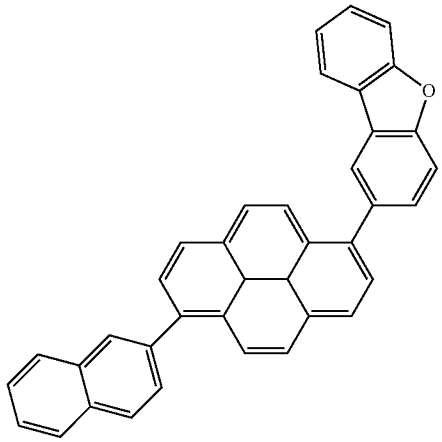

-continued
H152
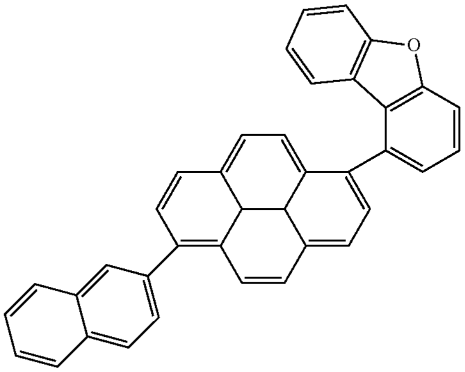
H153
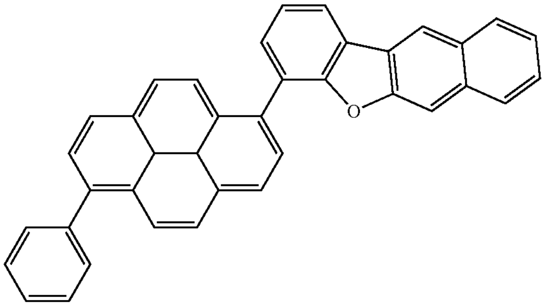
H154
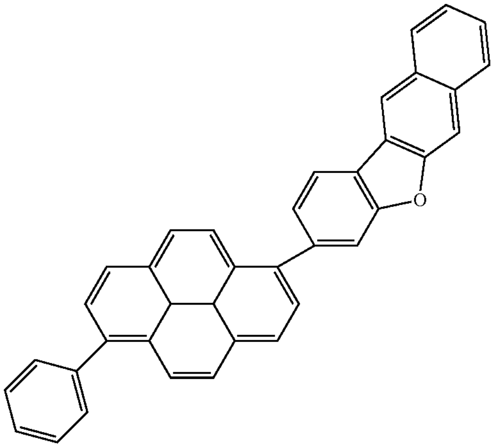
H155
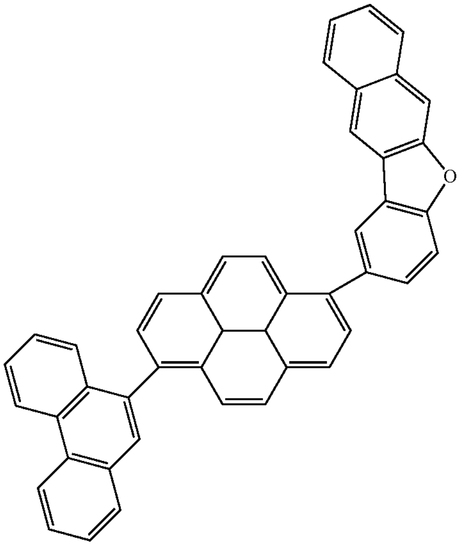
H156
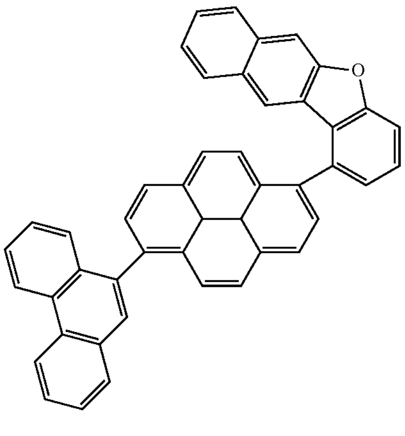
H157
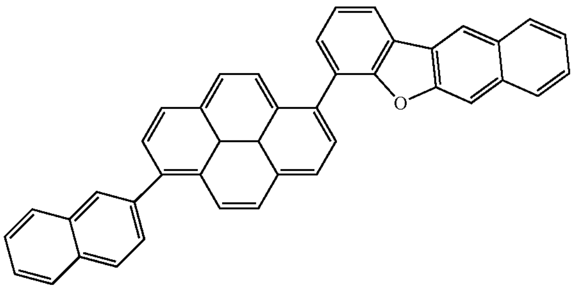

-continued
H158
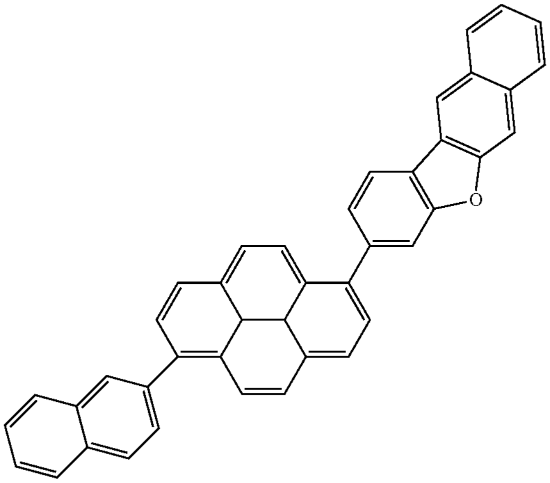
H159
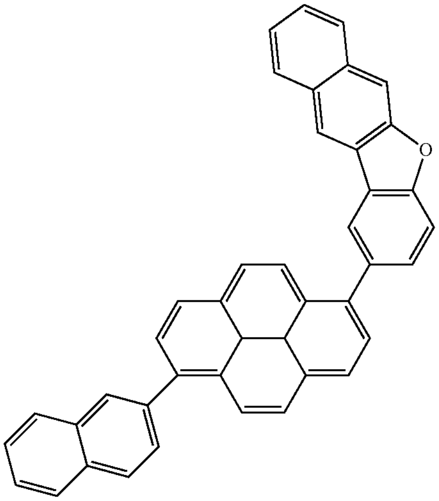
H160
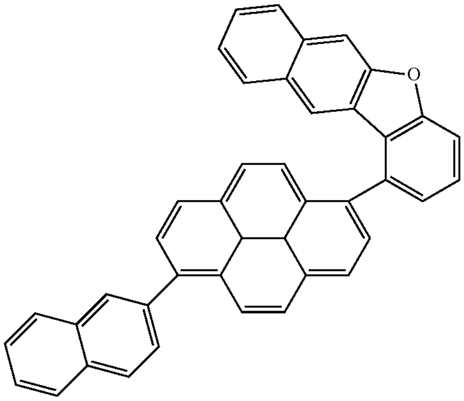
H161
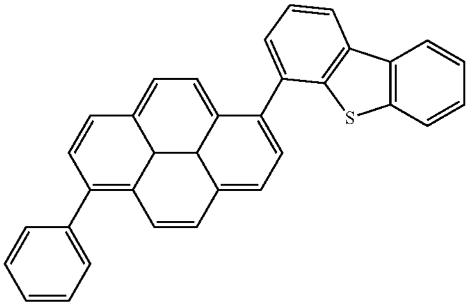
H162
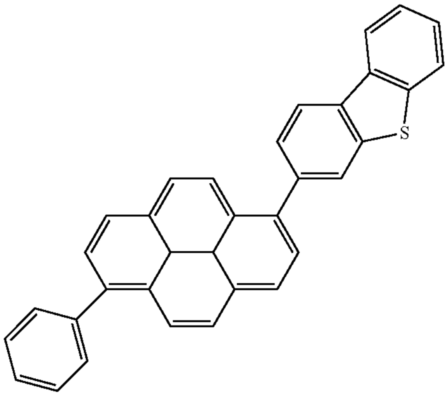
H163
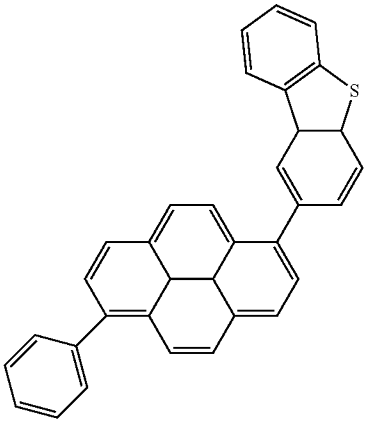

-continued
H164
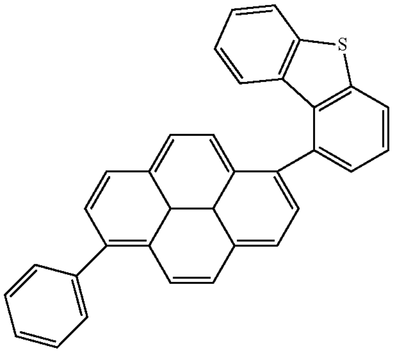
H165
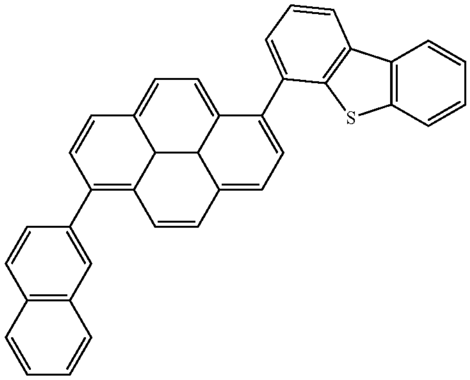
H166
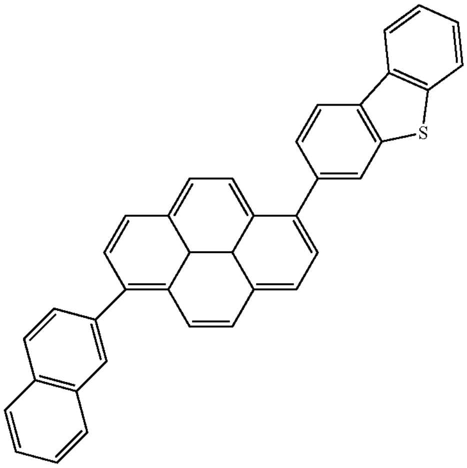
H167
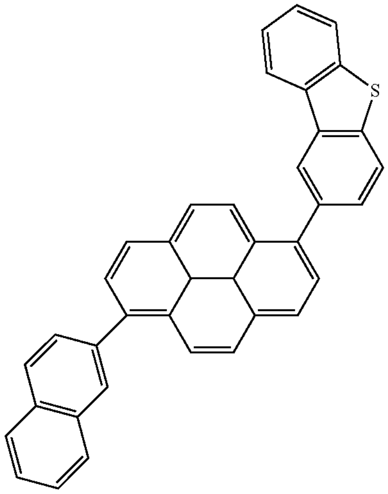
H168
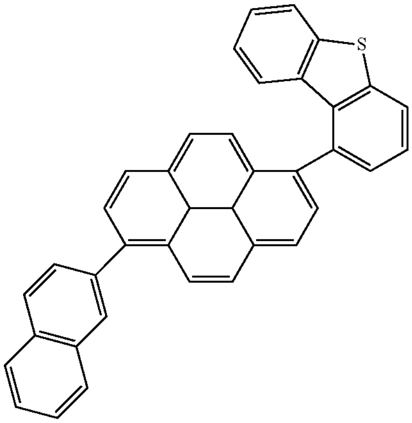
H169
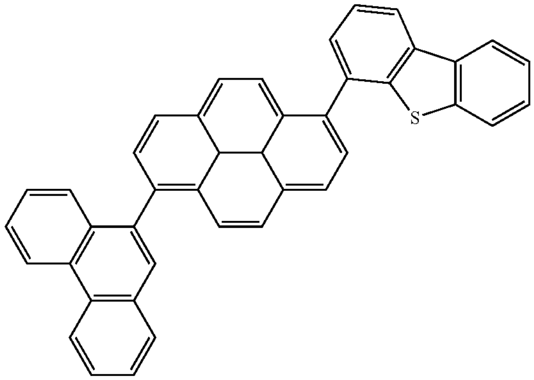

-continued
H170
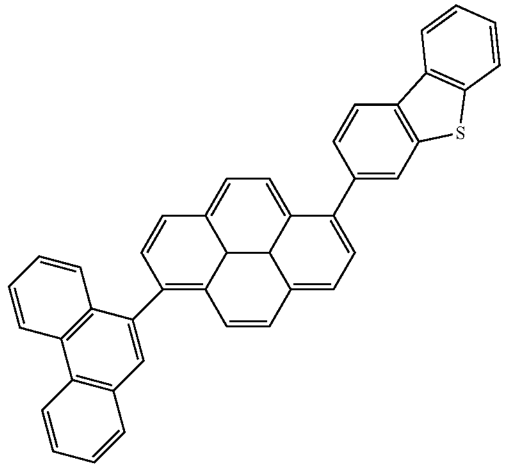
H171
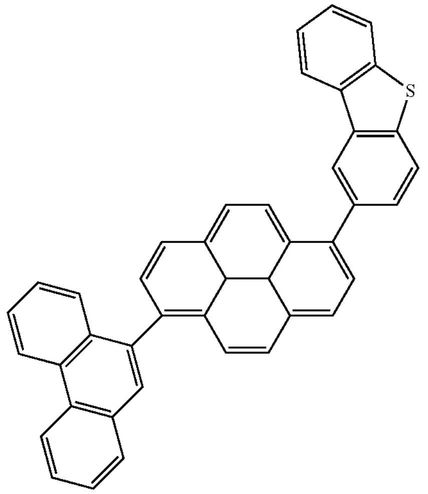
H172
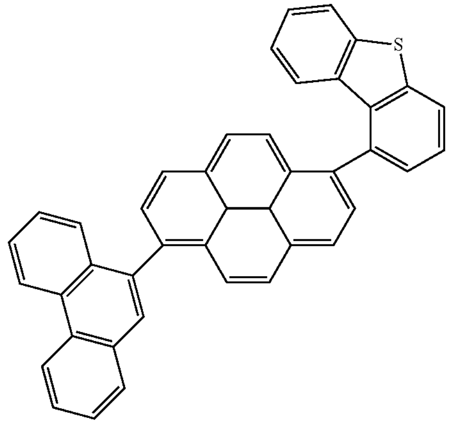
H173
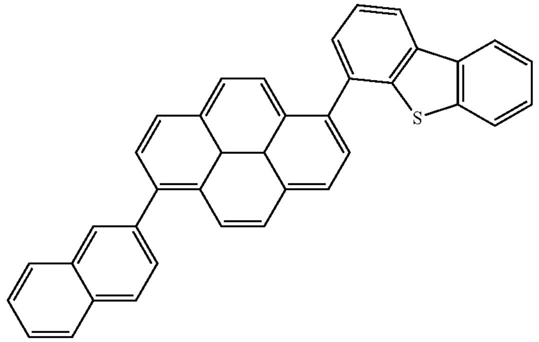
H174
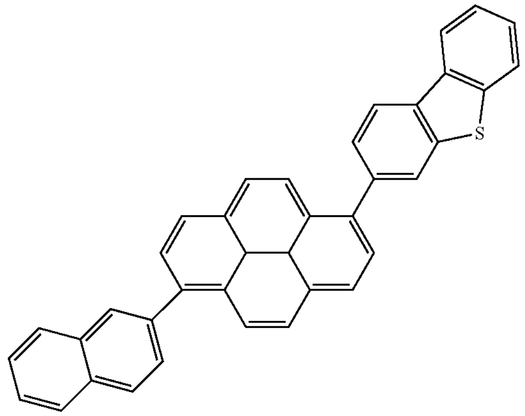
H175
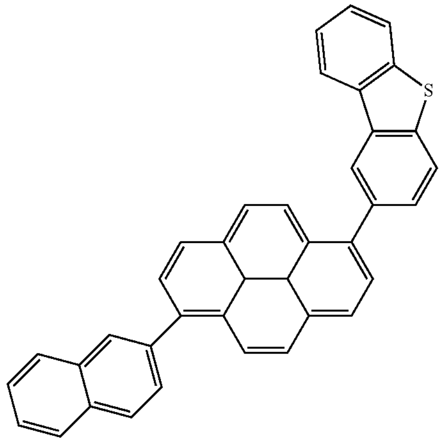

-continued
H176
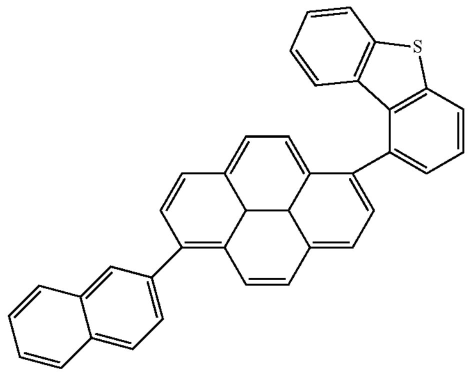
H177
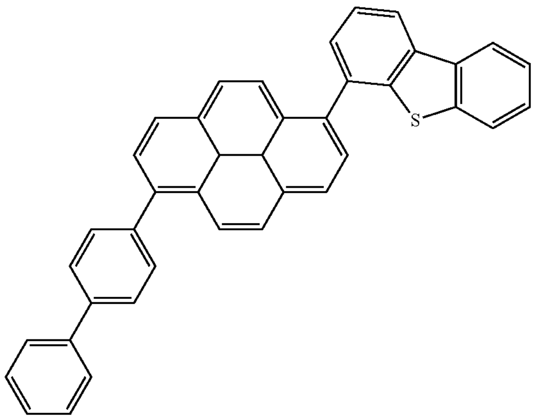
H178
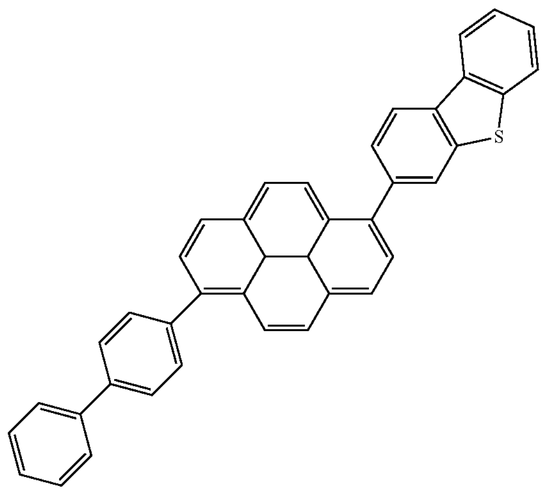
H179
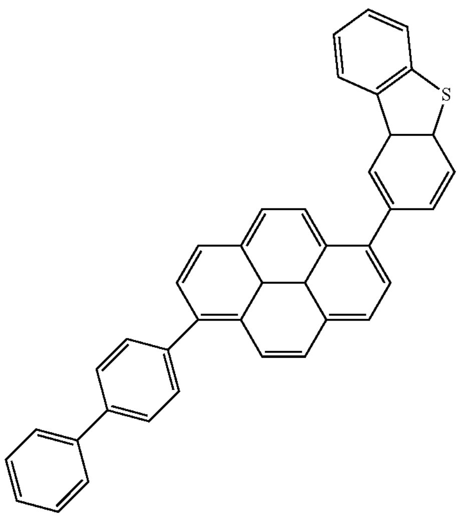
H180
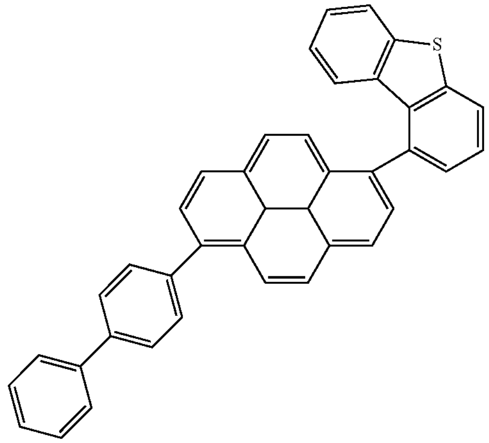
H181
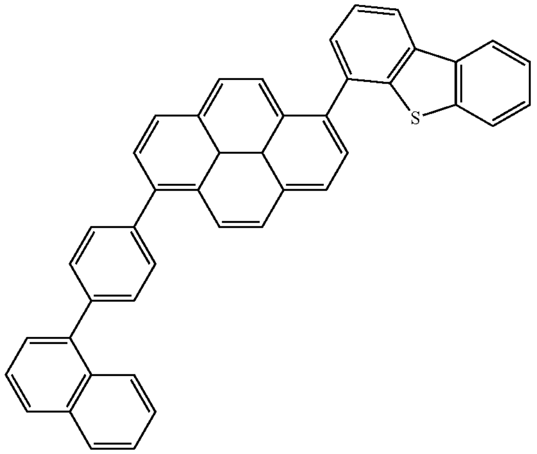

-continued

H182

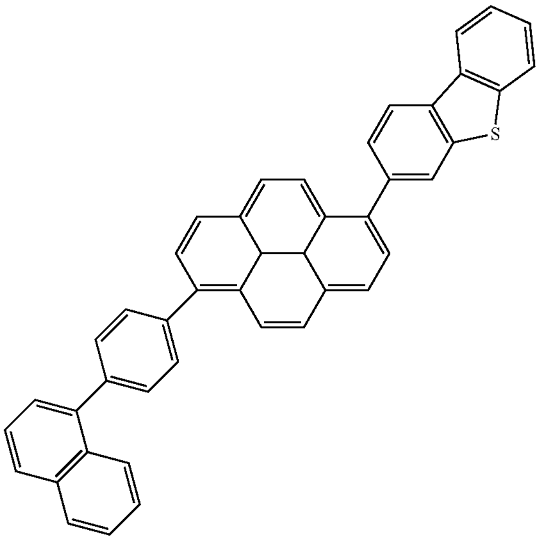

H183

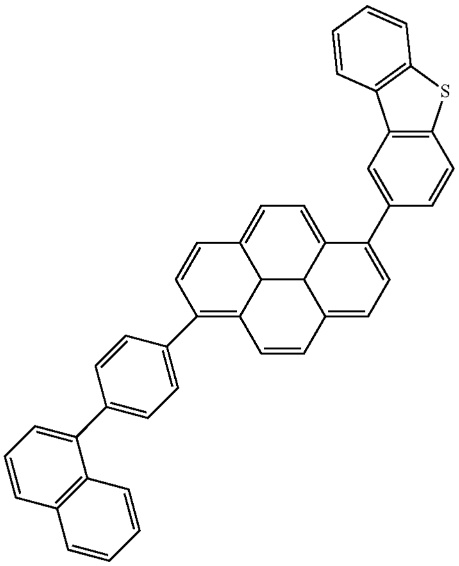

H184

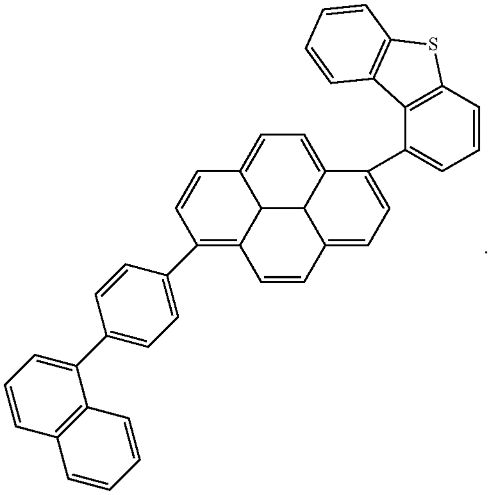

In one or more embodiments, in the organic light-emitting device, the first electrode may be an anode, the second electrode may be a cathode, the organic layer may include an emission auxiliary layer between the first electrode and the emission layer, the first compound may be included in the emission auxiliary layer, and the second compound may be included in the emission layer.

In one or more embodiments, in the organic light-emitting device, the first electrode may be an anode, the second electrode may be a cathode, and the organic layer may include i) a hole transport region between the first electrode and the emission auxiliary layer, the hole transport region including at least one of a hole injection layer, a hole transport layer, a buffer layer, and an electron blocking layer, and ii) an electron transport region between the emission layer and the second electrode, the electron transport region including at least one of a hole blocking layer, an electron transport layer, and an electron injection layer.

In one or more embodiments, the emission auxiliary layer and the emission layer may directly contact each other.

Since the organic light-emitting device includes the emission auxiliary layer disposed between the first electrode and the emission layer and including the first compound, and the emission layer including the second compound, energy may be effectively transferred from a host to a dopant in the emission layer, and a balance between the transfer of holes and electrons to the emission layer may be effectively achieved. Accordingly, it is possible to realize an organic light-emitting device having a low driving voltage, high efficiency, and a long lifespan.

FIG. 1 is a schematic view of an organic light-emitting device 10 according to an embodiment.

The organic light-emitting device 10 may include a first electrode 110, a hole transport layer 130, an emission auxiliary layer 140, an emission layer 150, an electron transport layer 170, and a second electrode 190, which are sequentially stacked in this stated order.

Figure 2:
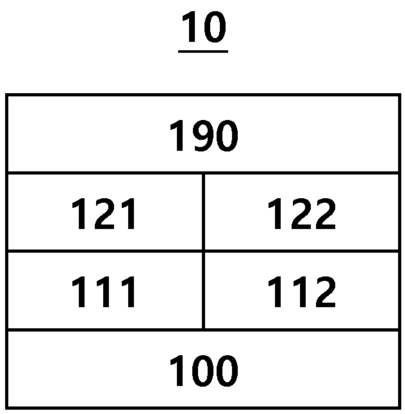
Figure 3:
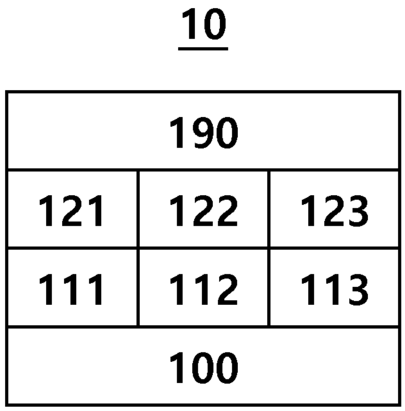
Figure 4:
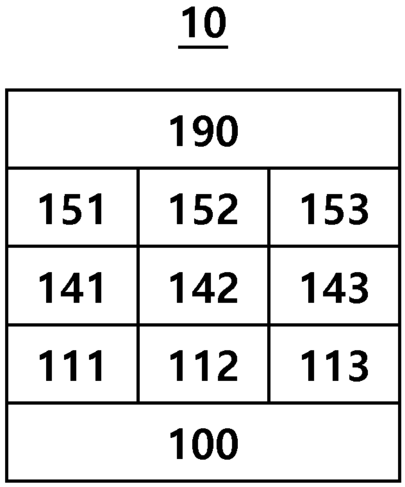

FIGS. 2 to 4 are other schematic views of an organic light-emitting device 10 according to an embodiment.

The organic light-emitting device 10 may include a substrate 100 comprising at least a first sub-pixel region, and a second sub-pixel region, a first sub-pixel electrode 111 disposed in the first sub-pixel region of the substrate, a first sub-pixel organic layer 121 disposed on the first sub-pixel electrode, a second sub-pixel electrode 112 disposed in the second sub-pixel region of the substrate, a second sub-pixel organic layer 122 disposed on the second sub-pixel electrode, and a second electrode 190 disposed on the first sub-pixel organic layer and the second sub-pixel organic layer, the first sub-pixel organic layer 121 may comprise a first compound represented by one selected from Formulae 1A and 1B, and the second sub-pixel organic layer 122 may comprise a second compound represented by one selected from Formulae 2A to 2C.

In one or more embodiments, in Formulae 1A, 1B, 2A to 2C, and 10, $A_{21}$, $A_{31}$, $A_{32}$, $A_{41}$, and $A_{42}$ may each independently be a group represented by Formula 10, m21, m31, m32, m41, and m42 may each independently be an integer from 1 to 3, $X_1$ may be O or S, $X_2$ may be selected from a single bond, O, and S, ring $B_1$ and ring $B_2$ may each independently be selected from benzene and naphthalene, $L_1$ to $L_{12}$, $L_{21}$, $L_{22}$, $L_{31}$ to $L_{33}$, and $L_{41}$ to $L_{43}$ may each independently be selected from a substituted or unsubstituted $C_3$-$C_{10}$ cycloalkylene group, a substituted or <Formula 1A>

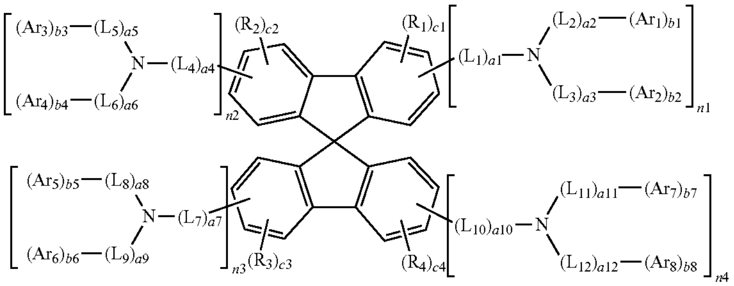

<Formula 1B>

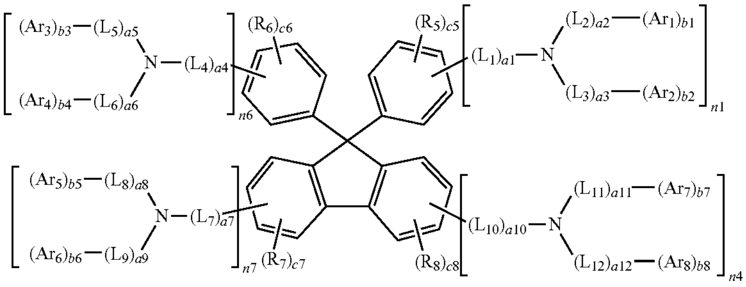

<Formula 2A>

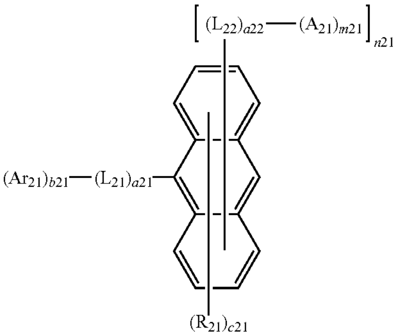

<Formula 2B>

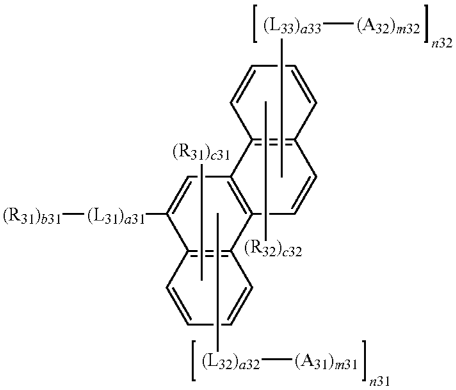

<Formula 2C>

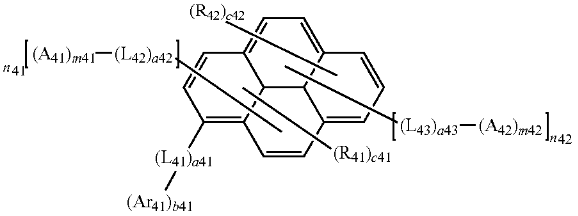

<Formula 10>

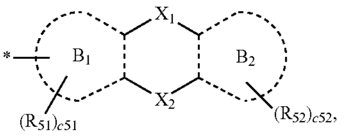

unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, a1 to a12, a21, a22, a31 to a33, and a41 to a43 may each independently be an integer from 0 to 3, $Ar_1$ to $Ar_8$, $Ar_{21}$, $Ar_{31}$, and $Ar_{41}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, except: 1) if $L_8$ and $L_9$ in Formula 1B are phenylene, $Ar_8$ and Are in Formula 1B may each independently be selected from a substituted or unsubstituted phenyl group, a substituted or unsubstituted biphenyl group, a substituted or unsubstituted terphenyl group, a substituted or unsubstituted pentalenyl group, a substituted or unsubstituted indenyl group, a substituted or unsubstituted naphthyl group, a substituted or unsubstituted azulenyl group, a substituted or unsubstituted heptalenyl group, a substituted or unsubstituted indacenyl group, a substituted or unsubstituted acenaphthyl group, a substituted or unsubstituted fluorenyl group, a substituted or unsubstituted spiro-fluorenyl group, a substituted or unsubstituted benzofluorenyl group, a substituted or unsubstituted dibenzofluorenyl group, a substituted or unsubstituted phenalenyl group, a substituted or unsubstituted phenanthrenyl group, a substituted or unsubstituted anthracenyl group, a substituted or unsubstituted fluoranthenyl group, a substituted or unsubstituted triphenylenyl group, a substituted or unsubstituted pyrenyl group, a substituted or unsubstituted chrysenyl group, a substituted or unsubstituted naphthacenyl group, a substituted or unsubstituted picenyl group, a substituted or unsubstituted perylenyl group, a substituted or unsubstituted pentaphenyl group, a substituted or unsubstituted hexacenyl group, a substituted or unsubstituted pentacenyl group, a substituted or unsubstituted rubicenyl group, a substituted or unsubstituted coronenyl group, a substituted or unsubstituted ovalenyl group, a substituted or unsubstituted pyrrolyl group, a substituted or unsubstituted thiophenyl group, a substituted or unsubstituted furanyl group, a substituted or unsubstituted imidazolyl group, a substituted or unsubstituted pyrazolyl group, a substituted or unsubstituted thiazolyl group, a substituted or unsubstituted isothiazolyl group, a substituted or unsubstituted oxazolyl group, a substituted or unsubstituted isoxazolyl group, a substituted or unsubstituted pyridinyl group, a substituted or unsubstituted pyrazinyl group, a substituted or unsubstituted pyrimidinyl group, a substituted or unsubstituted pyridazinyl group, a substituted or unsubstituted isoindolyl group, a substituted or unsubstituted indolyl group, a substituted or unsubstituted indazolyl group, a substituted or unsubstituted purinyl group, a substituted or unsubstituted quinolinyl group, a substituted or unsubstituted isoquinolinyl group, a substituted or unsubstituted benzoquinolinyl group, a substituted or unsubstituted phthalazinyl group, a substituted or unsubstituted naphthyridinyl group, a substituted or unsubstituted quinoxalinyl group, a substituted or unsubstituted quinazolinyl group, a substituted or unsubstituted cinnolinyl group, a substituted or unsubstituted carbazolyl group, a substituted or unsubstituted phenanthridinyl group, a substituted or unsubstituted acridinyl group, a substituted or unsubstituted phenanthrolinyl group, a substituted or unsubstituted phenazinyl group, a substituted or unsubstituted benzimidazolyl group, a substituted or unsubstituted benzofuranyl group, a substituted or unsubstituted benzothiophenyl group, a substituted or unsubstituted isobenzothiazolyl group, a substituted or unsubstituted benzoxazolyl group, a substituted or unsubstituted isobenzoxazolyl group, a substituted or unsubstituted triazolyl group, a substituted or unsubstituted tetrazolyl group, a substituted or unsubstituted oxadiazolyl group, a substituted or unsubstituted triazinyl group, a substituted or unsubstituted benzocarbazolyl group, a substituted or unsubstituted dibenzocarbazolyl group, a substituted or unsubstituted thiadiazolyl group, a substituted or unsubstituted imidazopyridinyl group, a substituted or unsubstituted imidazopyrimidinyl group, a substituted or unsubstituted benzoxanthenyl group, a substituted or unsubstituted dibenzodioxinyl group, and —$Si(Q_1)(Q_2)(Q_3)$, and 2) if $L_{11}$ and $L_{12}$ in Formula 1B are phenylene, $Ar_7$ and $Ar_8$ in Formula 1B may each independently be selected from a substituted or unsubstituted phenyl group, a substituted or unsubstituted biphenyl group, a substituted or unsubstituted terphenyl group, a substituted or unsubstituted pentalenyl group, a substituted or unsubstituted indenyl group, a substituted or unsubstituted naphthyl group, a substituted or unsubstituted azulenyl group, a substituted or unsubstituted heptalenyl group, a substituted or unsubstituted indacenyl group, a substituted or unsubstituted acenaphthyl group, a substituted or unsubstituted fluorenyl group, a substituted or unsubstituted spiro-fluorenyl group, a substituted or unsubstituted benzofluorenyl group, a substituted or unsubstituted dibenzofluorenyl group, a substituted or unsubstituted phenalenyl group, a substituted or unsubstituted phenanthrenyl group, a substituted or unsubstituted anthracenyl group, a substituted or unsubstituted fluoranthenyl group, a substituted or unsubstituted triphenylenyl group, a substituted or unsubstituted pyrenyl group, a substituted or unsubstituted chrysenyl group, a substituted or unsubstituted naphthacenyl group, a substituted or unsubstituted picenyl group, a substituted or unsubstituted perylenyl group, a substituted or unsubstituted pentaphenyl group, a substituted or unsubstituted hexacenyl group, a substituted or unsubstituted pentacenyl group, a substituted or unsubstituted rubicenyl group, a substituted or unsubstituted coronenyl group, a substituted or unsubstituted ovalenyl group, a substituted or unsubstituted pyrrolyl group, a substituted or unsubstituted thiophenyl group, a substituted or unsubstituted furanyl group, a substituted or unsubstituted imidazolyl group, a substituted or unsubstituted pyrazolyl group, a substituted or unsubstituted thiazolyl group, a substituted or unsubstituted isothiazolyl group, a substituted or unsubstituted oxazolyl group, a substituted or unsubstituted isoxazolyl group, a substituted or unsubstituted pyridinyl group, a substituted or unsubstituted pyrazinyl group, a substituted or unsubstituted pyrimidinyl group, a substituted or unsubstituted pyridazinyl group, a substituted or unsubstituted isoindolyl group, a substituted or unsubstituted indolyl group, a substituted or unsubstituted indazolyl group, a substituted or unsubstituted purinyl group, a substituted or unsubstituted quinolinyl group, a substituted or unsubstituted isoquinolinyl group, a substituted or unsubstituted benzoquinolinyl group, a substituted or unsubstituted phthalazinyl group, a substituted or unsubstituted naphthyridinyl group, a substituted or unsubstituted quinoxalinyl group, a substituted or unsubstituted quinazolinyl group, a substituted or unsubstituted cinnolinyl group, a substituted or unsubstituted carbazolyl group, a substituted or unsubstituted phenanthridinyl group, a substituted or unsubstituted acridinyl group, a substituted or unsubstituted phenanthrolinyl group, a substituted or unsubstituted phenazinyl group, a substituted or unsubstituted benzimidazolyl group, a substituted or unsubstituted benzofuranyl group, a substituted or unsubstituted benzothiophenyl group, a substituted or unsubstituted isobenzothiazolyl group, a substituted or unsubstituted benzoxazolyl group, a substituted or unsubstituted isobenzoxazolyl group, a substituted or unsubstituted triazolyl group, a substituted or unsubstituted tetrazolyl group, a substituted or unsubstituted oxadiazolyl group, a substituted or unsubstituted triazinyl group, a substituted or unsubstituted benzocarbazolyl group, a substituted or unsubstituted dibenzocarbazolyl group, a substituted or unsubstituted thiadiazolyl group, a substituted or unsubstituted imidazopyridinyl group, a substituted or unsubstituted imidazopyrimidinyl group, a substituted or unsubstituted benzoxanthenyl group, a substituted or unsubstituted dibenzodioxinyl group, and —$Si(Q_1)(Q_2)(Q_3)$, b1 to b8, b21, b31, and b41 may each independently be an integer from 1 to 5, $Ar_1$ and $Ar_2$ are optionally linked to form a saturated or unsaturated ring, $Ar_3$ and $Ar_4$ are optionally linked to form a saturated or unsaturated ring, $Ar_5$ and $Ar_6$ are optionally linked to form a saturated or unsaturated ring, and $Ar_7$ and $Ar_8$ are optionally linked to form a saturated or unsaturated ring, $R_1$ to $R_8$, $R_{21}$, $R_{31}$, $R_{32}$, $R_{41}$, $R_{42}$, $R_{51}$, and $R_{52}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, and —$Si(Q_1)(Q_2)(Q_3)$, c1 to c4, c7, and c8 may each independently be an integer from 0 to 4, c5 and c6 are each independently an integer from 0 to 5, c21 is an integer from 0 to 8, c31 and c32 are each independently an integer from 0 to 5, c41 and c42 are each independently an integer from 0 to 4, and c51 and c52 are each independently an integer from 0 to 6, n1 to n4, n7, and n8 may each independently be an integer from 0 to 4, and n5 and n6 are each independently an integer from 0 to 5, provided that the sum of n1, n2, n3, and n4 is one or more and the sum of n5, n6, n7, and n8 is one or more, n21 is an integer from 1 to 3, and n31 and n32 are each independently an integer from 0 to 3, provided that n31+n32 is one or more, and n41 and n42 are each independently an integer from 0 to 3, provided that n41+n42 is one or more, and at least one substituent selected from a substituent(s) of the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be selected from:

a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$Si(Q_{11})(Q_{12})(Q_{13})$, and —$N(Q_{14})(Q_{15})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with a least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si$(Q_{21})(Q_{22})(Q_{23})$, and —N$(Q_{24})(Q_{25})$; and Si$(Q_{31})(Q_{32})(Q_{33})$ and —N$(Q_{34})(Q_{35})$, wherein $Q_1$ to $Q_3$, $Q_{11}$ to $Q_{15}$, $Q_{21}$ to $Q_{25}$, and $Q_{31}$ to $Q_{35}$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group, and

* indicates a binding site to a neighboring atom.

In one or more embodiments, the first sub-pixel electrode 111 and the second sub-pixel electrode 112 may each be an anode, and the second electrode 190 may be a cathode.

In one or more embodiments, the first sub-pixel organic layer 121 may comprise a first sub-pixel emission layer 151, and a first sub-pixel emission auxiliary layer 141 between the first sub-pixel electrode 111 and the first sub-pixel emission layer 151, and the second sub-pixel organic layer 122 may comprise a second sub-pixel emission layer 152, and a second sub-pixel emission auxiliary layer 142 between the second sub-pixel electrode 112 and the second sub-pixel emission layer 152, wherein the first sub-pixel emission auxiliary layer 141 may comprise the first compound, and the second sub-pixel emission layer 152 may comprise the second compound.

In one or more embodiments, the first sub-pixel emission layer 151 may emit first color light, and the second sub-pixel emission layer 152 may emit second color light, wherein, (i) the first color light may be red, and the second color light may be green, (ii) the first color light may be green, and the second color light may be red, (iii) the first color light may be red, and the second color light may be blue, (iv) the first color light may be blue, and the second color light may be red, (v) the first color light may be green, and the second color light may be blue, or (vi) the first color light may be blue, and the second color light may be green.

In one or more embodiments, the substrate 100 may further comprise a third sub-pixel region, and the organic light-emitting device 10 may further comprise a third sub-pixel electrode 113 disposed on the third sub-pixel region, a third sub-pixel organic layer 123 disposed on the third sub-pixel electrode 113 and comprising a third sub-pixel emission layer 153 and a third sub-pixel emission auxiliary layer 143.

In one or more embodiments, the third sub-pixel emission layer 153 may emit third color light, wherein, the third color light may be red, green or blue.

In FIG. 1, a substrate may be additionally disposed under the first electrode 110 or above the second electrode 190. The substrate may be a glass substrate or a transparent plastic substrate, each having excellent mechanical strength, thermal stability, transparency, surface smoothness, ease of handling, and water resistance.

The first electrode 110 may be formed by depositing or sputtering a material for forming the first electrode 110 on the substrate. When the first electrode 110 is an anode, the material for forming the first electrode 110 may be selected from materials with a high work function to facilitate hole injection. The first electrode 110 may be a reflective electrode, a semi-transmissive electrode, or a transmissive electrode. The material for forming the first electrode may be a transparent and highly conductive material, and examples of such a material are indium tin oxide (ITO), indium zinc oxide (IZO), tin oxide ($SnO_2$), and zinc oxide (ZnO). When the first electrode 110 is a semi-transmissive electrode or a reflective electrode, at least one selected from magnesium (Mg), aluminum (Al), aluminum-lithium (Al—Li), calcium (Ca), magnesium-indium (Mg—In), and magnesium-silver (Mg—Ag) may be used as a material for forming the first electrode 110. In FIGS. 2 to 4, the first sub-pixel electrode 111, the second sub-pixel electrode 112, and the third sub-pixel electrode 113 may be understood by referring to the descriptions provided in connection with the first electrode.

The first electrode 110 may have a single-layered structure, or a multi-layered structure including two or more layers. For example, the first electrode 110 may have a three-layered structure of ITO/Ag/ITO, but the structure of the first electrode 110 is not limited thereto.

Holes provided by the first electrode 110 may arrive at the emission layer 150 through the hole transport region 130.

The hole transport region 130 may have a single-layered structure formed of a single material, a single-layered structure formed of a plurality of different materials, or a multi-layered structure having a plurality of layers formed of a plurality of different materials.

For example, the hole transport region 130 may include a hole injection layer or a hole transport layer, or may have a hole injection layer/hole transport layer structure, a hole injection layer/hole transport layer/buffer layer structure, a hole injection layer/buffer layer structure, or a hole transport layer/buffer layer structure, wherein, in each structure, constituting layers are sequentially stacked on the first electrode 110 in this stated order.

When the hole transport region includes a hole injection layer, the hole injection layer may be formed on the first electrode 110 by using one or more suitable methods selected from vacuum deposition, spin coating, casting, Langmuir-Blodgett (LB) deposition, inkjet printing, laser printing, and laser-induced thermal imaging.

When a hole injection layer is formed by vacuum deposition, for example, the vacuum deposition may be performed at a deposition temperature of about 100° C. to about 500° C., at a vacuum degree of about 10-8 torr to about 10-3 torr, and at a deposition rate of about 0.01 Å/see to about 100 Å/see by taking into account the compound for the hole injection layer to be deposited and the structure of the hole injection layer to be formed.

When a hole injection layer is formed by spin coating, the spin coating may be performed at a coating rate of about 2,000 rpm to about 5,000 rpm and at a temperature of about 80° C. to 200° C. by taking into account the compound for the hole injection layer to be deposited and the structure of the hole injection layer to be formed.

When the hole transport region includes a hole transport layer, the hole transport layer may be formed on the first electrode 110 or the hole injection layer by using one or more suitable methods selected from vacuum deposition, spin coating, casting, an LB method, inkjet printing, laser printing, and laser-induced thermal imaging. When the hole transport layer is formed by vacuum deposition or spin coating, deposition and coating conditions for the hole transport layer may be determined by referring to the deposition and coating conditions for the hole injection layer.

The hole transport region may include at least one selected from m-MTDATA, TDATA, 2-TNATA, NPB, B—NPB, TPD, Spiro-TPD, Spiro-NPB, methylated-NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonicacid (PANI/CSA), polyaniline/poly(4-styrenesulfonate) (PANI/PSS), a compound represented by Formula 201 below, and a compound represented by Formula 202 below:

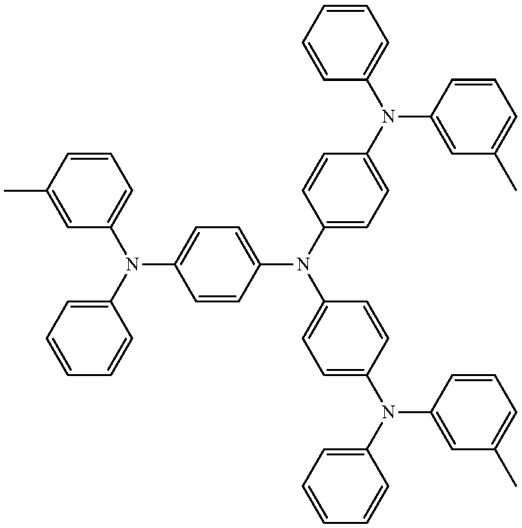

m-MTDATA

-continued

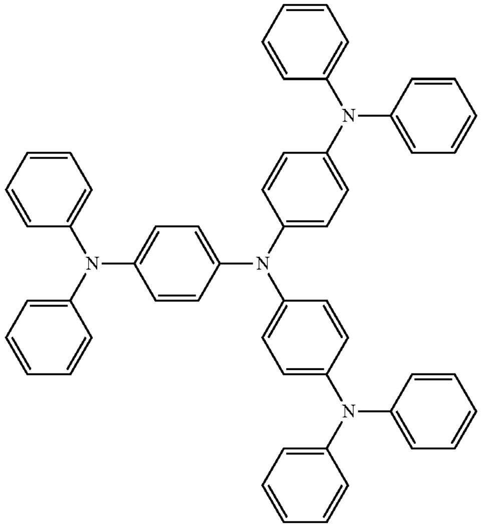

TDATA

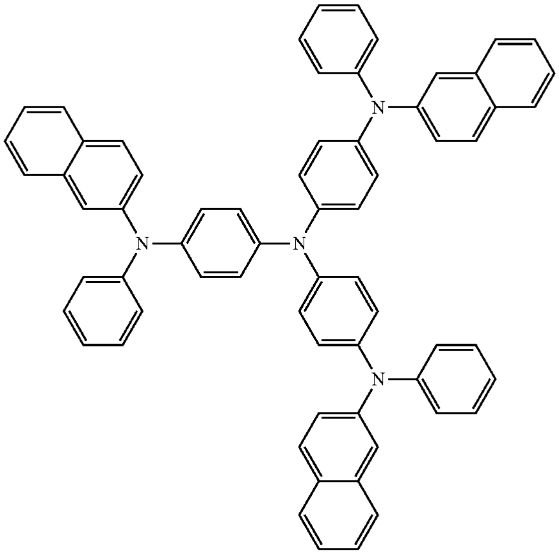

2-TNATA

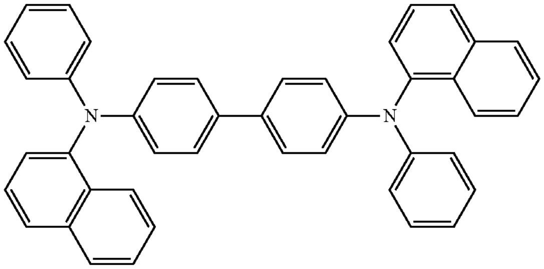

NPB

-continued

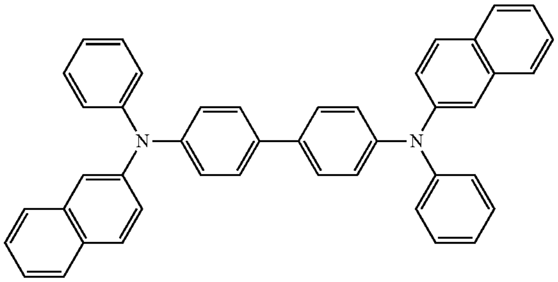

β-NPB

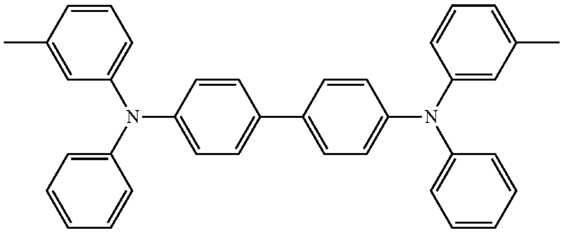

TPD

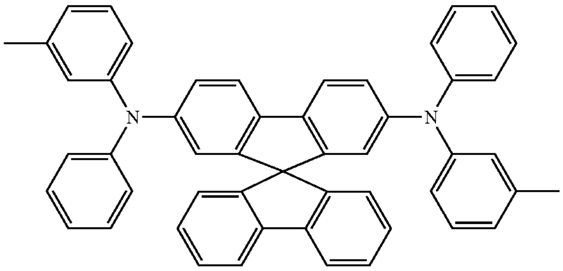

Spiro-TPD

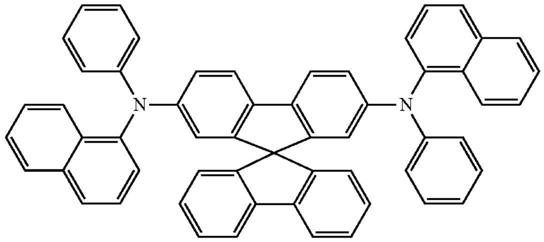

Spiro-NPB

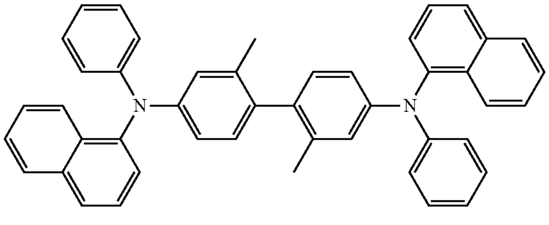

methylated NPB

-continued

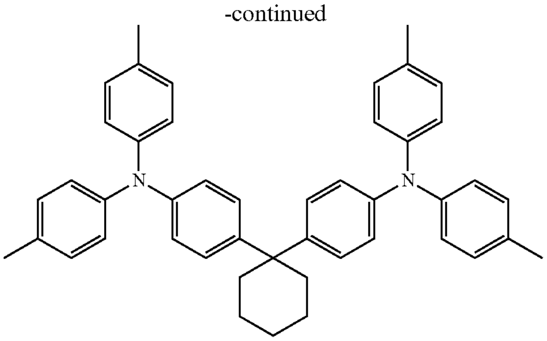

TAPC

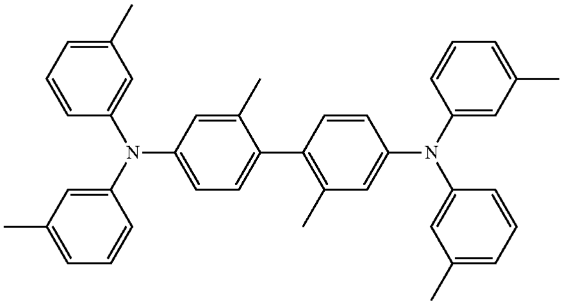

HMTPD

<Formula 201>

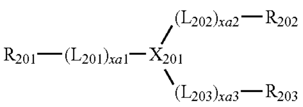

<Formula 202>

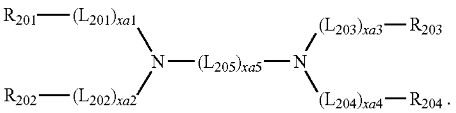

In Formulae 201 and 202, $X_{201}$ may be selected from N, B, and P, $L_{201}$ to $L_{205}$ may be the same as explained in connection with $L_1$;

xa1 to xa4 may each independently be selected from 0, 1, 2, and 3;

xa5 may be selected from 1, 2, 3, 4, and 5; and $R_{201}$ to $R_{204}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

In one or more embodiments, in Formulae 201 and 202, $L_{201}$ to $L_{205}$ may each independently be selected from:

a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group; and a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, an isoindolyl group, a quinolinyl group, an isoquinolinyl group, a quinoxalinyl group, a quinazolinyl group, a carbazolyl group, and a triazinyl group;

xa1 to xa4 may each independently be 0, 1, or 2;

xa5 may be 1, 2, or 3;

$R_{201}$ to $R_{204}$ may each independently be selected from:

a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, an azulenyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, but they are not limited thereto.

The compound represented by Formula 201 may be represented by Formula 201A:

<Formula 201A>

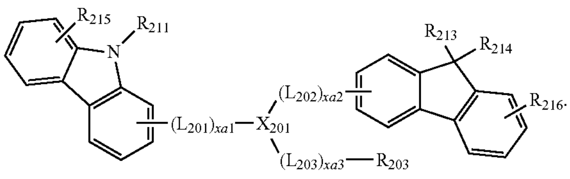

In one or more embodiments, the compound represented by Formula 201 may be represented by Formula 201A-1 below, but is not limited thereto:

<Formula 201A-1>

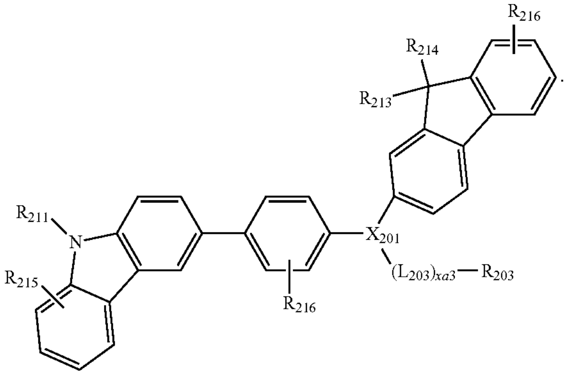

For example, the compound represented by Formula 202 may be represented by Formula 202A below, but is not limited thereto:

<Formula 202A>

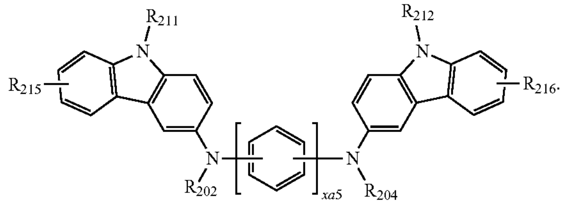

Regarding Formulae 201A, 201A-1, and 202A, $X_{201}$, $L_{201}$ to $L_{203}$, xa1 to xa3, xa5, and $R_{202}$ to $R_{204}$ are the same as described above, $R_{211}$ and $R_{212}$ are the same as described in connection with $R_{203}$, and $R_{213}$ to $R_{216}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_5$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group.

The compound represented by Formula 201 and the compound represented by Formula 202 may each include compounds HT1 to HT20 illustrated below, but are not limited thereto.

HT1

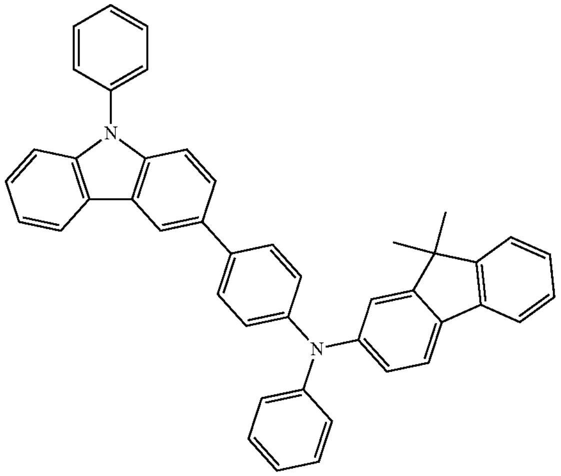

HT2

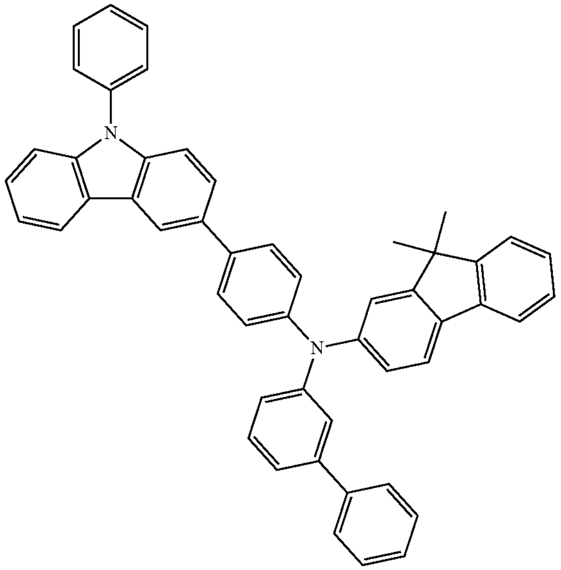

-continued

HT3

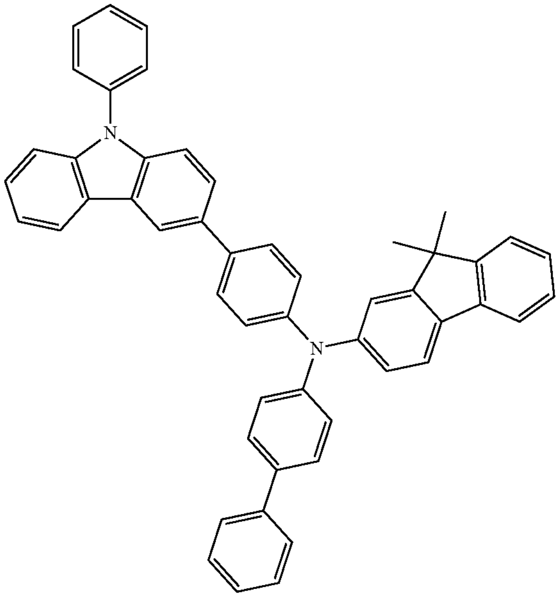

HT4

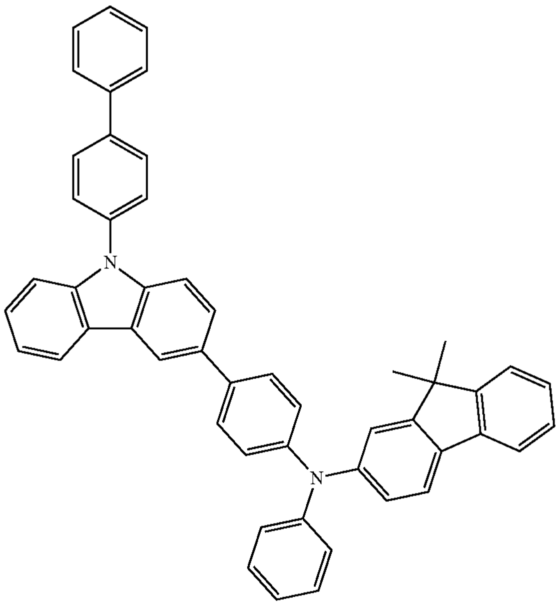

-continued
HT5
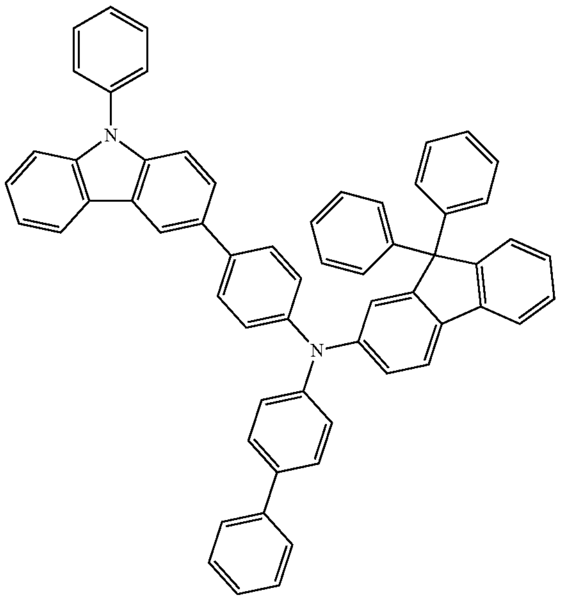
HT6
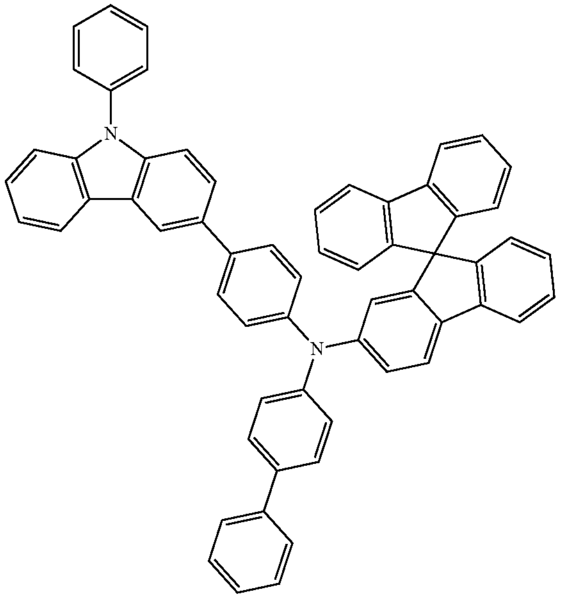
-continued
HT7
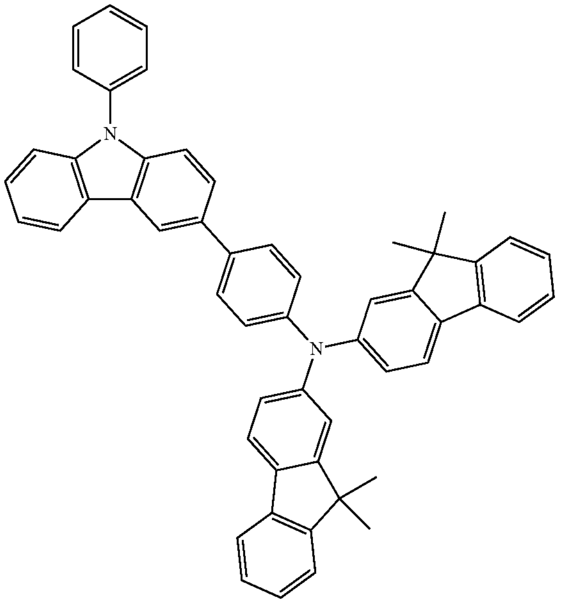
HT8
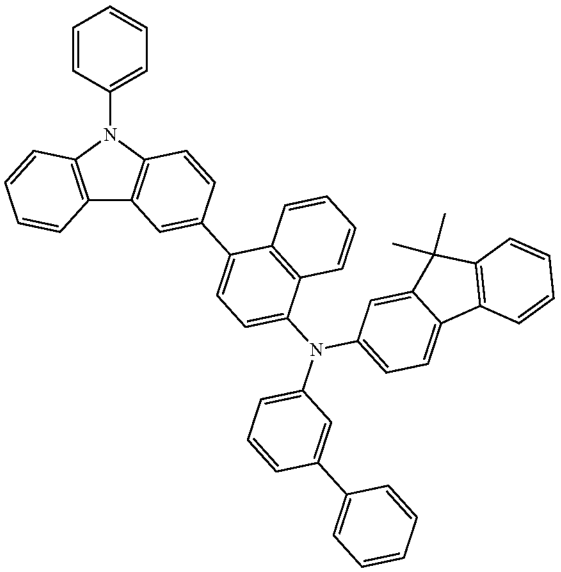

-continued
HT9
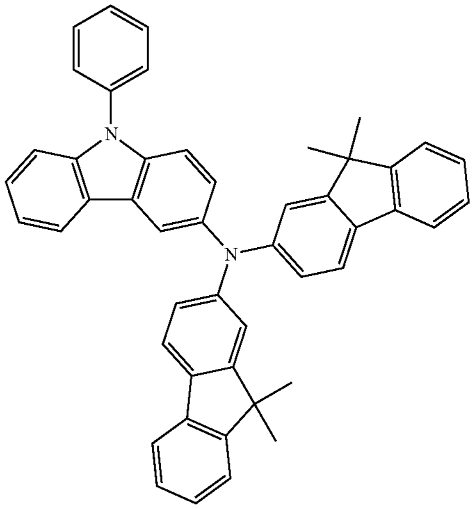
HT10
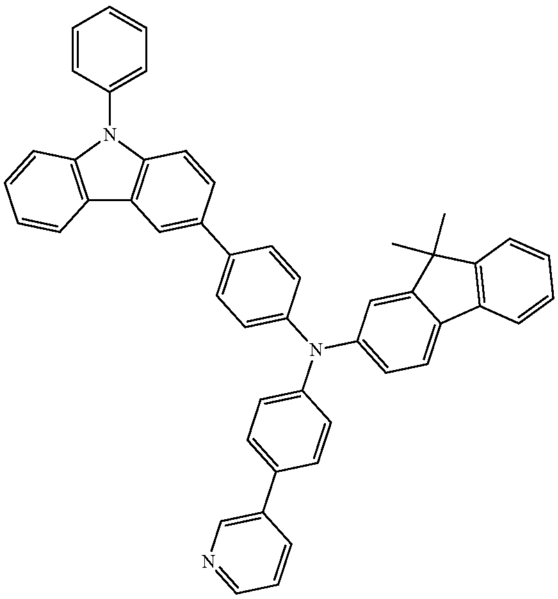
-continued
HT11
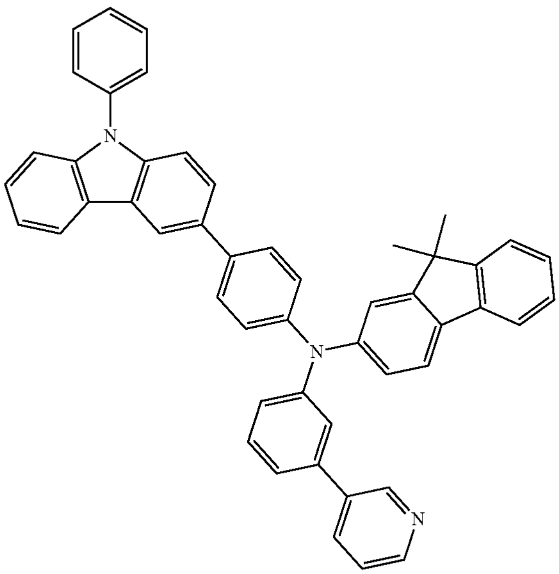
HT12
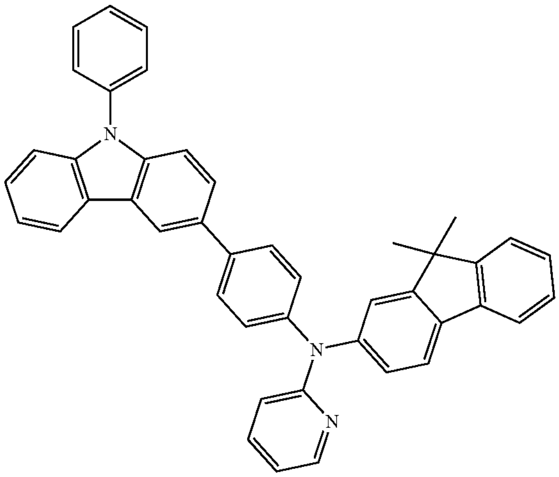
HT13
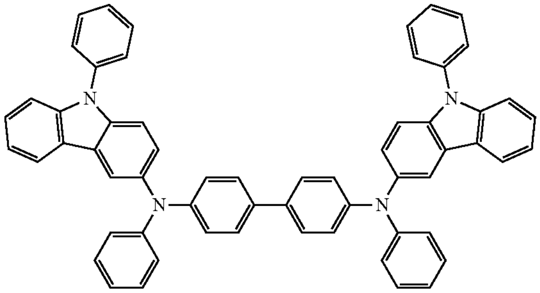

-continued

HT14

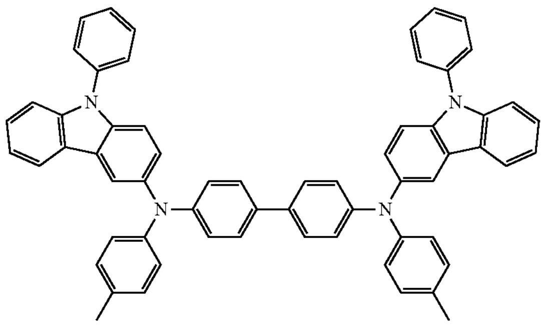

HT15

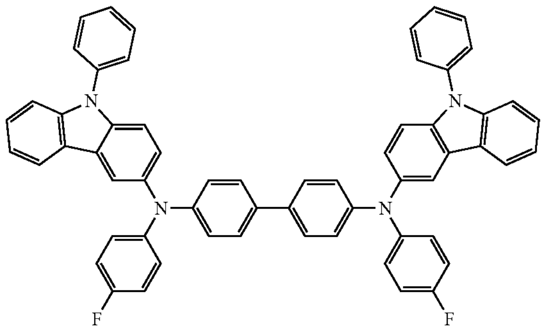

HT16

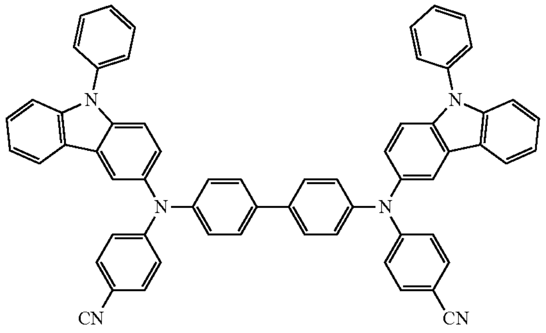

HT17

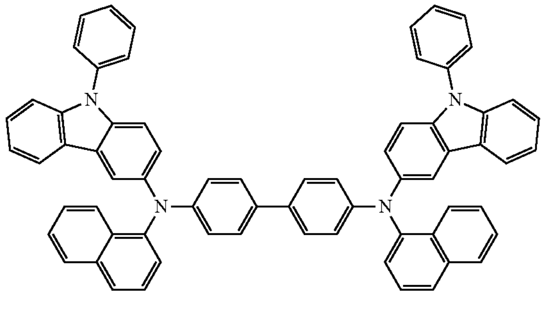

-continued

HT18

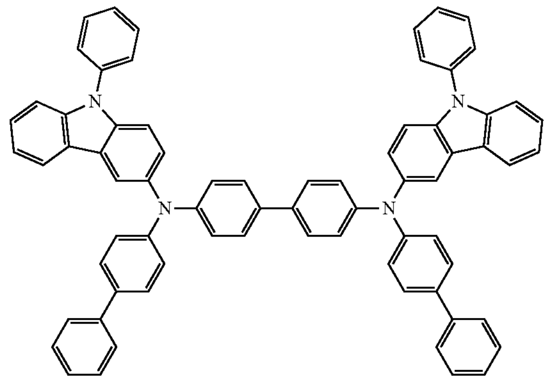

HT19

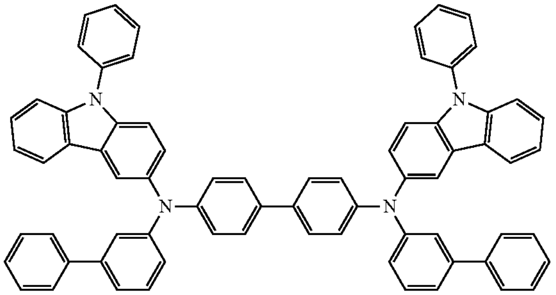

HT20

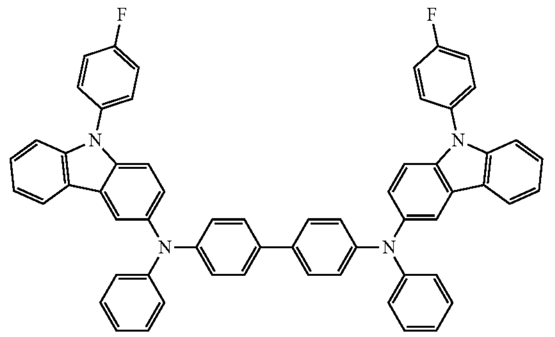

A thickness of the hole transport region may be in a range of about 100 Å to about 10,000 Å, for example, about 100 Å to about 1,000 Å. When the hole transport region includes a hole injection layer and a hole transport layer, the thickness of the hole injection layer may be in a range of about 100 Å to less than about 10,000 Å, and for example, about 100 Å to about 1,000 Å, and the thickness of the hole transport layer may be in a range of about 50 Å to about 2,000 Å, and for example, about 100 Å to about 1,500 Å. When the thicknesses of the hole transport region, the hole injection layer, and the hole transport layer are within these ranges, satisfactory hole transporting characteristics may be obtained without a substantial increase in driving voltage.

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant. The p-dopant may be one selected from a quinone derivative, a metal oxide, and a cyano group-containing compound, but embodiments are not limited thereto. For example, non-limiting examples of the p-dopant are a quinone derivative, such as tetracyanoquinonedimethane (TCNQ) or 2,3,5,6-tetrafluoro-tetracyano-1,4-benzoquinonedimethane (F4-TCNQ); a metal oxide, such as a tungsten oxide or a molybdenum oxide, and Compound HT-D1 illustrated below, but are not limited thereto.

<Compound HT-D1>

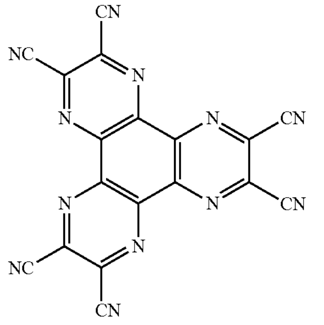

<F4-TCNQ>

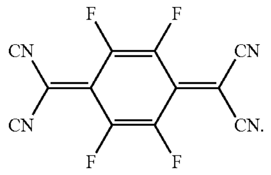

The hole transport region 130 may further include, in addition to the hole injection layer and the hole transport layer, at least one selected from a buffer layer and an electron blocking layer. Since the buffer layer may compensate for an optical resonance distance according to a wavelength of light emitted from the emission layer, light emission efficiency of a formed organic light-emitting device may be improved. For use as a material included in the buffer layer, materials that are to be included in the hole transport region may be used. The electron blocking layer prevents injection of electrons from the electron transport region.

The emission auxiliary layer 140 may be formed on the hole transport region 130 by using one or more suitable methods selected from vacuum deposition, spin coating, casting, an LB method, inkjet printing, laser printing, and laser-induced thermal imaging. When the emission auxiliary layer 140 is formed by vacuum deposition or spin coating, deposition and coating conditions for the emission auxiliary layer 140 may be determined by referring to the deposition and coating conditions for the hole injection layer.

The emission auxiliary layer 140 may include the first compound described herein.

A thickness of the emission auxiliary layer 140 may be in a range of about 10 Å to about 1,000 Å, for example, about 50 Å to about 700 Å. When the thickness of the emission auxiliary layer 140 is within this range, the efficiency and lifespan of the organic light-emitting device 10 may be increased without a substantial increase in driving voltage. In FIGS. 2 to 4, the first sub-pixel emission auxiliary layer 141, the second sub-pixel emission auxiliary layer 142, and the third sub-pixel emission auxiliary layer 143 may be understood by referring to the descriptions provided in connection with the emission auxiliary layer 140.

The emission layer 150 may be formed on the emission auxiliary layer 140 by using one or more suitable methods selected from vacuum deposition, spin coating, casting, an LB method, inkjet printing, laser printing, and laser-induced thermal imaging. When the emission layer 150 is formed by vacuum deposition or spin coating, deposition and coating conditions for the emission layer 150 may be determined by referring to the deposition and coating conditions for the hole injection layer.

The emission layer 150 illustrated in FIG. 1 may further include a dopant, and the second compound included in the emission layer 150 may function as a host. The second compound included in the emission layer 150 illustrated in FIG. 1 may be understood as described above. In FIGS. 2 to 4, the first sub-pixel emission layer 151, the second sub-pixel emission layer 152, and the third sub-pixel emission layer 153 may be understood by referring to the descriptions provided in connection with the emission layer 150.

When the organic light-emitting device 10 is a full-color organic light-emitting device, the emission layer may be patterned into a red emission layer, a green emission layer, or a blue emission layer, according to a sub-pixel. In one or more embodiments, the emission layer 150 may have a stacked structure including a red emission layer, a green emission layer, and a blue emission layer, or may include a red light-emitting material, a green light-emitting material, and a blue light-emitting material, which are mixed with each other in a single layer, to emit white light.

The emission layer 150 may further include, in addition to the first compound and the second compound, each functioning as the host, a phosphorescent dopant or a fluorescent dopant.

The phosphorescent dopant may include an organometallic complex represented by Formula 401 below:

<Formula 401>

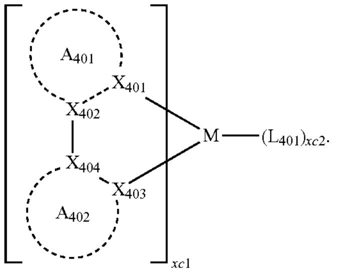

In Formula 401,

M may be selected from iridium (Ir), platinum (Pt), osmium (Os), titanium (Ti), zirconium (Zr), hafnium (Hf), europium (Eu), terbium (Tb), and thulium (Tm);

$X_{401}$ to $X_{404}$ may each independently be nitrogen or carbon;

rings $A_{401}$ and $A_{402}$ may each independently be selected from a substituted or unsubstituted benzene, a substituted or unsubstituted naphthalene, a substituted or unsubstituted fluorene, a substituted or unsubstituted spiro-fluorene, a substituted or unsubstituted indene, a substituted or unsubstituted pyrrole, a substituted or unsubstituted thiophene, a substituted or unsubstituted furan, a substituted or unsubstituted imidazole, a substituted or unsubstituted pyrazole, a substituted or unsubstituted thiazole, a substituted or unsubstituted isothiazole, a substituted or unsubstituted oxazole, a substituted or unsubstituted isoxazole, a substituted or unsubstituted pyridine, a substituted or unsubstituted pyrazine, a substituted or unsubstituted pyrimidine, a substituted or unsubstituted pyridazine, a substituted or unsubstituted quinoline, a substituted or unsubstituted isoquinoline, a substituted or unsubstituted benzoquinoline, a substituted or unsubstituted quinoxaline, a substituted or unsubstituted quinazoline, a substituted or unsubstituted carbazole, a substituted or unsubstituted benzimidazole, a substituted or unsubstituted benzofuran, a substituted or unsubstituted benzothiophene, a substituted or unsubstituted isobenzothiophene, a substituted or unsubstituted benzoxazole, a substituted or unsubstituted isobenzoxazole, a substituted or unsubstituted triazole, a substituted or unsubstituted oxadiazole, a substituted or unsubstituted triazine, a substituted or unsubstituted dibenzofuran, and a substituted or unsubstituted dibenzothiophene; and at least one substituent of the substituted benzene, the substituted naphthalene, the substituted fluorene, the substituted spiro-fluorene, the substituted indene, the substituted pyrrole, the substituted thiophene, the substituted furan, substituted imidazole, the substituted pyrazole, the substituted thiazole, the substituted isothiazole, the substituted oxazole, the substituted isoxazole, the substituted pyridine, the substituted pyrazine, the substituted pyrimidine, the substituted pyridazine, the substituted quinoline, the substituted isoquinoline, the substituted benzoquinoline, the substituted quinoxaline, the substituted quinazoline, the substituted carbazole, the substituted benzimidazole, the substituted benzofuran, substituted benzothiophene, the substituted isobenzothiophene, the substituted benzoxazole, the substituted isobenzoxazole, the substituted triazole, the substituted oxadiazole, the substituted triazine, substituted dibenzofuran, and the substituted dibenzothiophene may be selected from:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{401}$)($Q_{402}$), —Si($Q_{403}$)($Q_{404}$)($Q_{405}$), and —B($Q_{406}$)($Q_{407}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_5$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{411}$)($Q_{412}$), —Si($Q_{413}$)($Q_{414}$)($Q_{415}$), and —B($Q_{416}$)($Q_{417}$); and —N($Q_{421}$)($Q_{422}$), —Si($Q_{423}$)($Q_{424}$)($Q_{425}$), and —B($Q_{426}$)($Q_{427}$), $L_{401}$ is an organic ligand;

xc1 is 1, 2, or 3; and xc2 is 0, 1, 2, or 3.

$L_{401}$ may be a monovalent, divalent, or trivalent organic ligand. For example, $L_{401}$ may be selected from a halogen ligand (for example, Cl or F), a diketone ligand (for example, acetylacetonate, 1,3-diphenyl-1,3-propandionate, 2,2,6,6-tetramethyl-3,5-heptandionate, or hexafluoroacetonate), a carboxylic acid ligand (for example, picolinate, dimethyl-3-pyrazolecarboxylate, or benzoate), a carbon monooxide ligand, an isonitrile ligand, a cyano ligand, and a phosphorous ligand (for example, phosphine or phosphite), but is not limited thereto.

$Q_{401}$ to $Q_{407}$, $Q_{411}$ to $Q_{417}$, and $Q_{421}$ to $Q_{427}$ may each independently be selected from hydrogen, a $C_1$-$C_{60}$ alkyl group, a $C_2$-$C_{60}$ alkenyl group, a $C_6$-$C_{60}$ aryl group, and a $C_2$-$C_{60}$ heteroaryl group.

When $A_{401}$ in Formula 401 has two or more substituents, the substituents of $A_{401}$ may be linked to each other to form a saturated or unsaturated ring.

When $A_{402}$ in Formula 401 has two or more substituents, the substituents of $A_{402}$ may be linked to each other to form a saturated or unsaturated ring.

When xc1 in Formula 401 is two or more, a plurality of ligands

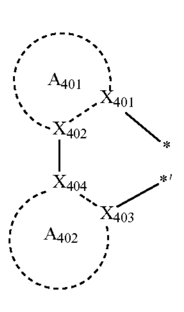

in Formula 401 may be identical to or different from each other.

When xc1 in Formula 401 is two or more, $A_{401}$ and $A_{402}$ may be respectively directly connected to $A_{401}$ and $A_{402}$ of other neighboring ligands with or without a linker (for example, a $C_1$-$C_5$ alkylene, or —N(R')— (wherein R' may be a $C_1$-$C_{10}$ alkyl group or a $C_6$-$C_{20}$ aryl group) or —C(=O)—) therebetween.

The phosphorescent dopant may be, for example, selected from Compounds PD1 to PD75, but is not limited thereto:
PD1
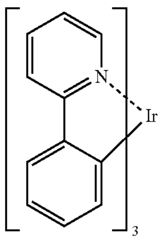
PD2
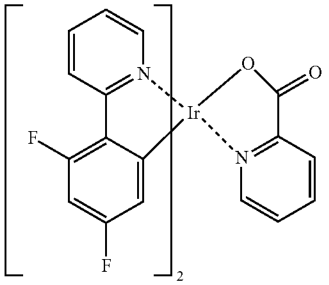
PD3
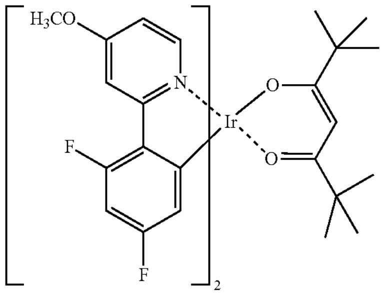
PD4
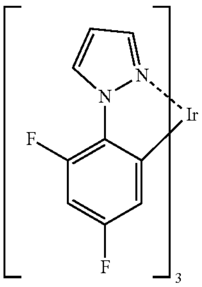
PD5
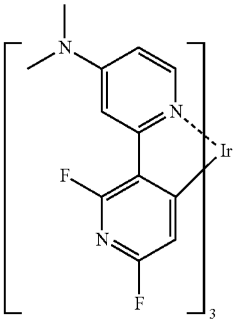
-continued
PD6
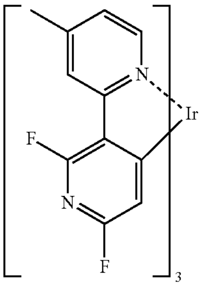
PD7
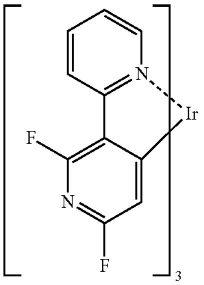
PD8
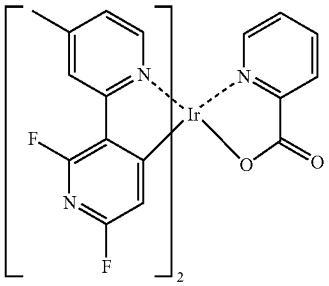
PD9
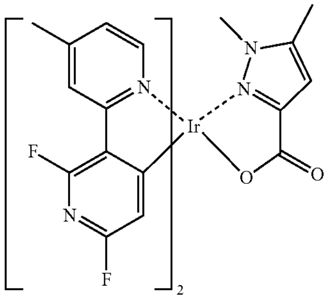
PD10
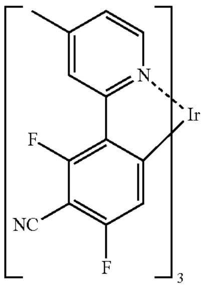

PD11
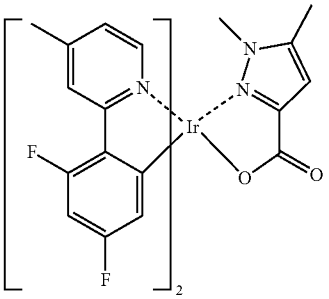
PD12
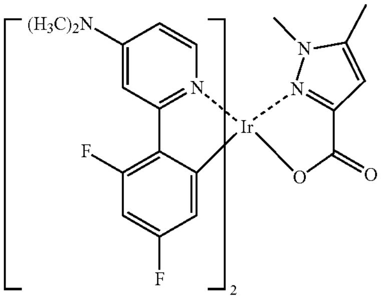
PD13
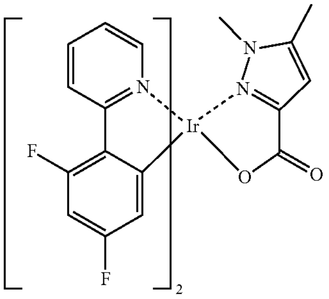
PD14
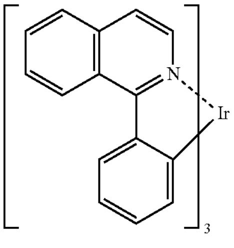
PD15
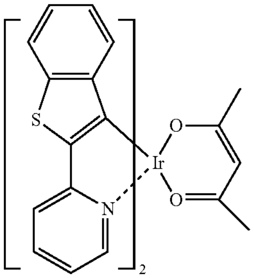
PD16
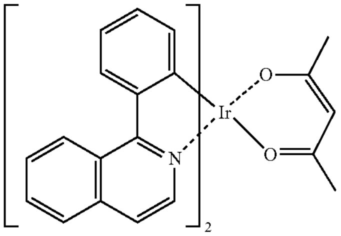
PD17
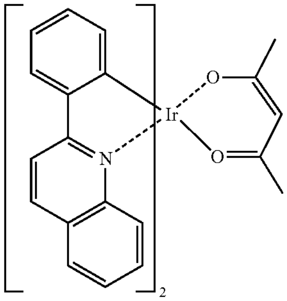
PD18
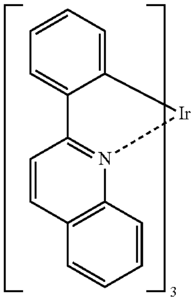
PD19
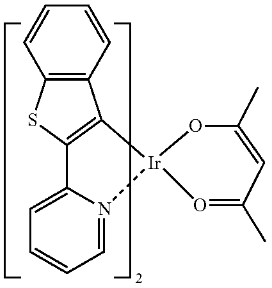
PD20
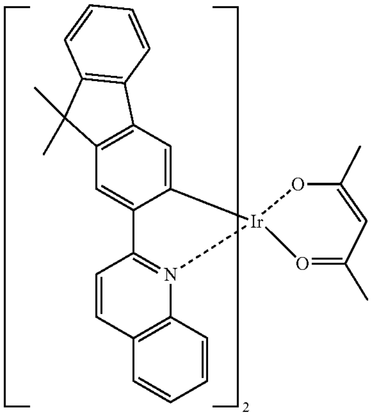

-continued
PD21
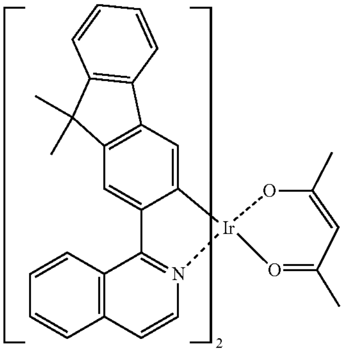
PD22
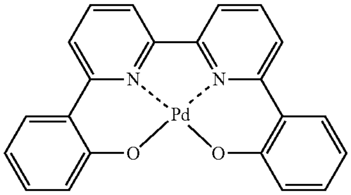
PD23
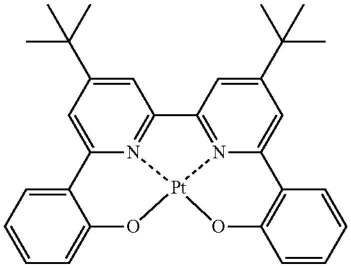
PD24
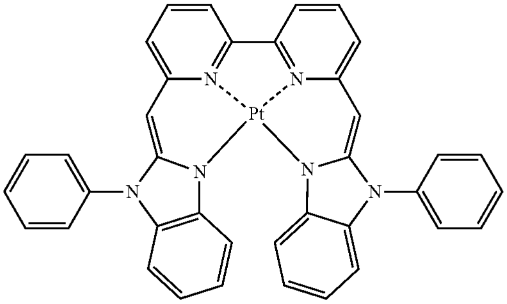
PD25
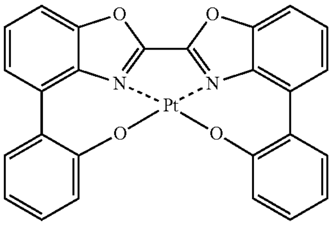
PD26
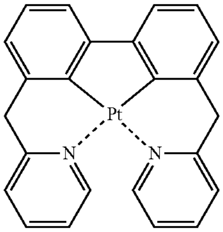
-continued
PD27
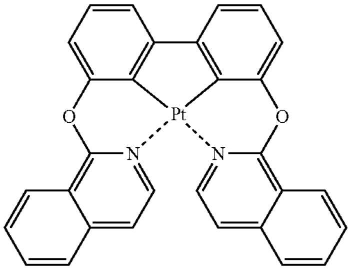
PD28
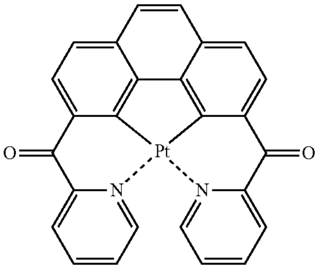
PD29
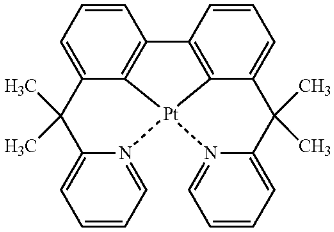
PD30
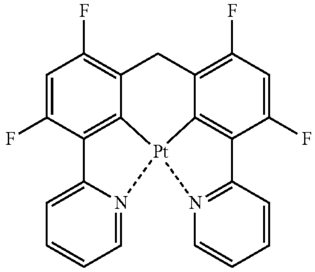
PD31
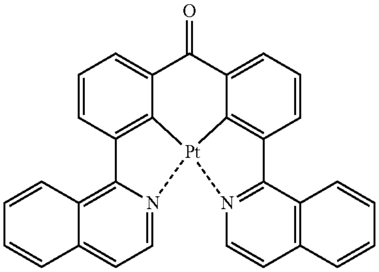
PD32
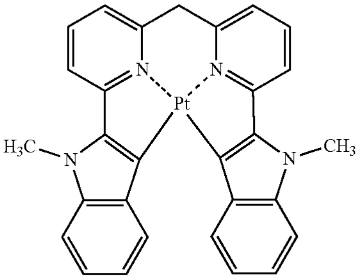

-continued
PD33
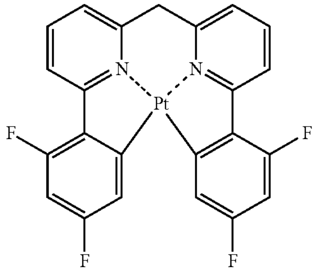
PD34
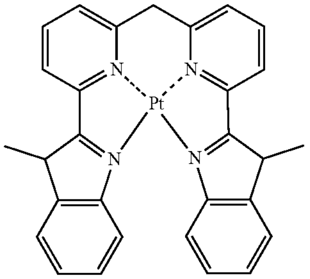
PD35
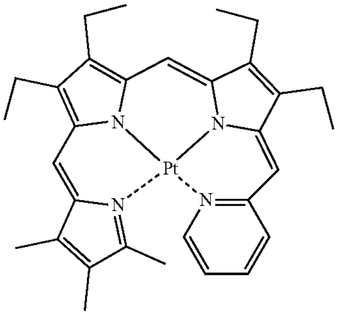
PD36
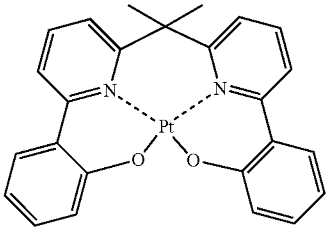
PD37
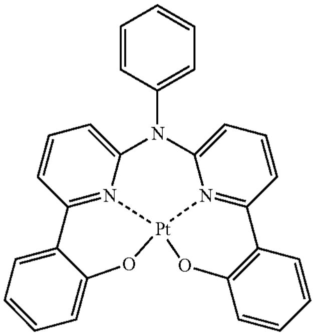
-continued
PD38
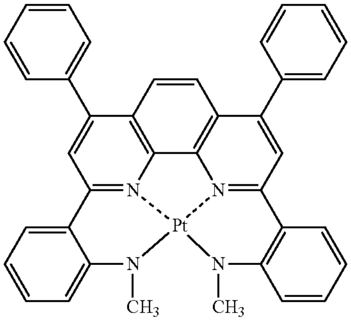
PD39
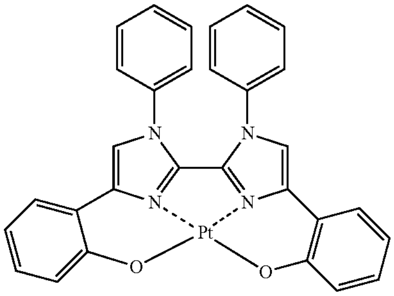
PD40
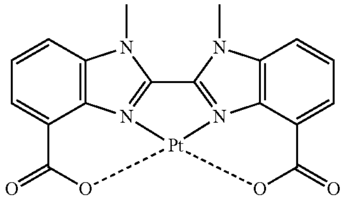
PD41
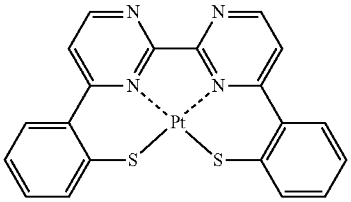
PD42
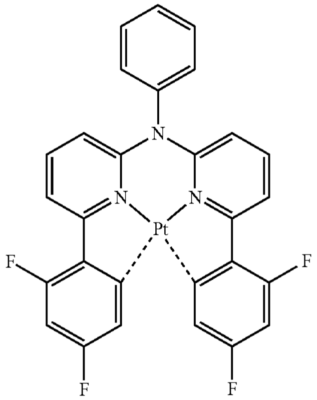

-continued
PD43
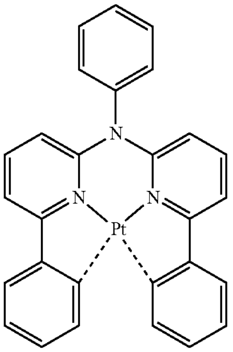
PD44
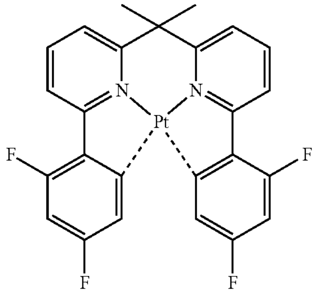
PD45
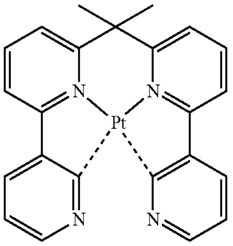
PD46
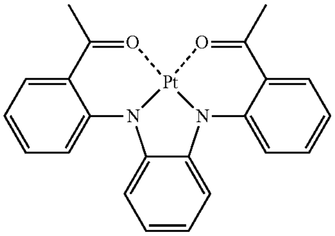
PD47
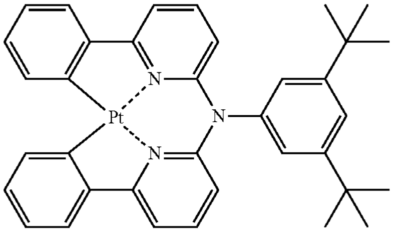
PD48
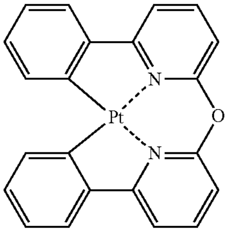
-continued
PD49
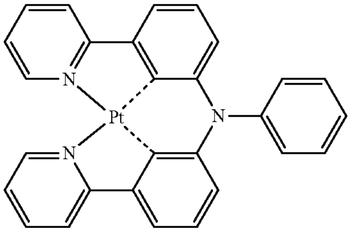
PD50
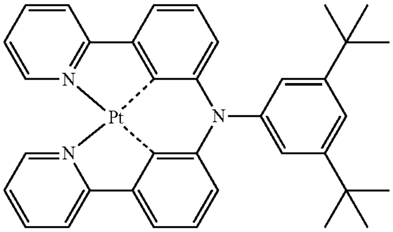
PD51
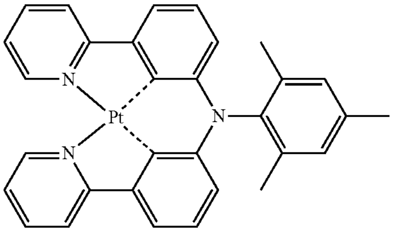
PD52
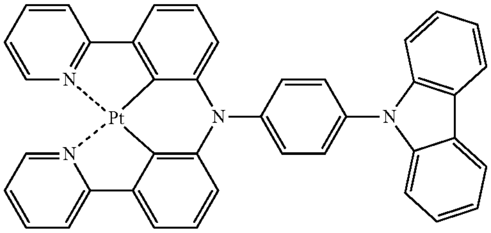
PD53
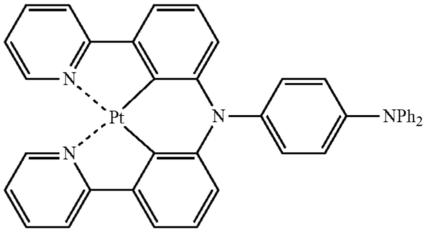
PD54
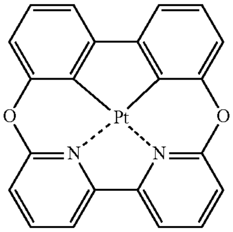

-continued
PD55
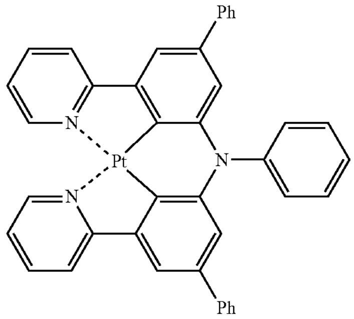
PD56
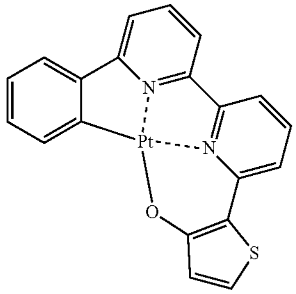
PD57
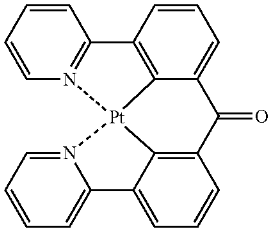
PD58
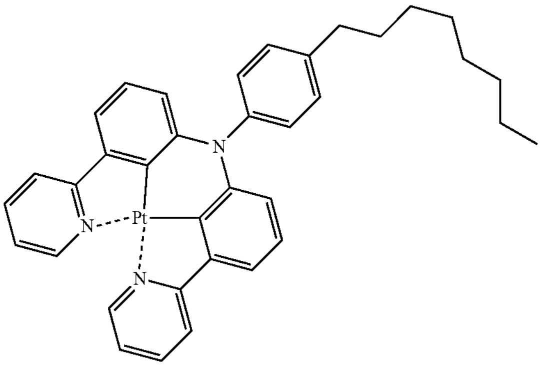
PD59
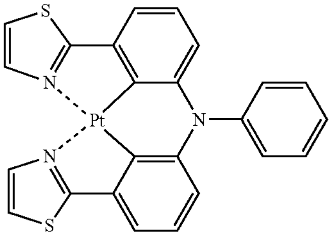
-continued
PD60
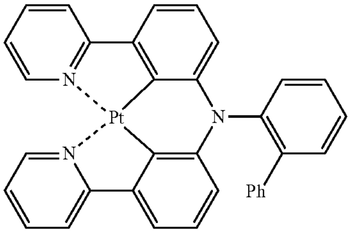
PD61
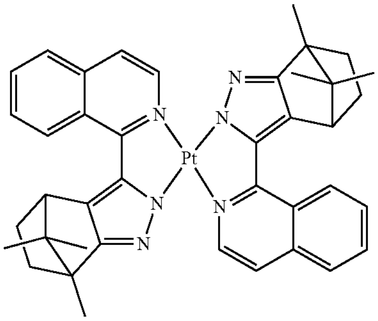
PD62
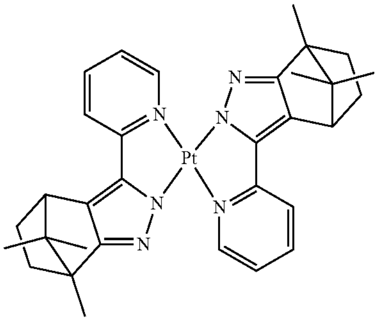
PD63
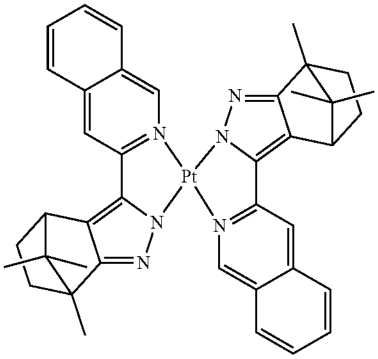
PD64
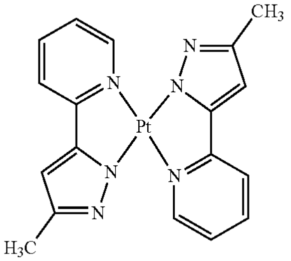

-continued
PD65
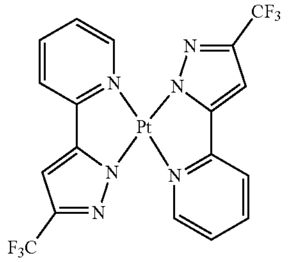
PD66
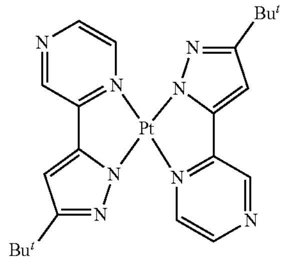
PD67
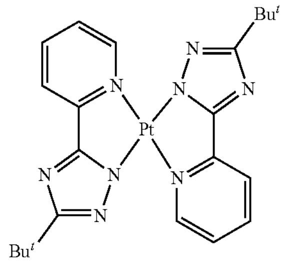
PD68
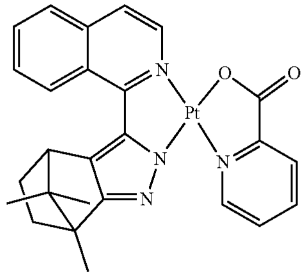
PD69
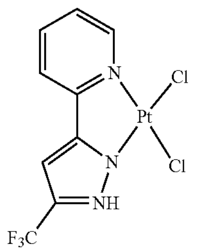
PD70
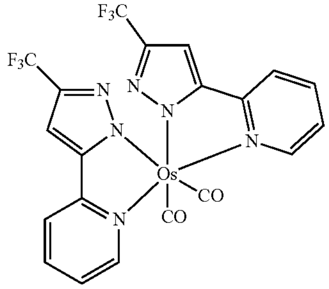
-continued
PD71
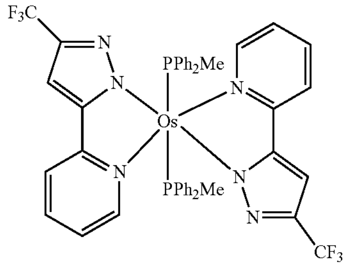
PD72
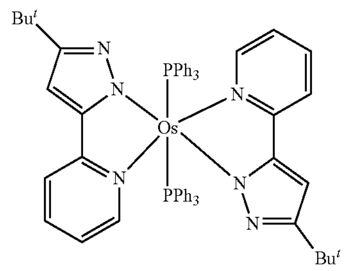
PD73
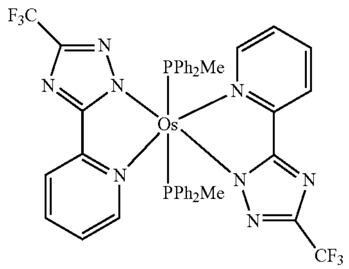
PD74
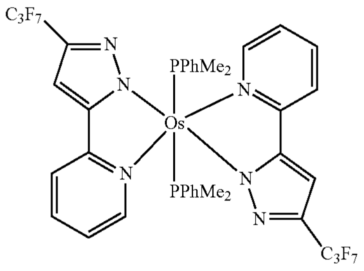
PD75
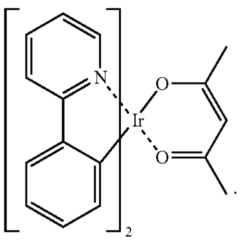
The fluorescent dopant may include a compound represented by Formula 501 below.
<Formula 501>
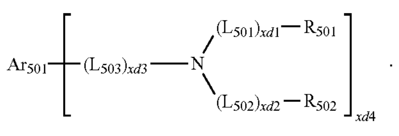

In Formula 501, $Ar_{501}$ may be selected from:

a naphthalene group, a heptalene group, a fluorene group, a spiro-fluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, and an indenoanthracene group; and a naphthalene group, a heptalene group, a fluorene group, a spiro-fluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, and an indenoanthracene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, and —Si($Q_{501}$)($Q_{502}$)($Q_{503}$) (wherein $Q_{501}$ to $Q_{503}$ are each independently selected from hydrogen, a $C_1$-$C_{60}$ alkyl group, a $C_2$-$C_{60}$ alkenyl group, a $C_6$-$C_{60}$ aryl group, and a $C_1$-$C_{60}$ heteroaryl group), $L_{501}$ to $L_{503}$ may be understood by referring to the descriptions of $L_1$; $R_{501}$ and $R_{502}$ may each independently be selected from:

a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazole group, a triazinyl group, a dibenzofuranyl group, and a dibenzothiophenyl group; and a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, and a dibenzothiophenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, and a dibenzothiophenyl group;

xd1 to xd3 may each independently be selected from 0, 1, 2, and 3; and xd4 may be selected from 1, 2, 3, and 4.

The fluorescent dopant may include at least one of Compounds FD1 to FD9:

FD1

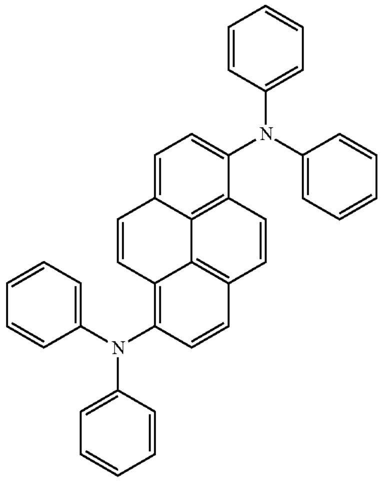

FD2

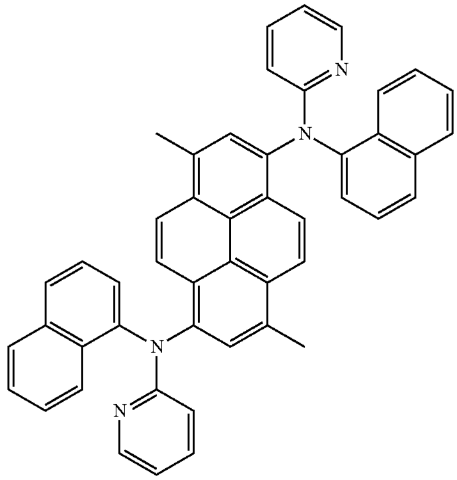

-continued
FD3
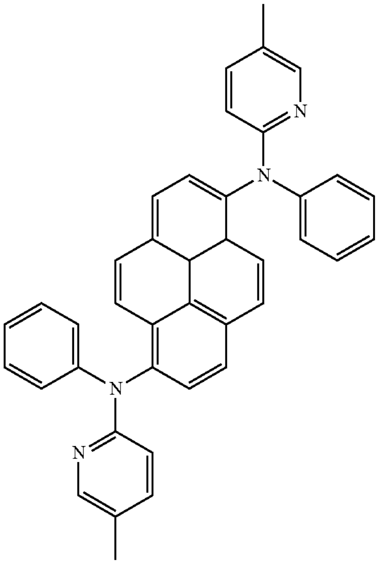
FD4
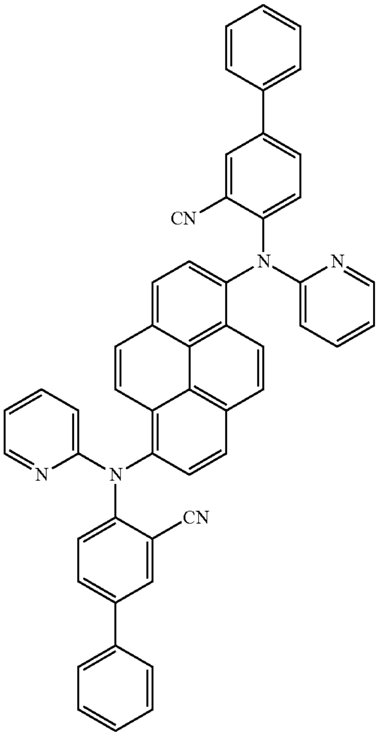
-continued
FD5
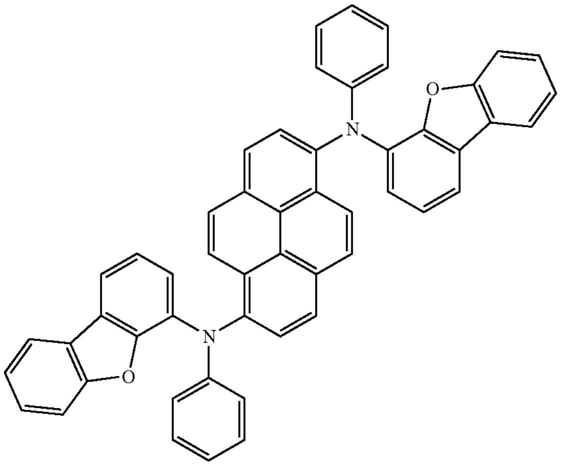
FD6
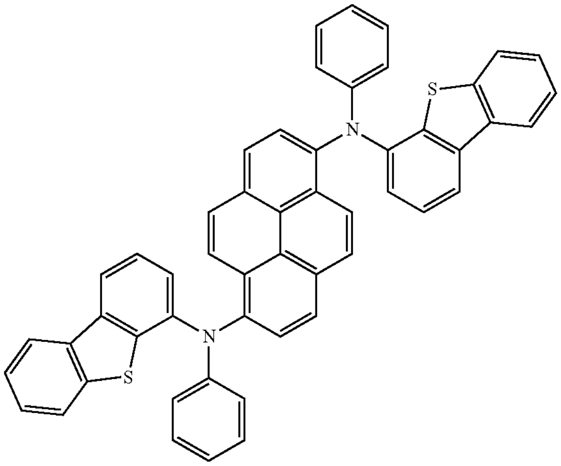
FD7
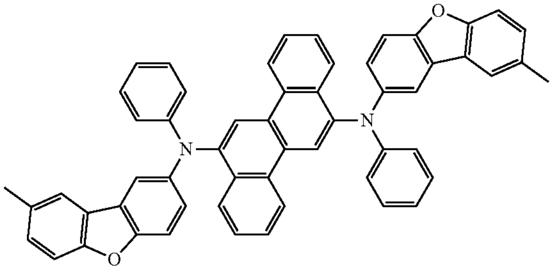
FD8
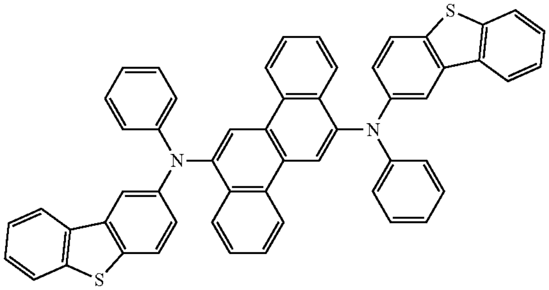

-continued
FD9
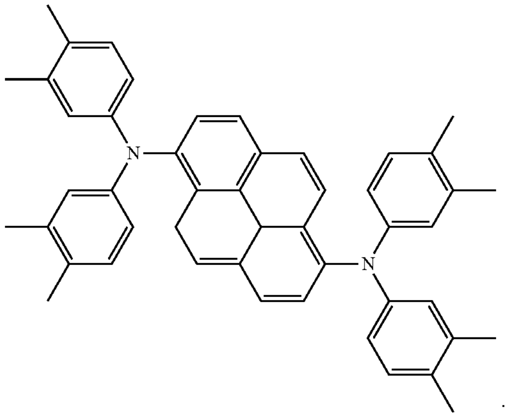
In one or more embodiments, the fluorescent dopant may be selected from the following compounds, but embodiments of the present disclosure are not limited thereto.
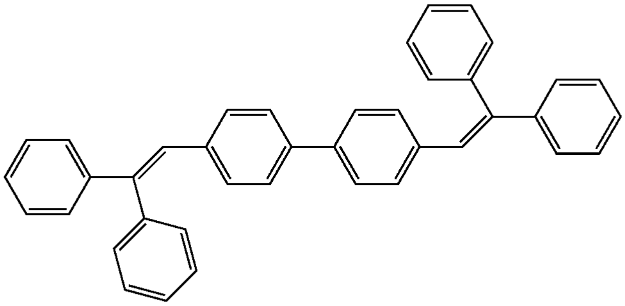
DPVBi
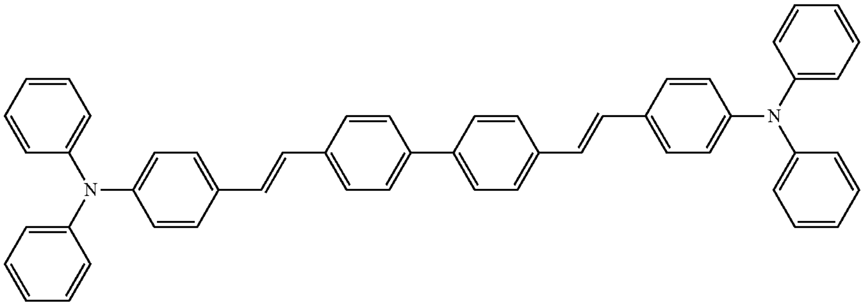
DPAVBi
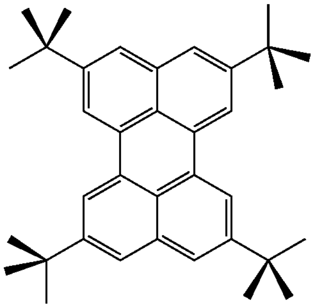
TBPe
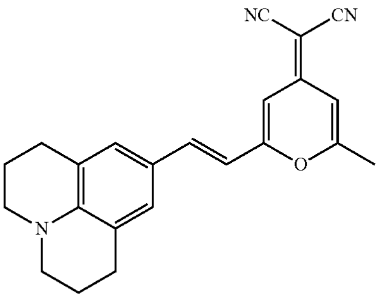
DCM -continued

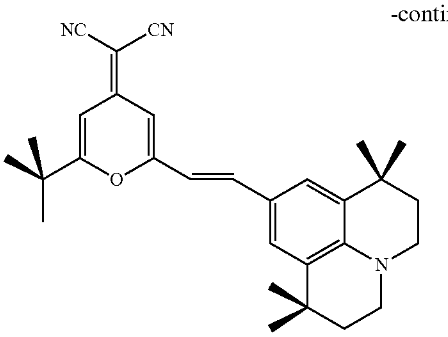

DCJTB

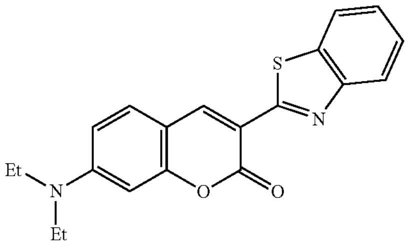

Coumarin 6

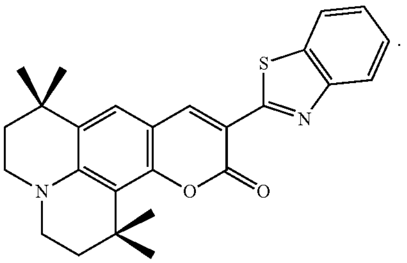

C545T

An amount of the dopant in the emission layer 150 may be, in general, in a range of about 0.01 parts to about 15 parts by weight based on 100 parts by weight of the host, but is not limited thereto.

A thickness of the emission layer 150 may be in a range of about 100 Å to about 1,000 Å, for example, about 200 Å to about 600 Å. When the thickness of the emission layer 150 is within this range, excellent light emission characteristics may be obtained without a substantial increase in driving voltage.

Then, the electron transport region 170 may be disposed on the emission layer 150.

The electron transport region 170 may include at least one selected from a hole blocking layer, an electron transport layer, and an electron injection layer, but is not limited thereto.

For example, the electron transport region 170 may have an electron transport layer/electron injection layer structure or a hole blocking layer/electron transport layer/electron injection layer structure, wherein layers of each structure are sequentially stacked in the stated order in a direction away from the emission layer, but the structure thereof is not limited thereto.

When the electron transport region includes a hole blocking layer, the hole blocking layer may be formed on the emission layer by using one or more suitable methods selected from vacuum deposition, spin coating, casting, an LB method, inkjet printing, laser printing, and laser-induced thermal imaging. When the hole blocking layer is formed by vacuum deposition or spin coating, deposition and coating conditions for the hole blocking layer may be determined by referring to the deposition and coating conditions for the hole injection layer.

The hole blocking layer may include, for example, at least one of BCP and Bphen, but is not limited thereto.

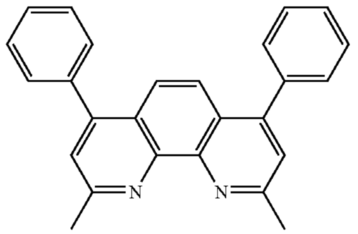

BCP

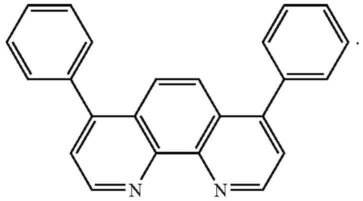

Bphen

A thickness of the hole blocking layer may be in a range of about 20 Å to about 1,000 Å, for example, about 30 Å to about 300 Å. When the thickness of the hole blocking layer is within these ranges, the hole blocking layer may have improved hole blocking ability without a substantial increase in driving voltage.

The electron transport region may include an electron transport layer. The electron transport layer may be formed on the emission layer or the hole blocking layer by using one or more suitable methods selected from vacuum deposition, spin coating, casting, an LB method, inkjet printing, laser printing, and laser-induced thermal imaging. When an electron transport layer is formed by vacuum deposition or spin coating, deposition and coating conditions for the electron transport layer may be determined by referring to the deposition and coating conditions for the hole injection layer.

In one or more embodiments, the electron transport layer may include at least one compound selected from a compound represented by Formula 601 and a compound represented by Formula 602 illustrated below:

<Formula 601>

$$Ar_{601}—[(L_{601})_{xe1}—E_{601}]_{xe2}.$$

In Formula 601, $Ar_{601}$ may be selected from:

a naphthalene group, a heptalene group, a fluorene group, a spiro-fluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, and an indenoanthracene group; and a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, naphthacene, a picene, a perylene, a pentaphene, and an indenoanthracene, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group and —Si($Q_{301}$)($Q_{302}$)($Q_{303}$) (wherein $Q_{301}$ to $Q_{303}$ may each independently be a $C_1$-$C_{60}$ alkyl group, a $C_2$-$C_{60}$ alkenyl group, a $C_6$-$C_{60}$ aryl group, or a $C_1$-$C_{60}$ heteroaryl group);

$L_{601}$ may be the same as explained in connection with $L_{201}$;

$E_{601}$ may be selected from:

a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group; and a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group;

xe1 may be selected from 0, 1, 2, and 3; and xe2 may be selected from 1, 2, 3, and 4.

<Formula 602>

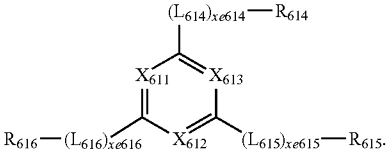

In Formula 602, $X_{611}$ may be N or C-($L_{611}$) xe611-$R_{611}$, $X_{612}$ may be N or C-$(L_{612})_{xe}$612-$R_{612}$, $X_{613}$ may be N or C-$(L_{613})_{xe}$613-$R_{613}$, and at least one of $X_{611}$ to $X_{613}$ may be N;

$L_{611}$ to $L_{616}$ may be the same as explained in connection with $L_1$;

$R_{611}$ to $R_{616}$ may each independently be selected from:

a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, an azulenyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

xe611 to xe616 may each independently be selected from 0, 1, 2, and 3.

The compound represented by Formula 601 and the compound represented by Formula 602 may each independently be selected from Compounds ET1 to ET15 illustrated below:

ET1

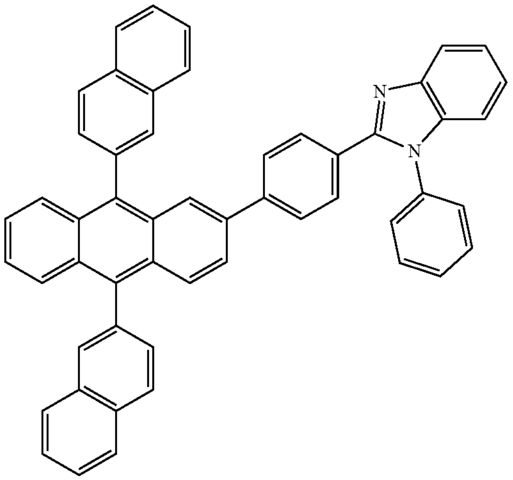

-continued

ET2

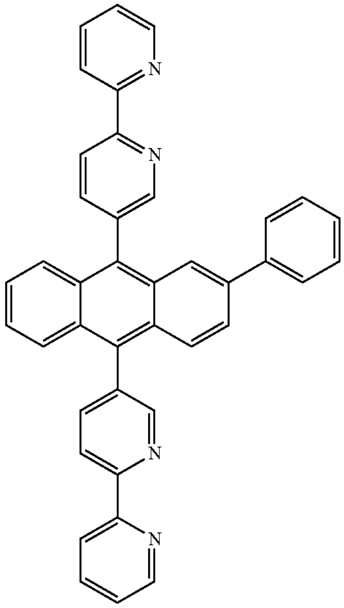

ET3

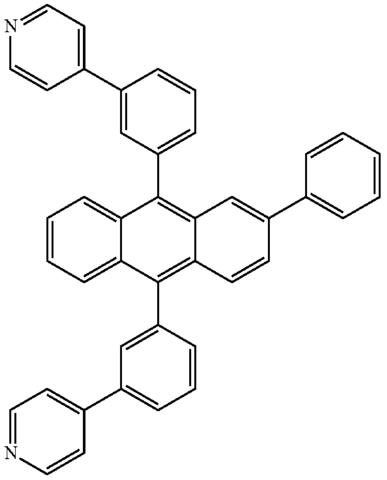

ET4

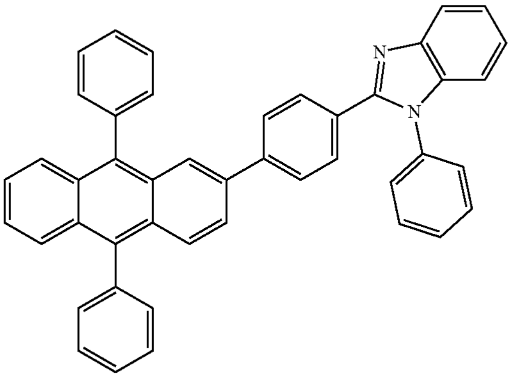

-continued
ET5
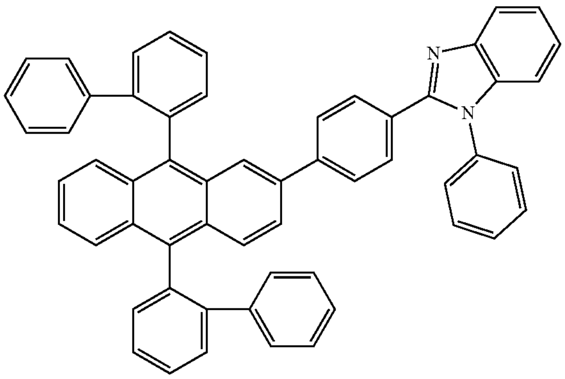
ET6
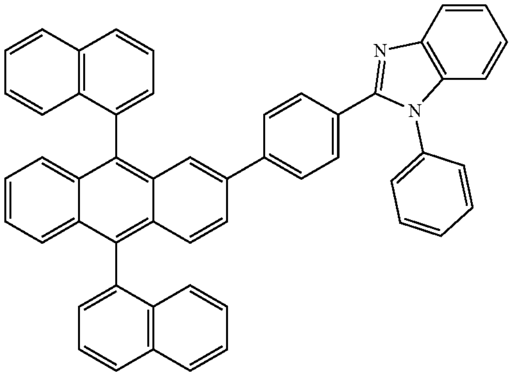
ET7
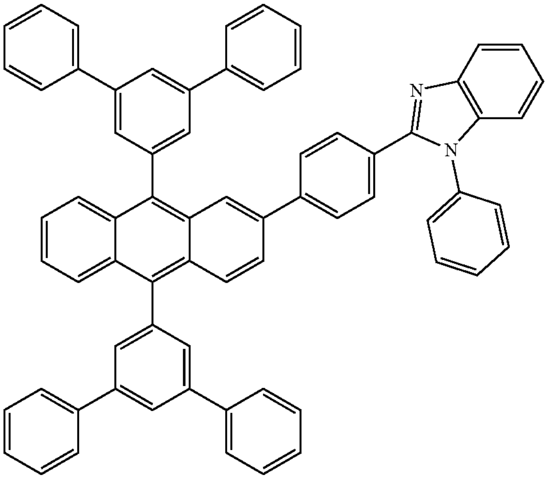
-continued
ET8
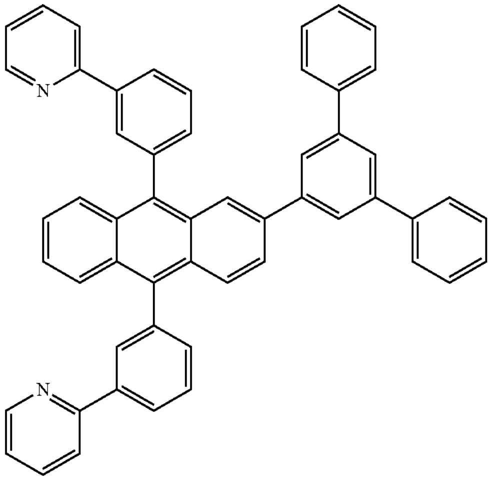
ET9
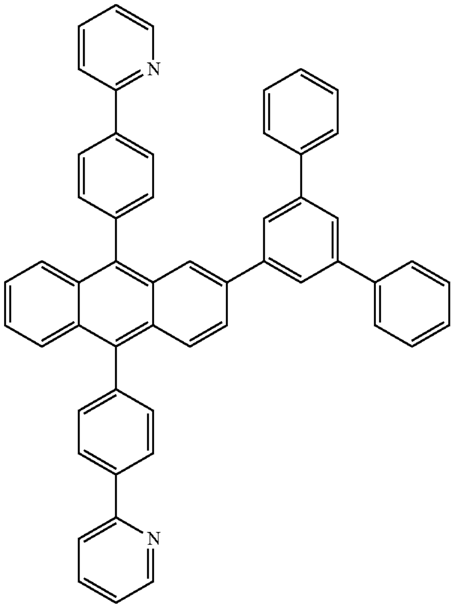

-continued
ET10
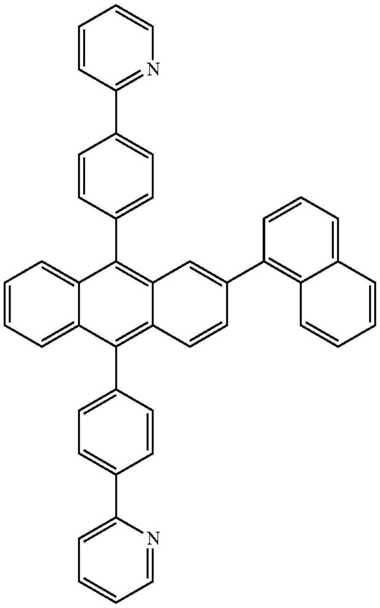
ET11
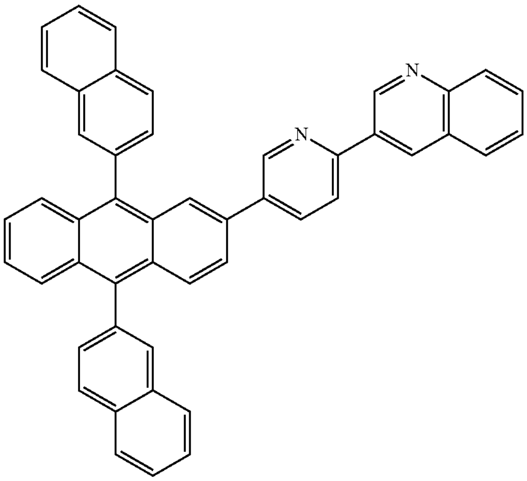
ET12
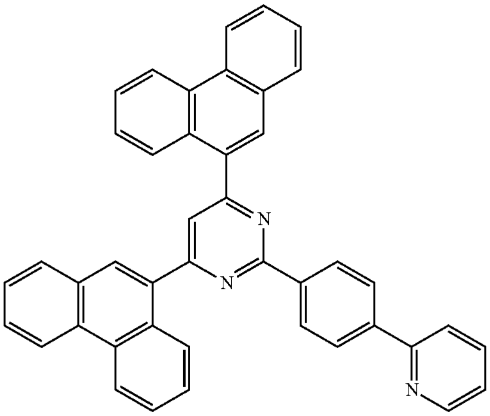
-continued
ET13
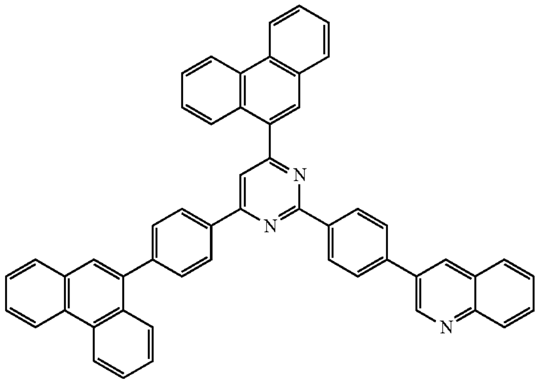
ET14
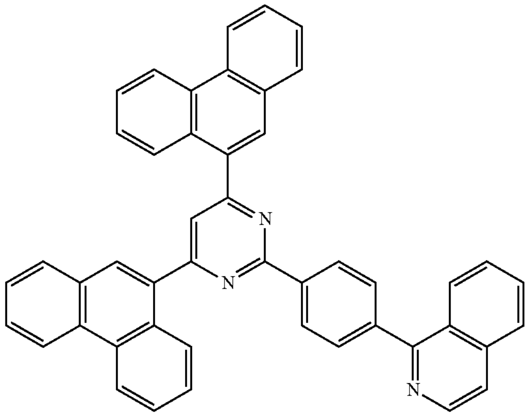
ET15
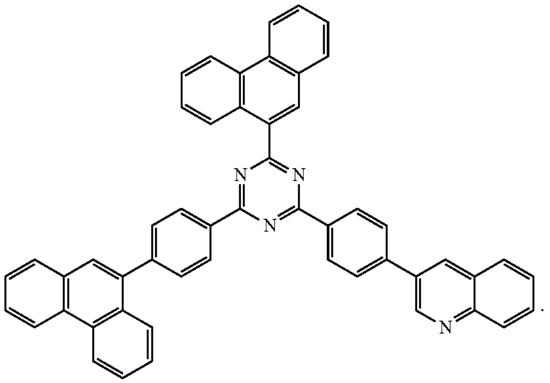
In one or more embodiments, the electron transport layer may further include at least one selected from BCP, Bphen, $Alq_3$, BAlq, TAZ, and NTAZ.

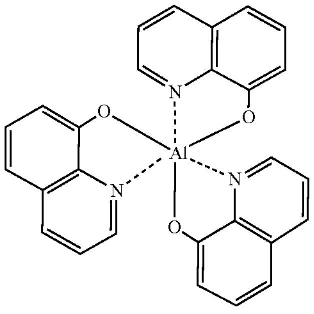

Alq3

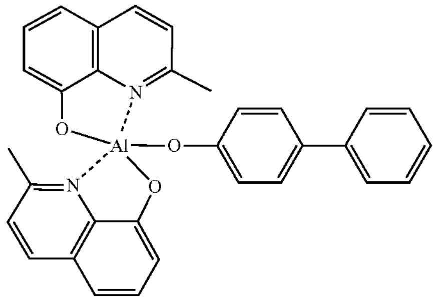

BAlq

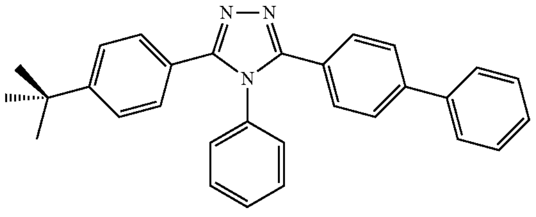

TAZ

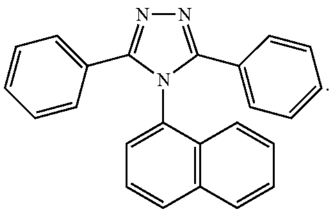

NTAZ

A thickness of the electron transport layer may be in a range of about 100 Å to about 1,000 Å, for example, about 150 Å to about 500 Å. When the thickness of the electron transport layer is within these ranges, satisfactory electron transport characteristics may be obtained without a substantial increase in the driving voltage.

Also, the electron transport layer may further include, in addition to the materials described above, a metal-containing material.

The metal-containing material may include a Li complex. The Li complex may include, for example, Compound ET-D1 (8-hydroxyquinolinolato-lithium, LiQ) or ET-D2

ET-D1

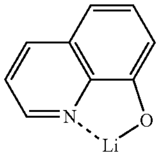

ET-D2

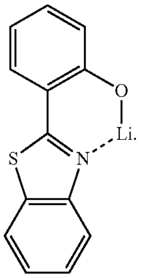

The electron transport region may include an electron injection layer that facilitates injection of electrons from the second electrode 190.

The electron injection layer may be formed on the electron transport layer by using one or more suitable methods selected from vacuum deposition, spin coating, casting, an LB method, inkjet printing, laser printing, and laser-induced thermal imaging. When an electron injection layer is formed by vacuum deposition or spin coating, deposition and coating conditions for the electron injection layer may be determined by referring to the deposition and coating conditions for the hole injection layer.

The electron injection layer may include at least one selected from LiF, NaCl, CsF, $Li_2O$, BaO, and LiQ.

A thickness of the electron injection layer may be in a range of about 1 Å to about 100 Å, for example, about 3 Å to about 90 Å. When the thickness of the electron injection layer is within the range described above, the electron injection layer may have satisfactory electron injection characteristics without a substantial increase in driving voltage.

The second electrode 190 may be disposed on the electron transport layer 170 having such a structure. The second electrode 190 may be a cathode that is an electron injection electrode, and in this regard, a material for forming the second electrode 190 may be a material having a low work function, and such a material may be a metal, an alloy, an electrically conductive compound, or a mixture thereof. Examples of the second electrode 190 are lithium (Li), magnesium (Mg), aluminum (Al), aluminum-lithium (Al—Li), calcium (Ca), magnesium-indium (Mg—In), and magnesium-silver (Mg—Ag). In one or more embodiments, the material for forming the second electrode 190 may be ITO or IZO. The second electrode 190 may be a semi-transmissive electrode or a transmissive electrode.

Hereinbefore, the organic light-emitting device has been described with reference to FIGS. 1 to 4, but is not limited thereto.

The term "$C_1$-$C_{60}$ alkyl group" as used herein refers to a linear or branched saturated aliphatic hydrocarbon monovalent group having 1 to 60 carbon atoms, and non-limiting examples thereof include a methyl group, an ethyl group, a propyl group, an isobutyl group, a sec-butyl group, a tert-butyl group, a pentyl group, an iso-amyl group, and a hexyl group. The term "$C_1$-$C_{60}$ alkylene group" as used herein refers to a divalent group having the same structure as the $C_1$-$C_{60}$ alkyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and non-limiting examples thereof include a methoxy group, an ethoxy group, and an isopropyloxy group.

The term "$C_2$-$C_{60}$ alkenyl group" as used herein refers to a hydrocarbon group formed by substituting at least one carbon-carbon double bond in the middle or at the terminus of the $C_2$-$C_{60}$ alkyl group, and non-limiting examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group formed by substituting at least one carbon-carbon triple bond in the middle or at the terminus of the $C_2$-$C_{60}$ alkyl group, and examples thereof include an ethynyl group, and a propynyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon monocyclic group having 3 to 10 carbon atoms, and examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent saturated monocyclic group having at least one heteroatom selected from N, O, Si, P, and S as a ring-forming atom and 1 to 10 carbon atoms, and examples thereof include a tetrahydrofuranyl group and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent monocyclic group having 3 to 10 carbon atoms, at least one carbon-carbon double bond in the ring thereof, and no aromaticity, and examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group that has at least one heteroatom selected from N, O, Si, P, and S as a ring-forming atom, 1 to 10 carbon atoms, and at least one carbon-carbon double bond in its ring. Non-limiting examples of the $C_1$-$C_{10}$ heterocycloalkenyl group include a 2,3-dihydrofuranyl group and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and a $C_6$-$C_{60}$ arylene group used herein refers to a divalent group having a carbocyclic aromatic system having 6 to 60 carbon atoms. Non-limiting examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

The term "$C_1$-$C_{60}$ heteroaryl group" as used herein refers to a monovalent group having a carbocyclic aromatic system that has at least one heteroatom selected from N, O, Si, P, and S as a ring-forming atom, and 1 to 60 carbon atoms. The term "$C_1$-$C_{60}$ heteroarylene group" as used herein refers to a divalent group having a carbocyclic aromatic system that has at least one heteroatom selected from N, O, Si, P, and S as a ring-forming atom, and 1 to 60 carbon atoms. Non-limiting examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the rings may be fused to each other.

The term "$C_6$-$C_{60}$ aryloxy group" as used herein refers to —$OA_{102}$ (wherein $A_{102}$ is the $C_6$-$C_{60}$ aryl group), and a $C_6$-$C_{60}$ arylthio group used herein indicates —$SA_{103}$ (wherein $A_{103}$ is the $C_6$-$C_{60}$ aryl group).

The term "monovalent non-aromatic condensed polycyclic group," used herein, refers to a monovalent group (for example, having 8 to 60 carbon atoms) that has two or more rings condensed to each other, only carbon atoms as ring-forming atoms, and non-aromaticity in the entire molecular structure. Examples of the monovalent non-aromatic condensed polycyclic group include a fluorenyl group. The term "divalent non-aromatic condensed polycyclic group," used herein, refers to a divalent group having the same structure as the monovalent non-aromatic condensed polycyclic group.

The term "monovalent non-aromatic condensed heteropolycyclic group" as used herein refers to a monovalent group (for example, having 1 to 60 carbon atoms) that has two or more rings condensed to each other, has a heteroatom selected from N, O, Si, P, and S, other than carbon atoms, as a ring-forming atom, and has non-aromaticity in the entire molecular structure. Non-limiting examples of the monovalent non-aromatic condensed heteropolycyclic group include a carbazolyl group. The term "divalent non-aromatic condensed heteropolycyclic group," used herein, refers to a divalent group having the same structure as the monovalent non-aromatic condensed heteropolycyclic group.

At least one of substituents of the substituted condensed polycyclic group, the substituted $C_5$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be selected from:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), and B($Q_{16}$)($Q_{17}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), and —B($Q_{26}$)($Q_{27}$); and —N($Q_{31}$)($Q_{32}$), —Si($Q_{33}$)($Q_{34}$)($Q_{35}$), and —B($Q_{36}$)($Q_{37}$), wherein $Q_1$ to $Q_7$, $Q_{11}$ to $Q_{17}$, $Q_{21}$ to $Q_{27}$, and $Q_{37}$ to $Q_{37}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

The term "Ph", as used herein, may refer to a phenyl group; the term "Me", as used herein, may refer to a methyl group; the term "Et", as used herein, may refer to an ethyl group; and the terms "ter-Bu" or "But", as used herein, may refer to a tert-butyl group.

According to one or more embodiments, an organic light-emitting device may have a low driving voltage, high efficiency, and a long lifespan.

What is claimed is:

1. An organic light-emitting device comprising:

a substrate comprising at least a first sub-pixel region, and a second sub-pixel region;

a first sub-pixel electrode disposed in the first sub-pixel region of the substrate;

a first sub-pixel organic layer disposed on the first sub-pixel electrode;

a second sub-pixel electrode disposed in the second sub-pixel region of the substrate;

a second sub-pixel organic layer disposed on the second sub-pixel electrode; and a second electrode disposed on the first sub-pixel organic layer and the second sub-pixel organic layer, wherein the first sub-pixel organic layer comprises;

a first sub-pixel emission layer; and a first sub-pixel emission auxiliary layer between the first sub-pixel electrode and the first sub-pixel emission layer, the first sub-pixel emission auxiliary layer comprises a first compound represented by Formula 1A or Formula 1B, the second sub-pixel organic layer comprises:

a second sub-pixel emission layer; and a second sub-pixel emission auxiliary layer between the second sub-pixel electrode and the second sub-pixel emission layer, the second sub-pixel emission layer comprises a second compound represented by Formula 2A, the first sub-pixel emission auxiliary layer is in direct contact with the first sub-pixel emission layer, and the second sub-pixel emission auxiliary layer is in direct contact with the second sub-pixel emission layer:

<Formula 1A>

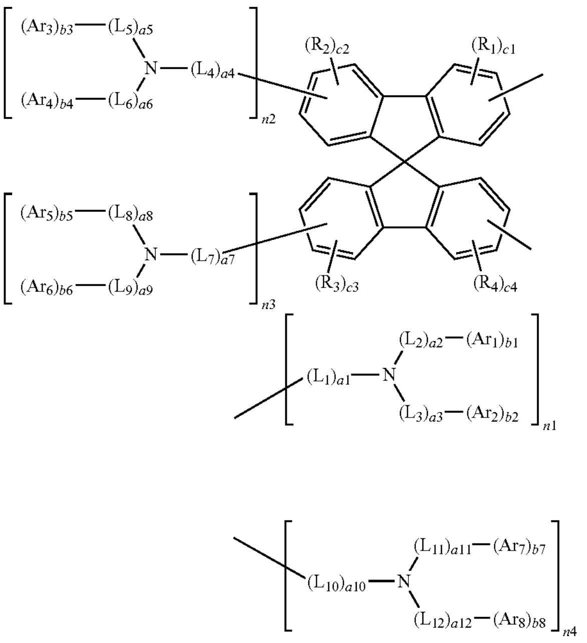

-continued

<Formula 1B>

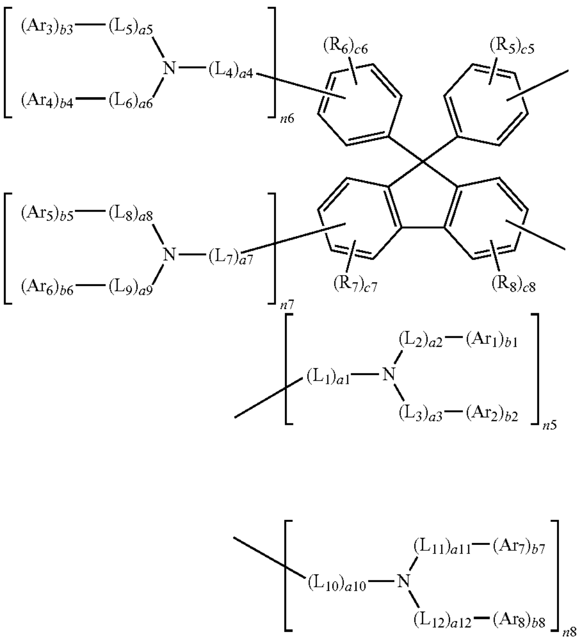

<Formula 2A>

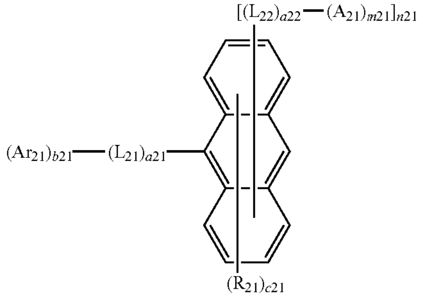

<Formula 10>

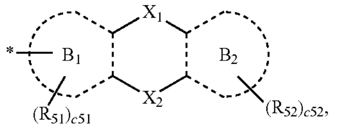

wherein in Formulae 1A, 1B, 2A, and 10, $A_{21}$ is a group represented by Formula 10, m21 is an integer from 1 to 3, $X_1$ is O or S, $X_2$ is a single bond, O, or S, ring $B_1$ and ring $B_2$ are each independently a benzene group or a naphthalene group, provided that ring $B_1$ and ring $B_2$ are not simultaneously a benzene group, $L_1$ to $L_{12}$, $L_{21}$, and $L_{22}$ are each independently a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, or a substituted or unsubstituted divalent non-aromatic condensed heteropolycyclic group, a1 to a12, a21, and a22 are each independently an integer from 0 to 3, $Ar_1$ to $Ar_8$, and $Ar_{21}$ are each independently a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group, b1 to b8, and b21 are each independently an integer from 1 to 5, $Ar_1$ and $Ar_2$ are optionally linked to form a saturated or unsaturated ring, $Ar_3$ and $Ar_4$ are optionally linked to form a saturated or unsaturated ring, $Ar_5$ and $Ar_6$ are optionally linked to form a saturated or unsaturated ring, $Ar_7$ and $Ar_8$ are optionally linked to form a saturated or unsaturated ring, $R_1$ to $R_8$, $R_{21}$, $R_{51}$, and $R_{52}$ are each independently hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, or $—Si(Q_1)(Q_2)(Q_3)$, c1 to c4, c7, and c8 are each independently an integer from 0 to 4, c5 and c6 are each independently an integer from 0 to 5, c21 is an integer from 0 to 8, c51 and c52 are each independently an integer from 0 to 6, n1 to n4 are each independently an integer from 0 to 4, provided that the sum of n1, n2, n3, and n4 is one or more, n5 and n6 are each independently an integer from 0 to 5, and n7 and n8 are each independently an integer from 0 to 4, provided that the sum of n5, n6, n7, and n8 is one or more, n21 is an integer from 1 to 3, at least one substituent selected from a substituent(s) of the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group is:

a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with at least one of deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$Si(Q_{11})(Q_{12})(Q_{13})$, and —$N(Q_{14})(Q_{15})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each substituted with a least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$Si(Q_{21})(Q_{22})(Q_{23})$, and —$N(Q_{24})(Q_{25})$; or —$Si(Q_{31})(Q_{32})(Q_{33})$ or —$N(Q_{34})(Q_{35})$, wherein $Q_1$ to $Q_3$, $Q_{11}$ to $Q_{15}$, $Q_{21}$ to $Q_{25}$, and $Q_{31}$ to $Q_{35}$ are each independently hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, or a monovalent non-aromatic condensed heteropolycyclic group, and

* indicates a binding site to a neighboring atom.

2. The organic light-emitting device of claim 1, wherein the first sub-pixel electrode and the second sub-pixel electrode are each an anode, the second electrode is a cathode.

3. The organic light-emitting device of claim 1, wherein the first sub-pixel emission layer emits first color light, and the second sub-pixel emission layer emits second color light, and wherein:

(i) the first color light is red, and the second color light is green, (ii) the first color light is green, and the second color light is red, (iii) the first color light is red, and the second color light is blue, (iv) the first color light is blue, and the second color light is red, (v) the first color light is green, and the second color light is blue, or (vi) the first color light is blue, and the second color light is green.

4. The organic light-emitting device of claim 1, wherein the substrate further comprises a third sub-pixel region, and the organic light-emitting device further comprises:

a third sub-pixel electrode disposed on the third sub-pixel region, and a third sub-pixel organic layer disposed on the third sub-pixel electrode and comprising a third sub-pixel emission layer and a third sub-pixel emission auxiliary layer.

5. The organic light-emitting device of claim 1, wherein the first compound is represented by one of Formulae 1A-1 to 1A-10 and 1B-1 to 1B-4:

<Formula 1A-1>
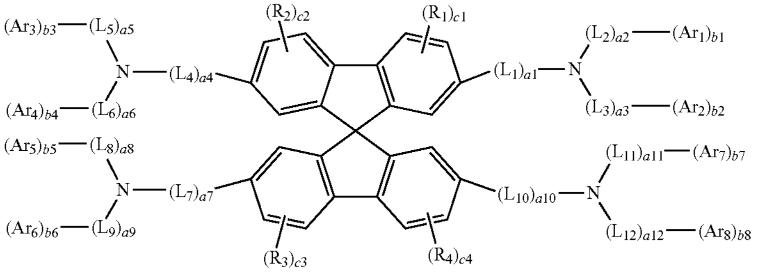
<Formula 1A-2>
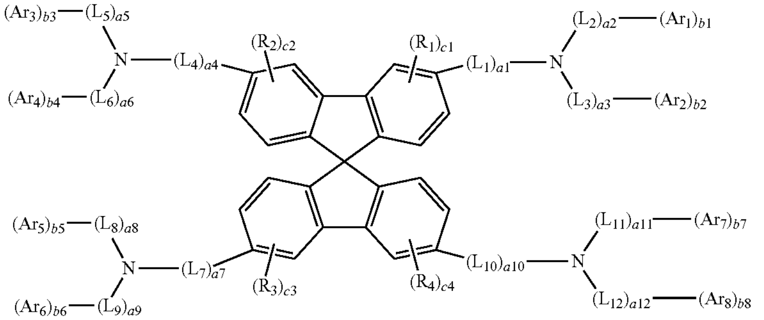
<Formula 1A-3>
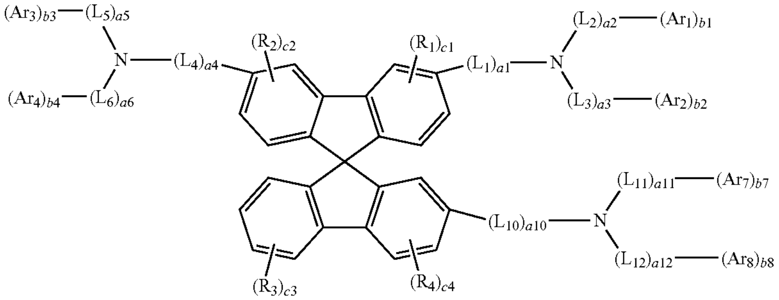
<Formula 1A-4>
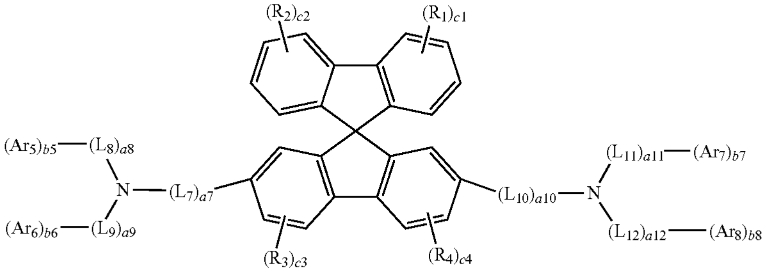
<Formula 1A-5>
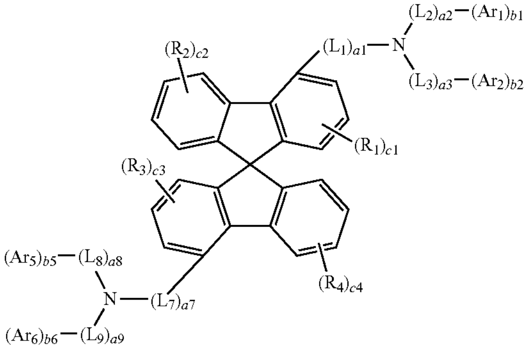

-continued
<Formula 1A-6>
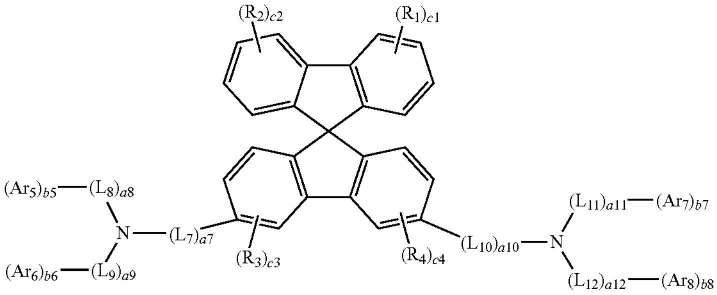
<Formula 1A-7>
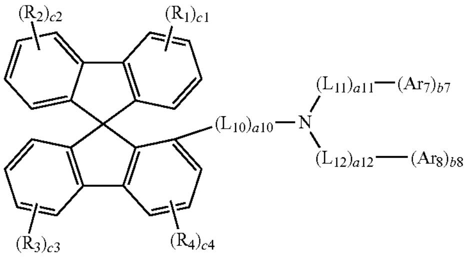
<Formula 1A-8>
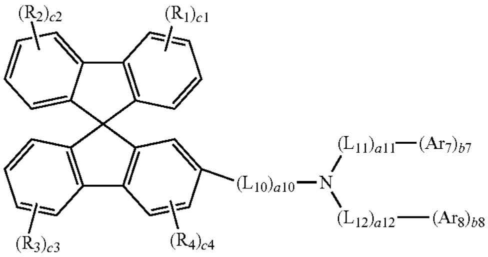
<Formula 1A-9>
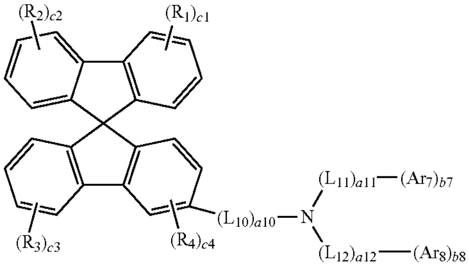
<Formula 1A-10>
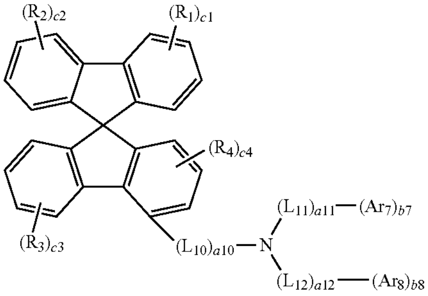
<Formula 1B-1>
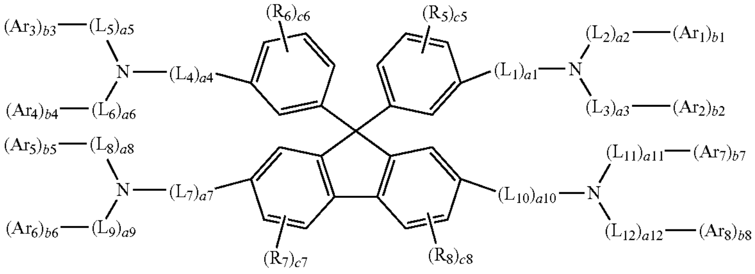
<Formula 1B-2>
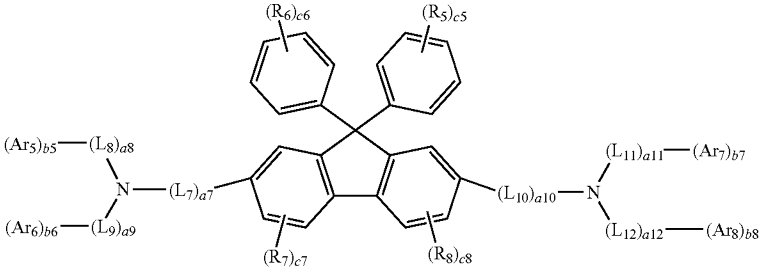

-continued

<Formula 1B-3>

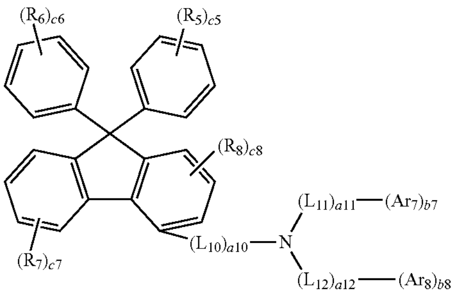

<Formula 1B-4>

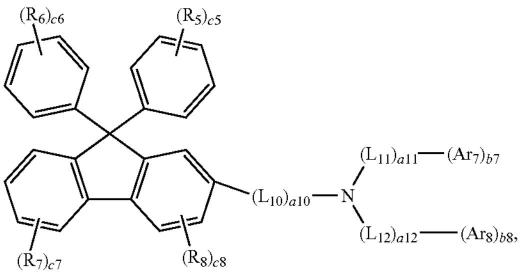

wherein in Formulae 1A-1 to 1A-10 and 1B-1 to 1B-4, $L_1$ to $L_{12}$, a1 to a12, $Ar_1$ to $Ar_8$, b1 to b8, $R_1$ to $R_{12}$, and c1 to c12 are the same as described in claim 1.

6. The organic light-emitting device of claim 1, wherein the first compound is represented by one of Formulae 1A-1 (1), 1A-2 (1), 1A-2 (2), 1A-3 (1), 1A-4 (1), 1A-4 (2), 1A-5 (1), 1A-5 (2), 1A-5 (3), 1A-6 (1), 1A-7 (1), 1A-8 (1), 1A-8 (2), 1A-8 (3), 1A-8 (4), 1A-9 (1), 1A-9 (2), 1A-10 (1), 1A-10 (2), 1A-10 (3), 1A-10 (4), 1B-1 (1), 1B-2 (1), 1B-2 (2), 1B-3 (1), and 1B-4 (1):

<Formula 1A-1(1)>

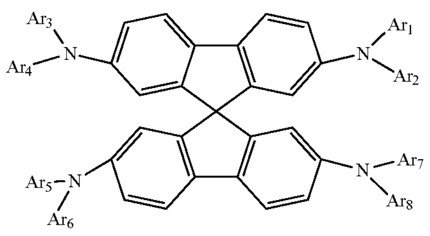

<Formula 1A-2(1)>

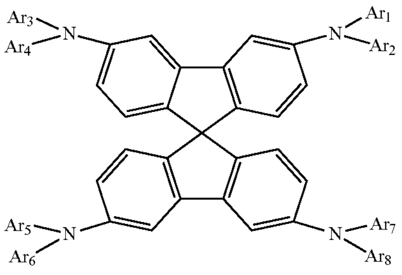

<Formula 1A-2(2)>

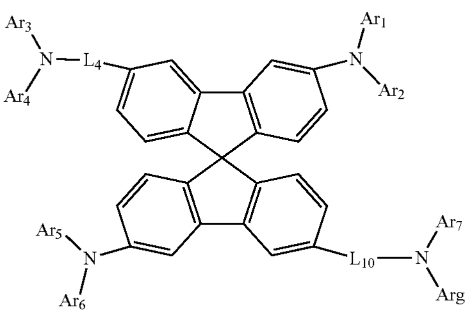

-continued

<Formula 1A-3(1)>

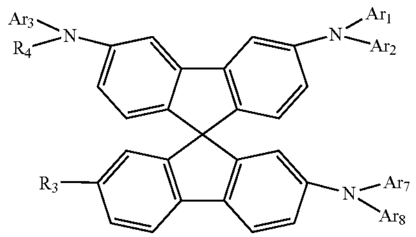

<Formula 1A-4(1)>

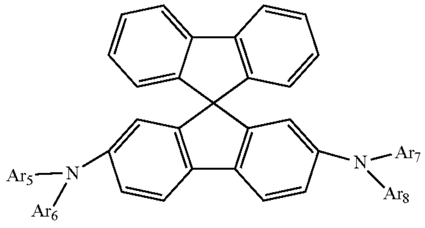

<Formula 1A-4(2)>

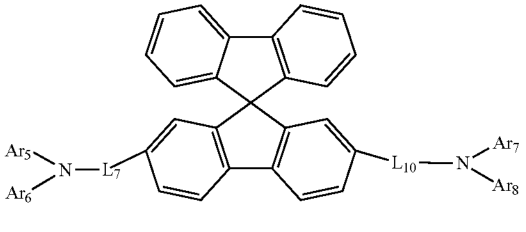

<Formula 1A-5(1)>

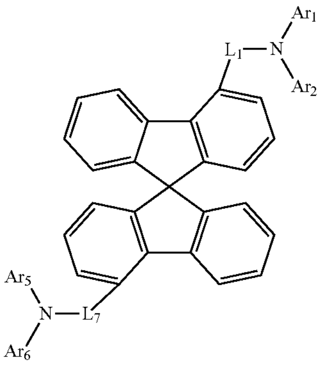

-continued
<Formula 1A-5(2)>
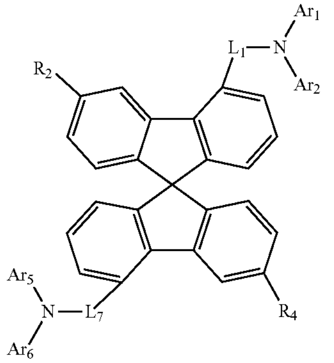
<Formula 1A-5(3)>
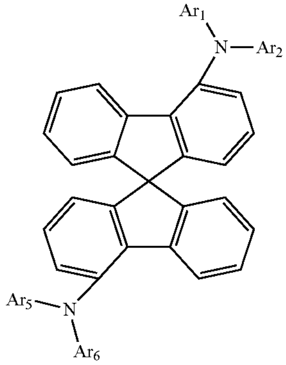
<Formula 1A-6(1)>
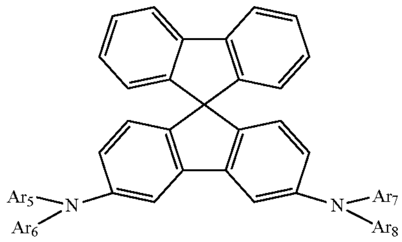
<Formula 1A-7(1)>
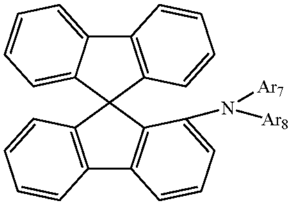
<Formula 1A-8(1)>
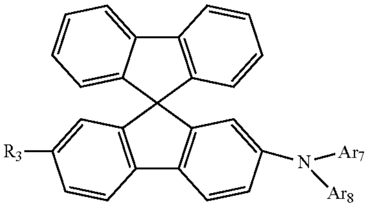
-continued
<Formula 1A-8(2)>
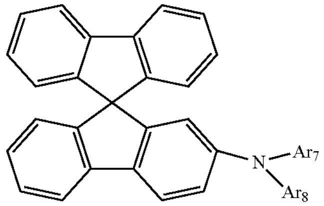
<Formula 1A-8(3)>
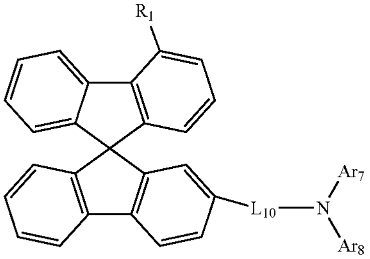
<Formula 1A-8(4)>
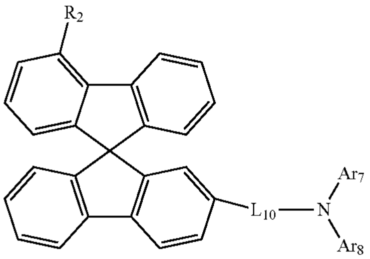
<Formula 1A-9(1)>
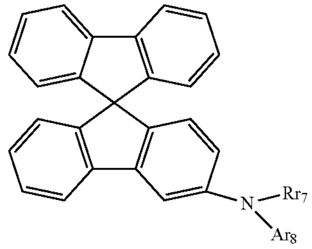
<Formula 1A-9(2)>
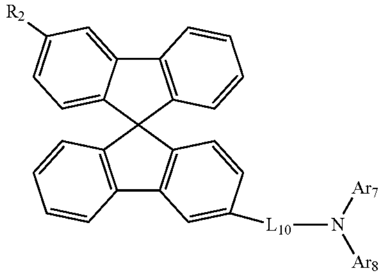
<Formula 1A-10(1)>
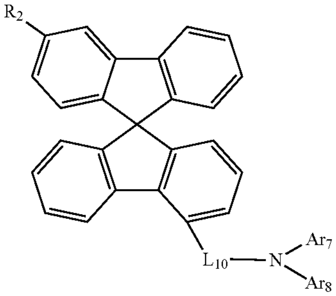

-continued

<Formula 1A-10(2)>

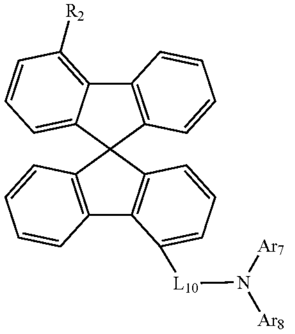

<Formula 1A-10(3)>

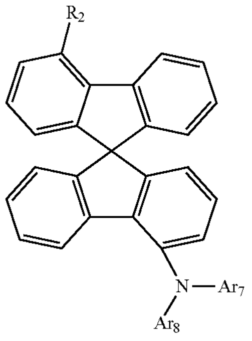

<Formula 1A-10(4)>

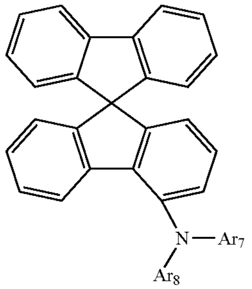

<Formula 1B-1(1)>

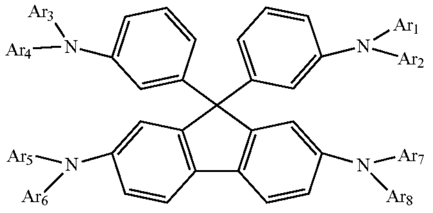

<Formula 1B-2(1)>

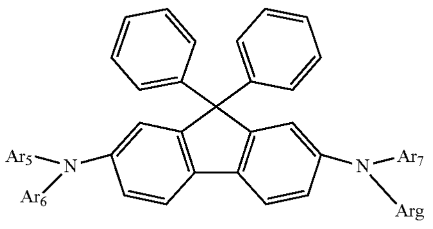

-continued

<Formula 1B-2(2)>

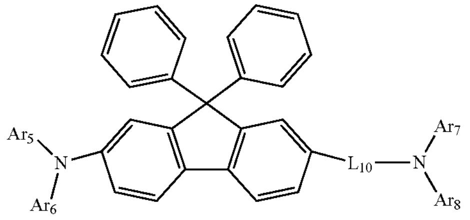

<Formula 1B-3(1)>

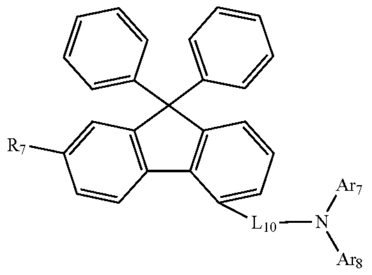

<Formula 1B-4(1)>

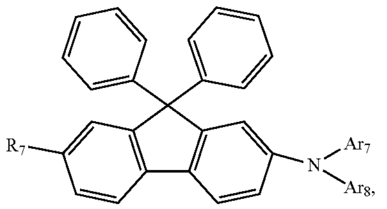

wherein in Formulae 1A-1 (1), 1A-2 (1), 1A-2 (2), 1A-3 (1), 1A-4 (1), 1A-4 (2), 1A-5 (1), 1A-5 (2), 1A-5 (3), 1A-6 (1), 1A-7 (1), 1A-8 (1), 1A-8 (2), 1A-8 (3), 1A-8 (4), 1A-9 (1), 1A-9 (2), 1A-10 (1), 1A-10 (2), 1A-10 (3), 1A-10 (4), 1B-1 (1), 1B-2 (1), 1B-2 (2), 1B-3 (1), and 1B-4 (1), $L_1$, $L_4$, $L_7$, $L_{10}$, $Ar_1$ to $Ar_8$, $R_1$ to $R_4$, and Ry are the same as described in claim 1.

7. The organic light-emitting device of claim 1, wherein the second compound is represented by Formula 2A-1:

<Formula 2A-1>

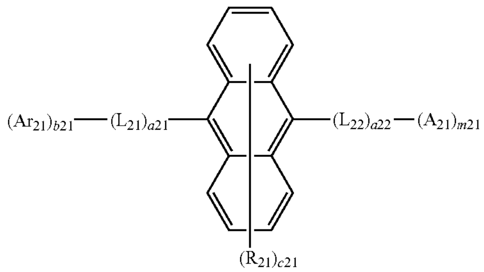

wherein in Formulae 2A-1, $A_{21}$, m21, $L_{21}$, $L_{22}$, a21, a22, $Ar_{21}$, b21, $R_{21}$, and c21 are the same as described in claim 1.

8. The organic light-emitting device of claim 1, wherein the second compound is represented by one of Formulae 2A-1 (5) to 2A-1 (8):

<Formula 2A-1(5)>
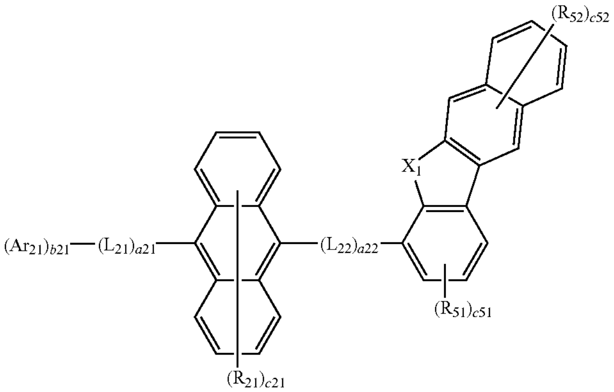
<Formula 2A-1(6)>
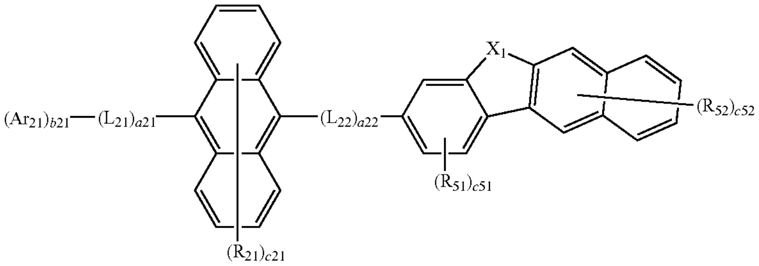
<Formula 2A-1(7)>
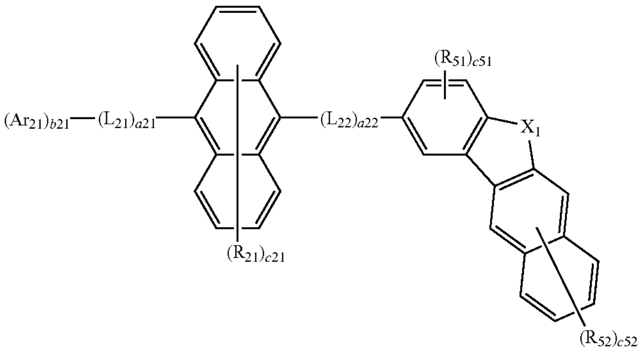
<Formula 2A-1(8)>
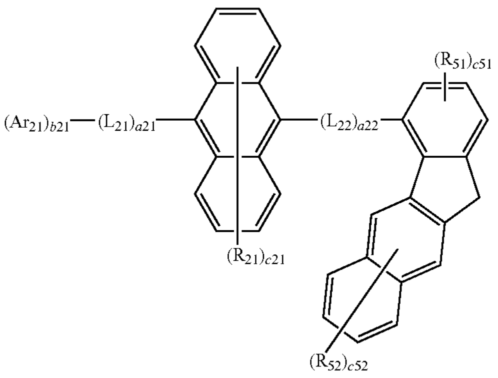
wherein in Formulae 2A-1 (1) to 2A-1 (8),
$L_{21}$, $L_{22}$, a21, a22, $Ar_{21}$, b21, $R_{21}$, and c21 are the same as described in claim 1.

9. The organic light-emitting device of claim 1, wherein the first compound is one of Compounds 1 to 51, and the second compound is one selected from Compounds H17 to H24:
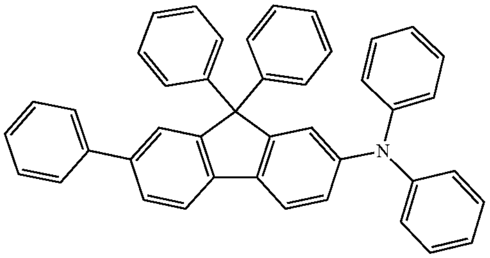
1
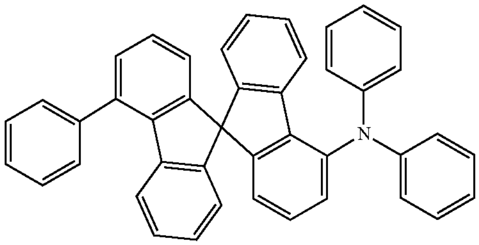
2
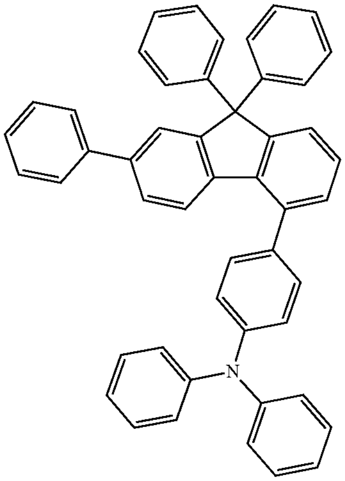
3
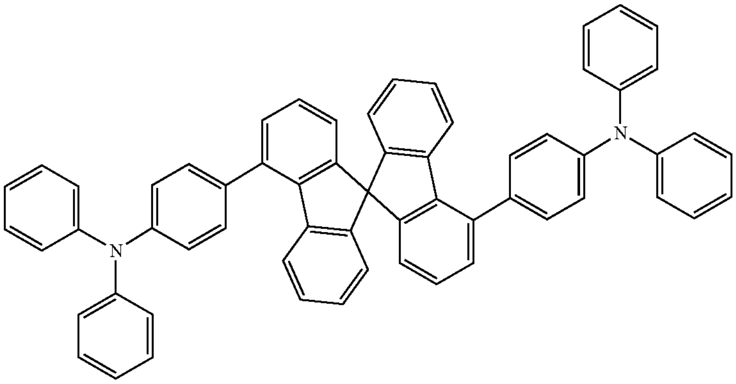
4

-continued
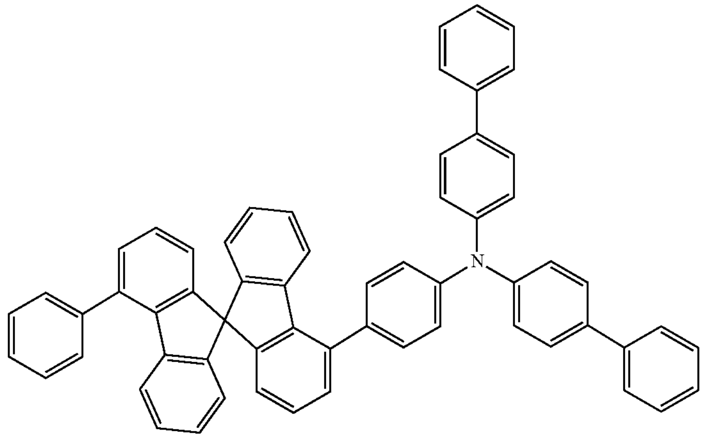
5
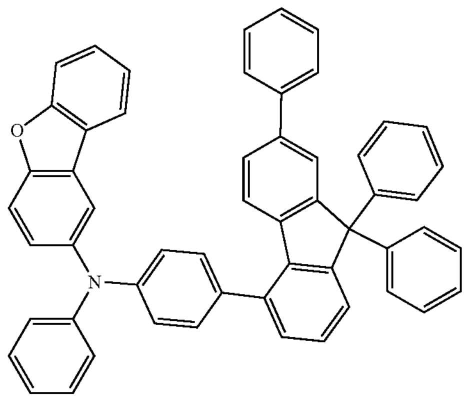
6
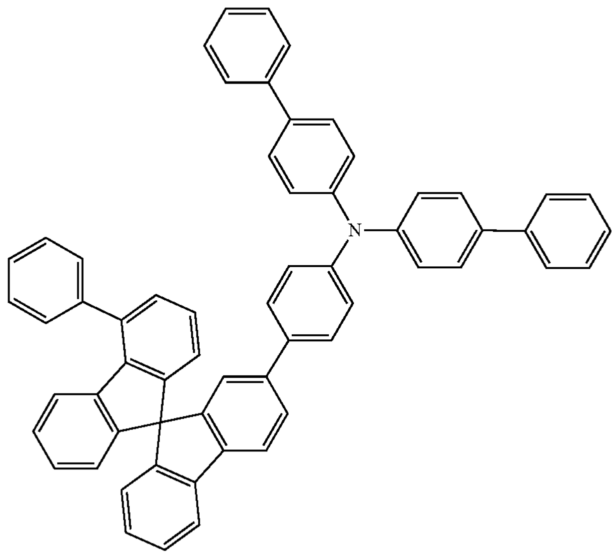
7

-continued
8
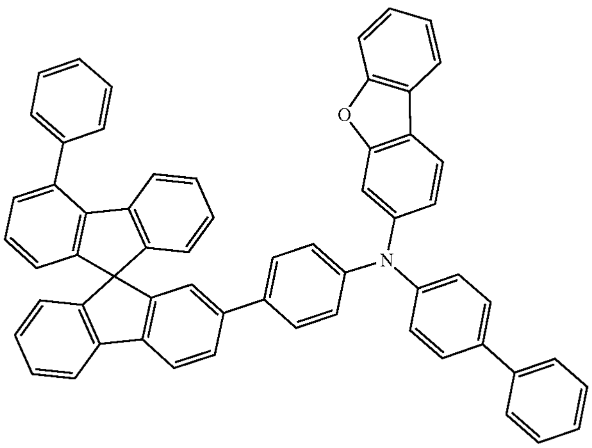
9
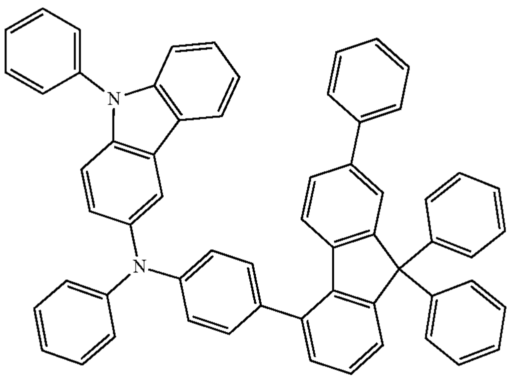
10
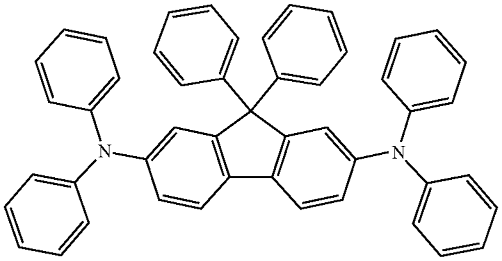
11
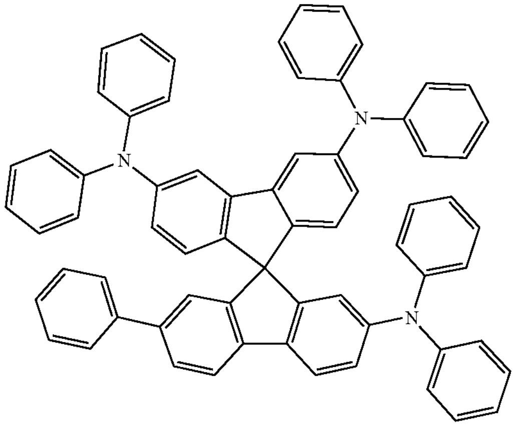
12
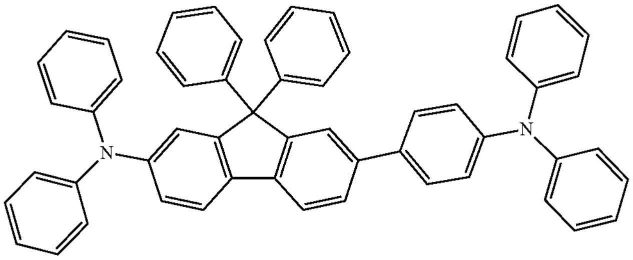
13
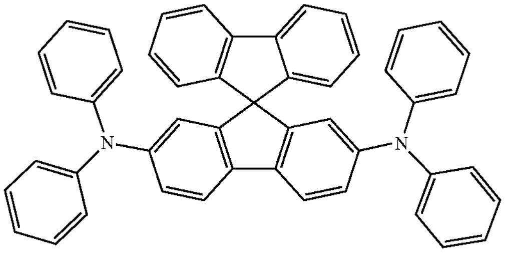
14
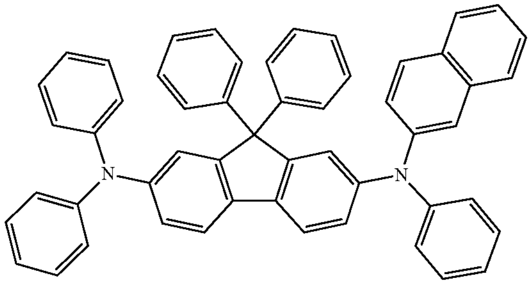

-continued
15
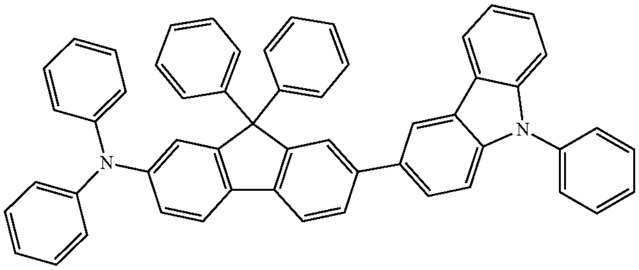
16
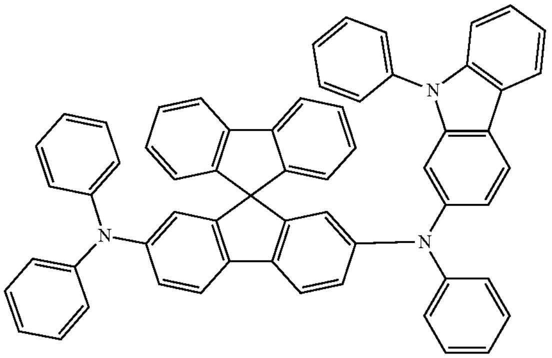
17
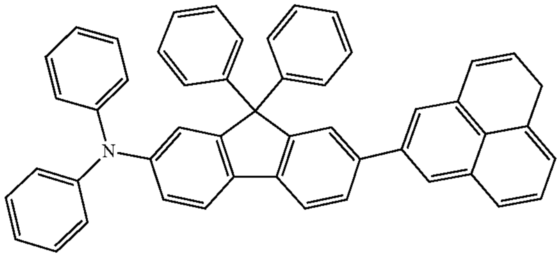
18
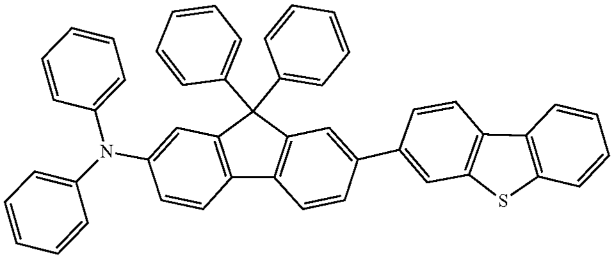
19
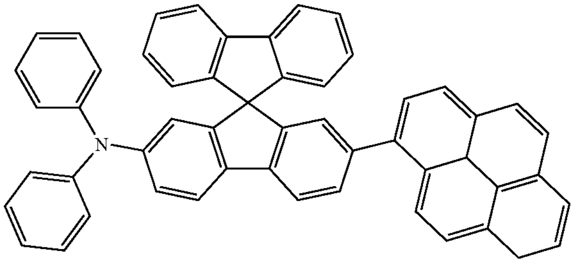
20
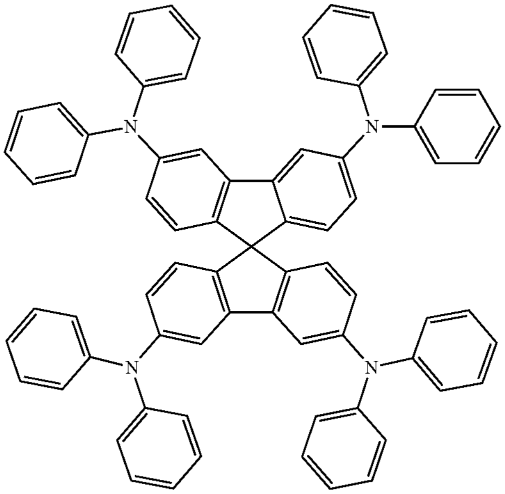

-continued
21
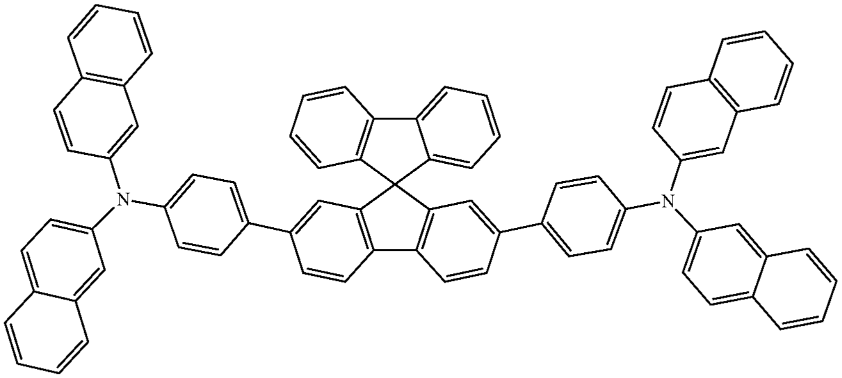
22
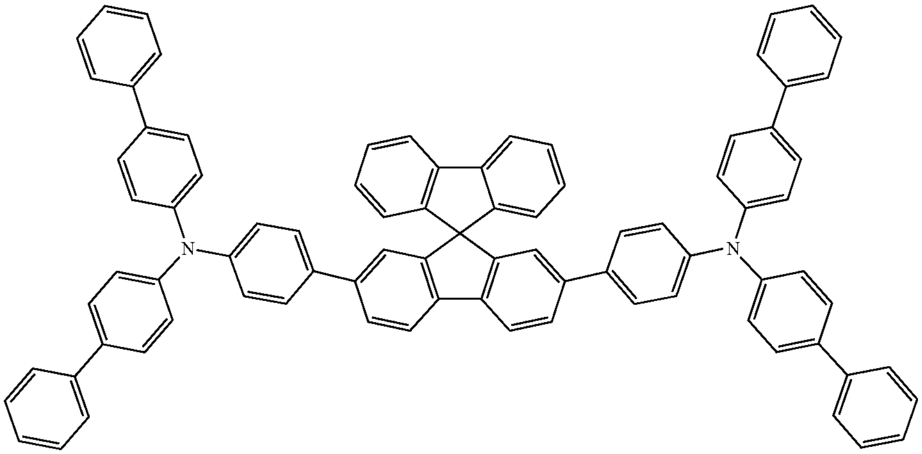
23
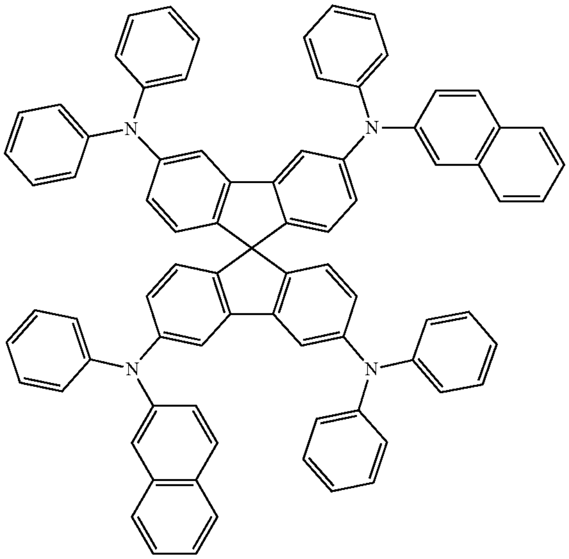
24
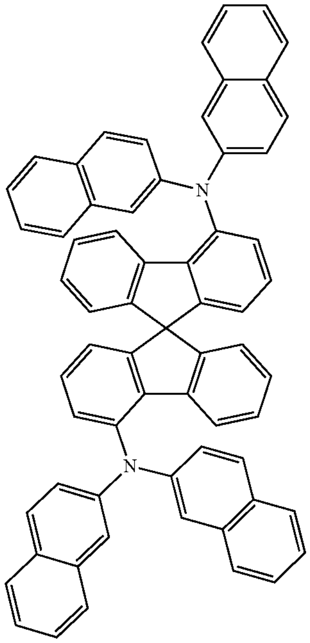

-continued
25
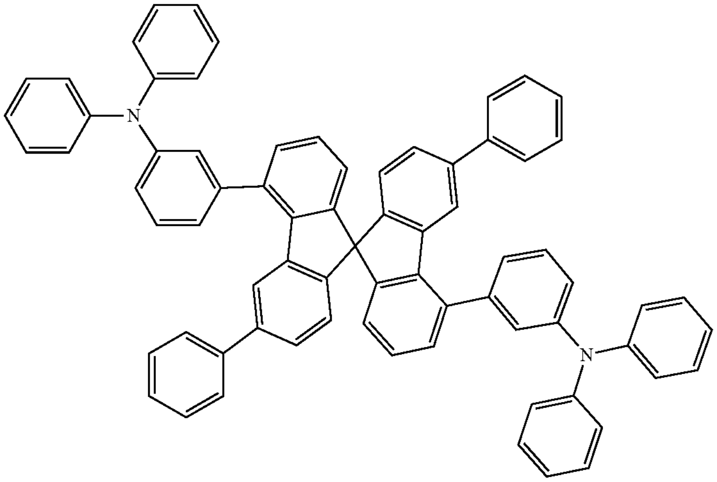
26
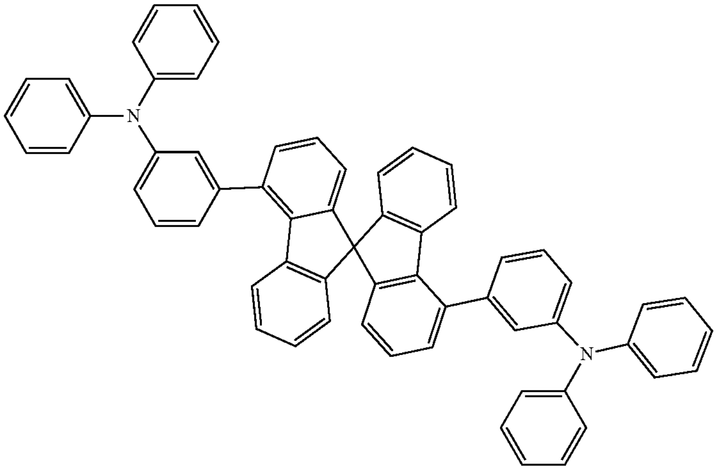
27
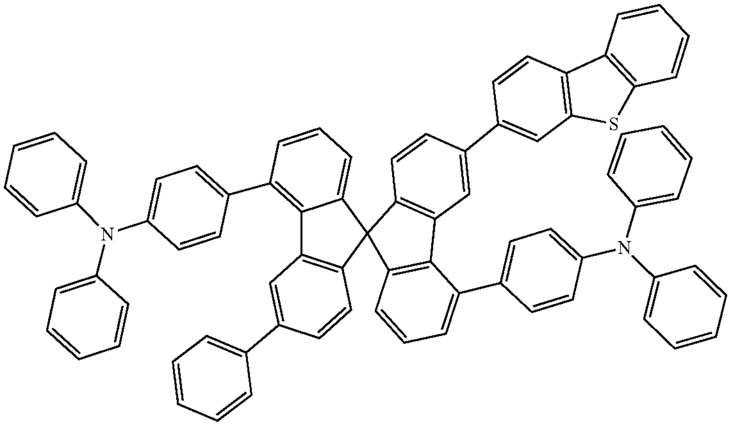

-continued
28
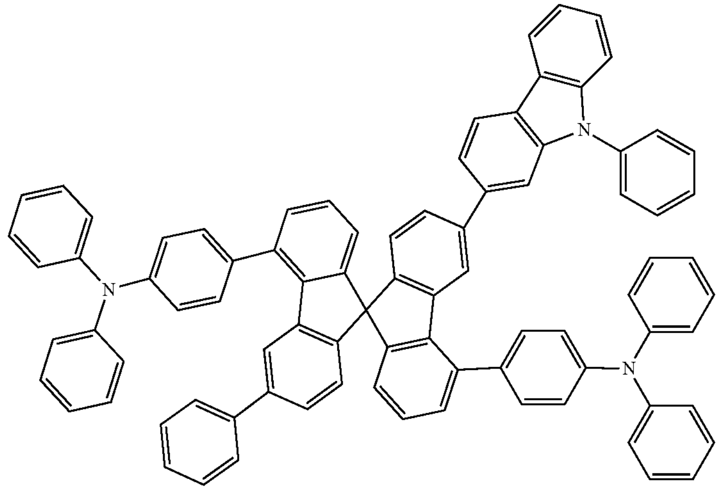
29
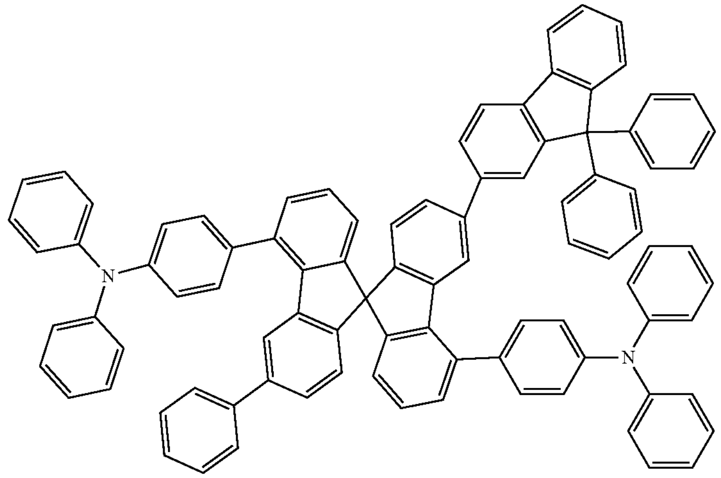
30
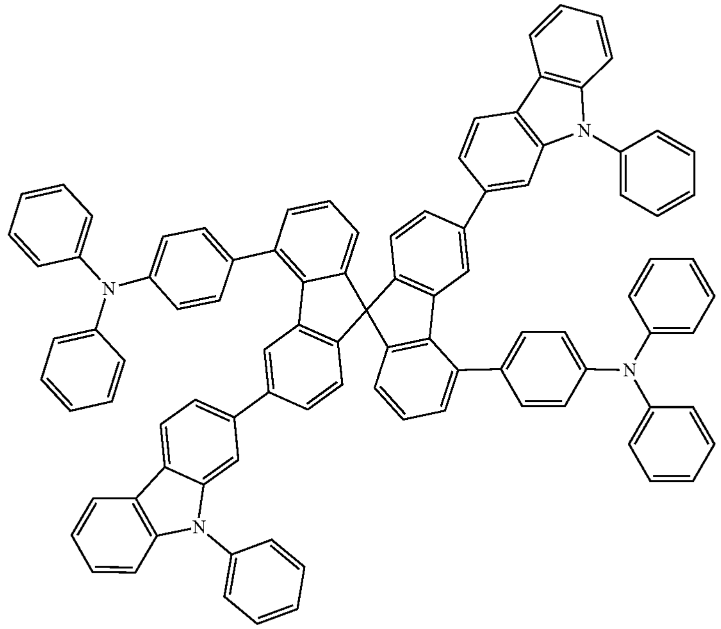

-continued
31
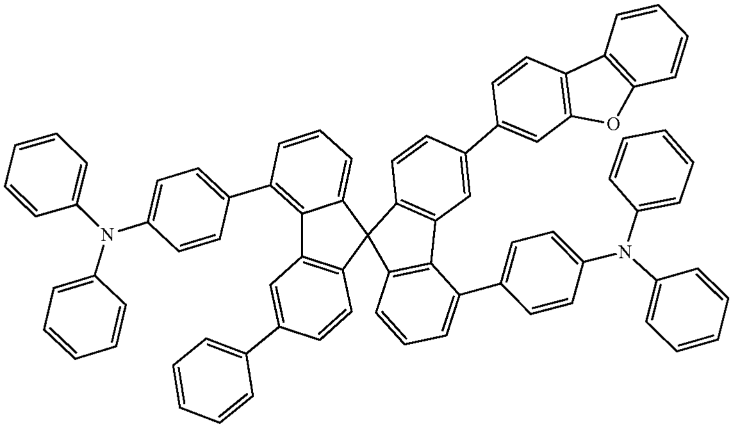
32
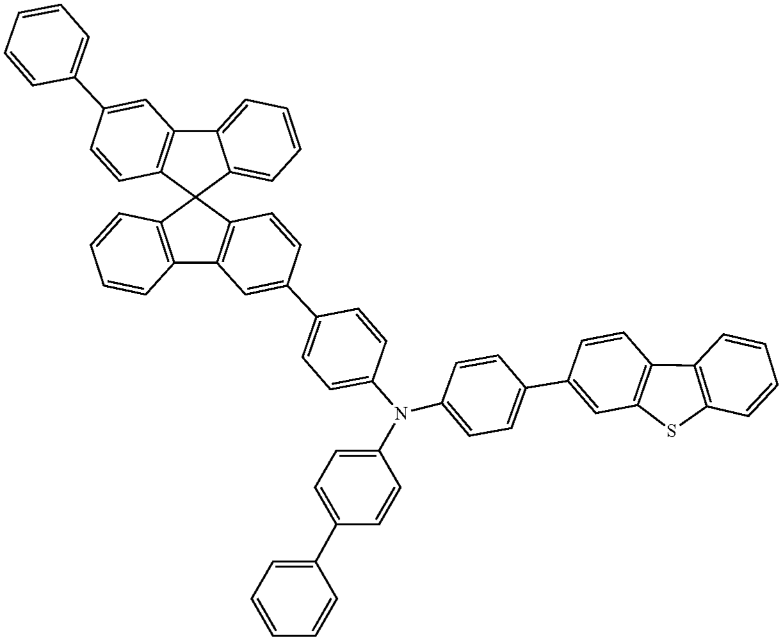

-continued
33
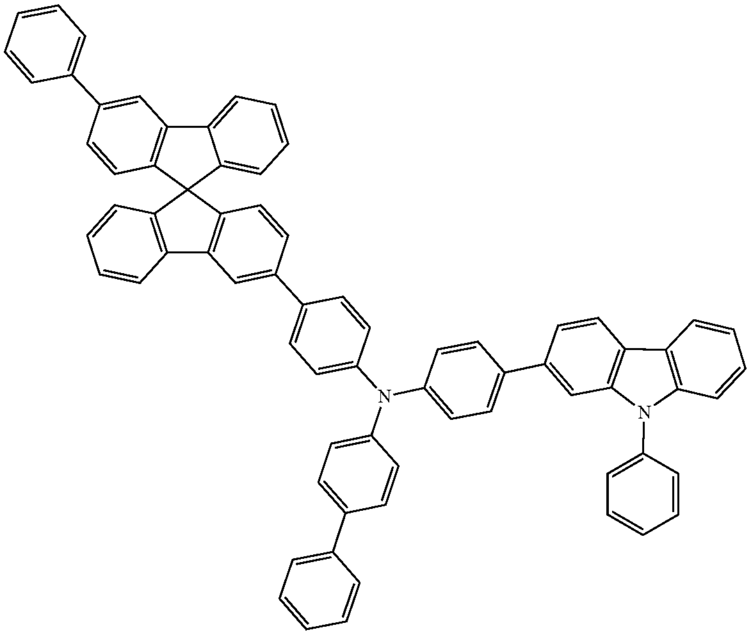
34
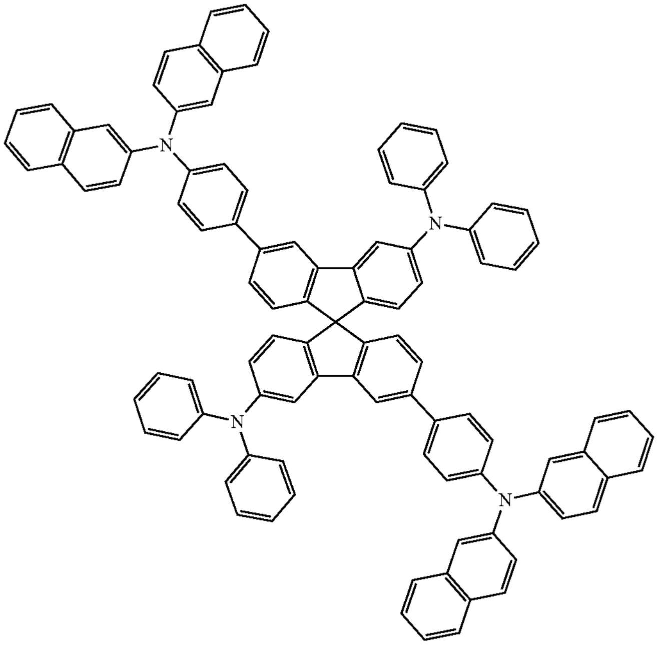

-continued
35
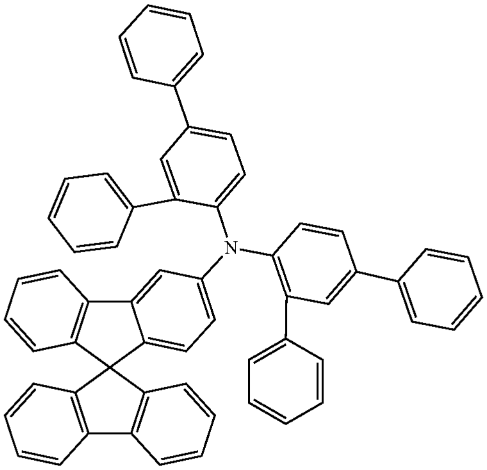
36
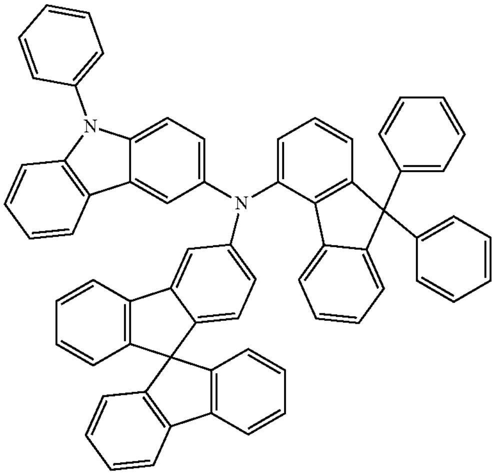
37
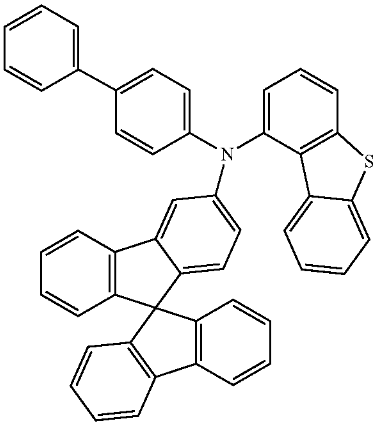
38
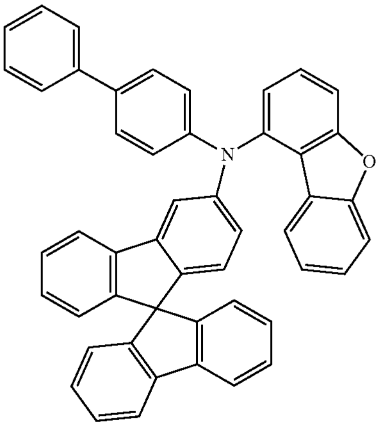
39
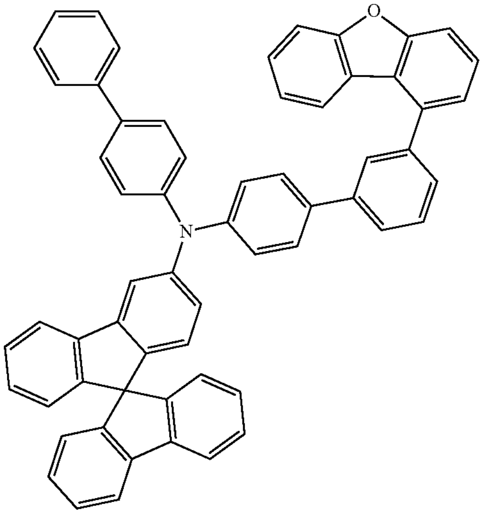

-continued
40
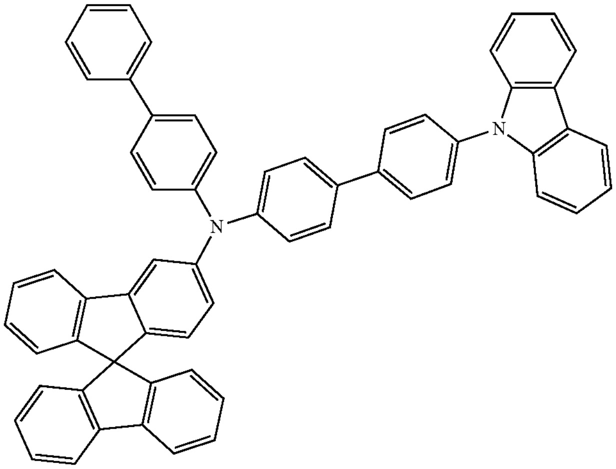
41
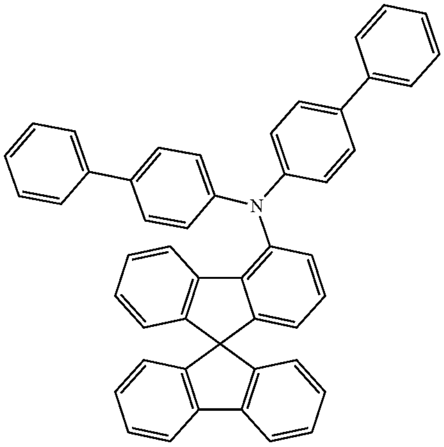
42
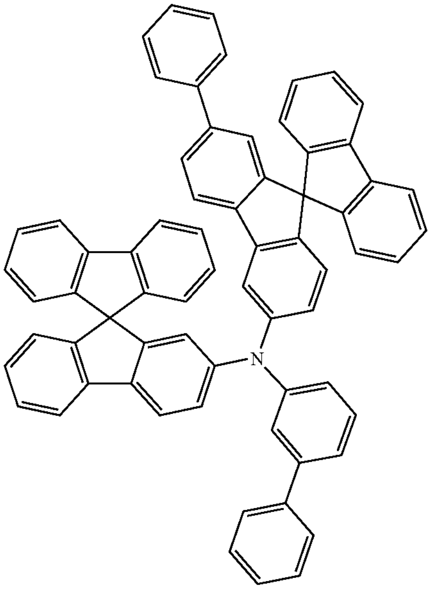
43
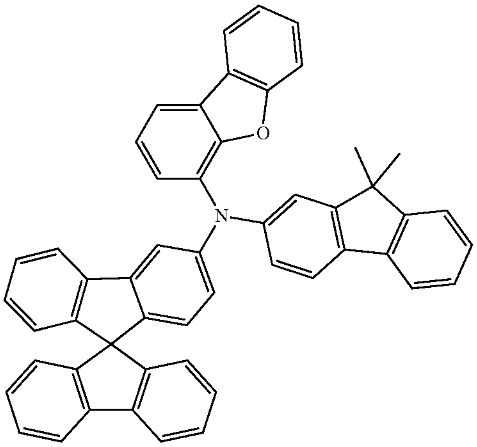
44
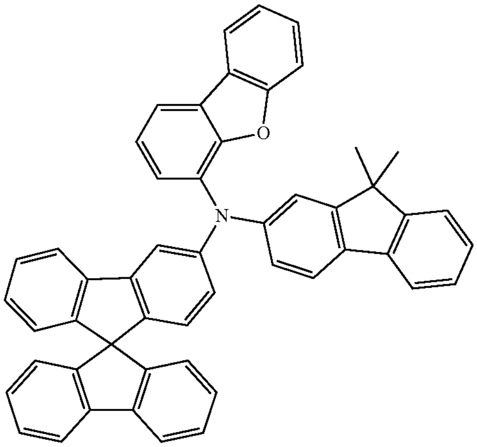

-continued
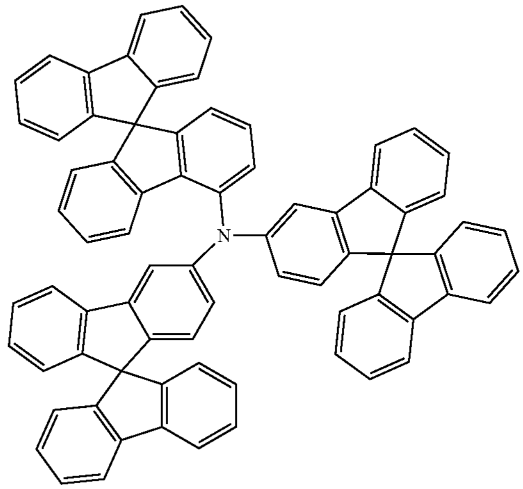
45
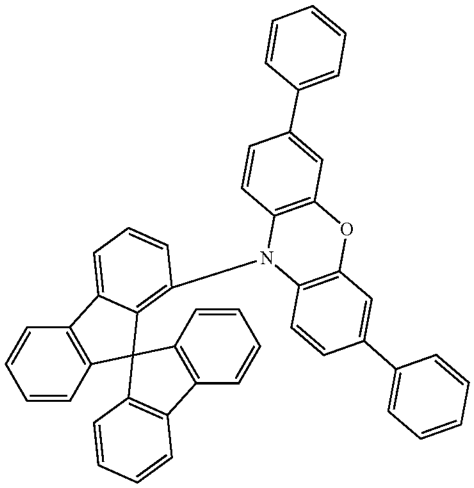
46
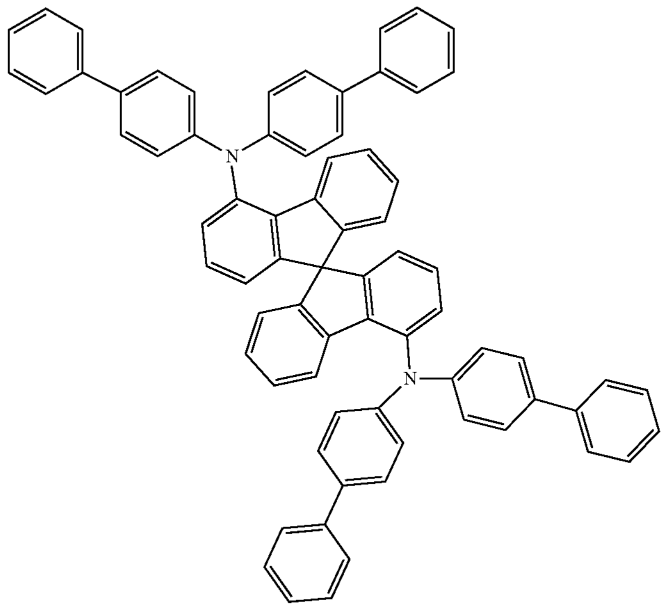
47

-continued
48
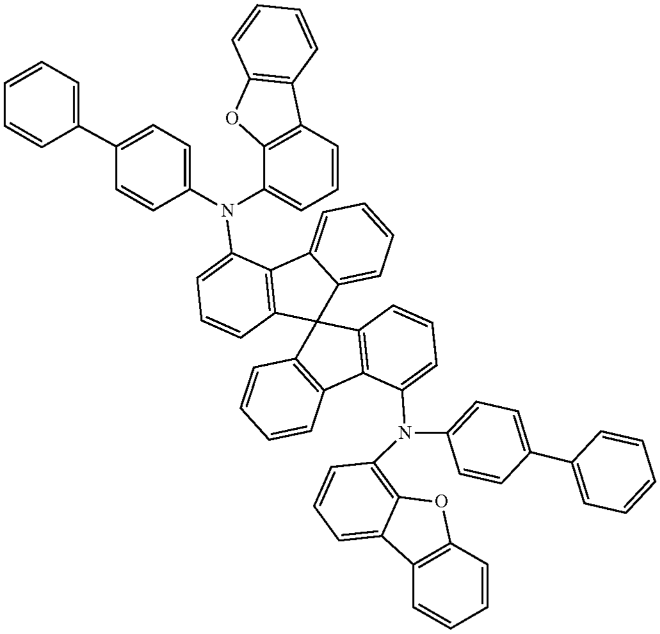
49
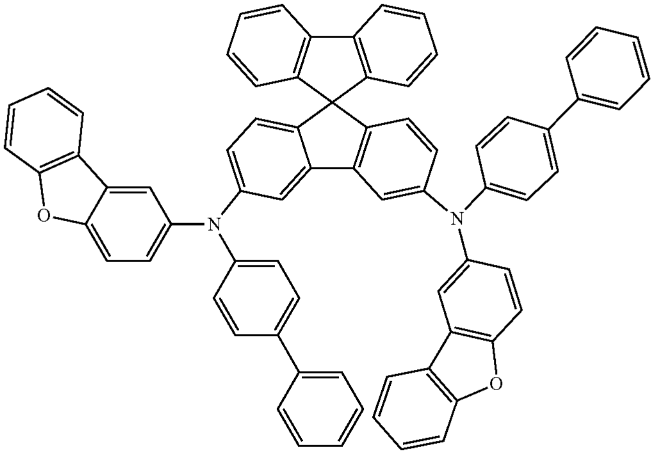
50
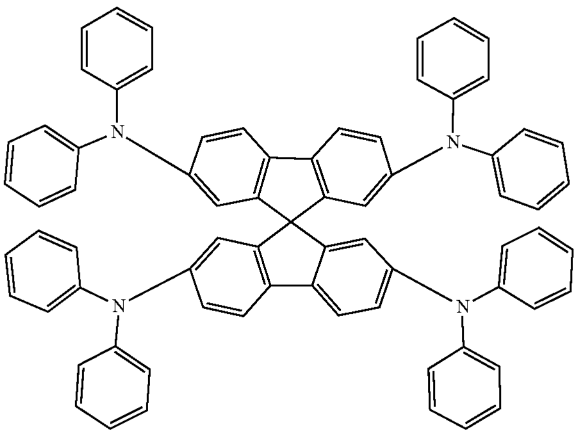
51
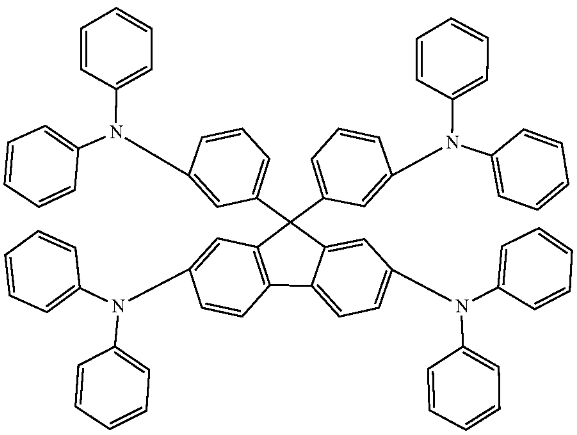

-continued
H17
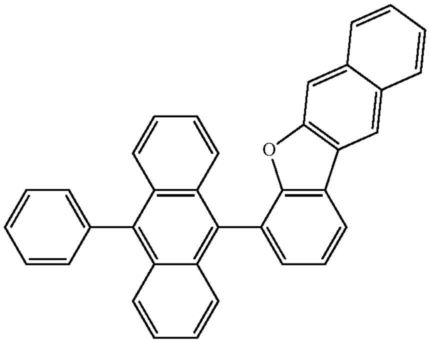
H18
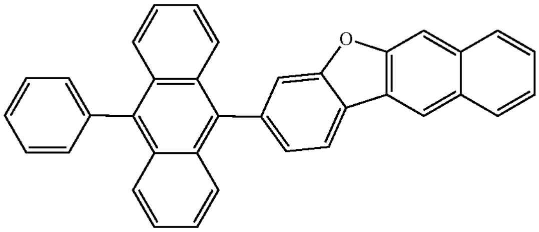
H19
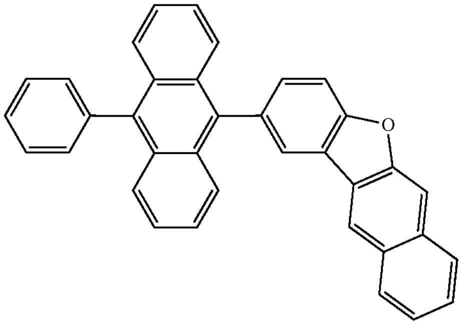
H20
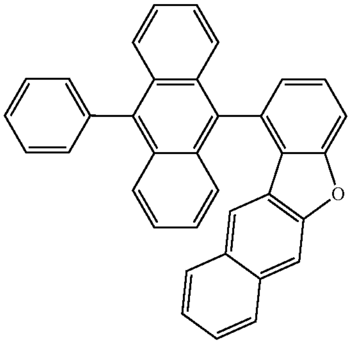
H21
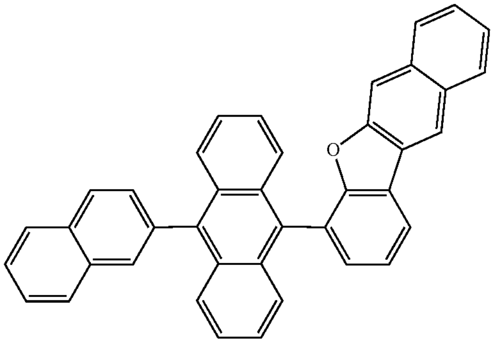
H22
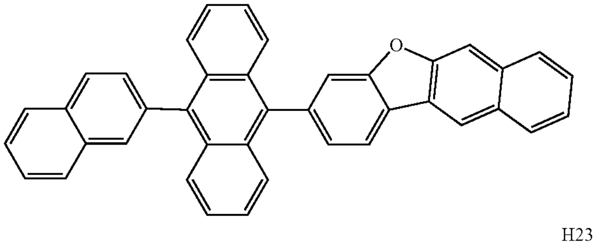
H23
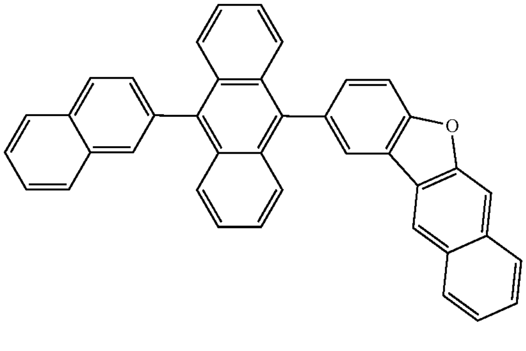
H24
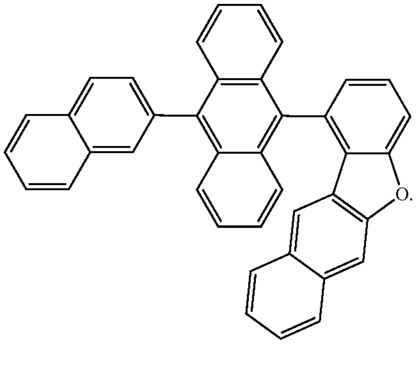

10. An organic light-emitting device comprising:

a substrate comprising at least a first sub-pixel region, and a second sub-pixel region;

a first sub-pixel electrode disposed in the first sub-pixel region of the substrate;

a first sub-pixel organic layer disposed on the first sub-pixel electrode;

a second sub-pixel electrode disposed in the second sub-pixel region of the substrate;

a second sub-pixel organic layer disposed on the second sub-pixel electrode; and a second electrode disposed on the first sub-pixel organic layer and the second sub-pixel organic layer, wherein the first sub-pixel organic layer comprises a first compound represented by Formula 1A or Formula 1B, and the second sub-pixel organic layer comprises a second compound represented by Formula 2A:

substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, or a substituted or unsubstituted divalent non-aromatic condensed heteropolycyclic group, a1 to a12, a21, and a22 are each independently an integer from 0 to 3, $Ar_1$ to $Ar_8$, and $Ar_{21}$ are each independently a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl <Formula 1A>

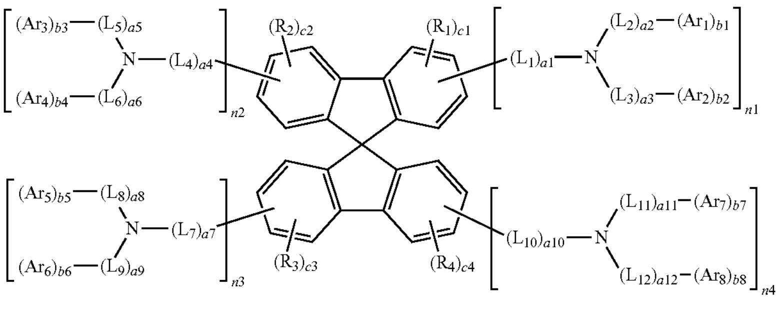

<Formula 1B>

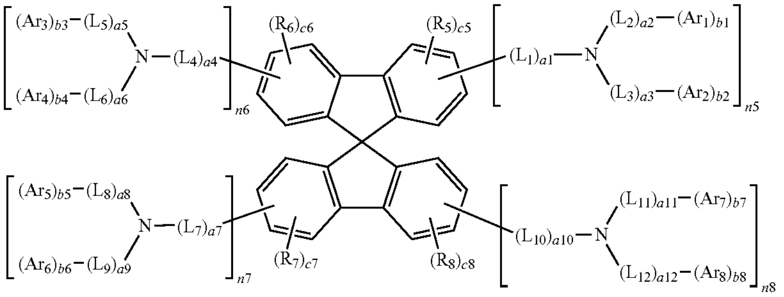

<Formula 2A>

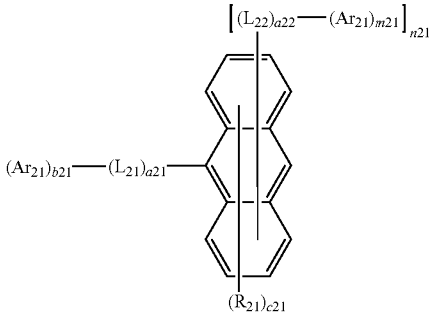

<Formula 10>

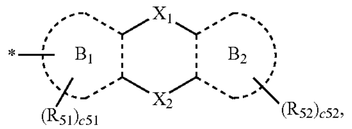

wherein in Formulae 1A, 1B, 2A, and 10, $A_{21}$ is a group represented by Formula 10, m21 is an integer from 1 to 3, $X_1$ is O or S, $X_2$ is a single bond, O, or S, ring $B_1$ and ring $B_2$ are each independently a benzene group or a naphthalene group, provided that ring $B_1$ and ring $B_2$ are not simultaneously a benzene group, $L_1$ to $L_{12}$, $L_{21}$, and $L_{22}$ are each independently a substituted or unsubstituted $C_3$-$C_{10}$ cycloalkylene group, a group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group, b1 to b8, and b21 are each independently an integer from 1 to 5, $Ar_1$ and $Ar_2$ are optionally linked to form a saturated or unsaturated ring, $Ar_3$ and $Ar_4$ are optionally linked to form a saturated or unsaturated ring, $Ar_5$ and $Ar_6$ are optionally linked to form a saturated or unsaturated ring, $Ar_7$ and $Ar_8$ are optionally linked to form a saturated or unsaturated ring, $R_1$ to $R_8$, $R_{21}$, $R_{51}$, and $R_{52}$ are each independently hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, or —$Si(Q_1)(Q_2)(Q_3)$, c1 to c4, c7, and c8 are each independently an integer from 0 to 4, c5 and c6 are each independently an integer from 0 to 5, c21 is an integer from 0 to 8, c51 and c52 are each independently an integer from 0 to 6, n1 to n4 are each independently an integer from 0 to 4, provided that the sum of n1, n2, n3, and n4 is two or more, n5 and n6 are each independently an integer from 0 to 5, and n7 and n8 are each independently an integer from 0 to 4, provided that the sum of n5, n6, n7, and n8 is two or more, n21 is an integer from 1 to 3, at least one substituent selected from a substituent(s) of the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group is:

a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with at least one of deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-Coo arylthio group, a $C_1$-$C_{60}$ heteroaryl group, a monovalent non-aromatic condensed polycyclic group, a monovalent non-aromatic condensed heteropolycyclic group, —$Si(Q_{11})(Q_{12})(Q_{13})$, and —$N(Q_{14})(Q_{15})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each substituted with a least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-Coo aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$Si(Q_{21})(Q_{22})(Q_{23})$, and —$N(Q_{24})(Q_{25})$; or —$Si(Q_{31})(Q_{32})(Q_{33})$ or —$N(Q_{34})(Q_{35})$, wherein $Q_1$ to $Q_3$, $Q_{11}$ to $Q_{15}$, $Q_{21}$ to $Q_{25}$, and $Q_{31}$ to $Q_{35}$ are each independently hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, or a monovalent non-aromatic condensed heteropolycyclic group, and

* indicates a binding site to a neighboring atom.

* * * * *